United States Patent
Wang et al.

(10) Patent No.: US 6,876,072 B1
(45) Date of Patent: *Apr. 5, 2005

(54) SEMICONDUCTOR CHIP ASSEMBLY WITH CHIP IN SUBSTRATE CAVITY

(75) Inventors: Chia-Chung Wang, Hsinchu (TW); Charles W. C. Lin, Singapore (SG)

(73) Assignee: Bridge Semiconductor Corporation, Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/653,723

(22) Filed: Sep. 2, 2003

Related U.S. Application Data

(63) Continuation of application No. 10/646,415, filed on Aug. 22, 2003, which is a continuation-in-part of application No. 09/962,754, filed on Sep. 24, 2001, now Pat. No. 6,673,710, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(51) Int. Cl.[7] .............................................. H01L 23/02
(52) U.S. Cl. .................... 257/678; 257/698; 257/787
(58) Field of Search ................................ 257/678, 693, 257/698, 773, 774, 778, 783, 787

(56) References Cited

U.S. PATENT DOCUMENTS

| | | | |
|---|---|---|---|
| 4,442,967 A | 4/1984 | van de Pas et al. | ........ 228/159 |
| 4,661,192 A | 4/1987 | McShane | .................... 156/292 |
| 4,717,066 A | 1/1988 | Goldenberg et al. | ........ 228/179 |

(Continued)

FOREIGN PATENT DOCUMENTS

| | | | |
|---|---|---|---|
| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

(Continued)

*Primary Examiner*—Phuc T. Dang
(74) *Attorney, Agent, or Firm*—David M. Sigmond

(57) ABSTRACT

A semiconductor chip assembly includes a semiconductor chip that includes first and second opposing major surfaces, wherein the first surface of the chip includes a conductive pad, a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity, a conductive trace in an electrically conductive path between the conductive terminal and the pad, and an adhesive disposed between the conductive trace and the chip, the conductive trace and the substrate, and the chip and the substrate.

200 Claims, 180 Drawing Sheets

U.S. PATENT DOCUMENTS

| | | | |
|---|---|---|---|
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Carlomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,149,958 A | 9/1992 | Hallenbeck et al. | 250/216 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,523,608 A | 6/1996 | Kitaoka et al. | 257/433 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/852 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,835 A | 11/1998 | Maekawa | 257/680 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,893,723 A | 4/1999 | Yamanaka | 438/65 |
| 5,925,931 A | 7/1999 | Yamamoto | 257/737 |
| 5,929,516 A | 7/1999 | Heerman et al. | 257/701 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,137,163 A | 10/2000 | Kim et al. | 257/686 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,214,641 B1 * | 4/2001 | Akram | 438/107 |
| 6,235,554 B1 | 5/2001 | Akram et al. | 438/109 |
| 6,335,565 B1 | 1/2002 | Miyamoto et al. | 257/686 |

| | | | |
|---|---|---|---|
| 6,426,562 B2 * | 7/2002 | Farnworth | 257/779 |
| 6,492,718 B2 | 12/2002 | Ohmori | 257/686 |
| 6,564,454 B1 | 5/2003 | Glenn et al. | 29/852 |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via–Fill".

U.S. Appl. No. 09/464,561, filed Dec. 16, 1999, entitled "Bumpless Flip Chip Assembly With Strips–In–Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through–Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

Harper, "Electronic Packaging and Interconnection Handbook," Third Edition, Published by McGraw–Hill, 2000, p. 7.42.

Towle et al., "Bumpless Build–Up Layer Packaging," 7 pages, downloaded from www.Intel.com on Nov. 1, 2002.

Towle et al., "Bumpless Build–Up Layer Packaging," 19 pages, dated Nov. 11, 2001, downloaded from www.Intel.com on Nov. 1, 2002.

Teixeira, "Bumpless Build–Up Layer Packaging Technology," Intel Backgrounder, 4 pages, downloaded from www.Intel.com on Nov. 1, 2002.

Braunisch et al., "Electrical Performance of Bumpless Build–Up Layer Packaging," 15 pages, downloaded from www.Intel.com on Nov. 1, 2002.

Braunisch et al., "Electrical Performance of Bumpless Build–Up Layer Packaging," 2002 Electronic Components and Technology Conference, 6 pages, downloaded from www.Intel.com on Nov. 1, 2002.

* cited by examiner

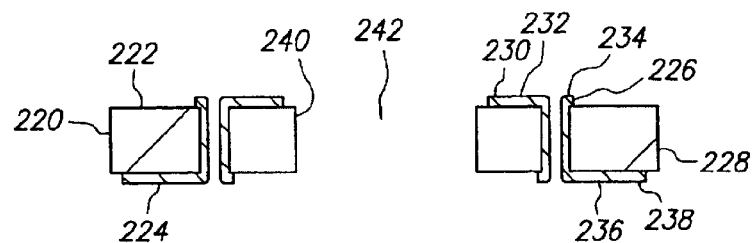
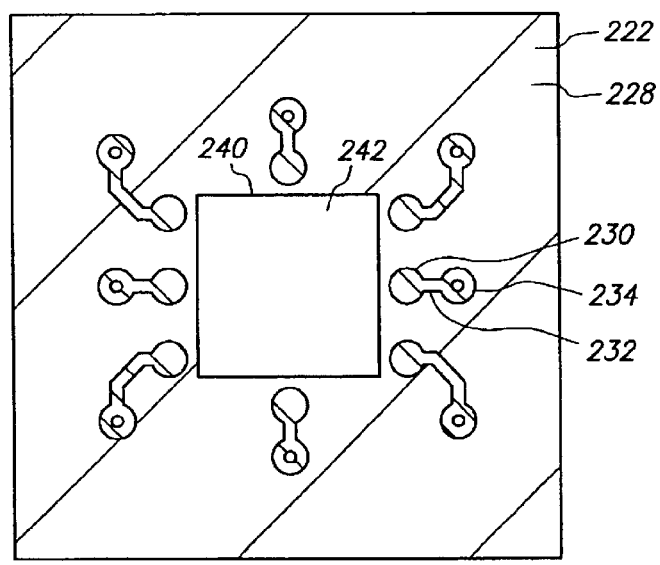
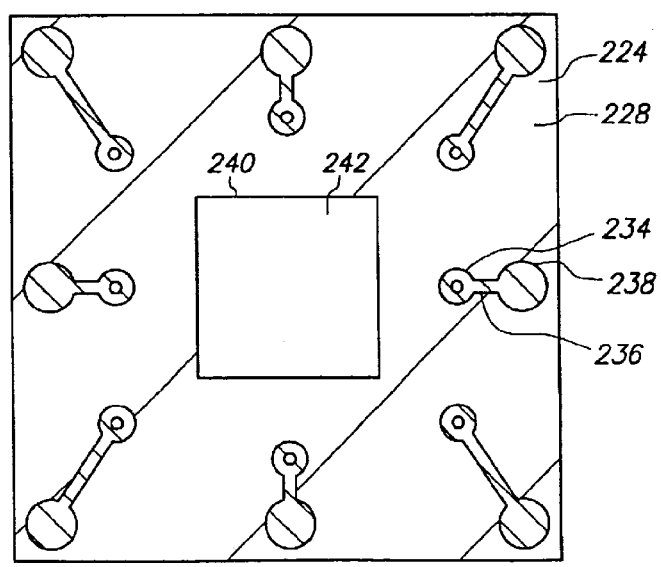
FIG. 16A
FIG. 16B
FIG. 16C

SEMICONDUCTOR CHIP ASSEMBLY WITH CHIP IN SUBSTRATE CAVITY

CROSS-REFERENCE TO RELATED APPLICATIONS

This application is a continuation of U.S. application Ser. No. 10/646,415 filed Aug. 22, 2003, which is a continuation-in-part of U.S. application Ser. No. 09/962,754 filed Sep. 24, 2001 now U.S. Pat. No. 6,673,710, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 now U.S. Pat. No. 6,440,835, each of which is incorporated by reference.

BACKGROUND OF THE INVENTION

1. Field of the Invention

The present invention relates to a semiconductor chip assembly, and more is particularly to a semiconductor chip assembly that includes a semiconductor chip, a conductive trace and a substrate and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

Chip scale packages (CSP) have emerged as a popular packaging technique for memory chips such as static random access memory (SRAM), dynamic random access memory (DRAM) and flash memory as well as other chips with low pin counts. Chip scale packages are hardly larger than the chip itself. However, advanced logic chips such as microprocessors, digital signal processors (DSP) and application-specific integrated circuits (ASIC) often require the package to be considerably larger than the chip to accommodate high pin counts and meet motherboard pitch limitations.

Unfortunately, these larger packages often employ wire bonding, TAB or flip-chip bonding, and as mentioned above, these connection techniques are not entirely satisfactory.

Bumpless Build-Up Layer (BBUL) is a package developed by Intel Corporation for advanced logic chips. The BBUL package includes a chip embedded in a substrate, such as bismaleimide triazine laminate or a copper heat spreader, which then has one or more build-up layers sequentially formed on the chip-substrate assembly. The substrate provides additional area to accommodate larger structures.

The BBUL manufacturing process includes punching a hole in a substrate, applying tape on the substrate to seal the hole at one end, disposing a chip in the hole such that the chip is coplanar with the substrate and the pads contact the tape, depositing an encapsulant in the hole and curing the encapsulant, removing the tape thereby exposing the pads, cleaning the pads, laminating a first dielectric layer on the chip and the substrate where the tape was previously located, laser drilling vias in the first dielectric layer that expose the pads, depositing and patterning metal by a semi-additive process such that the metal extends through the vias and contacts the pads, repeating the dielectric layer laminating, laser drilling and metal depositing and patterning for additional layers, depositing a photoimageable solder mask on the final layer, screen printing presolder in the solder mask, and attaching pins and land-side capacitors by a surface mount process. Thus, the BBUL package is one-sided and there are no plated through-holes or back-side wiring layers.

The BBUL package has the advantages of small electrical loop inductance, reduced thermomechanical stress, high lead count, component integration, and scalability. However, the BBUL package has the disadvantages mentioned above for thin film routing. Namely, complicated manufacturing requirements, high cost, and chip loss if the additional circuitry is defective. Furthermore, the BBUL package does not route the pads to the back-side of the substrate.

In view of the various development stages and limitations in currently available semiconductor chip assemblies, there is a need for a semiconductor chip assembly that is cost-effective, reliable, manufacturable, provides excellent mechanical and electrical performance, and is well-suited for advanced logic chips with high pin counts.

SUMMARY OF THE INVENTION

An object of the present invention is to provide a semiconductor chip assembly with a chip, a conductive trace and a substrate that provides a low cost, high performance, high reliability package.

Another object of the present invention is to provide a convenient, cost-effective method for manufacturing semiconductor chip assemblies as grid arrays or other structures.

In accordance with an aspect of the invention, a method of making a semiconductor chip assembly includes providing a semiconductor chip, a conductive trace and a substrate, wherein the chip includes first and second opposing major surfaces and a conductive pad, the pad extends to the first surface of the chip, the substrate includes first and second opposing major surfaces, a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity, and then electrically connecting the conductive terminal to the pad using the conductive trace.

The method can include mechanically attaching the conductive trace to the chip, the conductive trace to the substrate, and the chip to the substrate using an adhesive before electrically connecting the conductive terminal to the pad.

The method can include disposing the adhesive between the conductive trace and the chip, the conductive trace and the substrate, and the chip and the substrate such that the adhesive contacts and is sandwiched between the conductive trace and the chip, the conductive trace and the substrate, and the chip and the substrate.

The method can include contacting the adhesive to the conductive trace, then contacting the adhesive to the chip, and then contacting the adhesive to the substrate.

The method can include hardening the adhesive, thereby transforming a loose mechanical bond between the conductive trace and the chip, the conductive trace and the substrate, and the chip and the substrate into a solid mechanical bond between the conductive trace and the chip, the conductive trace and the substrate, and the chip and the substrate.

The method can include partially curing the adhesive proximate to the chip after contacting the adhesive to the conductive trace and the chip and before contacting the adhesive to the substrate, then partially curing the adhesive proximate to the substrate after contacting the adhesive to the substrate, and then fully curing the adhesive.

The method can include providing the adhesive as first and second adhesives, contacting the first adhesive to the conductive trace and the chip, and then contacting the second adhesive to the conductive trace, the substrate and the first adhesive.

The method can include contacting the first adhesive to the conductive trace, then contacting the first adhesive to the chip, then contacting the second adhesive to the substrate, and then contacting the second adhesive to the conductive trace and the first adhesive.

The method can include contacting the first adhesive to the conductive trace, then contacting the first adhesive to the chip, then contacting the second adhesive to the conductive trace and the first adhesive, and then contacting the second adhesive to the substrate.

The method can include partially curing the first adhesive after contacting the first adhesive to the conductive trace and the chip, then partially curing the second adhesive after contacting the second adhesive to the conductive trace, the substrate and the first adhesive, and then fully curing the first and second adhesives.

The method can include fully curing the first adhesive after contacting the first adhesive to the conductive trace and the chip, and then fully curing the second adhesive after contacting the second adhesive to the conductive trace, the substrate and the first adhesive.

The method can include contacting the first adhesive to the conductive trace and the chip without depositing the first adhesive into the cavity from the second surface of the substrate, then contacting the second adhesive to the conductive trace, the substrate and the first adhesive without depositing the second adhesive into the cavity from the second surface of the substrate, and then contacting a third adhesive to the dielectric base and the second adhesive by depositing the third adhesive into the cavity from the second surface of the substrate.

The method can include disposing the adhesive between the conductive trace and the chip such that the adhesive does not contact or cover a surface of the conductive trace that faces away from the chip.

The method can include disposing the adhesive between the chip and the substrate such that the adhesive and the chip seal the cavity at the first surface of the substrate.

The method can include disposing the adhesive between the conductive trace and the chip and between the conductive trace and the substrate such that the conductive trace is proximate to and electrically isolated from the conductive terminal and the pad.

The method can include disposing the adhesive between the conductive trace and the chip and between the conductive trace and the substrate such that the conductive trace has distal ends that overlap the conductive terminal and the pad.

The method can forming a connection joint that contacts and electrically connects the conductive trace and the pad, and forming an interconnect that contacts and electrically connects the conductive trace and the conductive terminal.

The method can include forming the connection joint by plating a metal on the conductive trace and the pad, and forming the interconnect by plating a metal on the conductive trace and the conductive terminal.

The method can include forming the connection joint by plating a metal on the conductive trace and the pad, and forming the interconnect by depositing solder or conductive adhesive on the conductive trace and the conductive terminal.

The method can include forming the connection joint by depositing solder or conductive adhesive on the conductive trace and the pad, and forming the interconnect by depositing solder or conductive adhesive on the conductive trace and the conductive terminal.

The method can include forming the connection joint by depositing a solder bump on the pad and then contacting the conductive trace to the solder bump, and forming the interconnect by depositing a solder ball on the conductive terminal and then contacting the conductive trace to the solder ball.

The method can include mechanically attaching and electrically connecting the conductive trace to the pad using the solder bump, and mechanically attaching and electrically connecting the conductive trace to the conductive terminal using the solder ball.

The method can include forming an opening through the adhesive that exposes the pad, and then forming the connection joint in the opening.

The method can include forming a via through the adhesive that exposes the conductive terminal, and then forming the interconnect in the via.

The method can include forming the opening by applying a laser that ablates the adhesive, and forming the via by applying a laser that ablates the adhesive.

The method can include forming the opening and the connection joint before or after mechanically attaching the chip to the substrate.

The method can include forming the opening and the connection joint, and then forming the via and the interconnect.

The method can include forming the opening and via, and then forming the connection joint and the interconnect.

The method can include sequentially forming the opening and the via, and then sequentially forming the connection joint and the interconnect.

The method can include sequentially forming the opening and the via, and then simultaneously forming the connection joint and the interconnect.

The method can include mechanically attaching the chip to the substrate without applying pressure to the second surface of the chip.

The method can include attaching the conductive trace to a metal base, then mechanically attaching the conductive trace to the chip and the substrate, and then etching the metal base, thereby exposing the conductive trace.

The method can include etching the metal base to remove all of the metal base that overlaps the conductive trace, the chip and/or the substrate or remove the metal base.

The method can include etching the metal base to remove all of the metal base that overlaps the chip and the substrate after mechanically attaching the chip to the substrate.

The method can include etching the metal base to remove all of the metal base that overlaps the chip before mechanically attaching the chip to the substrate, and etching the metal base to remove all of the metal base that overlaps the substrate after mechanically attaching the chip to the substrate.

The method can include providing a plating mask on the metal base, electroplating the conductive trace on an exposed portion of the metal base through an opening in the plating mask, and then removing the plating mask.

The method can include attaching the conductive trace and other conductive traces to the metal base, thereby electrically connecting the conductive trace to the other conductive traces, then mechanically attaching the conductive trace and the other conductive traces to the chip and the substrate, and then etching the metal base, thereby electrically isolating the conductive trace from the other conductive traces.

The method can include forming the opening through the metal base and the adhesive, then forming the connection joint on the metal base, the conductive trace and the pad, and then etching the metal base to reduce contact area between the metal base and the connection joint.

The method can include forming the via through the metal base and the adhesive, then forming the interconnect on the metal base, the conductive trace and the conductive terminal, and then etching the metal base to reduce contact area between the metal base and the interconnect.

The method can include forming the connection joint by initially electroplating the connection joint on the metal base and the conductive trace, and then electroplating the connection joint on the pad.

The method can include forming the interconnect by initially electroplating the interconnect on the metal base and the conductive trace, and then electroplating the interconnect on the conductive terminal.

The method can include providing a structure that includes the conductive trace, an insulative base and a metal base, wherein the conductive trace and the metal base are disposed on opposite sides of the insulative base, then mechanically attaching the conductive trace to the chip and the substrate, and then etching the metal base, thereby exposing the insulative base.

The method can include forming the opening through the insulative base and the adhesive, and then forming the connection joint in the opening.

The method can include forming the connection joint by initially electrolessly plating the connection joint on the pad, and then electrolessly plating the connection joint on the conductive trace.

The method can include forming the via through the insulative base and the adhesive, and then forming the interconnect in the via.

The method can include forming the interconnect by initially electrolessly plating the interconnect on the conductive trace, and then electrolessly plating the interconnect on the conductive terminal.

The method can include providing a metal layer that contacts the insulative base, forming an etch mask on the metal layer and etching the metal layer using the etch mask to selectively protect the metal layer such that the conductive trace includes an unetched portion of the metal layer.

In accordance with another aspect of the invention, a semiconductor chip assembly includes a semiconductor chip that includes first and second opposing major surfaces, wherein the first surface of the chip includes a conductive pad, a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity, a conductive trace in an electrically conductive path between the conductive terminal and the pad, wherein the electrically conductive path extends outside the cavity, and an adhesive disposed between the conductive trace and the chip, the conductive trace and the substrate, and the chip and the substrate.

The first surface of the chip can be disposed outside the cavity. The first surface of the chip can also be essentially coplanar with the conductive terminal at the first surface of the substrate.

The second surface of the chip can be disposed in the cavity. The second surface of the chip can also be spaced from the substrate by an open gap. The second surface of the chip can also be exposed.

The cavity can have a generally rectangular shape bounded by inner sidewalls of the dielectric base. The cavity can also be spaced from the conductive terminal. The cavity can extend into but not through the substrate, or alternatively, the cavity can extend through the substrate.

The conductive trace can extend within and outside a periphery of the chip. The conductive trace can also be disposed outside the cavity. The conductive trace can also be essentially flat and parallel to the first surface of the chip.

The conductive terminal can include a first contact terminal at the first surface of the substrate and a second contact terminal at the second surface of the substrate.

The adhesive can contact and be sandwiched between the conductive trace and the pad, the conductive trace and the first contact terminal, and the chip and the dielectric base. The adhesive can also extend into the cavity, with or without extending to the second surface of the chip. The adhesive can also be a single-piece adhesive or a multiple-piece adhesive.

The adhesive can include first and second opposing major surfaces such that the first surface faces In the first direction and the second surface faces in the second direction.

The assembly can include an opening that extends through the adhesive from the first surface of the adhesive to the pad, a connection joint in the opening that contacts and electrically connects the conductive trace and the pad, a via that extends through the adhesive from the first surface of the adhesive to the first contact terminal, and an interconnect in the via that contacts and electrically connects the conductive trace and the first contact terminal.

The opening can be within the periphery of the chip and aligned with the pad, and the via can be outside the periphery of the chip and aligned with the first contact terminal.

The conductive trace can provide horizontal routing within and outside a periphery of the chip, and the conductive terminal can provide horizontal and vertical routing outside the periphery of the chip. In addition, the conductive trace can provide no vertical routing, and the conductive terminal can provide horizontal routing at the first surface of the substrate and vertical routing between the first and second surfaces of the substrate. In addition, the connection joint can provide vertical routing between the conductive trace and the pad within the periphery of the chip, and the interconnect can provide vertical routing between the conductive trace and the first contact terminal outside the periphery of the chip.

The conductive trace can provide fine-pitch fan-out routing for the pad, and the conductive terminal can provide coarse-pitch fan-out routing for the pad. In addition, the conductive trace can have a larger pitch proximate to the conductive terminal than proximate to the pad, and the conductive terminal can have a larger pitch at the second surface of the substrate than proximate to the conductive trace. In addition, the conductive trace and the conductive terminal can have essentially identical pitches where they are proximate to one another.

The adhesive can be silicone, polyimide or epoxy, and the connection joint and the interconnect can be copper, nickel, solder or conductive adhesive.

The assembly can be devoid of wire bonds and TAB leads.

An advantage of the semiconductor chip assembly of the present invention is that it can include a conductive trace with fine-pitch routing and a conductive terminal with coarse-pitch routing. Another advantage is that the conductive terminal can include a back-side contact terminal. Another advantage is that the conductive trace, the chip and the substrate can be simultaneously mechanically attached to one another by a hardened adhesive bond which reduces manufacturing time and cost. Another advantage is that the connection joint and the interconnect can be simultaneously formed during a single plating operation which reduces manufacturing time and cost. Another advantage is that the conductive trace, the connection joint and the interconnect can be copper. Another advantage is that the assembly need not include wire bonds or TAB leads, although the process is flexible enough to accommodate these techniques if desired. Another advantage is that the assembly can be manufactured conveniently and cost effectively. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–14A are cross-sectional views showing a method of making a semiconductor chip assembly in accordance with a first embodiment of the present invention;

FIGS. 1B–14B are top plan views corresponding to FIGS. 1A–14A, respectively;

FIGS. 1C–14C are bottom plan views corresponding to FIGS. 1A–14A, respectively;

FIGS. 15A–32A are cross-sectional views showing a method of making a semiconductor chip assembly in accordance with a second embodiment of the present invention;

FIGS. 15B–32B are top plan views corresponding to FIGS. 15A–32A, respectively;

FIGS. 15C–32C are bottom plan views corresponding to FIGS. 15A–32A, respectively;

FIGS. 33A–46A are cross-sectional views showing a method of making a semiconductor chip assembly in accordance with a third embodiment of the present invention;

FIGS. 33B–46B are top plan views corresponding to FIGS. 33A–46A, respectively;

FIGS. 33C–46C are bottom plan views corresponding to FIGS. 33A–46A, respectively;

FIGS. 47A–61A are cross-sectional views showing a method of making a semiconductor chip assembly in accordance with a fourth embodiment of the present invention;

FIGS. 47B–61B are top plan views corresponding to FIGS. 47A–61A, respectively;

FIGS. 47C–61C are bottom plan views corresponding to FIGS. 47A–61A, respectively;

FIGS. 62A–76A are cross-sectional views showing a method of making a semiconductor chip assembly in accordance with a fifth embodiment of the present invention;

FIGS. 62B–76B are top plan views corresponding to FIGS. 62A–76A, respectively;

FIGS. 62C–76C are bottom plan views corresponding to FIGS. 62A–76A, respectively;

FIGS. 77A–92A are cross-sectional views showing a method of making a semiconductor chip assembly in accordance with a sixth embodiment of the present invention;

FIGS. 77B–92B are top plan views corresponding to FIGS. 77A–92A, respectively;

FIGS. 77C–92C are bottom plan views corresponding to FIGS. 77A–92A, respectively;

FIGS. 93A–107A are cross-sectional views showing a method of making a semiconductor chip assembly in accordance with a seventh embodiment of the present invention;

FIGS. 93B–107B are top plan views corresponding to FIGS. 93A–107A, respectively;

FIGS. 93C–107C are bottom plan views corresponding to FIGS. 93A–107A, respectively;

FIGS. 108A–127A are cross-sectional views showing a method of making a semiconductor chip assembly in accordance with an eighth embodiment of the present invention;

FIGS. 108B–127B are top plan views corresponding to FIGS. 108A–127A, respectively;

FIGS. 108C–127C are bottom plan views corresponding to FIGS. 108A–127A, respectively;

FIGS. 128A–148A are cross-sectional views showing a method of making a semiconductor chip assembly in accordance with an ninth embodiment of the present invention;

FIGS. 128B–148B are top plan views corresponding to FIGS. 128A–148A, respectively;

FIGS. 128C–148C are bottom plan views corresponding to FIGS. 128A–148A, respectively;

FIGS. 149A–163A are cross-sectional views showing a method of making a semiconductor chip assembly in accordance with an tenth embodiment of the present invention;

FIGS. 149B–163B are top plan views corresponding to FIGS. 146A–163A, respectively;

FIGS. 149C–163C are bottom plan views corresponding to FIGS. 146A–163A, respectively;

DETAILED DESCRIPTION OF THE PREFERRED EMBODIMENTS

FIGS. 1A–14A, 1B–14B and 1C–14C are cross-sectional, top and bottom views, respectively, of a method of making a semiconductor chip assembly in accordance with a first embodiment of the present invention.

Figure 1A:
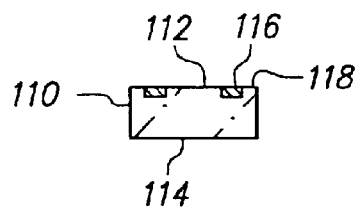
Figure 1B:
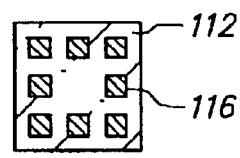
Figure 1C:
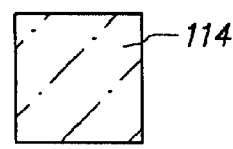

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114, conductive pad 116 and passivation layer 118. Chip 110 has a length and width across surfaces 112 and 114 of 10 millimeters, and a thickness between surfaces 112 and 114 of 350 microns. Surface 112 is the active surface and includes pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, an electrolessly plated nickel connection joint is used. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only eight pads are shown and a single pad 116 is labeled for convenience of illustration. In addition, chip 110 has already been singulated from other chips that it was previously attached to on a wafer.

Figure 2A:
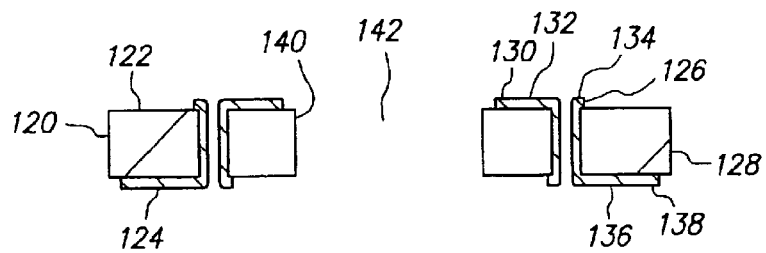
Figure 2B:
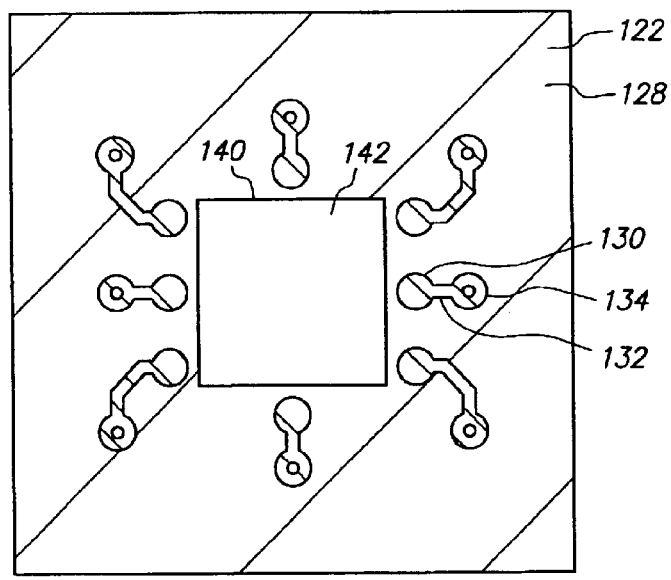
Figure 2C:
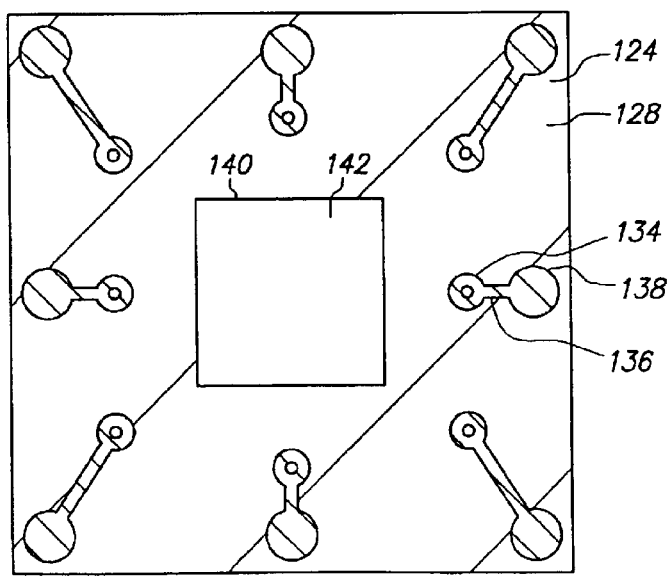

FIGS. 2A, 2B and 2C are cross-sectional, top and bottom views, respectively, of substrate 120. Substrate 120 includes opposing major surfaces 122 and 124, conductive terminal 126 and dielectric base 128. Conductive terminal 126 is composed of copper, and dielectric base 128 is composed of insulative glass-reinforced FR-4 epoxy. Conductive terminal 126 includes first contact terminal 130, first routing line 132, vertical connection 134, second routing line 136 and second contact terminal 138. Dielectric base 128 includes four flat inner sidewalls 140 that bound and define cavity 142.

First contact terminal 130 and first routing line 132 are contiguous with one another and disposed at surface 122. Vertical connection 134 is contiguous with routing lines 132 and 136 and extends through dielectric base 128 to surfaces 122 and 124. Second routing line 136 and second contact terminal 138 are contiguous with one another and disposed at surface 124. Thus, surface 122 includes dielectric base 128, first contact terminal 130 and first routing line 132, and surface 124 includes dielectric base 128, second routing line 136 and second contact terminal 138. Furthermore, conductive terminal 126 provides horizontal routing at surfaces 122 and 124 and vertical routing between surfaces 122 and 124.

Inner sidewalls 140 extend through dielectric base 128 to surfaces 122 and 124. Thus, cavity 142 has a rectangular shape with opposing open ends at surfaces 122 and 124 and is centrally located in and extends through substrate 120.

Conductive terminal 126 is spaced from cavity 142, and dielectric base 128 is flat at surfaces 122 and 124. In addition, first contact terminal 130 and first routing line 132 are flat at surface 122 and protrude from dielectric base 128 at surface 122, and second routing line 136 and second contact terminal 138 are flat at surface 124 and protrude from dielectric base 128 at surface 124.

Substrate 120 has a length and width across surfaces 122 and 124 of 40 millimeters. First contact terminal 130 is an enlarged circular region with a diameter of 200 microns, and second contact terminal 138 is an enlarged circular region with a diameter of 500 microns. First routing line 132 and second routing line 136 are elongated routing regions with a width of 100 microns. Vertical connection 134 is an enlarged annular region with a diameter of 200 microns. First contact terminal 130, first routing line 132, second routing line 136 and second contact terminal 138 have a thickness of 18 microns. Dielectric base 128 has a thickness of 400 microns. Cavity 142 has a length and width of 11 millimeters and a depth of 400 microns.

Substrate 120 is manufactured by providing dielectric base 128, cutting dielectric base 128 with an excise blade to form cavity 142, laminating first and second copper layers on the first and second opposing major surfaces of dielectric base 128, mechanically drilling through-holes through the metal layers and dielectric base 128, performing a plating operation to form plated through-holes (PTH) that provide the vertical connections, depositing first and second etch masks on the first and second metal layers, respectively, providing a wet chemical etch that selectively etches exposed portions of the first copper layer through openings in the first etch mask to form the first contact terminals and the first routing lines from unetched portions of the first metal layer and that selectively etches exposed portions of the second copper layer through openings in the second etch mask to form the second contact terminals and the second routing lines from unetched portions of the second metal layer, and then stripping the etch masks.

Substrate 120 includes many other conductive terminals, and only eight conductive terminals are shown and a single conductive terminal 126 is labeled for convenience of illustration. Each conductive terminal includes a first contact terminal, first routing line, vertical connection, second routing line and second contact terminal. The conductive terminals are spaced and separated from and one another and electrically isolated from one another by dielectric base 128. Furthermore, the conductive terminals are identical to one another except that the routing lines have varying shapes and lengths.

Figure 3A:
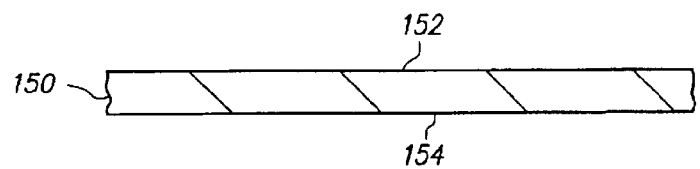
Figure 3B:
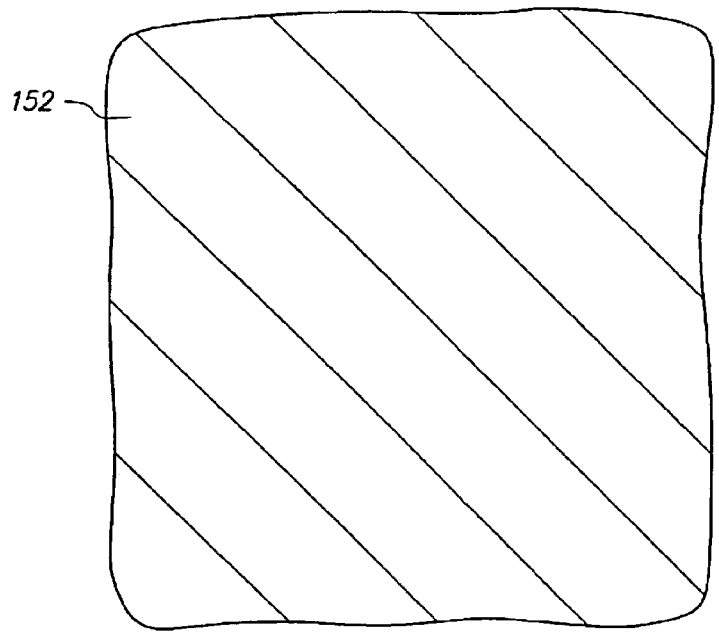
Figure 3C:
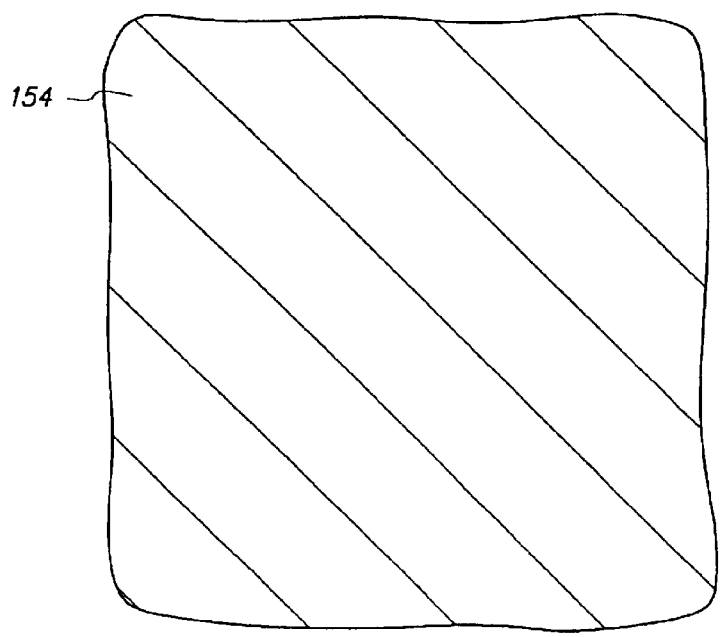

FIGS. 3A, 3B and 3C are cross-sectional, top and bottom views, respectively, of metal base 150 which includes opposing major surfaces 152 and 154. Metal base 150 is a copper foil with a length and width across surfaces 152 and 154 that exceeds 40 millimeters, and a thickness between surfaces 152 and 154 of 200 microns.

Metal base 150 is partially shown with wavy edges that depict a partial view that does not encompass the entire length and width across surfaces 152 and 154 or the actual edges for convenience of illustration.

Figure 4A:
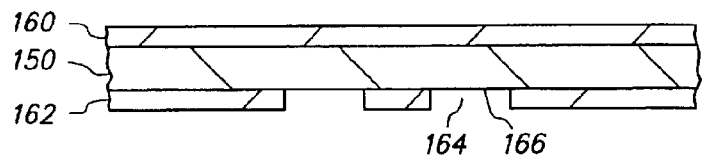
Figure 4B:
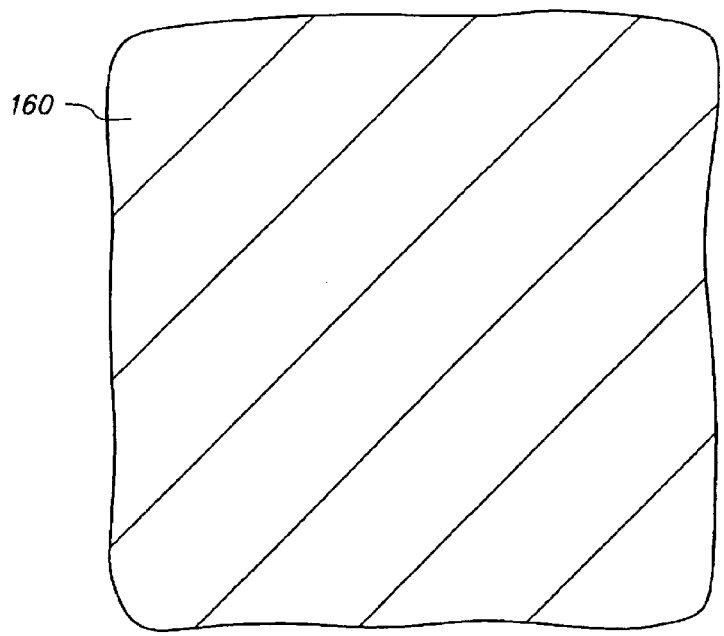
Figure 4C:
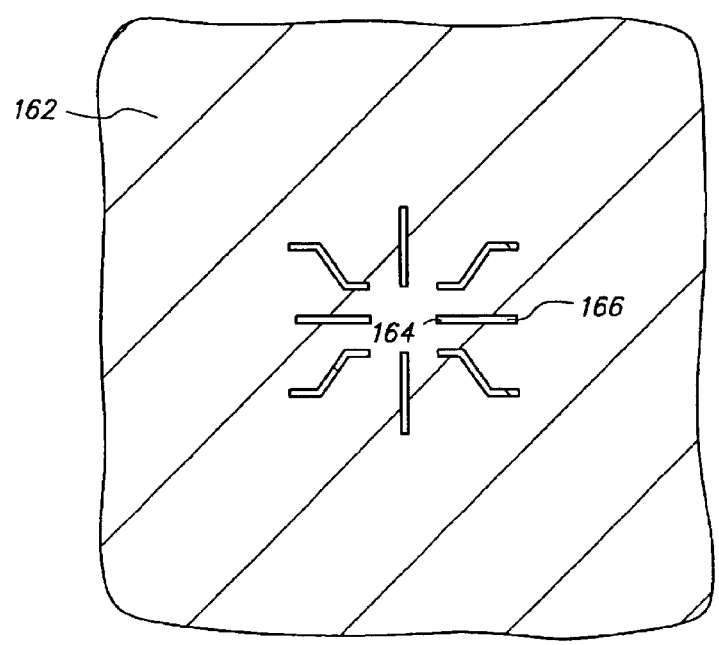

FIGS. 4A, 4B and 4C are cross-sectional, top and bottom views, respectively, of photoresist layers 160 and 162 formed on metal base 150. Photoresist layers 160 and 162 are deposited using a dry film lamination process in which hot rolls simultaneously press photoresist layers 160 and 162 onto surfaces 152 and 154, respectively. Thereafter, photoresist layer 162 is patterned by selectively applying light through a reticle (not shown), applying a developer solution to remove the photoresist portions rendered soluble by the light, and then hard baking, as is conventional. As a result, photoresist layer 160 remains unpatterned, and photoresist layer 162 contains opening 164 that selectively exposes portion 166 of surface 154. Photoresist layers 160 and 162 have a thickness of 25 microns.

Photoresist layer 162 contains many other openings, and only eight openings are shown and a single opening 164 is labeled for convenience of illustration.

Figure 5A:
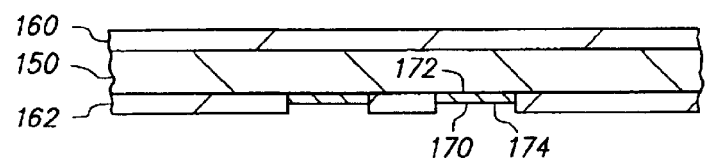
Figure 5B:
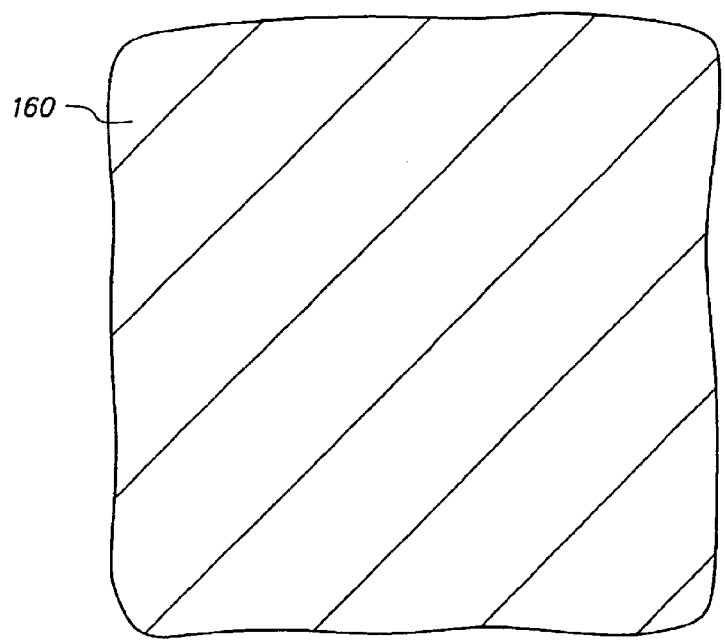
Figure 5C:
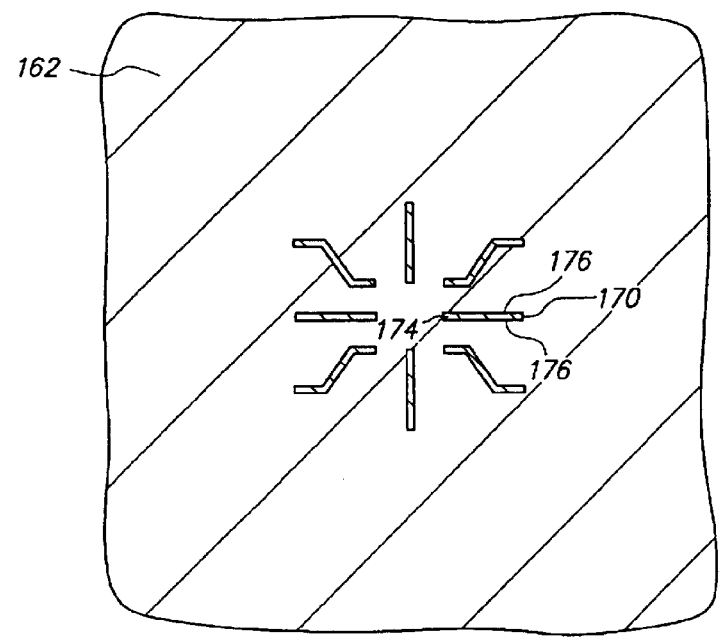

FIGS. 5A, 5B and 5C are cross-sectional, top and bottom views, respectively, of conductive trace 170 formed on metal base 150. Conductive trace 170 includes opposing major surfaces 172 and 174 and peripheral sidewalls 176 therebetween. Surface 172 faces towards and contacts and is covered by metal base 150, surface 174 faces away from metal base 150 and is exposed, and peripheral sidewalls 176 extend orthogonally from metal base 150 and are covered by photoresist layer 162. Conductive trace 170 includes a nickel layer deposited on metal base 150 and a copper layer deposited on the nickel layer and spaced from metal base 150. The nickel layer is 2 microns thick and the copper layer is 10 microns thick. Conductive trace 170 is a flat planar elongated lead with a thickness of 12 microns and a width of 50 microns. For convenience of illustration, the nickel and copper layers are shown as a single layer.

Conductive trace 170 is formed by an electroplating operation using photoresist layers 160 and 162 as plating masks. Thus, conductive trace 170 is formed additively on selectively exposed portion 166 of surface 154 of metal base 150. Initially, metal base 150 is connected to a plating bus (not shown), current is applied to the plating bus from an external power source and the structure is submerged in an electrolytic nickel plating solution such as Technic Techni Nickel "S" at room temperature to electroplate the nickel layer on exposed portion 166 of metal base 150. Thereafter, the structure is removed from the electrolytic nickel plating solution and submerged in an electrolytic copper plating solution such as Sel-Rex CUBATH M™ at room temperature while current is applied to the plating bus to electroplate the copper layer on the nickel layer. Thereafter, the structure is removed from the electrolytic copper plating solution and rinsed in distilled water to remove contaminants.

Metal base 150 includes many other conductive traces attached to surface 154, and only eight conductive traces are shown and a single conductive trace 170 is labeled for convenience of illustration. The conductive traces are spaced and separated from one another and electrically connected to one another by metal base 150. Furthermore, the conductive traces are identical to one another except that they have varying shapes and lengths.

Figure 6A:
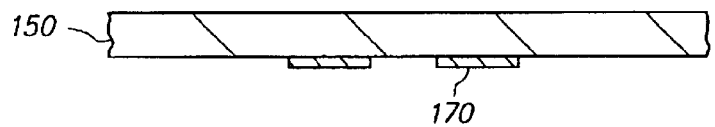
Figure 6B:
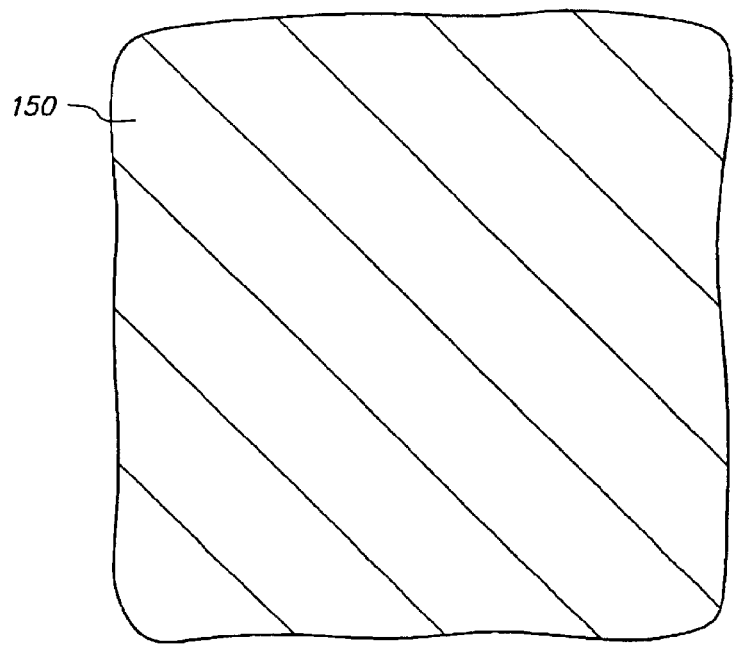
Figure 6C:
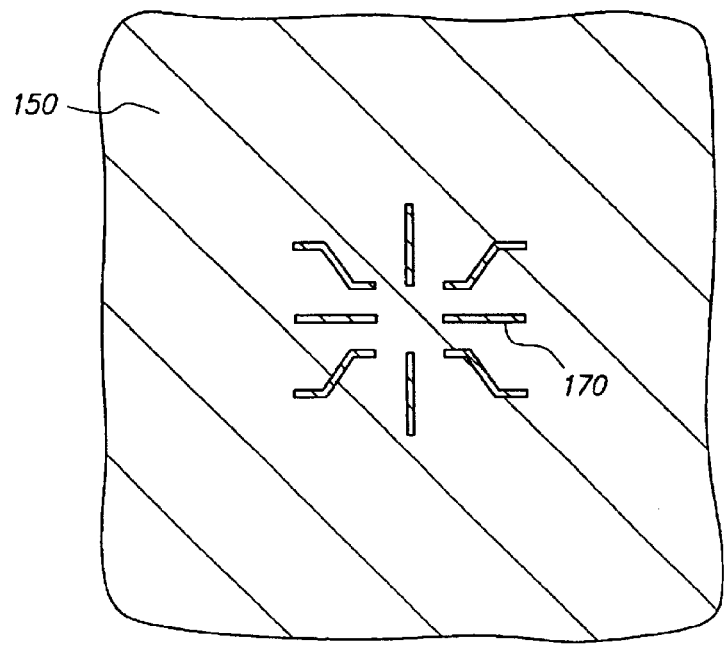

FIGS. 6A, 6B and 6C are cross-sectional, top and bottom views, respectively, of metal base 150 and conductive trace 170 after photoresist layers 160 and 162 are stripped. Photoresist layers 160 and 162 are removed using a solvent, such as a mild alkaline solution with a pH of 9, that is highly selective of photoresist with respect to copper and nickel. Therefore, no appreciable amount of metal base 150 or conductive trace 170 is removed.

At this stage, conductive trace 170 remains attached to metal base 150, surface 172 remains covered by metal base 150, and surface 174 and peripheral sidewalls 176 are exposed.

Figure 7A:
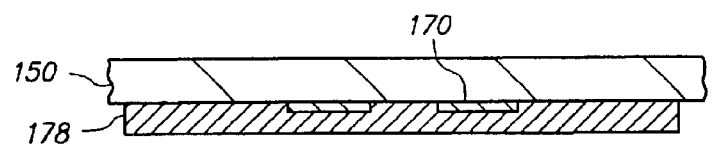
Figure 7B:
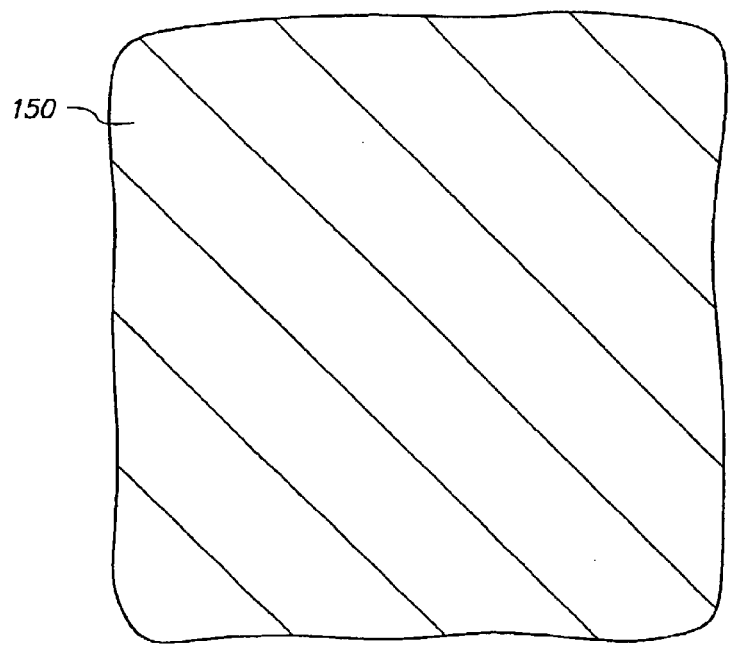
Figure 7C:
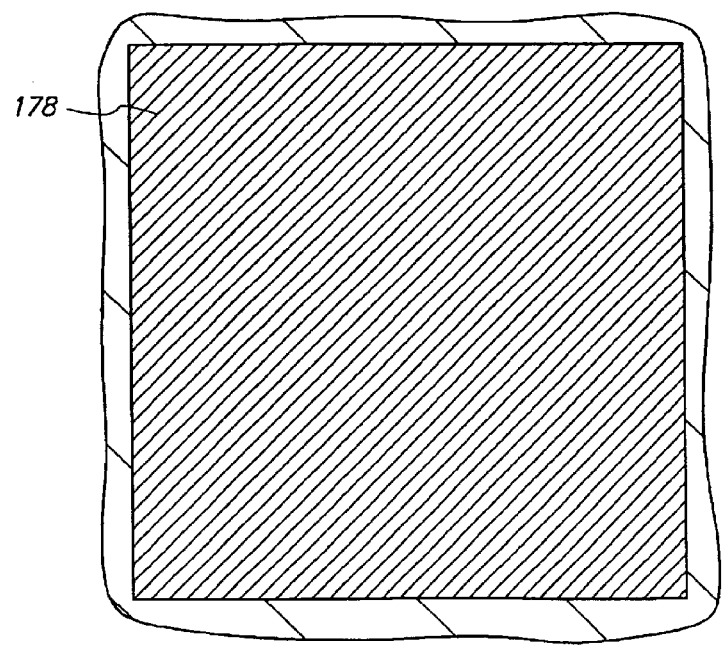

FIGS. 7A, 7B and 7C are cross-sectional, top and bottom views, respectively, of adhesive 178 formed on metal base 150 and conductive trace 170. Adhesive 178 may include an organic surface protectant such as HK 2000 which is promptly applied to the structure after conductive trace 170 is formed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over a selected portion of surface 154 of metal base 150 and over conductive trace 170 using stencil printing. During stencil printing, a stencil (not shown) is placed over metal base 150, a stencil opening is aligned with metal base 150, and then a squeegee (not shown) pushes the liquid resin along the surface of the stencil opposite metal base 150, through the stencil opening and onto metal base 150 and conductive trace 170. The liquid resin is compliant enough at room temperature to conform to virtually any shape. Therefore, the liquid resin flows over and covers conductive trace 170. Adhesive 178 has length and width of 40 millimeters, and a thickness of 50 microns as measured from conductive trace 170.

For convenience of illustration, adhesive 178 is shown below metal base 150 to retain a single orientation throughout the figures for ease of comparison between the figures, although in this step metal base 150 would be inverted so that gravitational force would assist the liquid resin flow.

Figure 8A:
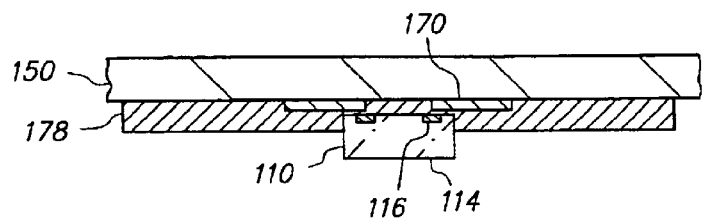
Figure 8B:
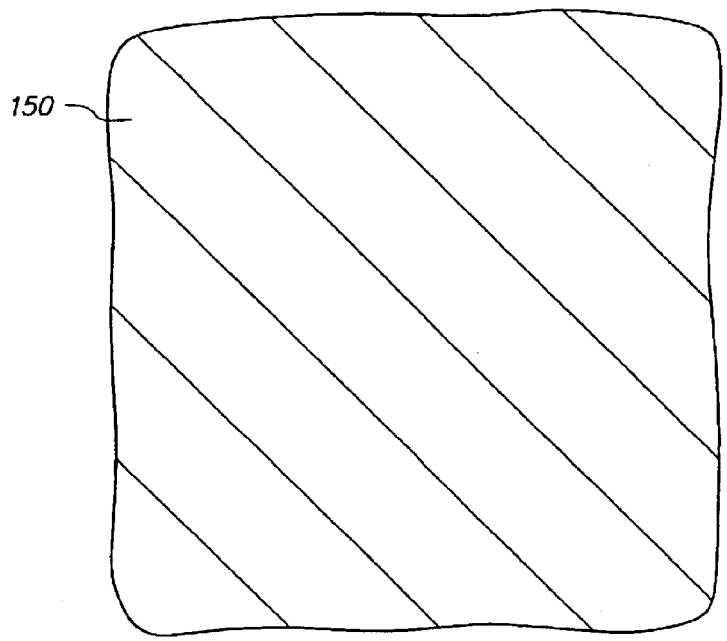
Figure 8C:
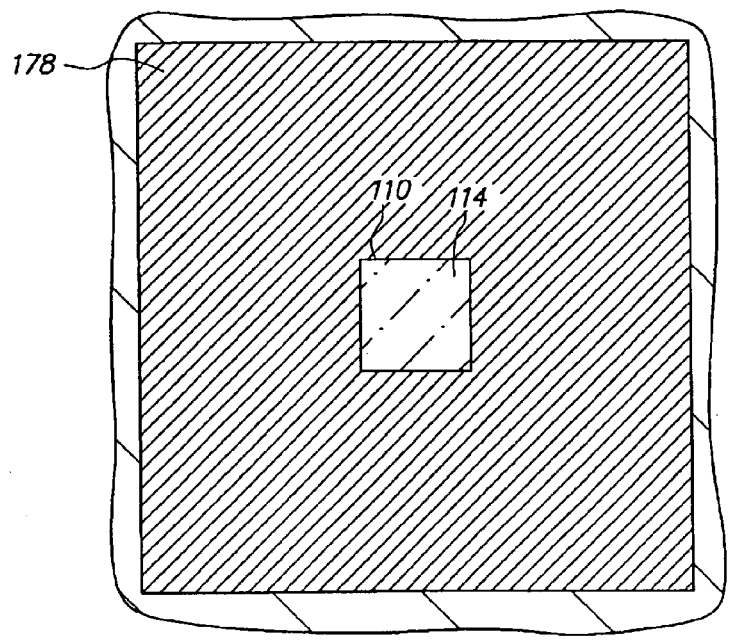

FIGS. 8A, 8B and 8C are cross-sectional, top and bottom views, respectively, of chip 110 mechanically attached to metal base 150 and conductive trace 170 by adhesive 178.

Adhesive 178 is disposed between and contacts chip 110 and metal base 150, and likewise, adhesive 178 is disposed between and contacts chip 110 and conductive trace 170. Surface 112 of chip 110 faces towards metal base 150 and conducive trace 170 and is covered by adhesive 178, and surface 114 of chip 110 faces away from metal base 150 and conductive trace 170 and is exposed. Chip 110 and metal base 150 do not contact one another, and chip 110 and conductive trace 170 do not contact one another.

Adhesive 178 is sandwiched between chip 110 and metal base 150 and between chip 110 and conductive trace 170 using relatively low pressure from a pick-up head that places chip 110 on adhesive 178, holds chip 110 against adhesive 178 for 5 seconds and then releases chip 110. The pick-up head is heated to a relatively low temperature such as 150° C., and adhesive 178 receives heat from the pick-up head transferred through chip 110. As a result, adhesive 178 proximate to chip 110 is partially polymerized (B stage) and forms a gel but is not fully cured, and adhesive 178 not proximate to chip 110 remains a liquid resin (A stage). Adhesive 178 that is partially polymerized provides a loose mechanical bond between chip 110 and conductive trace 170.

Chip 110 and metal base 150 are positioned relative to one another so that chip 110 is axially aligned with and centered relative to adhesive 178, conductive trace 170 is disposed above and overlaps and is electrically isolated from pad 116, and conductive trace 170 extends within and outside the periphery of chip 110. Chip 110 is and metal base 150 can be aligned using an automated pattern recognition system.

Similarly, the other conductive traces are mechanically attached to chip 110 by adhesive 178, are disposed above and overlap and are electrically isolated from the other pads of chip 110, and extend within and outside the periphery of chip 110. Accordingly, each conductive trace-overlaps and is proximate to a corresponding pad.

For convenience of Illustration, chip 110 is shown below adhesive 178 which is shown below metal base 150 to retain a single orientation throughout the figures for ease of comparison between the figures, although in this step metal base 150 would be inverted to facilitate the placement of chip 110 relative to metal base 150.

Figure 8D:
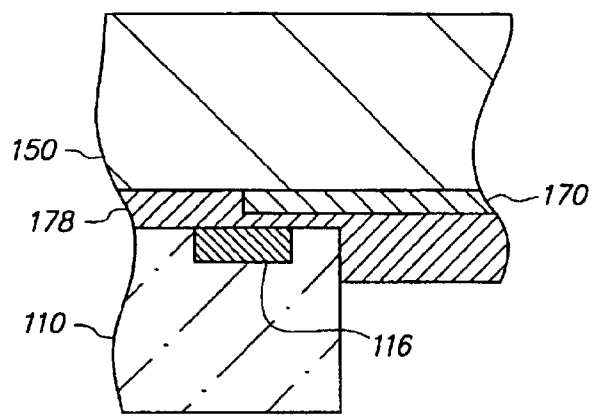
FIGS. 8D, 8E and 8F are enlarged cross-sectional, top and cross-sectional views, respectively, of the conductive trace and the pad in FIG. 8A.
Figure 8E:
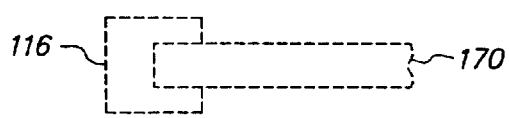
Figure 8F:
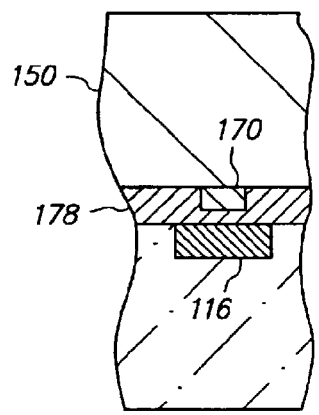

FIGS. 8D, 8E and 8F are enlarged cross-sectional, top and cross-sectional views, respectively, of pad 116 and conductive trace 170. FIG. 8F is oriented orthogonally with respect to FIG. 8D. As is seen, conductive trace 170 is proximate to pad 116 and a distal end of conductive trace 170 overlaps pad 116. Conductive trace 170 overlaps the center of pad 116 and one peripheral edge of pad 116 (but not the other three peripheral edges of pad 116), and peripheral sidewalls 176 of conductive trace 170 overlap pad 116. Since pad 116 and conductive trace 170 are not visible from surface 152 of metal base 150, they are shown in phantom in FIG. 8E.

Figure 9A:
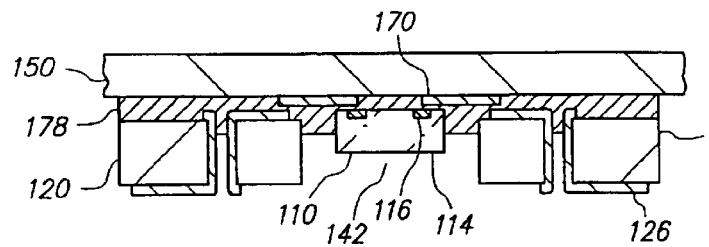
Figure 9B:
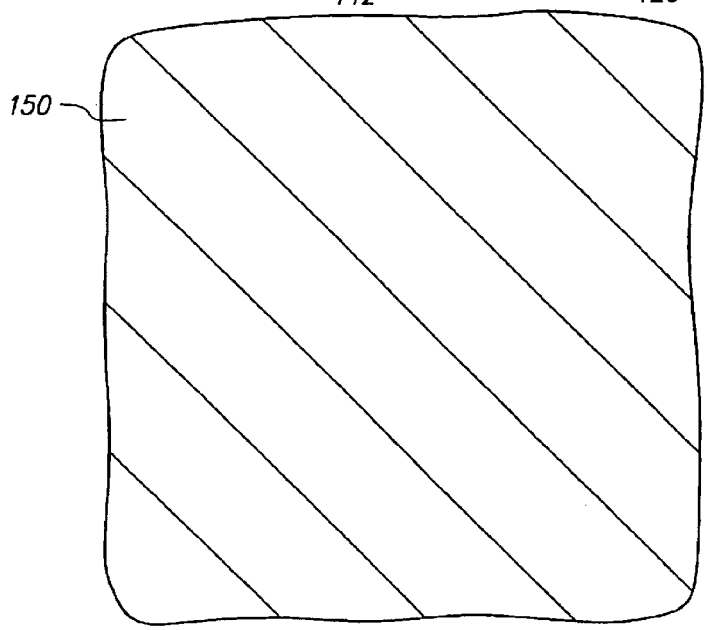
Figure 9C:
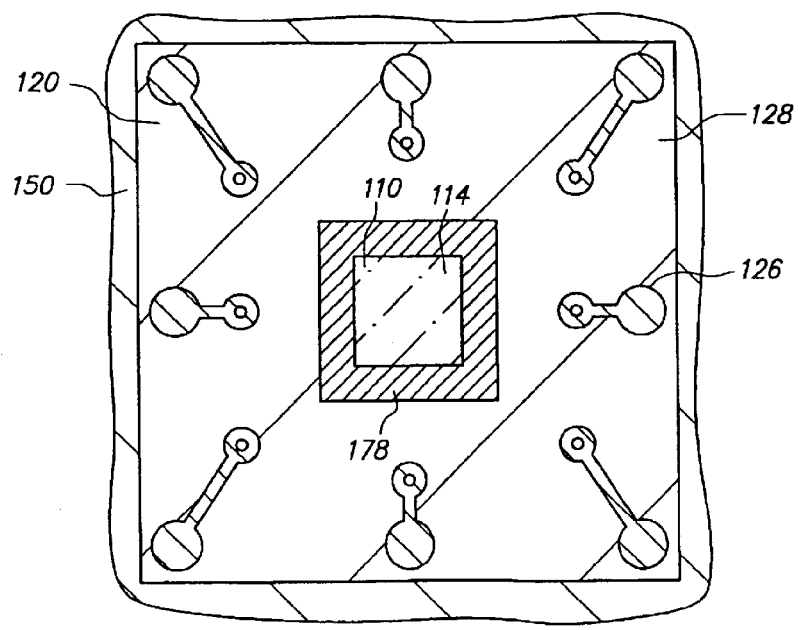

FIGS. 9A, 9B and 9C are cross-sectional, top and bottom views, respectively, of chip 110, metal base 150 and conductive trace 170 mechanically attached to substrate 120 by adhesive 178.

Adhesive 178 is disposed between and contacts chip 110 and substrate 120, likewise, adhesive 178 is disposed between and contacts substrate 120 and metal base 150, and likewise, adhesive 178 is disposed between and contacts substrate 120 and conductive trace 170. Surfaces 112 and 122 face towards metal base 150 and conductive trace 170 and are covered by adhesive 178, and surfaces 114 and 124 face away from metal base 150 and conductive trace 170 and are exposed. Chip 110 and substrate 120 do not contact one another, substrate 120 and metal base 150 do not contact one another, and substrate 120 and conductive trace 170 do not contact one another.

Adhesive 178 is sandwiched between substrate 120 and metal base 150 and between substrate 120 and conductive trace 170 using relatively low pressure from a pick-up head that places substrate 120 on adhesive 178, holds substrate 120 against adhesive 178 for 10 seconds and then releases substrate 120. The pick-up head is heated to a relatively low temperature such as 150° C., and adhesive 178 receives heat from the pick-up head transferred through substrate 120. As a result adhesive 178 proximate to substrate 120, which is a liquid resin (A stage), is partially polymerized (B stage) and forms a gel but is not fully cured. Adhesive 178 that is partially polymerized provides a loose mechanical bond between chip 110 and substrate 120 and between substrate 120 and conductive trace 170.

Substrate 120 and metal base 150 are positioned relative to one another so that substrate 120 is axially aligned with adhesive 178, substrate 120 is disposed within the periphery of metal base 150, and conductive trace 170 is disposed above and overlaps and is electrically isolated from first contact terminal 130. Substrate 120 and metal base 150 can be aligned using an automated pattern recognition system.

Thereafter, the structure is placed in an oven and adhesive 178 is fully cured (C stage) at relatively low temperature in the range of 200 to 250° C. to form a solid adhesive insulative thermosetting polyimide layer that mechanically attaches chip 110 to substrate 120, chip 110 to conductive trace 170 and substrate 120 to conductive trace 170. Fully curing adhesive 178 transforms adhesive 178 from a loose mechanical bond between chip 110 and substrate 120, chip 110 and conductive trace 170, and substrate 120 and conductive trace 170 into a solid mechanical bond between chip 110 and substrate 120, chip 110 and conductive trace 170, and substrate 120 and conductive trace 170.

Chip 110 extends into cavity 142. Chip 110 is centrally located in cavity 142, and the four peripheral edges of chip 110 (between surfaces 112 and 114) are spaced from the four inner sidewalls 140 of dielectric base 128 by 500 microns ((11,000−10,000)/2). Surface 112 is disposed outside cavity 142 and is essentially coplanar with first contact terminal 130 and first routing line 132. Surface 114 is disposed within cavity 142 between surfaces 122 and 124 and is spaced from substrate 120 by an open gap and is exposed. Thus, chip 110 extends 338 microns (350−12) into cavity 142 and is spaced 62 microns (400−338) from the open end of cavity 142.

Conductive trace 170 is disposed outside cavity 142. Furthermore, conductive trace 170 is essentially parallel to surfaces 112, 114, 122 and 124.

Adhesive 178 extends into cavity 142 but does not extend to surfaces 114 or 124. Adhesive 178 contacts and is sandwiched between the peripheral edges of chip 110 and inner sidewalls 140. In addition, adhesive 178 extends slightly outside the peripheral edges of substrate 120. For convenience of illustration, the portion of adhesive 178 outside the peripheral edges of substrate 120 is not shown.

Chip 110 and adhesive 178 in combination seal cavity 142 at surface 122. That is, chip 110 and adhesive 178 plug cavity 142 at surface 122 whereas cavity 142 remains open at surface 124.

Adhesive 178 is 5 microns thick between chip 110 and conductive trace 170 and 5 microns thick between substrate 120 and conductive trace 170. More particularly, adhesive 178 is 5 microns thick between pad 116 and conductive trace 170 and 5 microns thick between first contact terminal 130 and conductive trace 170.

Similarly, the other conductive traces are mechanically attached to substrate 120 by adhesive 178, are disposed outside cavity 142, and are disposed above and overlap and are electrically isolated from the other first contact terminals of substrate 120. Accordingly, each conductive trace overlaps and is proximate to a corresponding first contact terminal.

At this stage, conductive trace 170 and adhesive 178 are covered from above by metal base 150, chip 110 and substrate 120 are covered from above by adhesive 178, pad 116 is spaced from and electrically isolated from conductive trace 170, and conductive terminal 126 is spaced from and electrically isolated from conductive trace 170.

For convenience of illustration, chip 110 and substrate 120 are shown below adhesive 178 which is shown below metal base 150 to retain a single orientation throughout the figures for ease of comparison between the figures, although in this step metal base 150 would be inverted to facilitate the placement of substrate 120 relative to chip 110 and metal base 150.

Figure 9D:
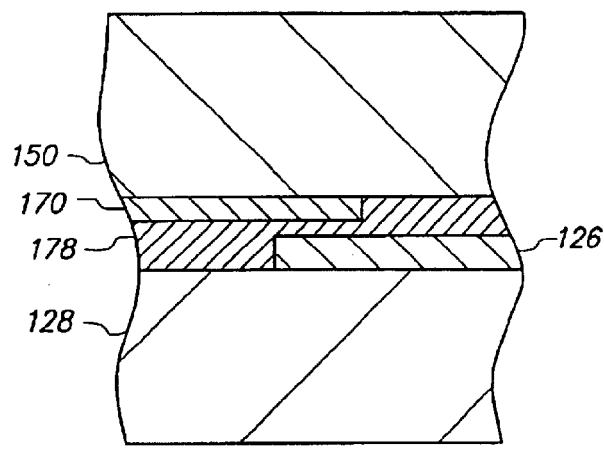
FIGS. 9D, 9E and 9F are enlarged cross-sectional, top and cross-sectional views, respectively, of the conductive trace and the first contact terminal in FIG. 9A.
Figure 9E:
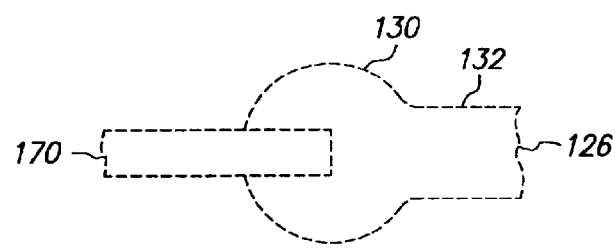
Figure 9F:
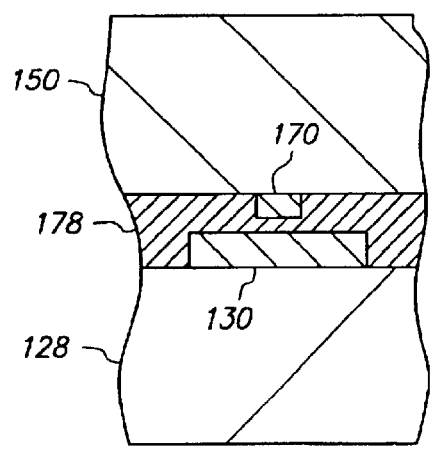

FIGS. 9D, 9E and 9F are enlarged cross-sectional, top and cross-sectional views, respectively, of conductive terminal 126 and conductive trace 170. FIG. 9F is oriented orthogonally with respect to FIG. 9D. As is seen, conductive trace 170 is proximate to first contact terminal 130 and a distal end of conductive trace 170 overlaps first contact terminal 130. Conductive trace 170 overlaps the center and the peripheral edge of first contact terminal 130, and peripheral sidewalls 176 of conductive trace 170 overlap first contact terminal 130. Since first contact terminal 130 and conductive trace 170 are not visible from surface 152 of metal base 150, they are shown in phantom in FIG. 9E.

Figure 10A:
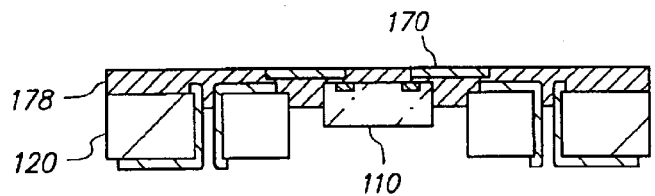
Figure 10B:
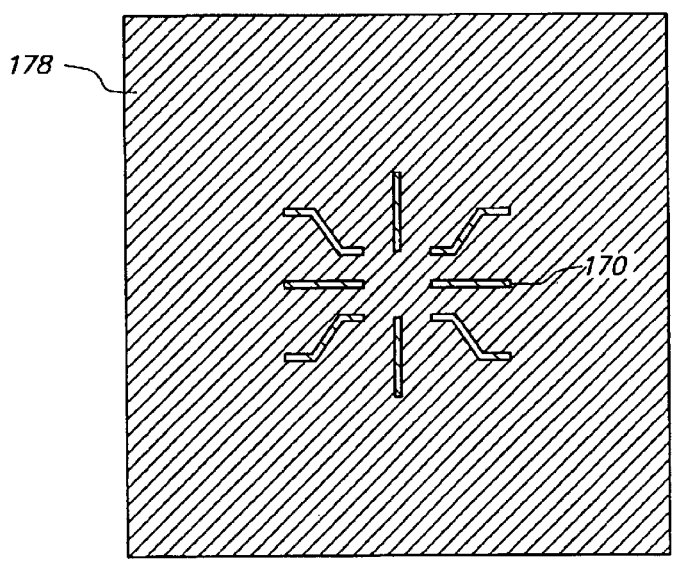
Figure 10C:
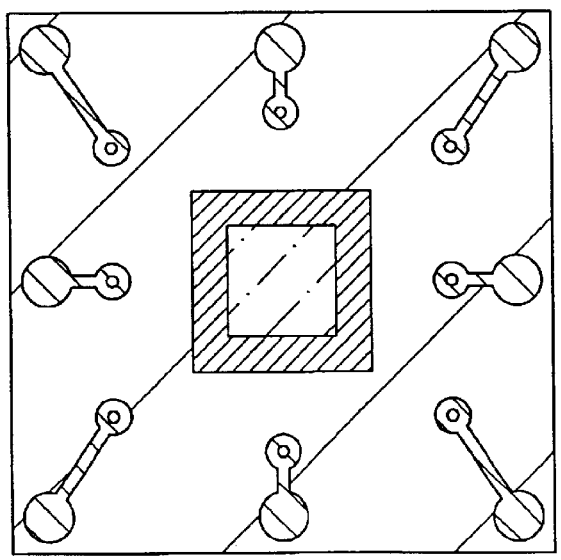

FIGS. 10A, 10B and 10C are cross-sectional, top and bottom views, respectively, of chip 110, substrate 120, conductive trace 170 and adhesive 178 after metal base 150 is removed. A 'front-side' wet chemical etch is applied to surface 152 of metal base 150. For instance, the wet chemical etch can be sprayed on surface 152, or a protective mask can be deposited on surface 124 and then the structure can be dipped in the wet chemical etch. The wet chemical etch is highly selective of copper with respect to nickel and polyimide. In addition, conductive trace 170 includes a nickel layer and a copper layer, and the copper layer is protected from the wet chemical etch by the nickel layer and adhesive 178. Therefore, no appreciable amount of conductive trace 170 or adhesive 178 is removed. A suitable wet chemical etch can be provided by a solution containing alkaline ammonia. The optimal etch time for exposing metal base 150 to the wet chemical etch in order to completely remove metal base 150 without excessively exposing the nickel layer of conductive trace 170 to the wet chemical etch can be established through trial end error.

The wet chemical etch removes metal base 150, thereby exposing conductive trace 170 and adhesive 178. As a result, the surfaces of conductive trace 170 and adhesive 178 that face away from chip 110 and substrate 120 are exposed.

Furthermore, removing metal base 150 electrically isolates the conductive traces from one another.

At this stage, adhesive 178 continues to contact and cover chip 110 and substrate 120 as well as surface 174 and peripheral sidewalls 176 of conductive trace 170 and provides critical mechanical support for conductive trace 170. In addition, adhesive 178 is coplanar with and adjacent to but does not contact or cover exposed surface 172 of conductive trace 170.

Figure 11A:
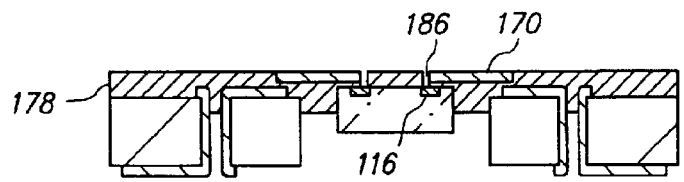
Figure 11B:
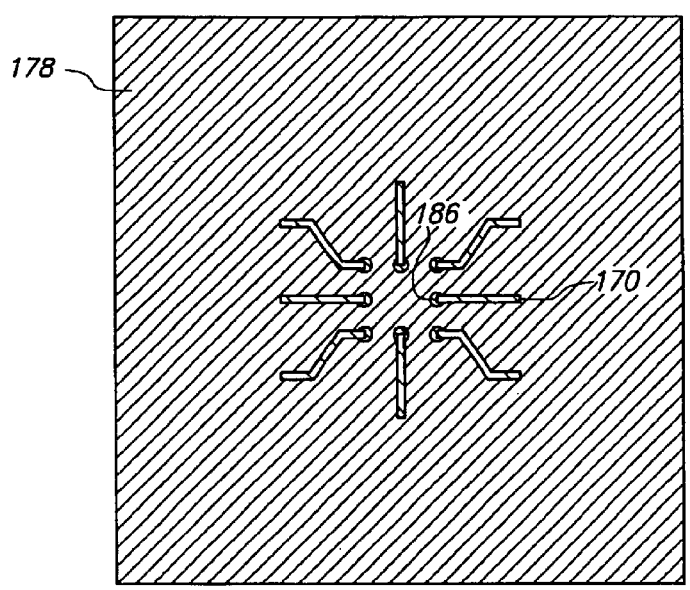
Figure 11C:
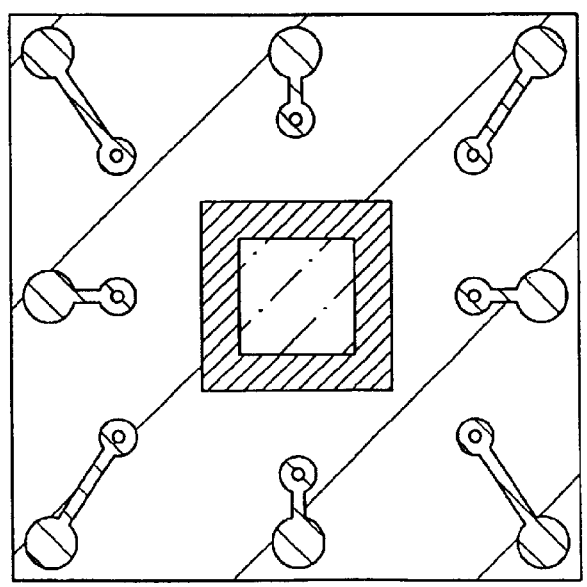

FIGS. 11A, 11B and 11C are cross-sectional, top and bottom views, respectively, of opening 186 formed in adhesive 178 that exposes pad 116.

Opening 186 is formed by applying a suitable etch that is highly selective of adhesive 178 with respect to pad 116 and conductive trace 170. In this instance, a selective TEA $CO_2$ laser etch is applied. The laser is directed at pad 116 and ablates adhesive 178. The laser has a spot size of 70 microns, pad 116 has a length and width of 100 microns, and conductive trace 170 has a width of 50 microns. The laser is aimed at a central portion of pad 116 within the periphery of pad 116 and strikes pad 116 and portions of conductive trace 170 and adhesive 178 that overlap pad 116 but does not strike passivation layer 118.

The laser drills through and removes portions of adhesive 178 within the periphery of pad 116 and outside conductive trace 170. However, portions of adhesive 178 that overlap the peripheral edges of pad 116 are outside the scope of the laser and remain intact. Likewise, conductive trace 170 shields the underlying adhesive 178 from the laser etch, and portions of adhesive 178 sandwiched between pad 116 and conductive trace 170 remain intact. The laser etch is anisotropic, and therefore little or none of adhesive 178 sandwiched between pad 116 and conductive trace 170 is undercut or removed.

Opening 186 has a diameter of 70 microns, is disposed within the periphery of chip 110 and is axially aligned with and centered relative to and partially exposes pad 116. Opening 186 is formed in and extends vertically through adhesive 178 without damaging pad 116, passivation layer 118 or conductive trace 170.

Opening 186 may extend slightly beneath conductive trace 170 and have a diameter that is slightly larger than 70 microns due to the beam angle of the laser, the thermal effects of the laser, and/or the isotropic nature of an oxygen plasma or wet chemical cleaning step. For convenience of explanation, this slight enlargement is ignored.

Many other openings are formed through adhesive 178, and only eight openings are shown and a single opening 186 is labeled for convenience of illustration. The openings are each aligned with and expose a corresponding pad.

Figure 11D:
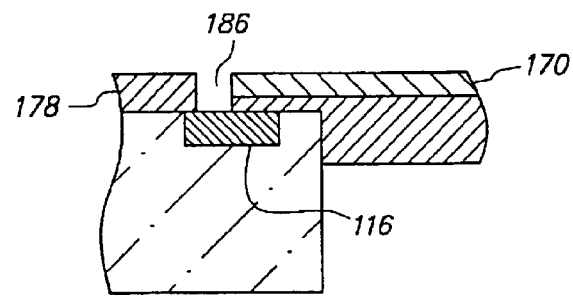
FIGS. 11D, 11E and 11F are enlarged cross-sectional, top and cross-sectional views, respectively, of the opening in FIG. 11A.
Figure 11E:
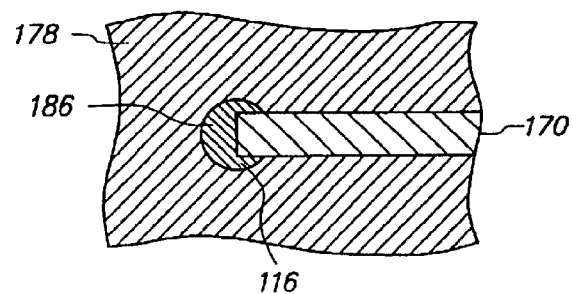
Figure 11F:
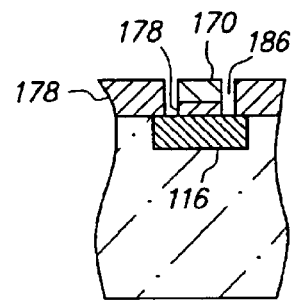

FIGS. 11D, 11E and 11F are enlarged cross-sectional, top and cross-sectional views, respectively, of opening 186. FIG. 11F is oriented orthogonally with respect to FIG. 11D. As is seen, opening 186 extends through adhesive 178 to pad 116 and exposes peripheral sidewalls 176 of conductive trace 170, and adhesive 178 remains in contact with and sandwiched between pad 116 and conductive trace 170.

Figure 12A:
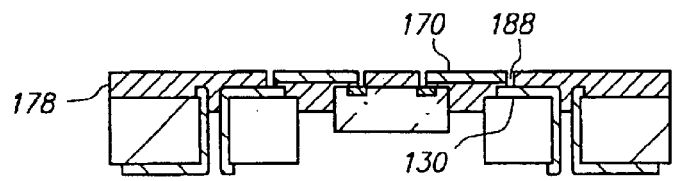
Figure 12B:
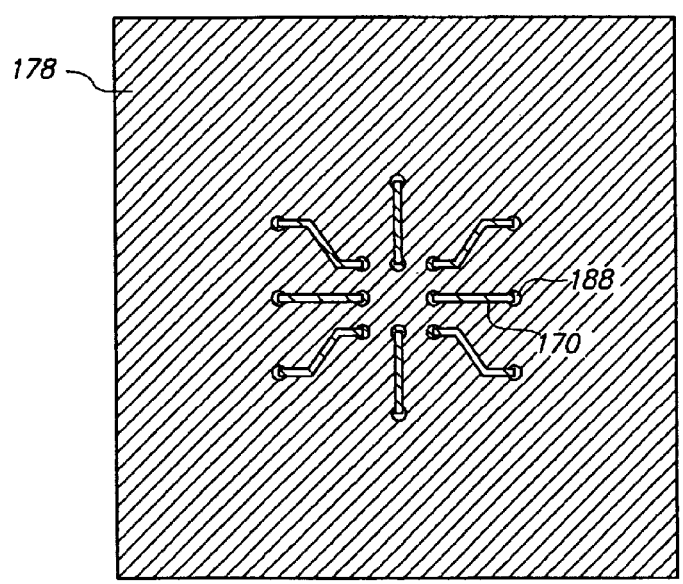
Figure 12C:
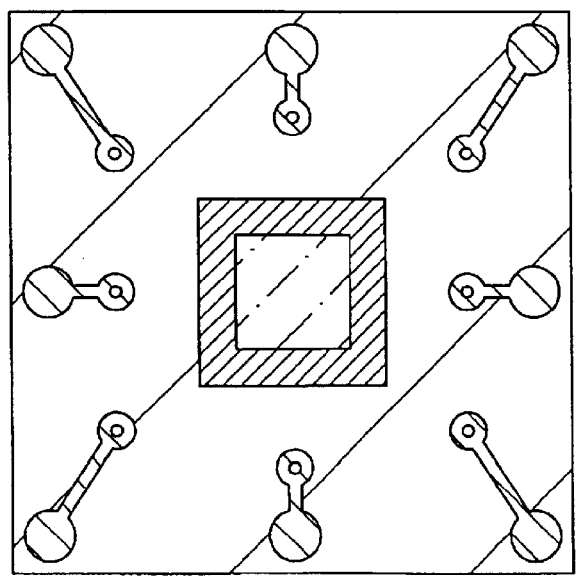

FIGS. 12A, 12B and 12C are cross-sectional, top and bottom views, respectively, of via 188 formed in adhesive 178 that exposes first contact terminal 130.

Via 188 is formed by applying a suitable etch that is highly selective of adhesive 178 with respect to first contact terminal 130 and conductive trace 170. In this instance, a selective TEA $CO_2$ laser etch is applied. The laser is directed at first contact terminal 130 and ablates adhesive 178. The laser has a spot size of 70 microns, first contact terminal 130 has a diameter of 200 microns, and conductive trace 170 has a width of 50 microns. The laser is aimed at a central portion of first contact terminal 130 within the periphery of first contact terminal 130 and strikes first contact terminal 130 and portions of conductive trace 170 and adhesive 178 that overlap first contact terminal 130 but does not strike dielectric base 128.

The laser drills through and removes portions of adhesive 178 within the periphery of first contact terminal 130 and outside conductive trace 170. However, portions of adhesive 178 that overlap the peripheral edge of first contact terminal 130 are outside the scope of the laser and remain intact. Likewise, conductive trace 170 shields the underlying adhesive 178 from the laser etch, and portions of adhesive 178 sandwiched between first contact terminal 130 and conductive trace 170 remain intact. The laser etch is anisotropic, and therefore little or none of adhesive 178 sandwiched between first contact terminal 130 and conductive trace 170 is undercut or removed.

Via 188 has a diameter of 70 microns, is disposed outside the periphery of chip 110 and is axially aligned with and centered relative to and partially exposes first contact terminal 130. Via 188 is formed in and extends vertically through adhesive 178 without damaging dielectric base 128, first contact terminal 130 or conductive trace 170.

Via 188 may extend slightly beneath conductive trace 170 and have a diameter that is slightly larger than 70 microns due to the beam angle of the laser, the thermal effects of the laser, and/or the isotropic nature of an oxygen plasma or wet chemical cleaning step. For convenience of explanation, this slight enlargement is ignored.

Thereafter, a brief cleaning step can be applied to remove oxides and debris that may be present on the exposed portions of pad 116, first contact terminal 130 and conductive trace 170. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 116, first contact terminal 130 and conductive trace 170 without damaging the structure.

Many other vias are formed through adhesive 178, and only eight vias are shown and a single via 188 is labeled for convenience of illustration. The vias are each aligned with and expose a corresponding first contact terminal.

Figure 12D:
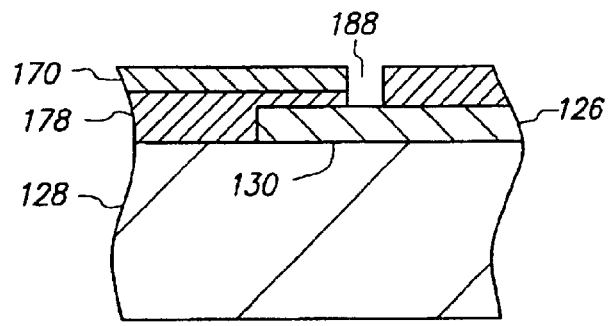
FIGS. 12D, 12E and 12F are enlarged cross-sectional, top and cross-sectional views, respectively, of the via in FIG. 12A.
Figure 12E:
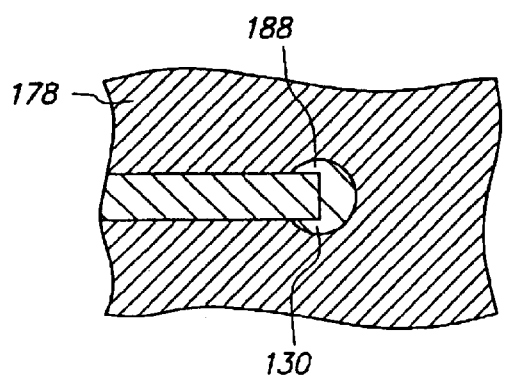
Figure 12F:
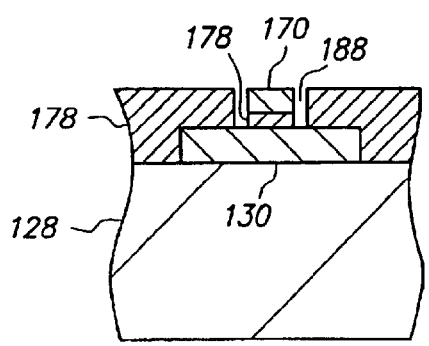

FIGS. 12D, 12E and 12F are enlarged cross-sectional, top and cross-sectional views, respectively, of via 188. FIG. 12F is oriented orthogonally with respect to FIG. 12D. As is seen, via 188 extends through adhesive 178 to first contact terminal 130 and exposes peripheral sidewalls 176 of conductive trace 170, and adhesive 178 remains in contact with and sandwiched between first contact terminal 130 and conductive trace 170.

Figure 13A:
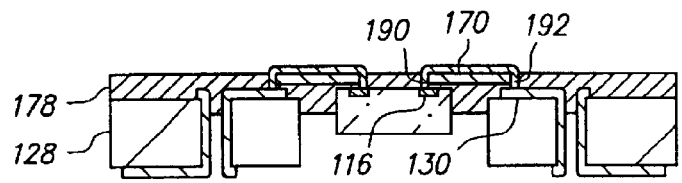
Figure 13B:
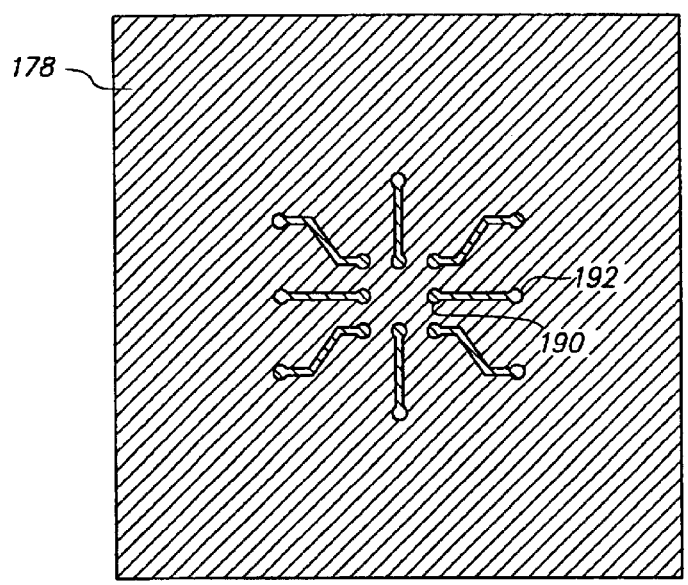
Figure 13C:
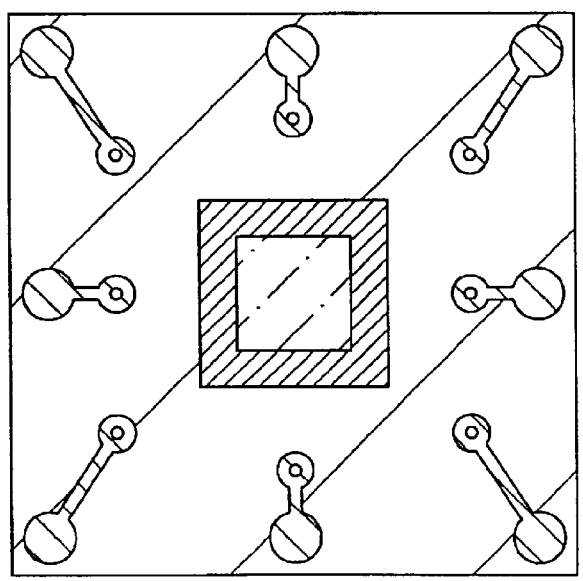

FIGS. 13A, 13B and 13C are cross-sectional, top and bottom views, respectively, of connection joint 190 formed on pad 116 and conductive trace 170, and interconnect 192 formed on first contact terminal 130 and conductive trace 170.

Connection joint 190 and interconnect 192 are formed by an electroless plating operation. Electroless plating provides metal deposition by an exchange reaction between metal complexes in a solution and a catalytic metal that activates or initiates the reaction. As a result, the electroless metal continually plates (i.e., deposits or grows) on the catalytic metal. The reaction does not require externally applied electric current, and therefore electroless plating can proceed without a plating bus. However, electroless plating is relatively slow.

Pad 116 and conductive trace 170 include exposed nickel and therefore are catalytic to electroless nickel. However, dielectric base 128 and adhesive 178 are not catalytic to electroless nickel and therefore a plating mask is not necessary.

The structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Connection joint 190 initially includes a first portion that begins to plate on pad 116 and a second portion that begins to plate on conductive trace 170, although the first and second connection joint portions do not contact one another and pad 116 remains electrically isolated from conductive trace 170. As the electroless plating operation continues, and the connection joint portions continue to plate on pad 116 and conductive trace 170 and expand axially in opening 186 towards one another, the connection joint portions eventually contact one another inside opening 186 and metallurgically merge into a single connection joint 190 that contacts and electrically connects pad 116 and conductive trace 170.

Interconnect 192 begins to plate on conductive trace 170, although interconnect 192 does not initially deposit on first contact terminal 130 since conductive terminal 126 is copper and is not catalytic to electroless nickel. As the electroless plating operation continues, and interconnect 192 continues to plate on conductive trace 170 and expand axially in via 188 towards first contact terminal 130, interconnect 192 eventually contacts first contact terminal 130 and changes the electrochemical potential of first contact terminal 130 by a small amount such as 0.2 volts. As a result, first contact terminal 130 becomes catalytic to electroless nickel, and interconnect 192 begins to plate on first contact terminal 130 as well.

The nickel electroless plating operation continues until connection joint 190 and interconnect 192 are about 15 microns thick. Thereafter, the structure is removed from the electroless nickel plating solution and rinsed in distilled water.

In this manner connection joint 190 and interconnect 192 are simultaneously formed during a single electroless plating operation.

Connection joint 190 extends through opening 186 and contacts and electrically connects pad 116 and conductive trace 170. Connection joint 190 contacts and covers portions of pad 116 beneath opening 186 and outside conductive trace 170 as well as portions of surface 172 and peripheral sidewalls 176 of conductive trace 170 that overlap pad 116. Thus, connection joint 190 provides a robust, permanent electrical connection between pad 116 and conductive trace 170. Connection joint 190 is the only electrical conductor external to chip 110 that contacts pad 116, adhesive 178 and connection joint 190 are the only materials external to chip 110 that contact pad 116, and adhesive 178 and connection joint 190 are the only materials that contact both pad 116 and conductive trace 170.

Interconnect 192 extends through via 188 and contacts and electrically connects first contact terminal 130 and conductive trace 170. Interconnect 192 contacts and covers portions of first contact terminal 130 beneath via 188 and outside conductive trace 170 as well as portions of surface 172 and peripheral sidewalls 176 of conductive trace 170 that overlap first contact terminal 130. Thus, interconnect 192 provides a robust, permanent electrical connection between first contact terminal 130 and conductive trace 170. Interconnect 192 is the only electrical conductor external to substrate 120 that contacts first contact terminal 130, adhesive 178 and interconnect 192 are the only materials external to substrate 120 that first contact terminal 130, and adhesive 178 and interconnect 192 are the only materials that contact both first contact terminal 130 and conductive trace 170.

Connection joint 190 and interconnect 192 are primarily nickel, contain about 4 to 9 weight percentage phosphorus, and constitute the distal ends of a single continuous electrolessly plated nickel trace that covers surface 172 of conductive trace 170 and extends into and through opening 186 and via 188. Furthermore, if vertical connection 134, second routing line 136 and second contact terminal 138 are exposed to the electroless nickel plating solution then a thin nickel layer may electrolessly plate on these features as well.

Many other connection joints are formed in the openings, and only eight connection joints are shown and a single connection joint 190 is labeled for convenience of illustration. The connection joints each extend into a corresponding opening and contact and electrically connect a corresponding pad and a corresponding conductive trace. Likewise, many other interconnects are formed in the vias, and only eight interconnects are shown and a single interconnect 192 is labeled for convenience of illustration. The interconnects each extend into a corresponding via and contact and electrically connect a corresponding first contact terminal and a corresponding conductive trace.

Figure 13D:
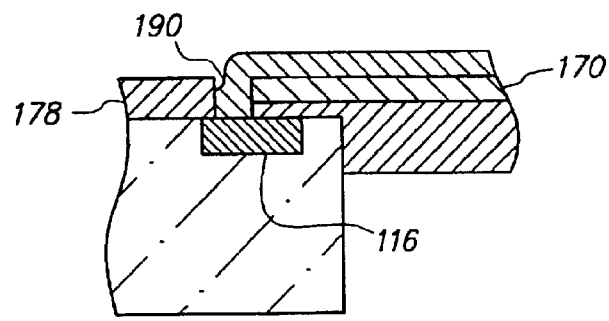
FIGS. 13D, 13E and 13F are enlarged cross-sectional, top and cross-sectional views, respectively, of the connection joint in FIG. 13A.
Figure 13E:
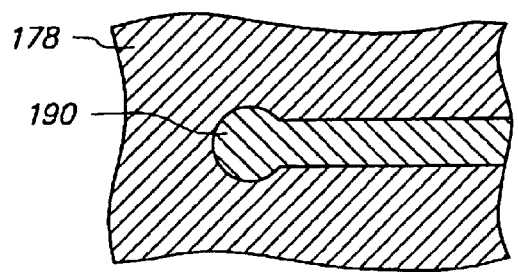
Figure 13F:
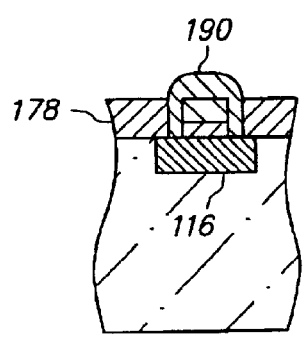

FIGS. 13D, 13E and 13F are enlarged cross-sectional, top and cross-sectional views, respectively, of connection joint 190. FIG. 13F is oriented orthogonally with respect to FIG. 13D. As is seen, connection joint 190 extends through opening 186 and contacts and electrically connects pad 116 and conductive trace 170. Furthermore, connection joint 190 contacts surface 172 and peripheral sidewalls 176 of conductive trace 170, and adhesive 178 remains in contact with and sandwiched between pad 116 and conductive trace 170.

Figure 13G:
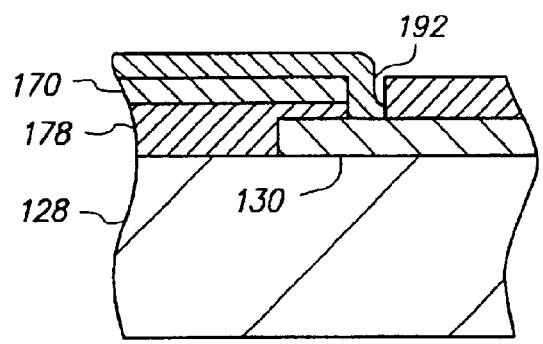
FIGS. 13G, 13H and 13I are enlarged cross-sectional, top and cross-sectional views, respectively, of the interconnect in FIG. 13A.
Figure 13H:
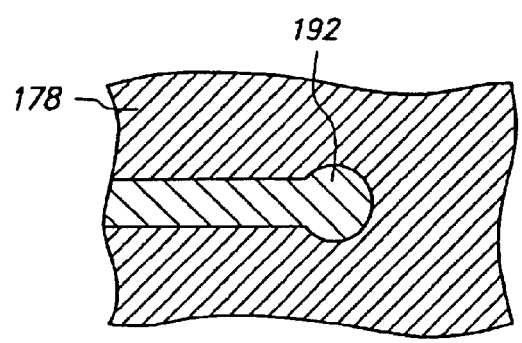
Figure 13I:
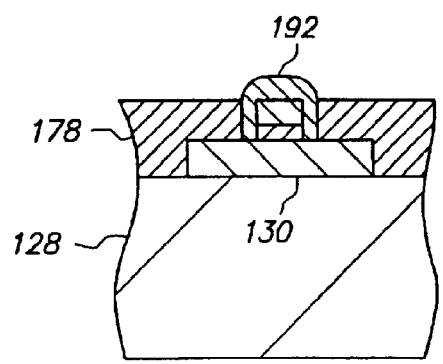

FIGS. 13G, 13H and 13I are enlarged cross-sectional, top and cross-sectional views, respectively, of interconnect 192. FIG. 13I is oriented orthogonally with respect to FIG. 13G. As is seen, interconnect 192 extends through via 188 and contacts and electrically connects first contact terminal 130 and conductive trace 170. Furthermore, interconnect 192 contacts surface 172 and peripheral sidewalls 176 of conductive trace 170, and adhesive 178 remains in contact with and sandwiched between first contact terminal 130 and conductive trace 170.

Figure 14A:
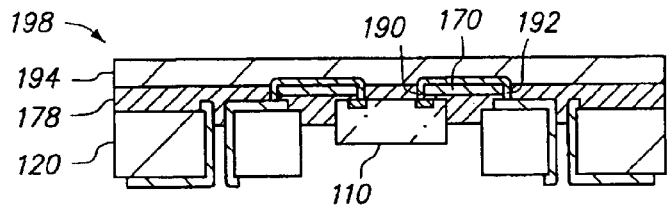
Figure 14B:
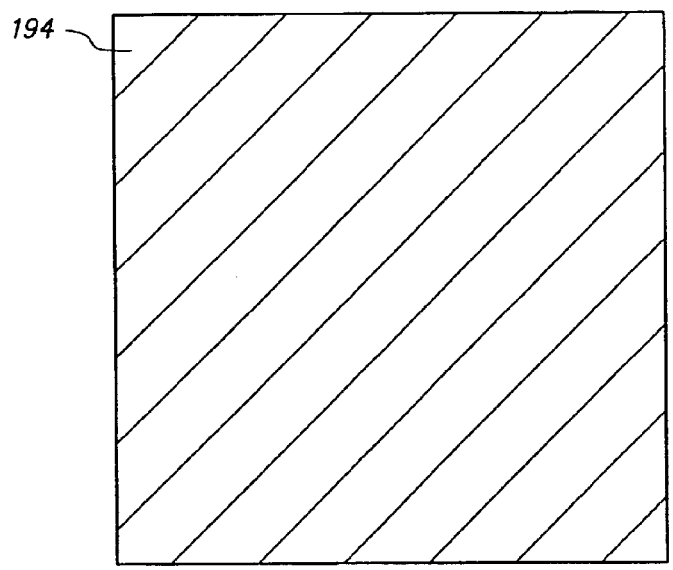
Figure 14C:
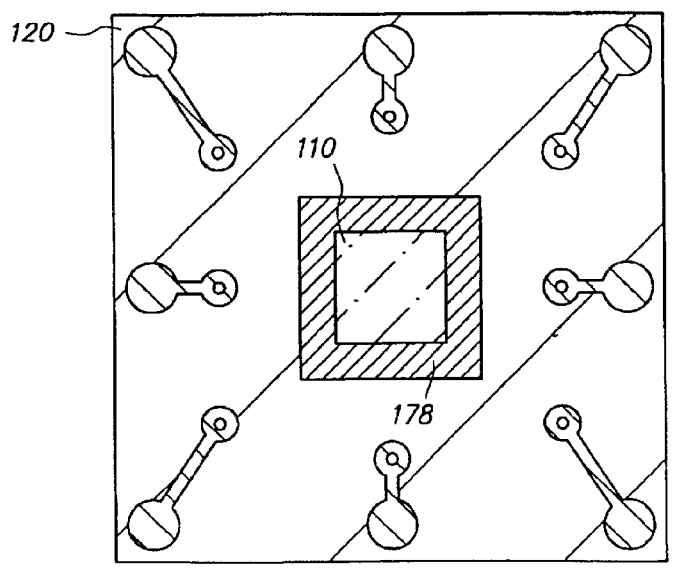

FIGS. 14A, 14B and 14C are cross-sectional, top and bottom views, respectively, of insulative base 194 formed over conductive trace 170, adhesive 178, connection joint 190 and interconnect 192.

Insulative base 194 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited over the structure using stencil printing, then the epoxy paste is cured or hardened at a relatively low temperature in the range of 100 to 250° C. to form a solid adherent insulator that provides a protective seal for conductive trace 170, connection joint 190 and interconnect 192. Insulative base 194 extends 50 microns above adhesive 178.

Insulative base 194 has a length and width of 40 millimeters, is axially aligned with and co-extensive with substrate 120 and covers the other conductive traces, connection joints and interconnects. Insulative base 194 provides mechanical support and environmental protection for the assembly.

At this stage, the manufacture of semiconductor chip assembly 198 that includes 7chip 110, substrate 120, conductive trace 170, adhesive 178, connection join993 t 190, interconnect 192 and insulative base 194 can be considered complete.

Chip 110, substrate 120 and conductive trace 170 are mechanically attached to one another by adhesive 178. Conductive trace 170 is electrically connected to pad 116 by connection joint 190 and to conductive terminal 126 by interconnect 192.

Connection joint 190 provides vertical routing between pad 116 and conductive trace 170 within the periphery of chip 110, conductive trace 170 provides horizontal routing between connection joint 190 and interconnect 192 within and outside the periphery of chip 110, interconnect 192 provides vertical routing between conductive trace 170 and conductive terminal 126 outside the periphery of chip 110, and conductive terminal 126 provides horizontal and vertical routing outside the periphery of chip 110. More particularly, at conductive terminal 126, first routing line 132 provides horizontal routing between first contact terminal 130 and vertical connection 134 at surface 122 of substrate 120, vertical connection 134 provides vertical routing between first routing line 132 at surface 122 of substrate 120 and second routing line 136 at surface 124 of substrate 120, and second routing line 136 provides horizontal routing between vertical connection 134 and second contact terminal 138 at surface 124 of substrate 120.

Conductive trace 170 provides fine-pitch fan-out routing for pad 116, and conductive terminal 126 provides coarse-pitch fan-out routing for pad 116. In particular, conductive trace 170 has a first pitch (relative to the other conductive traces) at its first distal end proximate to pad 116, a second pitch (relative to the other conductive traces) at its second distal end proximate to first contact terminal 130, and the first pitch is less than the second pitch. Likewise, conductive terminal 126 has a third pitch (relative to the other conductive terminals) at first contact terminal 130 proximate to conductive trace 170, a fourth pitch (relative to the other conductive terminals) at second contact terminal 138, and the third pitch is less than the fourth pitch. Furthermore, the second and third pitches are essentially identical.

The semiconductor chip assembly includes many other pads, conductive terminals, conductive traces, connection joints and interconnects, and only a single pad 116, conductive terminal 126, conductive trace 170, connection joint 190 and interconnect 192 are labeled for convenience of illustration. The conductive terminals each include first and second contact terminals, first and second routing lines and a vertical connection, the connection joints each extend into a corresponding opening in the adhesive and contact and electrically connect a corresponding pad and a corresponding conductive trace, and the interconnects each extend into a corresponding via in the adhesive and contact and electrically connect a corresponding conductive terminal and a corresponding conductive trace.

If desired, solder balls can be screen printed over the second contact terminals to provide connections to the next level assembly.

FIGS. 15A–32A, 15B–32B and 15C–32C are cross-sectional, top and bottom views, respectively, of a method of making a semiconductor chip assembly in accordance with a second embodiment of the present invention. In the second embodiment, the opening and the via are formed through the metal base and the adhesive, the connection joint is electroplated on the metal base, the conductive trace and the pad, the interconnect is electroplated on the metal base, the conductive trace and the first contact terminal, and then the metal base is etched to electrically isolate the conductive traces from one another. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, substrate 220 corresponds to substrate 120, etc.

Figure 15A:
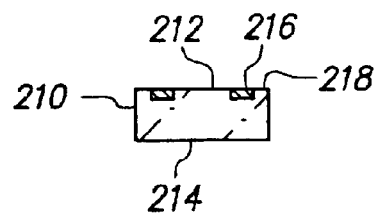
Figure 15B:
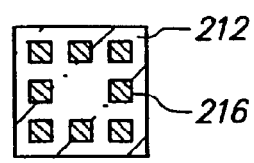
Figure 15C:
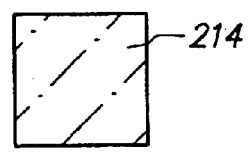

FIGS. 15A, 15B and 15C are cross-sectional, top and bottom views, respectively, of semiconductor chip 210 which includes opposing major surfaces 212 and 214. Surface 212 includes conductive pad 216 and passivation layer 218.

FIGS. 16A, 16B and 16C are cross-sectional, top and bottom views, respectively, of substrate 220 which includes opposing major surfaces 222 and 224, conductive terminal 226 and dielectric base 228. Conductive terminal 226 includes first contact terminal 230, first routing line 232, vertical connection 234, second routing line 236 and second contact terminal 238. Dielectric base 228 includes inner sidewalls 240 that bound cavity 242.

Figure 17A:
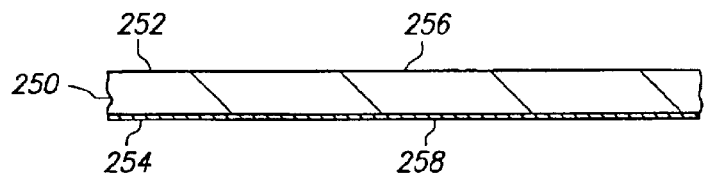
Figure 17B:
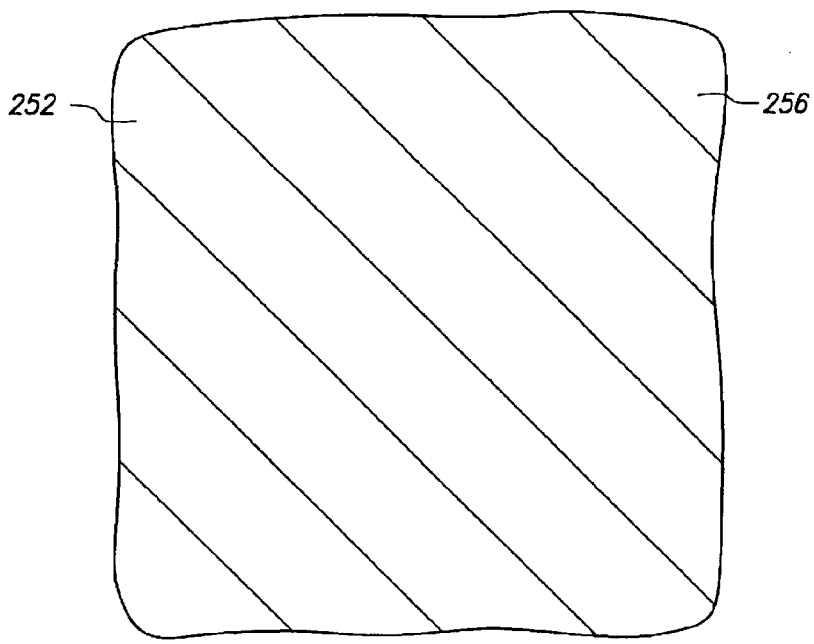
Figure 17C:
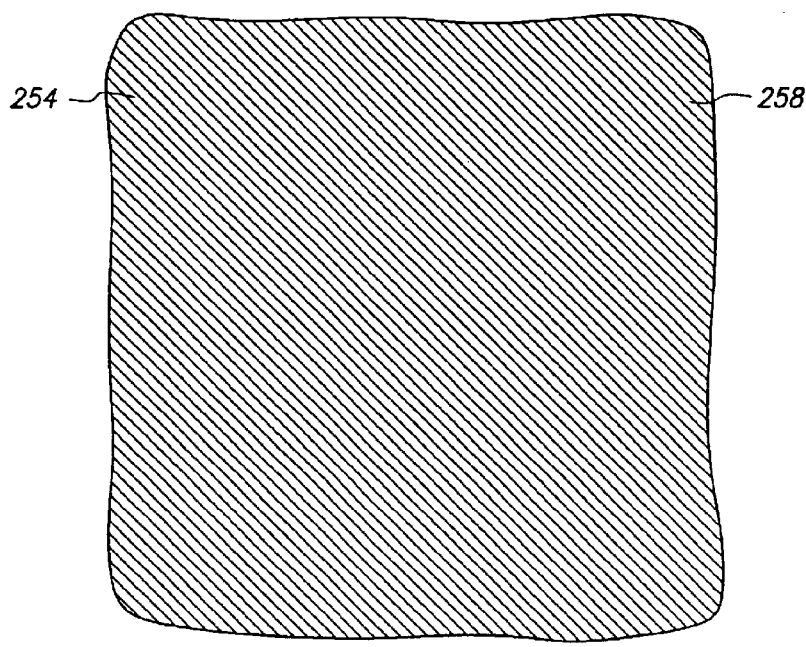

FIGS. 17A, 17B and 17C are cross-sectional, top and bottom views, respectively, of metal base 250 which includes opposing major surfaces 252 and 254, copper layer 256 and nickel layer 258. Copper layer 256 provides surface 252 and is spaced from surface 254, and nickel layer 258 provides surface 254 and is spaced from surface 252. Copper layer 256 is 200 microns thick, and nickel layer 258 is 1 micron thick. Thus, metal base 250 is identical to metal base 150 except that metal base 250 further includes nickel layer 258.

Figure 18A:
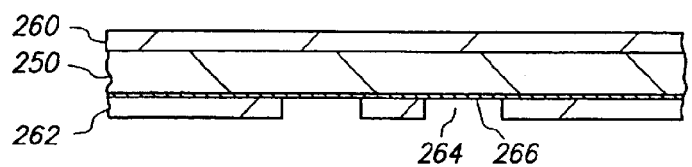
Figure 18B:
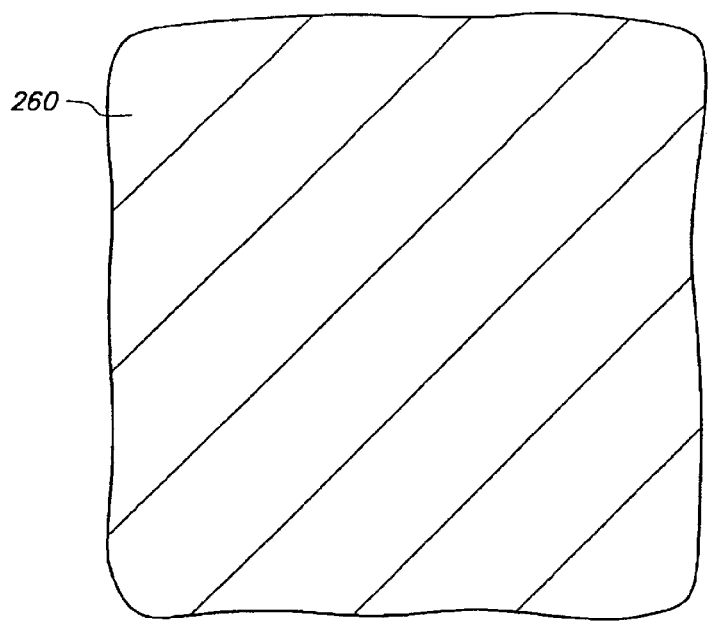
Figure 18C:
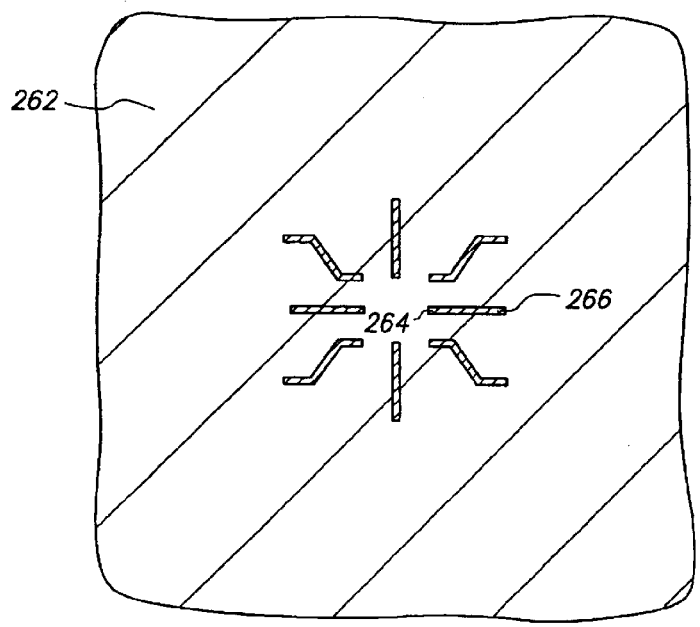

FIGS. 18A, 18B and 18C are cross-sectional, top and bottom views, respectively, of photoresist layers 260 and 262 formed on metal base 250. Photoresist layer 262 contains opening 264 that selectively exposes portion 266 of surface 254.

Figure 19A:
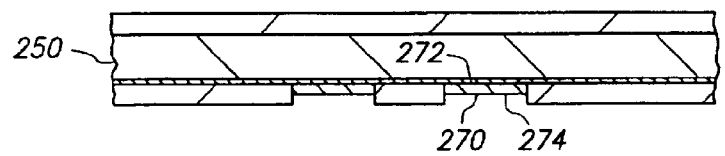
Figure 19B:
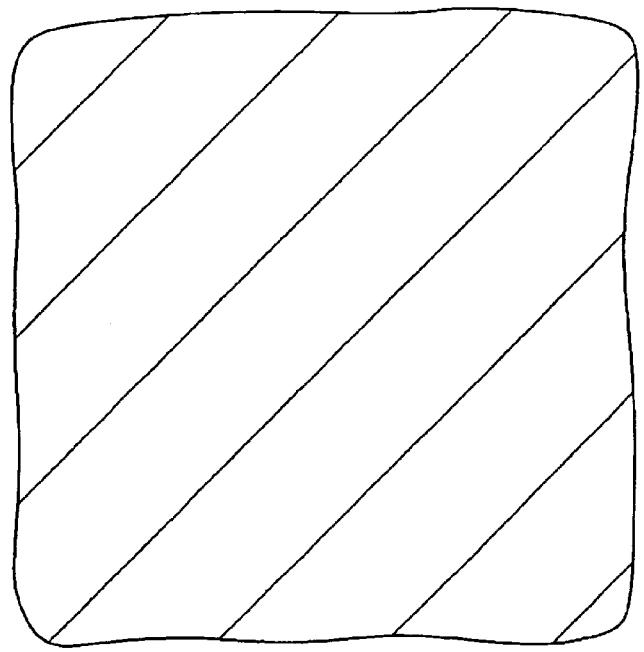
Figure 19C:
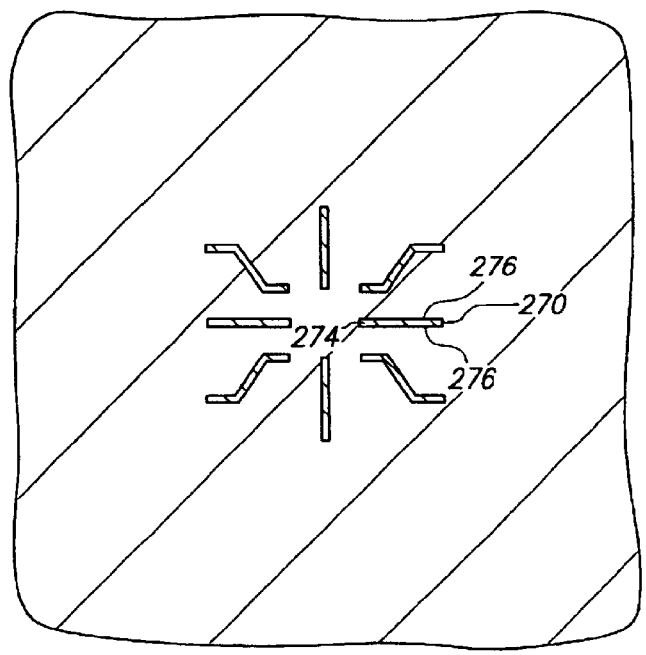

FIGS. 19A, 19B and 19C are cross-sectional, top and bottom views, respectively, of conductive trace 270 formed on metal base 250 by electroplating. Conductive trace 270 includes opposing major surfaces 272 and 274 and peripheral sidewalls 276. Conductive trace 270 is composed of copper and is 12 microns thick. Thus, conductive trace 270 is identical to conductive trace 170 except that conductive trace 270 lacks the nickel layer in conductive trace 170.

Figure 20A:
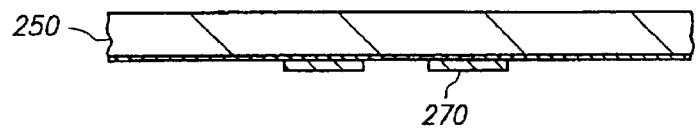
Figure 20B:
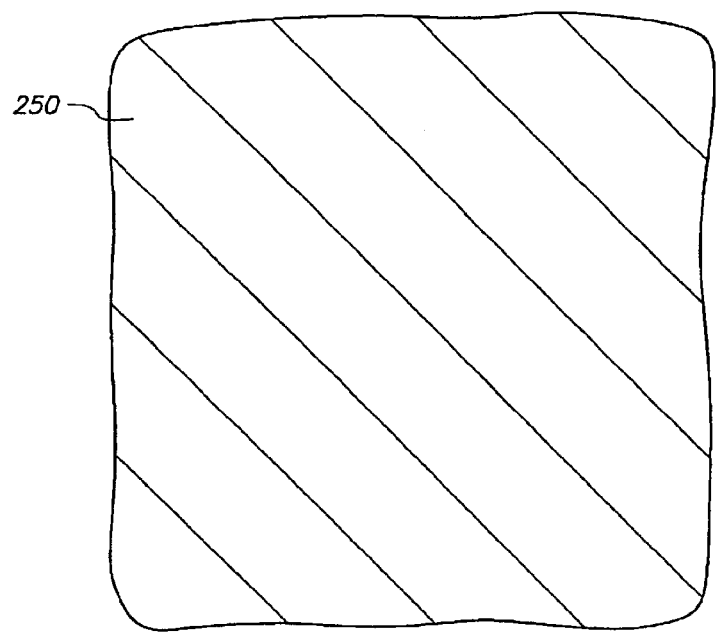
Figure 20C:
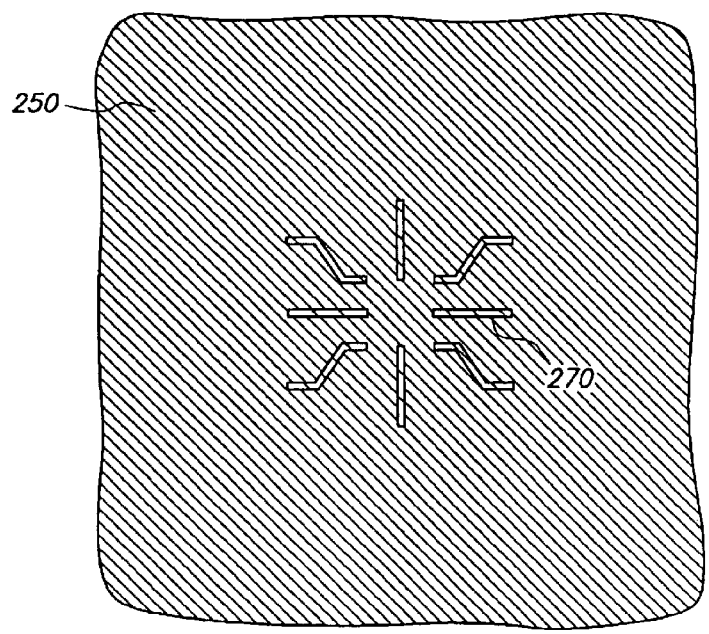

FIGS. 20A, 20B and 20C are cross-sectional, top and bottom views, respectively, of metal base 250 and conductive trace 270 after photoresist layers 260 and 262 are stripped.

Figure 21A:
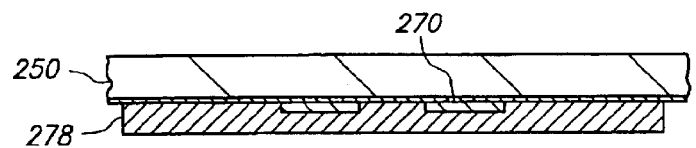
Figure 21B:
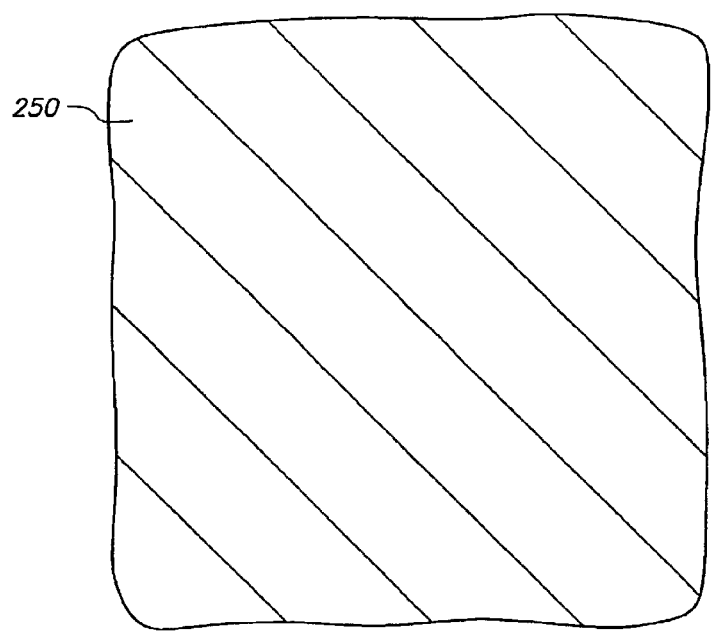
Figure 21C:
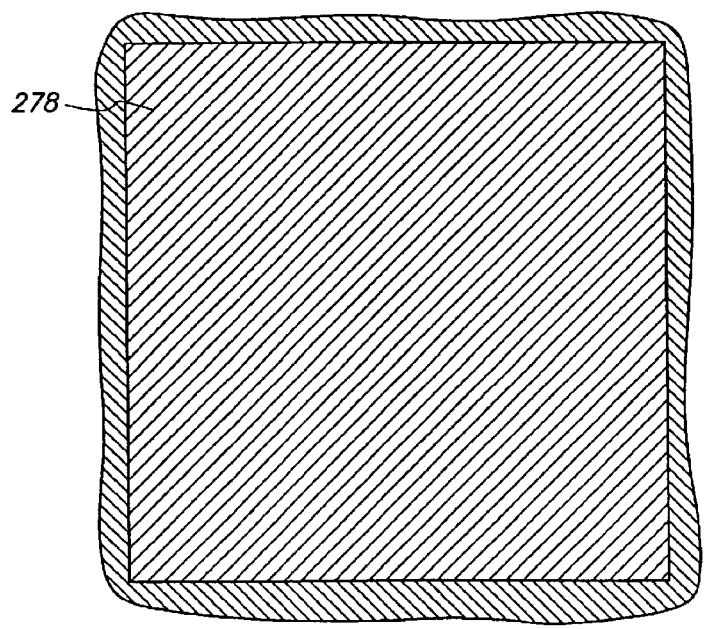

FIGS. 21A, 21B and 21C are cross-sectional, top and bottom views, respectively, of adhesive 278 formed on metal base 250 and conductive trace 270.

Figure 22A:
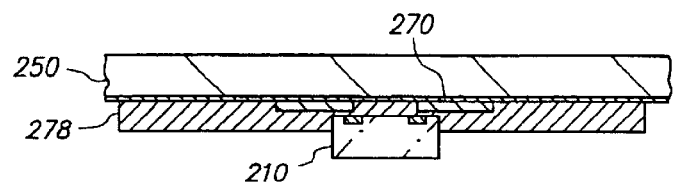
Figure 22B:
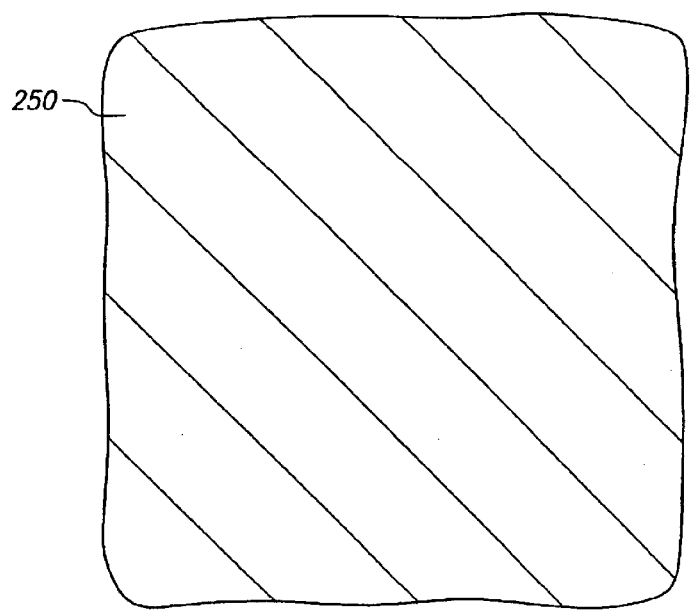
Figure 22C:
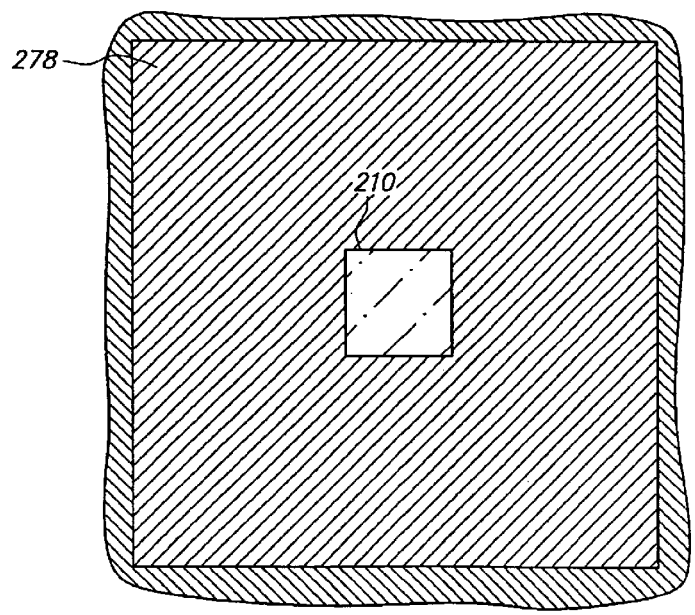

FIGS. 22A, 22B and 22C are cross-sectional, top and bottom views, respectively, of chip 210 mechanically attached to metal base 250 and conductive trace 270 by adhesive 278.

Figure 23A:
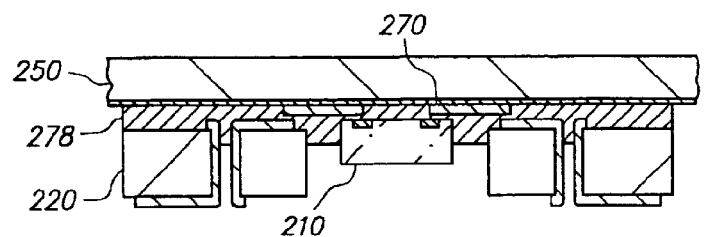
Figure 23B:
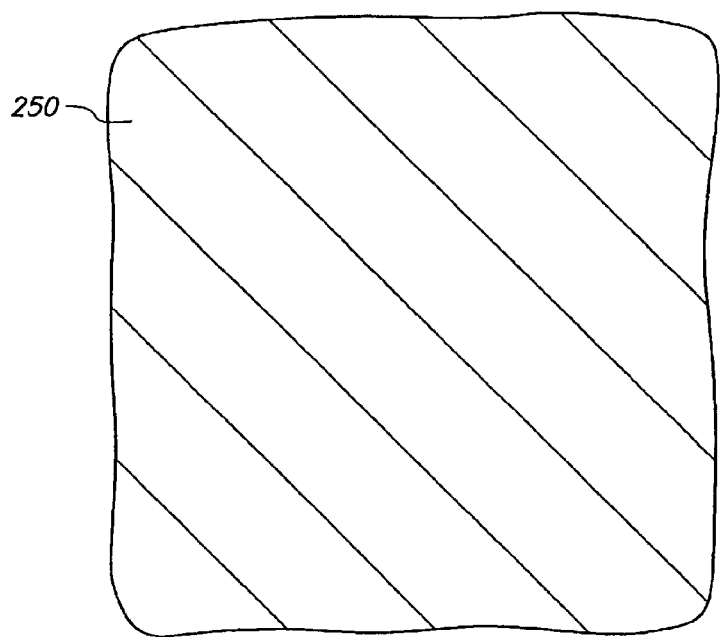
Figure 23C:
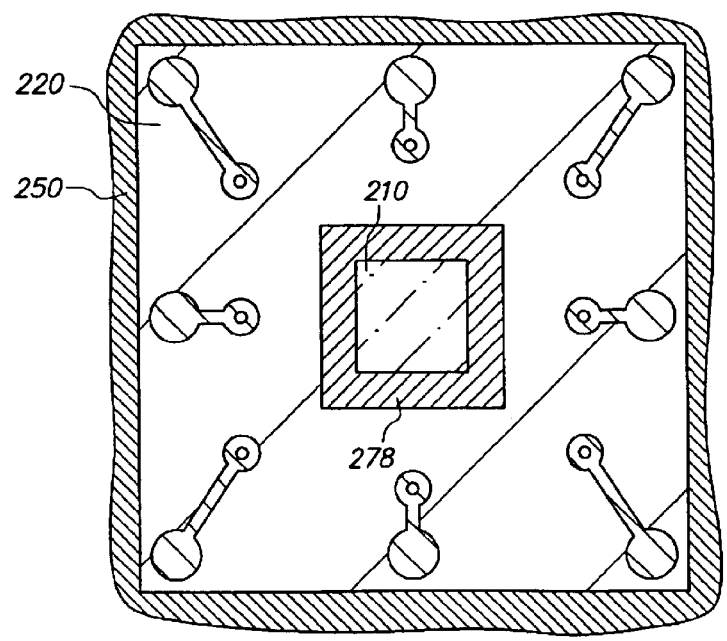

FIGS. 23A, 23B and 23C are cross-sectional, top and bottom views, respectively of chip 210, metal base 250 and conductive trace 270 mechanically attached to substrate 220 by adhesive 278.

Figure 24A:
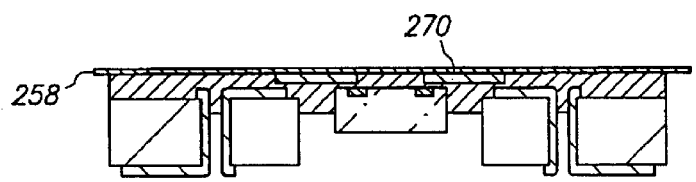
Figure 24B:
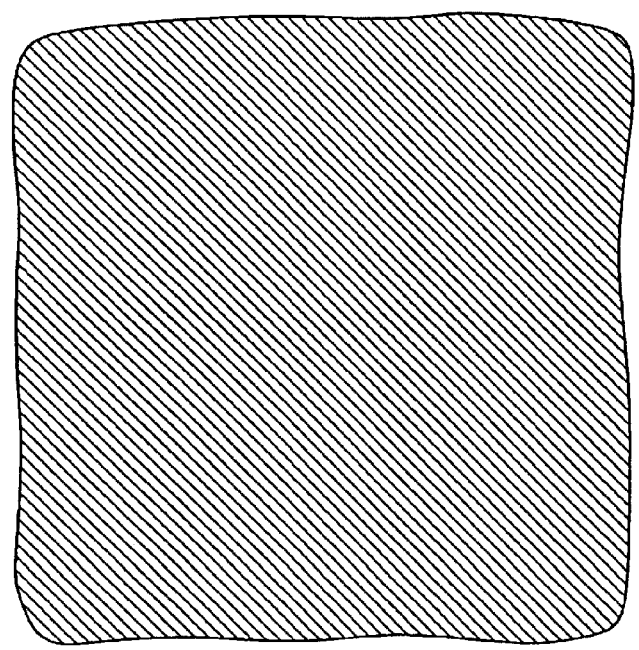
Figure 24C:
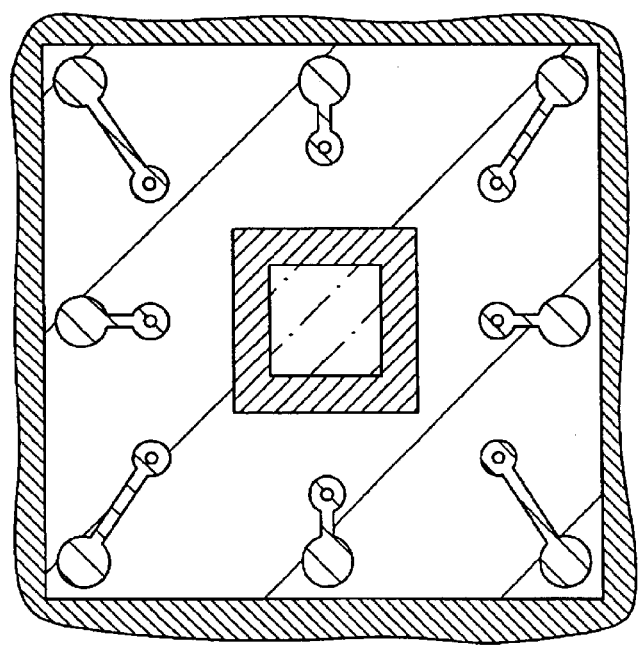

FIGS. 24A, 24B and 24C are cross-sectional, top and bottom views, respectively, of the structure after copper layer 256 is removed. Copper layer 256 is removed in the same manner that metal base 150 is removed. Namely, a wet chemical etch is applied to surface 252 of metal base 250 using a solution containing alkaline ammonia that is highly selective of copper with respect to nickel. Therefore, no appreciable amount of nickel layer 258 is removed. In addition, conductive trace 270 is protected from the wet chemical etch by nickel layer 258. At this stage, metal base 250 is composed of nickel layer 258.

Figure 25A:
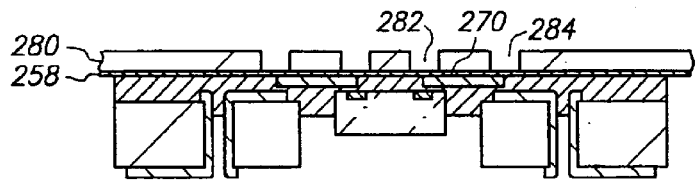
Figure 25B:
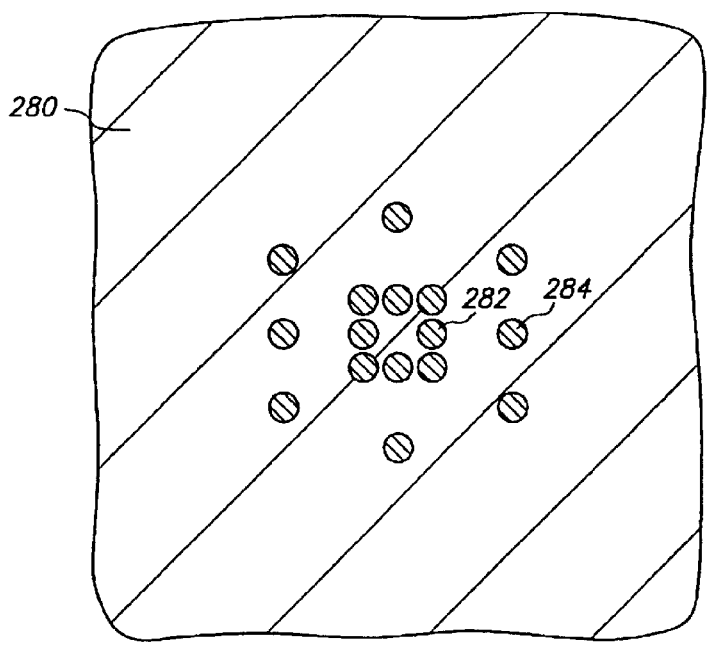
Figure 25C:
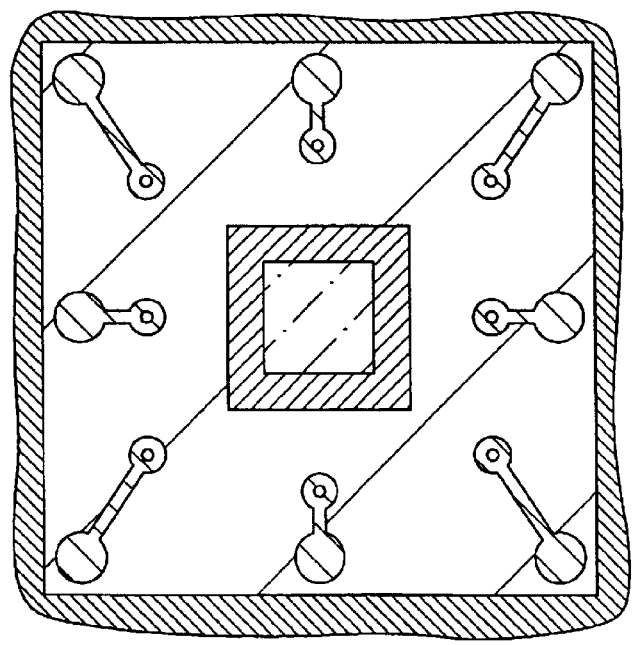

FIGS. 25A, 25B and 25C are cross-sectional, top and bottom views, respectively, of photoresist layer 280 formed on metal base 250. Photoresist layer 280 is deposited using a dry film lamination process in which a hot roll presses photoresist layer 280 onto nickel layer 258. Thereafter, photoresist layer 280 is patterned by selectively applying light through a reticle (not shown), applying a developer solution to remove the photoresist portions rendered soluble by the light, and then hard baking, as is conventional. As a result, photoresist layer 280 contains opening 282 that selectively exposes nickel layer 258 and is axially aligned with pad 216 and has a diameter of 200 microns, and opening 284 that selectively exposes nickel layer 258 and is axially aligned with first contact terminal 230 and has a diameter of 200 microns. Photoresist layer 280 has a thickness of 25 microns.

Photoresist layer 280 contains many other openings above corresponding pads of chip 210, and only eight openings are shown and a single opening 282 is labeled for convenience of illustration. Likewise, photoresist layer 280 contains many other openings above corresponding first contact terminals of substrate 220, and only eight openings are shown and a single opening 284 is labeled for convenience of illustration.

Figure 26A:
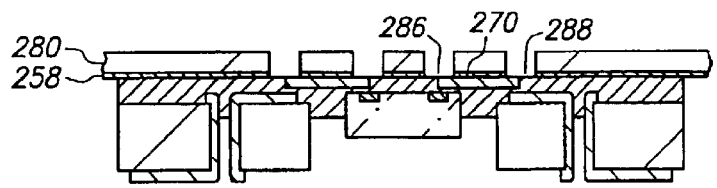
Figure 26B:
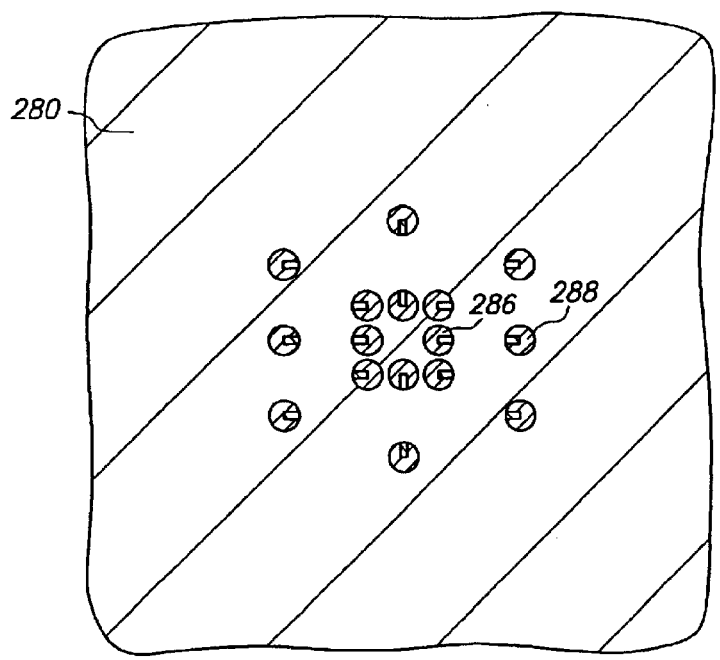
Figure 26C:
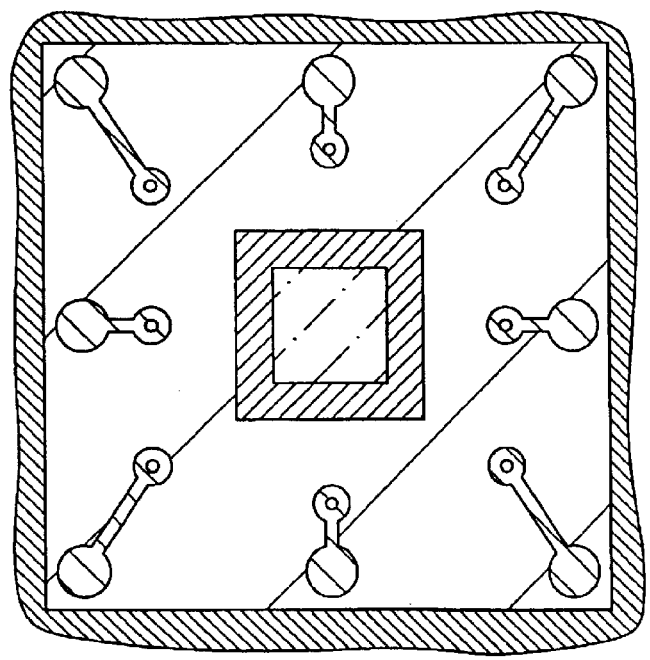

FIGS. 26A, 26B and 26C are cross-sectional, top and bottom views, respectively, of opening 286 and via 288 that are partially formed and extend through metal base 250 and expose conductive trace 270 and adhesive 278.

Opening 286 and via 288 are formed through metal base 250 by wet chemical etching using photoresist layer 280 as an etch mask. Metal base 250, which at this stage consists of nickel layer 258, is selectively etched using a nickel etching solution, such as a dilute mixture of nitric and hydrochloric acid, that is highly selective of nickel with respect to polyimide, epoxy and silicon. Therefore, no appreciable amount of chip 210, dielectric base 228 or adhesive 278 is removed.

Since nickel layer 258 is extremely thin relative to conductive terminal 226 and conductive trace 270, and the structure is removed from the nickel etching solution immediately after opening 286 and via 288 are formed through nickel layer 258, it is not critical that the nickel etching solution be highly selective of nickel with respect to copper. The nickel etching solution has no significant impact on conductive terminal 226 or conductive trace 270. In addition, conductive trace 270 and adhesive 278 protect pad 216 from the nickel etching solution. The optimal etch time for exposing nickel layer 258 to the wet chemical etch without significantly undercutting nickel layer 258 or impacting conductive terminal 226 and conductive trace 270 can be established through trial and error.

The wet chemical etch etches completely through nickel layer 258, thereby effecting a pattern transfer of photoresist layer 280 onto nickel layer 258. Opening 286 is axially aligned with pad 216 and has a diameter of 200 microns, and via 288 is axially aligned with first contact terminal 230 and has a diameter of 200 microns.

At this stage, opening 286 is formed in and extends vertically through metal base 250 to adhesive 278 but does not extend through adhesive 278 to pad 216, and via 288 is formed in and extends vertically through metal base 250 to adhesive 278 but does not extend through adhesive 278 to first contact terminal 230.

Figure 27A:
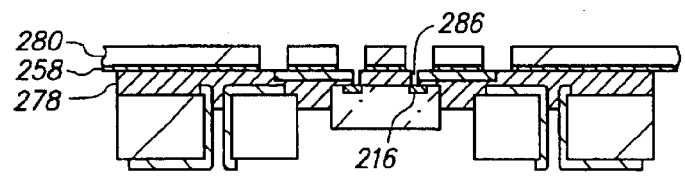
Figure 27B:
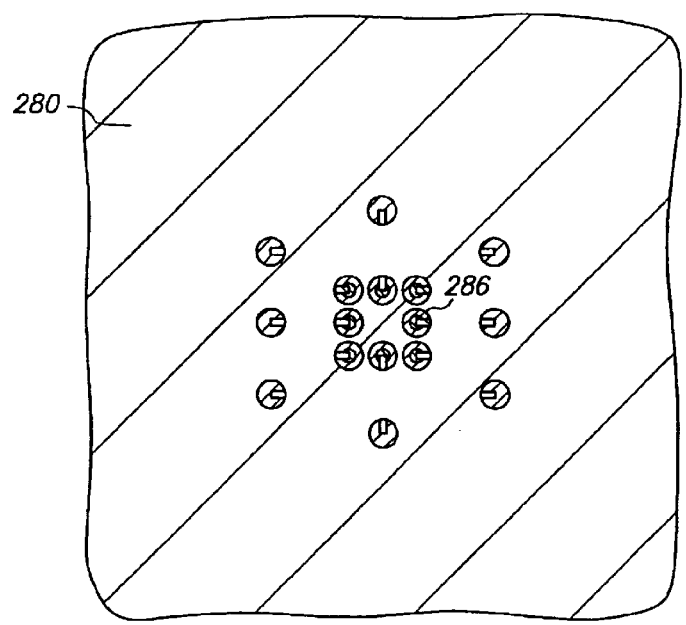
Figure 27C:
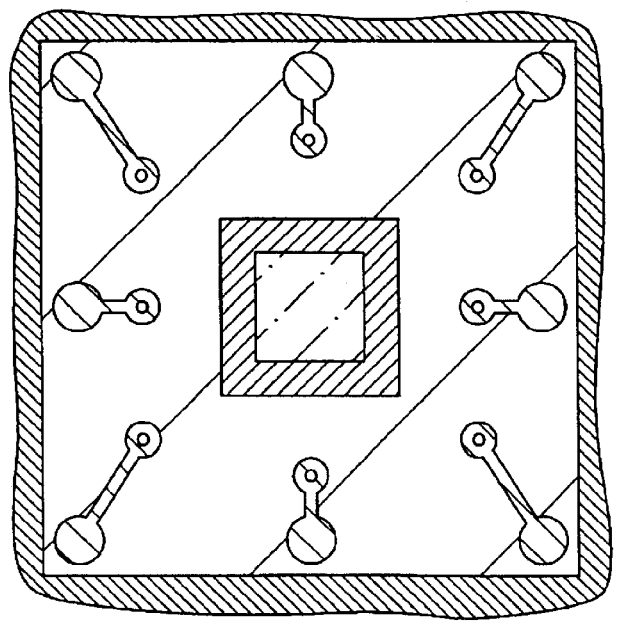

FIGS. 27A, 27B and 27C are cross-sectional, top and bottom views, respectively, of opening 286 that is fully formed and extends through metal base 250 and adhesive 278 and exposes pad 216.

Opening 286 is formed through adhesive 278 in essentially the same manner as opening 186. Namely, a selective TEA CO$_2$ laser etch is directed at and axially aligned with and centered relative to pad 216. The laser has a spot size of 70 microns, pad 216 has a length and width of 100 microns and opening 286 has a diameter of 200 microns at nickel layer 258. As a result, the laser strikes pad 216 and portions of conductive trace 270 and adhesive 278 that overlap pad 216 and ablates adhesive 278, and nickel layer 258 and photoresist layer 280 are outside the scope of the laser.

The laser drills through and removes a central portion of adhesive 278 within opening 286, thereby extending opening 286 through adhesive 278. However, portions of adhesive 278 that overlap the peripheral edges of pad 216 are outside the scope of the laser and remain intact. Likewise, conductive trace 270 shields the underlying adhesive 278 from the laser etch, and portions of adhesive 278 sandwiched between pad 216 and conductive trace 270 remain intact.

Opening 286 is formed in and extends vertically through metal base 250 and adhesive 278, is axially aligned with and exposes pad 216, and has a diameter of 200 microns at nickel layer 258 and a diameter of 70 microns at adhesive 278.

Figure 27D:
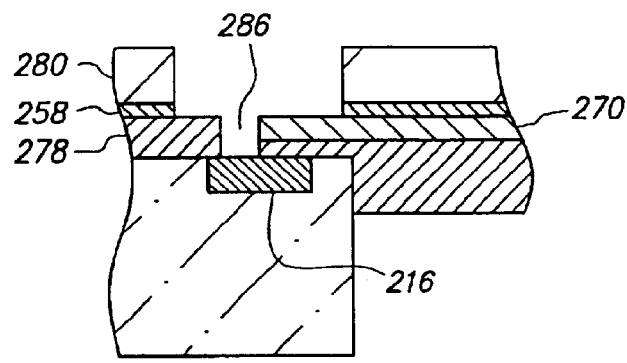
FIGS. 27D, 27E and 27F are enlarged cross-sectional, top and cross-sectional views, respectively, of the opening in FIG. 27A.
Figure 27E:
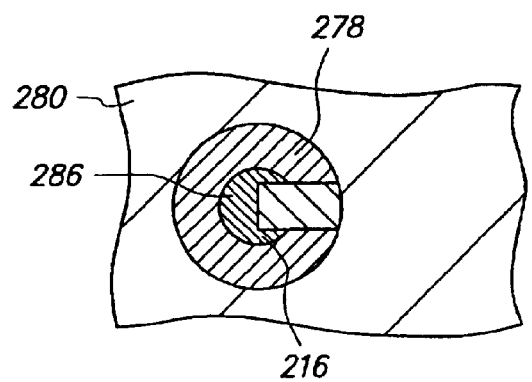
Figure 27F:
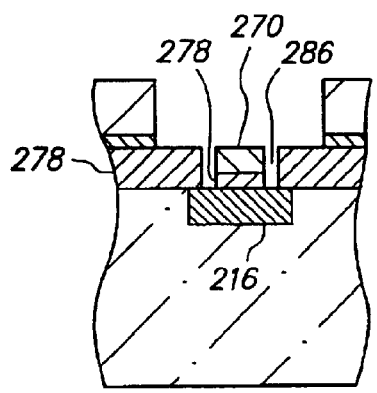

FIGS. 27D, 27E and 27F are enlarged cross-sectional, top and cross-sectional views, respectively, of opening 286. FIG. 27F is oriented orthogonally with respect to FIG. 27D. As is seen, opening 286 extends through metal base 250 and adhesive 278 to pad 216 and exposes surface 272 and peripheral sidewalls 276 of conductive trace 270, and adhesive 278 remains in contact with and sandwiched between pad 216 and conductive trace 270.

Figure 28A:
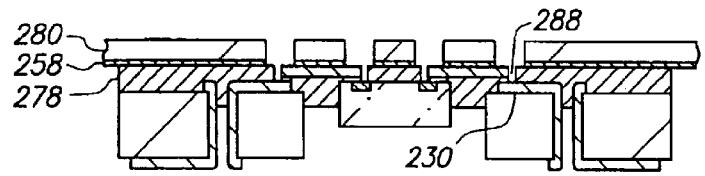
Figure 28B:
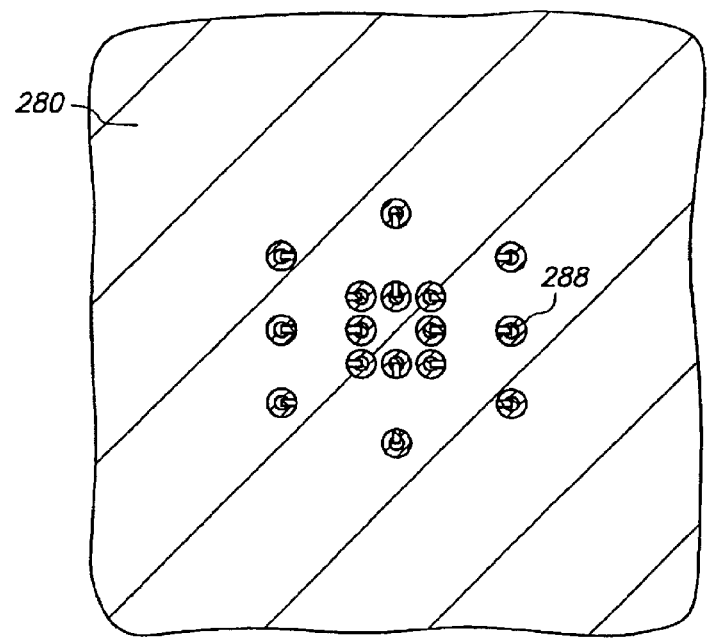
Figure 28C:
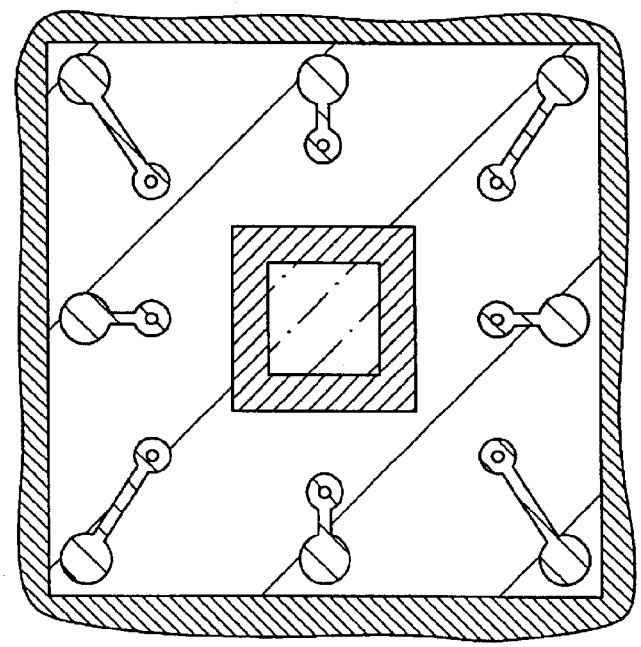

FIGS. 28A, 28B and 28C are cross-sectional, top and bottom views, respectively, of via 288 that is fully formed and extends through metal base 250 and adhesive 278 and exposes first contact terminal 230.

Via 288 is formed through adhesive 278 in essentially the same manner as via 188. Namely, a selective TEA CO$_2$ laser etch is directed at and axially aligned with and centered relative to first contact terminal 230. The laser has a spot size of 70 microns, first contact terminal 230 has a diameter of 200 microns, and via 288 has a diameter of 200 microns at nickel layer 258. As a result, the laser strikes first contact terminal 230 and portions of conductive trace 270 and adhesive 278 that overlap first contact terminal 230 and ablates adhesive 278, and nickel layer 258 and photoresist layer 280 are outside the scope of the laser.

The laser drills through and removes a central portion of adhesive 278 within via 288, thereby extending via 288 through adhesive 278. However, portions of adhesive 278 that overlap the peripheral edges of first contact terminal 230 are outside the scope of the laser and remain intact. Likewise, conductive trace 270 shields the underlying adhesive 278 from the laser etch, and portions of adhesive 278 sandwiched between first contact terminal 230 and conductive trace 270 remain intact.

Via 288 is formed in and extends vertically through metal base 250 and adhesive 278, is axially aligned with and exposes first contact terminal 230, and has a diameter of 200 microns at nickel layer 258 and a diameter of 70 microns at adhesive 278.

Figure 28D:
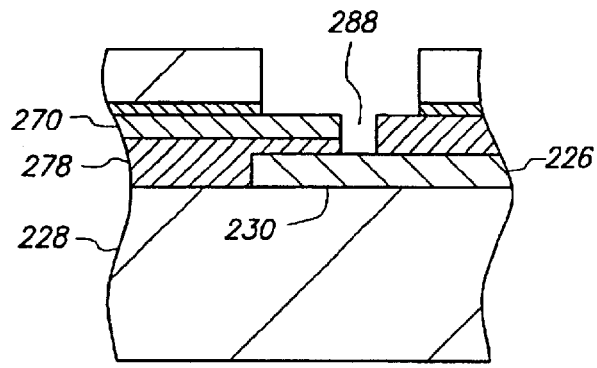
FIGS. 28D, 28E and 28F are enlarged cross-sectional, top and cross-sectional views, respectively, of the via in FIG. 28A.
Figure 28E:
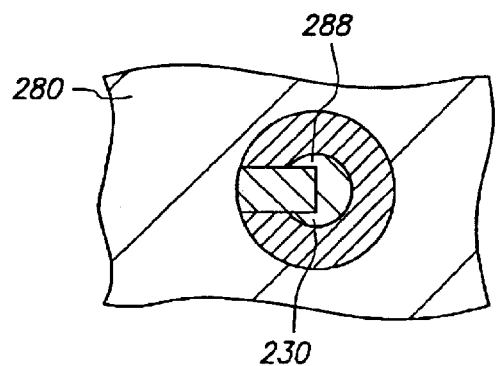
Figure 28F:
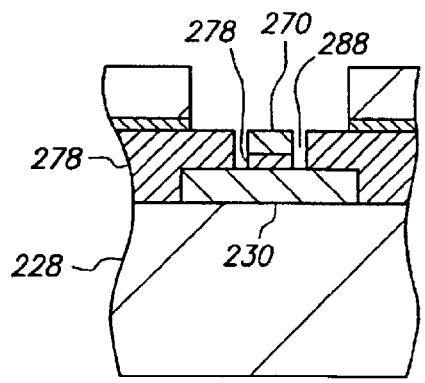

FIGS. 28D, 28E and 28F are enlarged cross-sectional, top and cross-sectional views, respectively, of via 288. FIG. 28F is oriented orthogonally with respect to FIG. 28D. As is seen, via 288 extends through metal base 250 and adhesive 278 to first contact terminal 230 and exposes surface 272 and peripheral sidewalls 276 of conductive trace 270, and adhesive 278 remains in contact with and sandwiched between first contact terminal 230 and conductive trace 270.

Figure 29A:
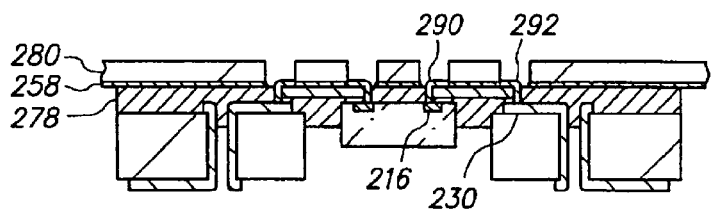
Figure 29B:
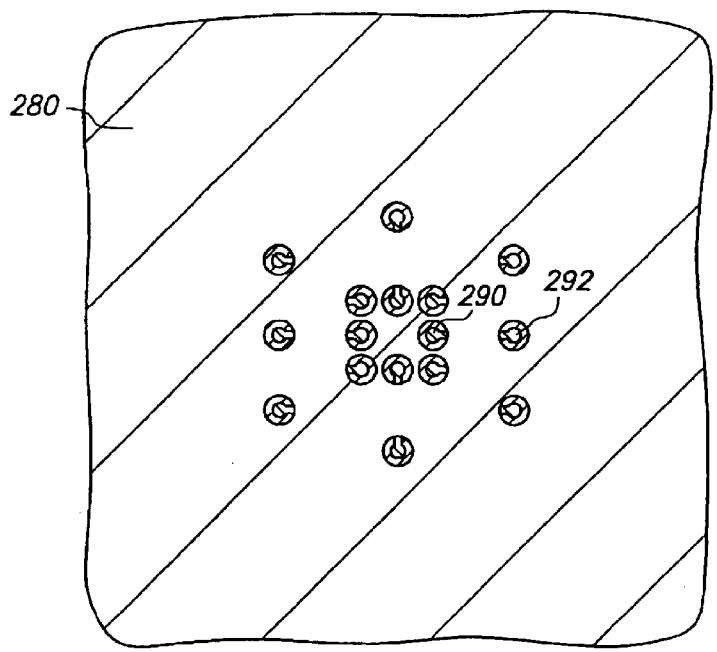
Figure 29C:
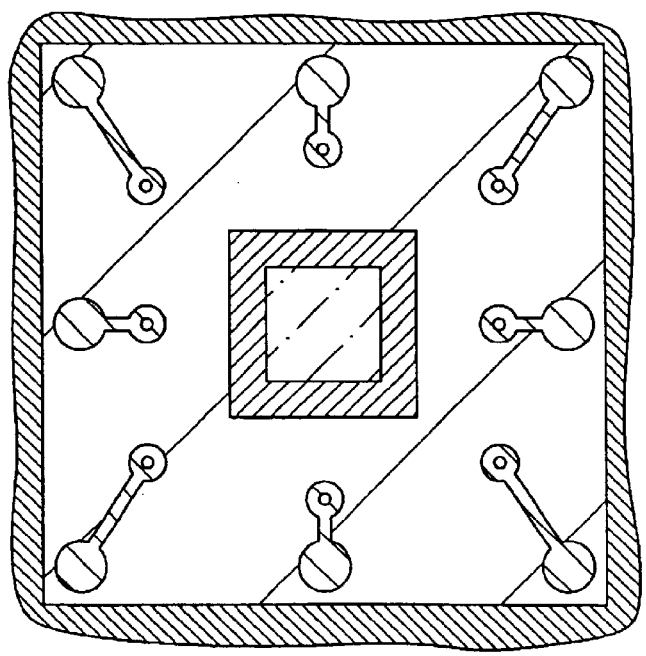

FIGS. 29A, 29B and 29C are cross-sectional, top and bottom views, respectively, of connection joint 290 formed on pad 216, metal base 250 and conductive trace 270, and interconnect 292 formed on first contact terminal 230, metal base 250 and conductive trace 270.

Connection joint 290 and interconnect 292 are formed by an electroplating operation using photoresist layer 280 as a plating mask. Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where the electroplating is desired.

Metal base 250 is connected to a plating bus (not shown), current is applied to the plating bus from an external power source, and the structure is submerged in an electrolytic copper plating solution such as Sel-Rex CUBATH M™ at room temperature. As a result, connection joint 290 begins to plate on metal base 250 and conductive trace 270 in opening 286. However, connection joint 290 does not initially deposit on pad 216 since adhesive 278 is an electrical insulator that cannot supply current from the plating bus to generate electroplating and pad 216 is electrically isolated from the plating bus. Likewise, interconnect 292 begins to plate on metal base 250 and conductive trace 270 in via 288. However, interconnect 292 does not initially deposit on first contact terminal 230 since adhesive 278 is an electrical insulator that cannot supply current from the plating bus to generate electroplating and first contact terminal 230 is electrically isolated from the plating bus.

As the electroplating operation continues, connection joint 290 continues to plate on metal base 250 and conductive trace 270 and expand axially in opening 286 towards pad 216. Eventually connection joint 290 contacts pad 216, and as a result, pad 216 is electrically connected to the plating bus by metal base 250 and connection joint 290, and connection joint 290 begins to plate on pad 216 as well. Likewise, interconnect 292 continues to plate on metal base 250 and conductive trace 270 and expand axially in via 288 towards first contact terminal 230. Eventually interconnect 292 contacts first contact terminal 230, and as a result, first contact terminal 230 is electrically connected to the plating bus by metal base 250 and interconnect 292, and interconnect 292 begins to plate on first contact terminal 230 as well.

The copper electroplating operation continues until connection joint 290 and interconnect 292 are about 15 microns thick. Thereafter, the structure is removed from the electrolytic copper plating solution and rinsed in distilled water.

In this manner connection joint 290 and interconnect 292 are simultaneously formed during a single electroplating operation.

Connection joint 290 extends through opening 286 and contacts and electrically connects pad 216, metal base 250 and conductive trace 270. Likewise, interconnect 292 extends through via 288 and contacts and electrically connects first contact terminal 230, metal base 250 and conductive trace 270. Connection joint 290 and interconnect 292 are composed of copper and are electrically connected to one another by metal base 250 and conductive trace 270, however connection joint 290 and interconnect 292 are spaced and separated from one another. Furthermore, if vertical connection 234, second routing line 236 and second contact terminal 238 are exposed to the electrolytic copper plating solution then a thin copper layer will electroplate on these features as well.

Figure 29D:
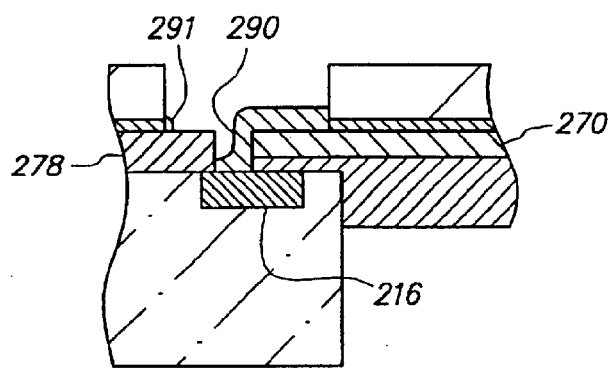
FIGS. 29D, 29E and 29F are enlarged cross-sectional, top and cross-sectional views, respectively, of the connection joint in FIG. 29A.
Figure 29E:
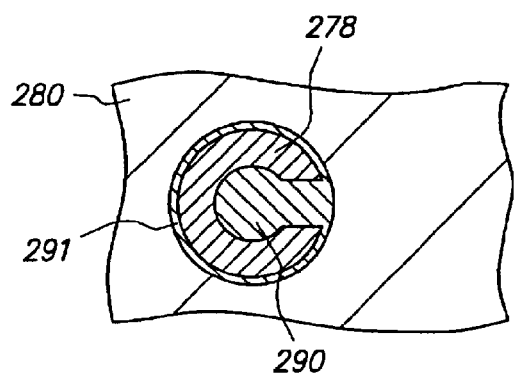
Figure 29F:
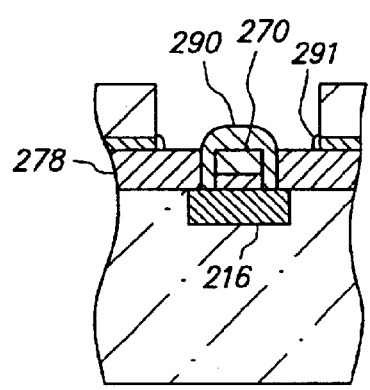

FIGS. 29D, 29E and 29F are enlarged cross-sectional, top and cross-sectional views, respectively, of connection joint 290. FIG. 29F is oriented orthogonally with respect to FIG. 29D. As is seen, connection joint 290 extends through opening 286 and contacts and electrically connects pad 216, metal base 250 and conductive trace 270. Connection joint 290 includes thin C-shaped portion 291 that contacts and extends radially inward from metal base 250, is disposed outside conductive trace 270 and is spaced from opening 286 where opening 286 extends through adhesive 278. Furthermore, connection joint 290 contacts surface 272 and peripheral sidewalls 276 of conductive trace 270, and adhesive 278 remains in contact with and sandwiched between pad 216 and conductive trace 270.

Figure 29G:
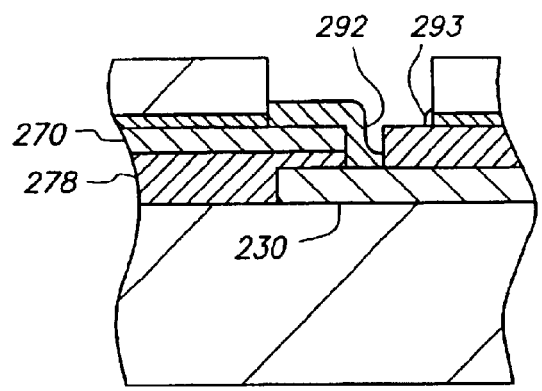
FIGS. 29G, 29H and 29I are enlarged cross-sectional, top and cross-sectional views, respectively, of the interconnect in FIG. 29A.
Figure 29H:
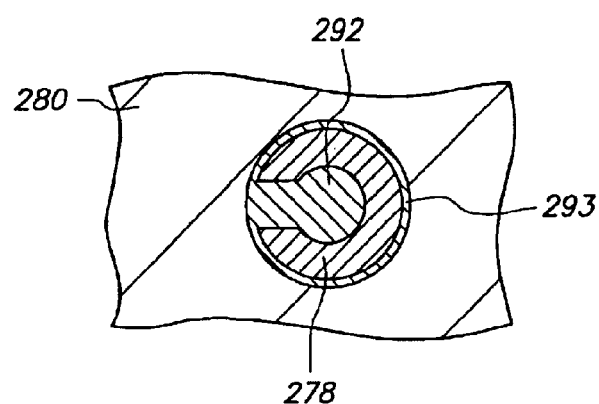
Figure 29I:
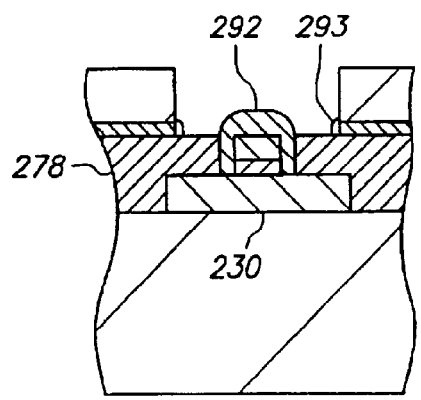

FIGS. 29G, 29H and 29I are enlarged cross-sectional, top and cross-sectional views, respectively, of interconnect 292. FIG. 29I is oriented orthogonally with respect to FIG. 29G. As is seen, interconnect 292 extends through via 288 and contacts and electrically connects first contact terminal 230, metal base 250 and conductive trace 270. Interconnect 292 includes thin C-shaped portion 293 that contacts and extends radially inward from metal base 250, is disposed outside conductive trace 270 and is spaced from via 288 where via 288 extends through adhesive 278. Furthermore, interconnect 292 contacts surface 272 and peripheral sidewalls 276 of conductive trace 270, and adhesive 278 remains in contact with and sandwiched between first contact terminal 230 and conductive trace 270.

Figure 30A:
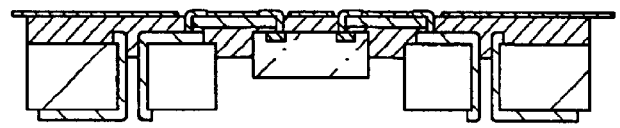
Figure 30B:
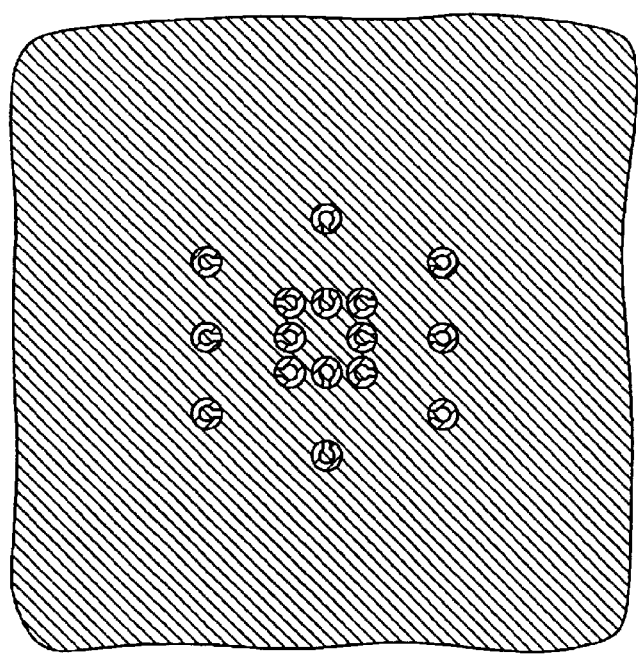
Figure 30C:
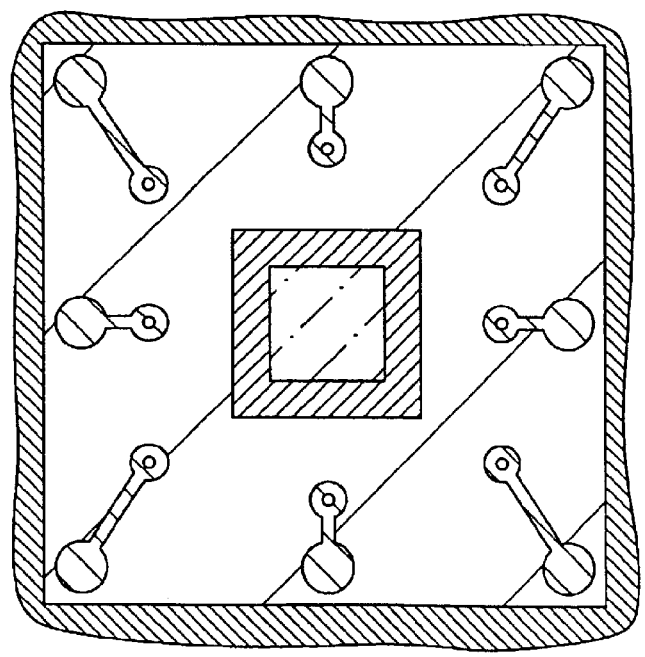

FIGS. 30A, 30B and 30C are cross-sectional, top and bottom views, respectively, of the structure after photoresist layer 280 is stripped. Photoresist layer 280 is removed using a solvent, such as a mild alkaline solution with a pH of 9, that is highly selective of photoresist with respect to copper, nickel, polyimide, epoxy and silicon. Therefore, no appreciable amount of chip 210, substrate 220, metal base 250, conductive trace 270, adhesive 278, connection joint 290 or interconnect 292 is removed.

Figure 31A:
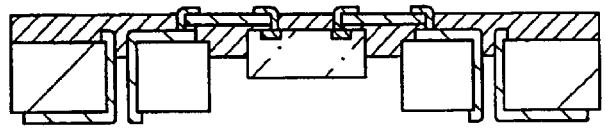
Figure 31B:
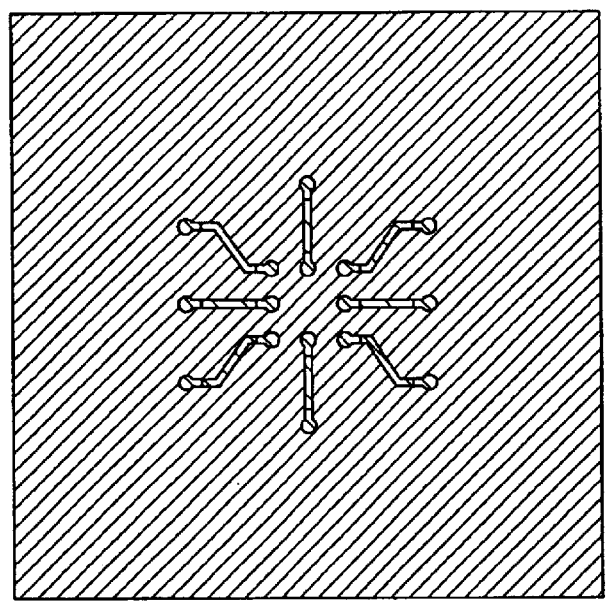
Figure 31C:
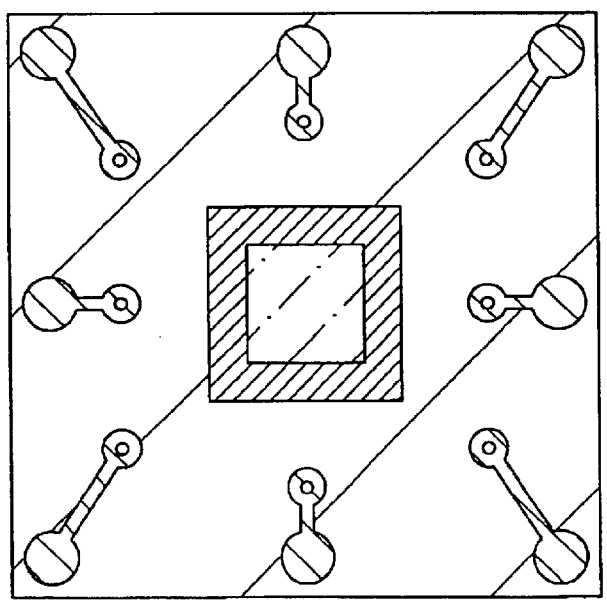

FIGS. 31A, 31B and 31C are cross-sectional, top and bottom views, respectively, of the structure after metal base 250 is removed.

Metal base 250, which at this stage consists of nickel layer 258, is removed using a nickel etching solution, such as a dilute mixture of nitric and hydrochloric acid, that is highly selective of nickel with respect to polyimide, epoxy and silicon. Therefore, no appreciable amount of chip 210, dielectric base 228 or adhesive 278 is removed.

Since nickel layer 258 is extremely thin relative to conductive terminal 226, conductive trace 270, connection joint 290 and interconnect 292, and the structure is removed from the nickel etching solution soon after nickel layer 258 is stripped, it is not critical that the nickel etching solution be highly selective of nickel with respect to copper.

In fact, the nickel etching solution is also selective of copper, and C-shaped portions 291 and 293 are extremely thin relative to conductive terminal 226, conductive trace 270, and the remainder of connection joint 290 and interconnect 292. As a result, the nickel etching solution also removes C-shaped portions 291 and 293 (as well as the other C-shaped portions of the other connection joints and interconnects), which are relatively unimportant byproducts of the electroplating operation that formed connection joint 290 and interconnect 292. However, the nickel etching solution is not applied long enough to appreciably affect the other copper features.

The nickel etching solution has no significant impact on conductive terminal 226, conductive trace 270, connection joint 290 or interconnect 292. In addition, adhesive 278 and connection joint 290 protect pad 216 from the nickel etching solution. The optimal etch time for exposing nickel layer 258 to the wet chemical etch in order to completely remove nickel layer 258 without significantly impacting conductive terminal 226, conductive trace 270, connection joint 290 or interconnect 292 can be established through trial and error.

Removing metal base 250 removes the portions of metal base 250 that contact conductive trace 270, connection joint 290 and interconnect 292. Thus, removing metal base 250 reduces and eliminates contact area between metal base 250 and conductive trace 270, between metal base 250 and connection joint 290, and between metal base 250 and interconnect 292. Furthermore, removing metal base 250 electrically isolates the conductive traces from one another, the connection joints from one another, and the interconnects from one another.

Figure 32A:
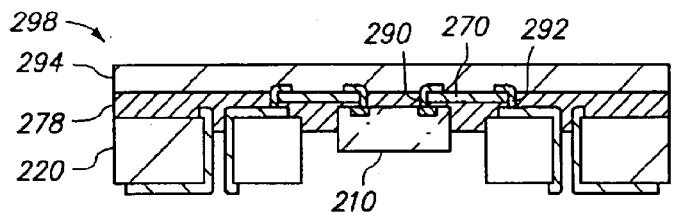
Figure 32B:
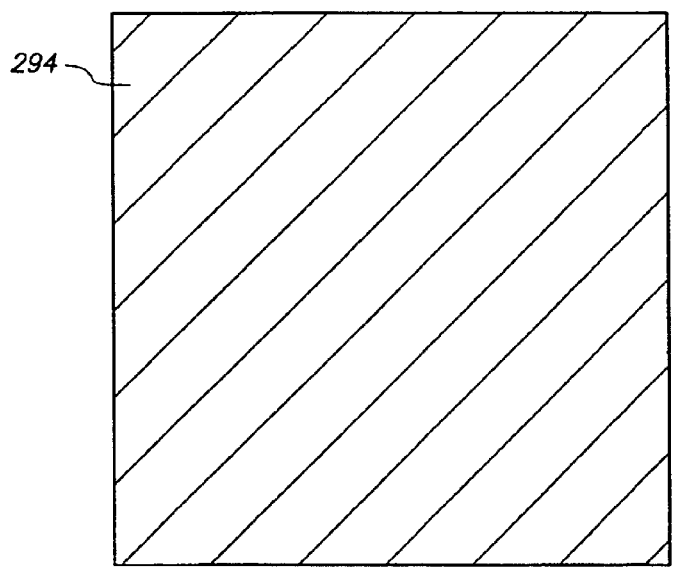
Figure 32C:
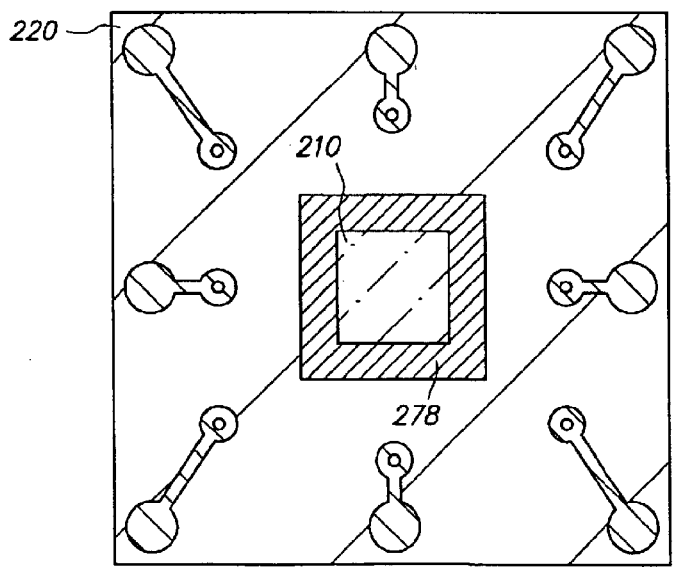

FIGS. 32A, 32B and 32C are cross-sectional, top and bottom views, respectively, of insulative base 294 formed over conductive trace 270, adhesive 278, connection joint 290 and interconnect 292.

At this stage, the manufacture of semiconductor chip assembly 298 that includes chip 210, substrate 220, conductive trace 270, adhesive 278, connection joint 290, interconnect 292 and insulative base 294 can be considered complete.

FIGS. 33A–46A, 33B–46B and 33C–46C are cross-sectional, top and bottom views, respectively, of a method of making a semiconductor chip assembly in accordance with a third embodiment of the present invention. In the third embodiment, a laminated structure that includes the conductive trace, the insulative base and the metal base is mechanically attached to the chip and the substrate, and then the opening and the via are formed through the insulative base and the adhesive. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, substrate 320 corresponds to substrate 120, etc.

Figure 33A:
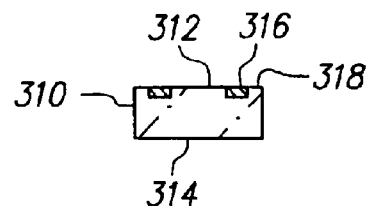
Figure 33B:
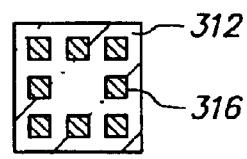
Figure 33C:

FIGS. 33A, 33B and 33C are cross-sectional, top and bottom views, respectively, of semiconductor chip 310 which includes opposing major surfaces 312 and 314. Surface 312 includes conductive pad 316 and passivation layer 318.

Figure 34A:
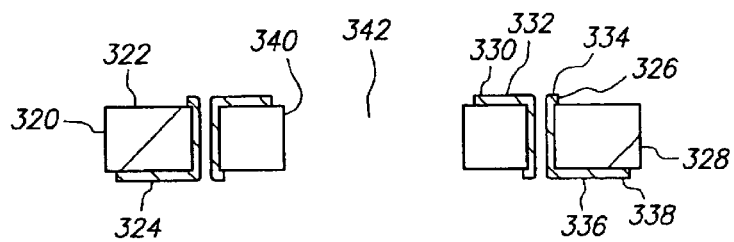
Figure 34B:
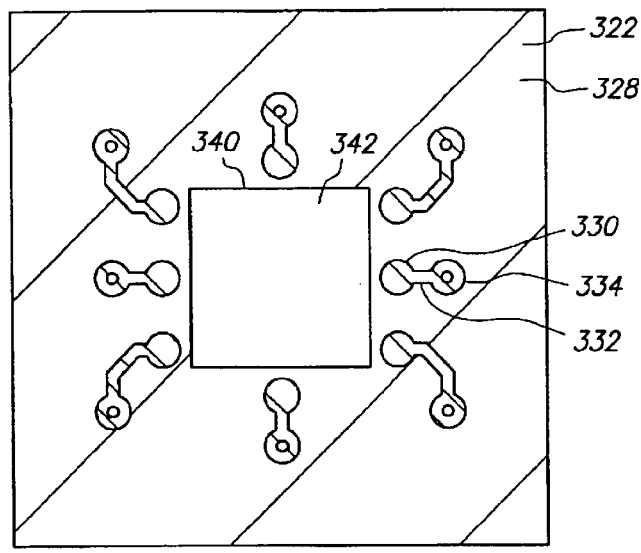
Figure 34C:
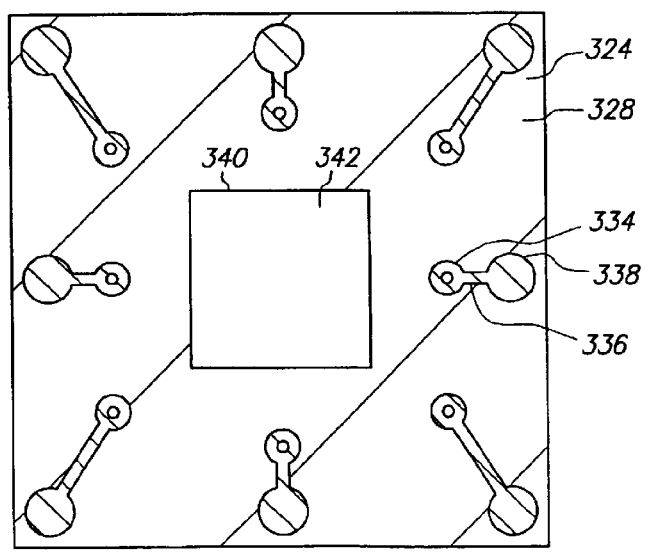

FIGS. 34A, 34B and 34C are cross-sectional, top and bottom views, respectively, of substrate 320 which includes opposing major surfaces 322 and 324, conductive terminal 326 and dielectric base 328. Conductive terminal 326 includes first contact terminal 330, first routing line 332, vertical connection 334, second routing line 336 and second contact terminal 338. Dielectric base 328 includes inner sidewalls 340 that bound cavity 342.

Figure 35A:
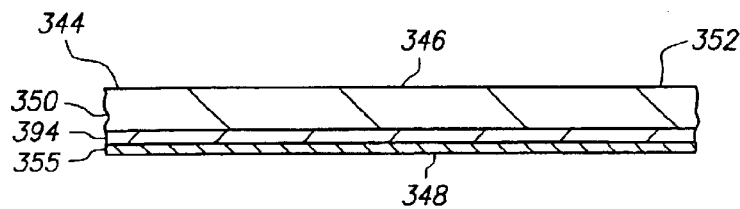
Figure 35B:
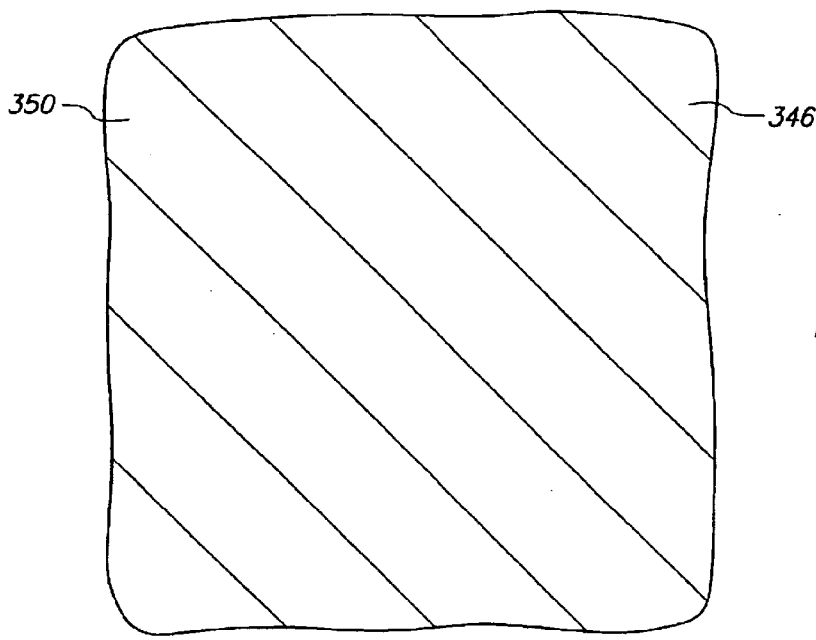
Figure 35C:
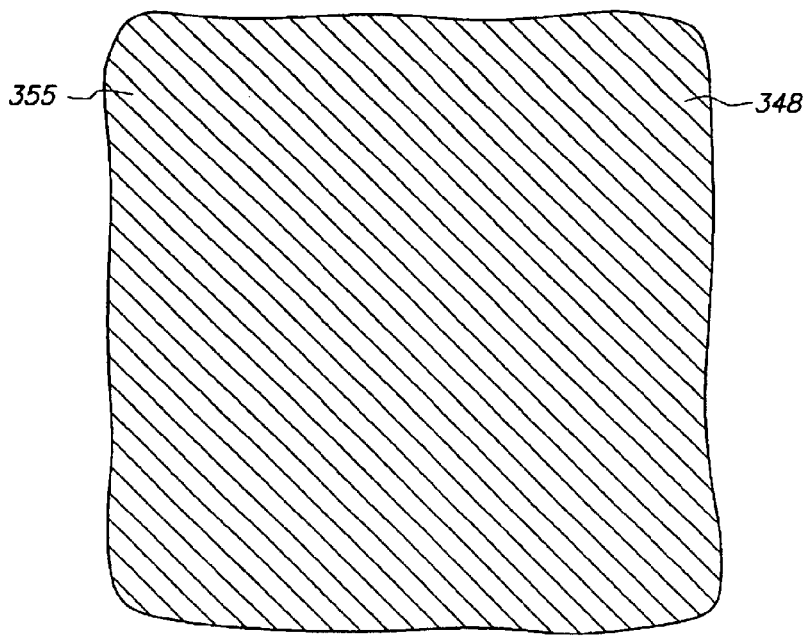

FIGS. 35A, 35B and 35C are cross-sectional, top and bottom views, respectively, of laminated structure 344 which includes opposing major surfaces 346 and 348, metal base 350, metal layer 355 and insulative base 394. Laminated structure 344 is a diclad laminate in which insulative base 394 adhesively attaches metal base 350 and metal layer 355 to one another. Metal base 350 and metal layer 355 are disposed on opposite sides of insulative base 394 and are spaced, separated and electrically isolated from one another. Laminated structure 344 has a length and width across surfaces 346 and 348 that exceeds 40 millimeters. Metal base 350 provides surface 344 (at surface 352), and metal layer 355 provides surface 348. Metal base 350 is identical to metal base 150. Metal layer 355 is a copper foil with a thickness of 12 microns. Insulative base 394 is a polyimide layer with a thickness of 25 microns. Thus, insulative base 394 has a different composition and is longer, wider and thinner than insulative base 194.

Figure 36A:
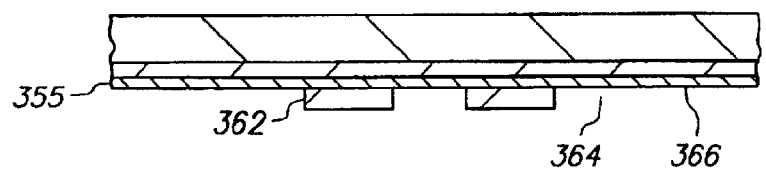
Figure 36B:
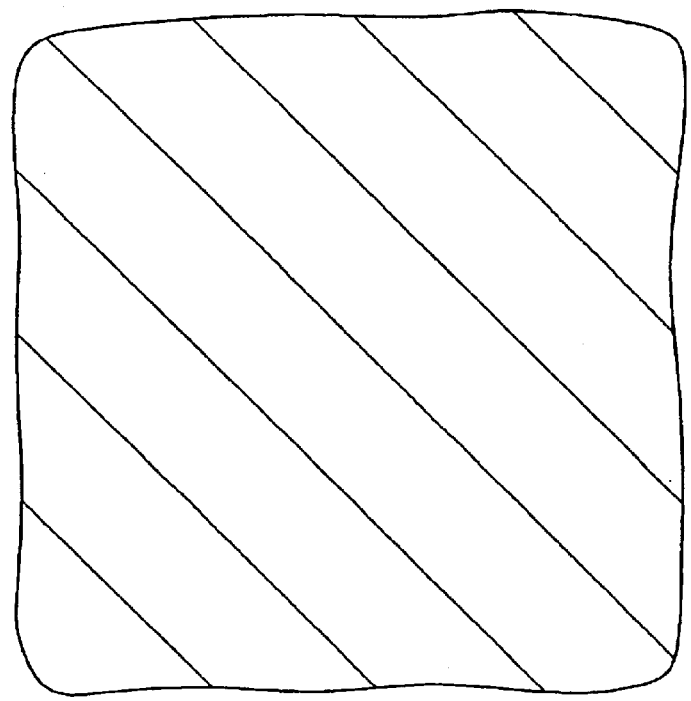
Figure 36C:
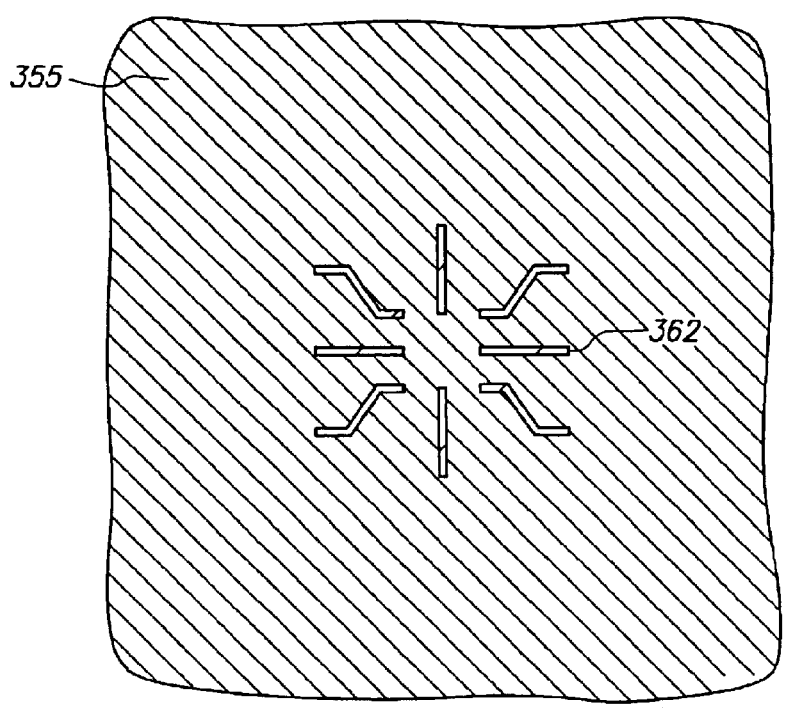

FIGS. 36A, 36B and 36C are cross-sectional, top and bottom views, respectively, of photoresist layer 362 formed on metal layer 355. Photoresist layer 362 contains opening 364 that selectively exposes portion 366 of surface 348. Furthermore, photoresist layer 362 is essentially a mirror image of photoresist layer 162. That is, photoresist layer 362 provides coverage where photoresist layer 162 provides exposure and vice-versa.

Figure 37A:
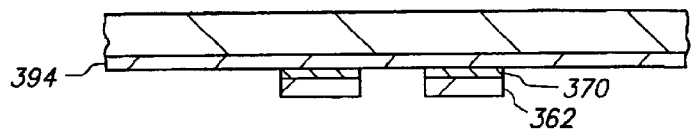
Figure 37B:
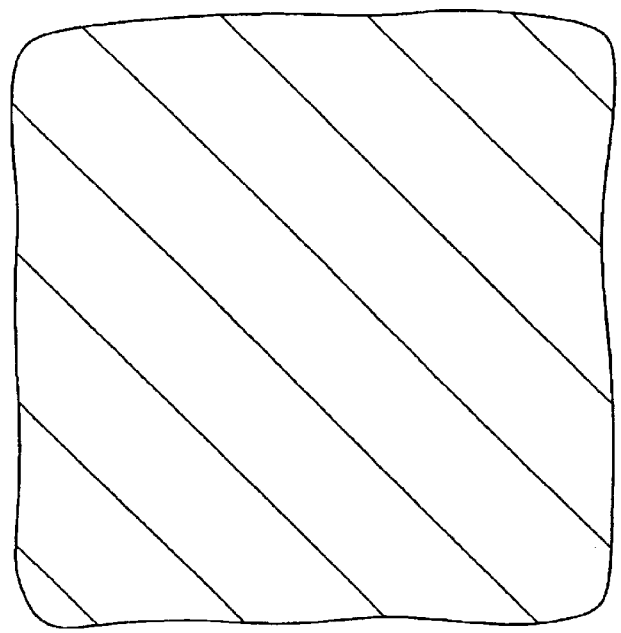
Figure 37C:
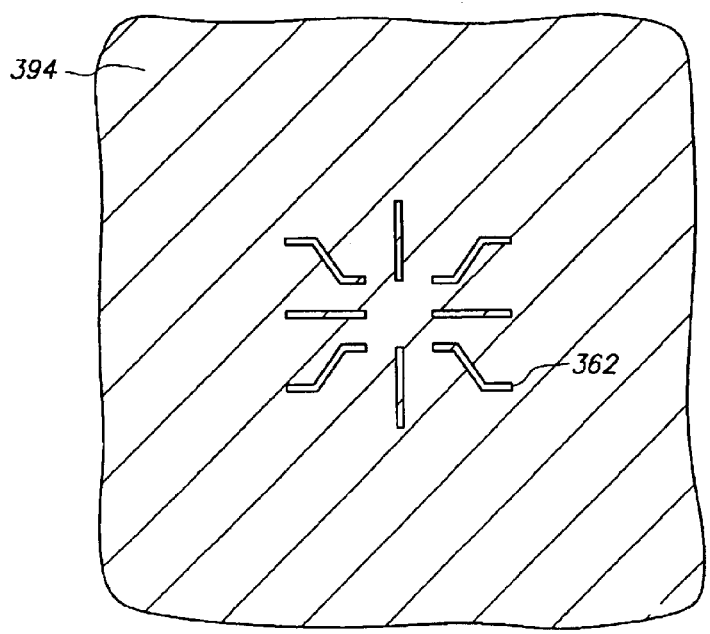

FIGS. 37A, 37B and 37C are cross-sectional, top and bottom views, respectively, of conductive trace 370 formed from metal layer 355 by wet chemical etching using photoresist layer 362 as an etch mask. A "back-side" wet chemical etch is applied to surface 348 of laminated structure 344. For instance, the wet chemical etch can be sprayed on surface 348, or a protective mask can be deposited on surface 346 and then the structure can be dipped in the wet chemical etch. The wet chemical etch is highly selective of copper with respect to polyimide. Therefore, no appreciable amount of insulative base 394 is removed. A suitable wet chemical etch can be provided by a solution containing alkaline ammonia. The optimal etch time for exposing metal layer 355 to the wet chemical etch without significantly undercutting conductive trace 370 can be established through trial and error.

The wet chemical etch etches completely through metal layer 355, thereby effecting a pattern transfer of photoresist layer 362 onto metal layer 355. Conductive trace 370 constitutes a remaining or unetched portion of metal layer 355 after the wet chemical etch is applied.

Figure 38A:
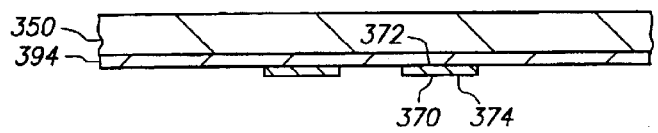
Figure 38B:
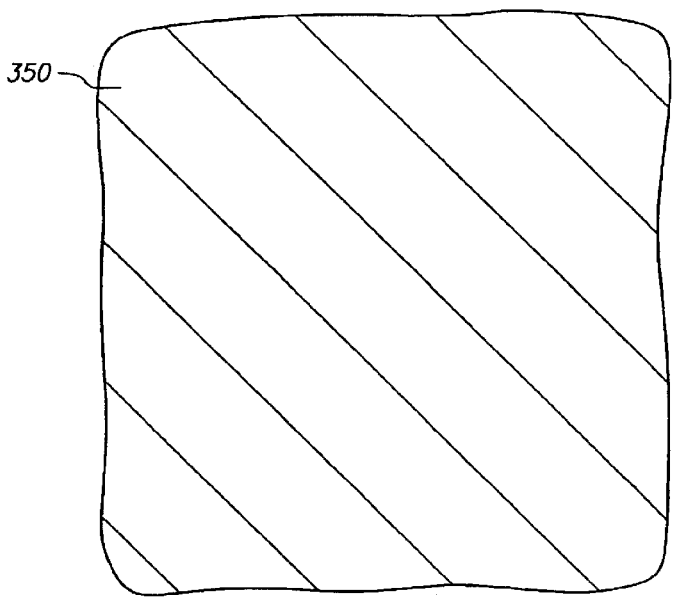
Figure 38C:
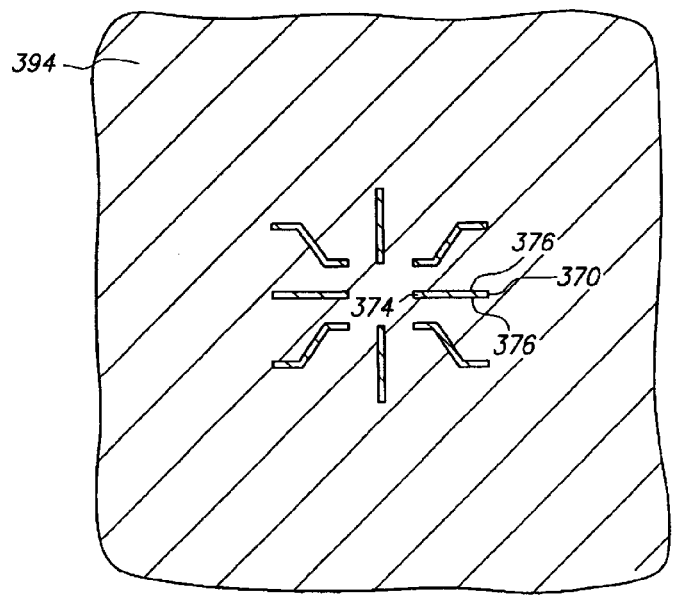

Conductive trace 370 includes opposing major surfaces 372 and 374 and peripheral sidewalls 376 (FIGS. 38A and 38C). Conductive trace 370 is composed of copper and is 12 microns thick. Thus, conductive trace 370 is identical to conductive trace 170 except that conductive trace 370 lacks the nickel layer in conductive trace 170 and conductive trace 370 has tapered sidewalls due to undercutting by the wet chemical etch.

The conductive traces are electrically isolated from one another since metal base 350 does not electrically connect the conductive traces.

FIGS. 38A, 38B and 38C are cross-sectional, top and bottom views, respectively, of metal base 350, conductive trace 370 and insulative base 394 after photoresist layer 362 is stripped.

Figure 39A:
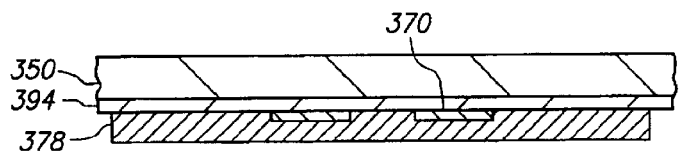
Figure 39B:
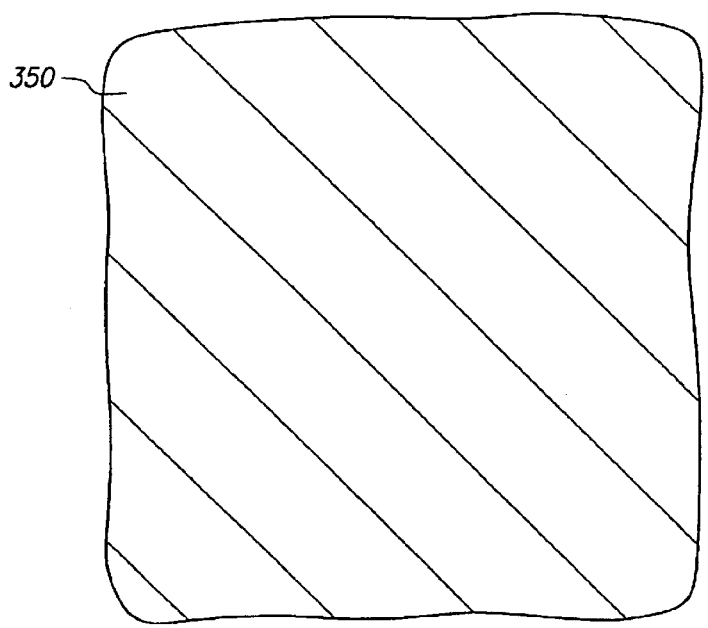
Figure 39C:
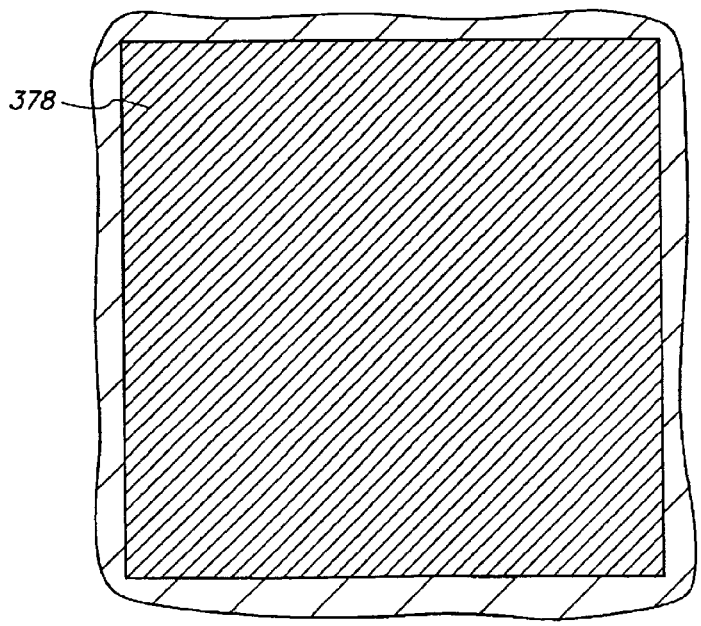

FIGS. 39A, 39B and 39C are cross-sectional, top and bottom views, respectively, of adhesive 378 formed on conductive trace 370 and insulative base 394. Adhesive 378 is spaced and separated from metal base 350.

Figure 40A:
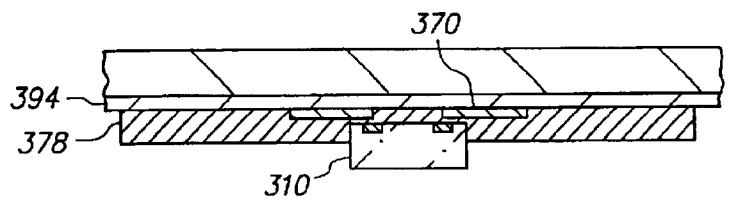
Figure 40B:
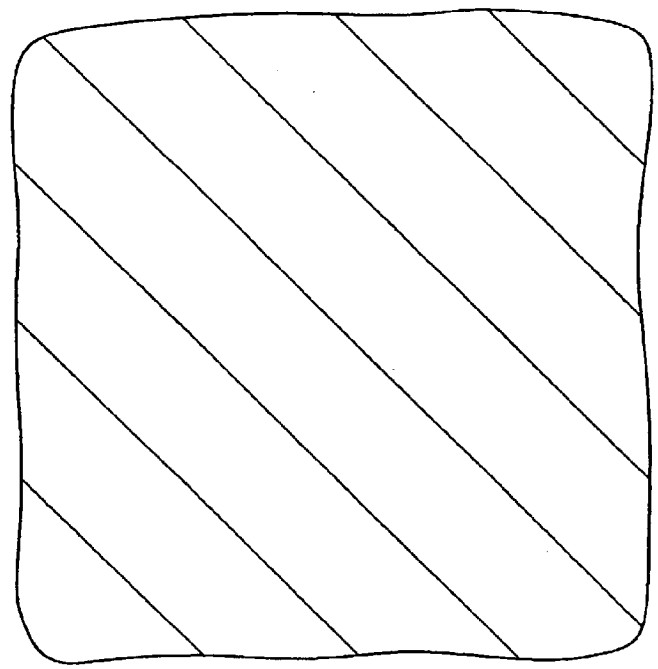
Figure 40C:
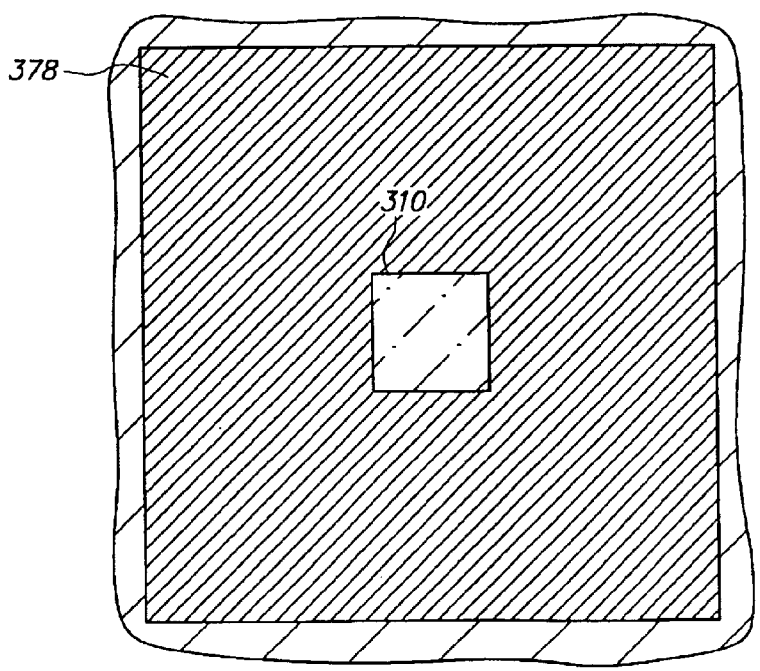

FIGS. 40A, 40B and 40C are cross-sectional, top and bottom views, respectively, of chip 310 mechanically attached to conductive trace 370 and insulative base 394 by adhesive 378.

Figure 41A:
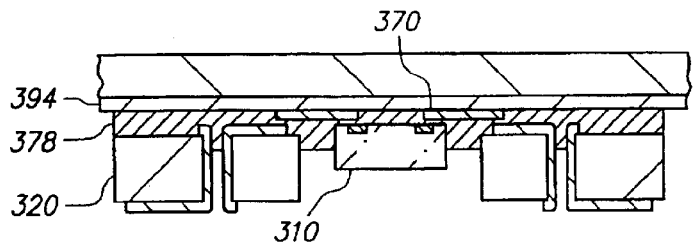
Figure 41B:
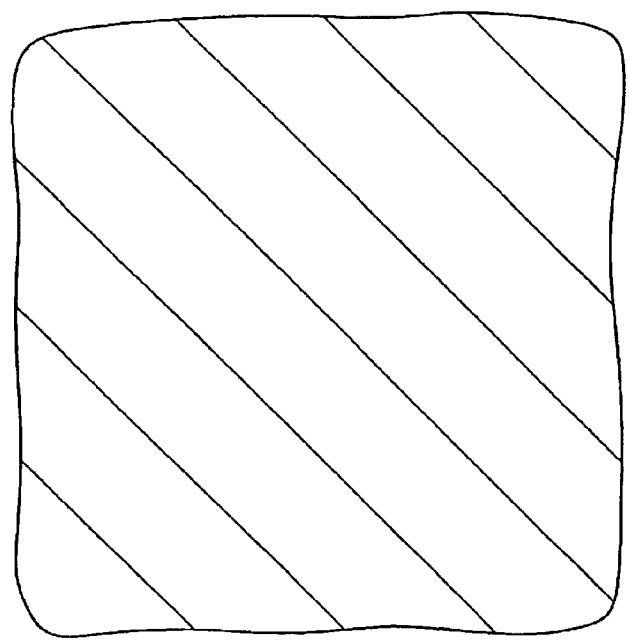
Figure 41C:
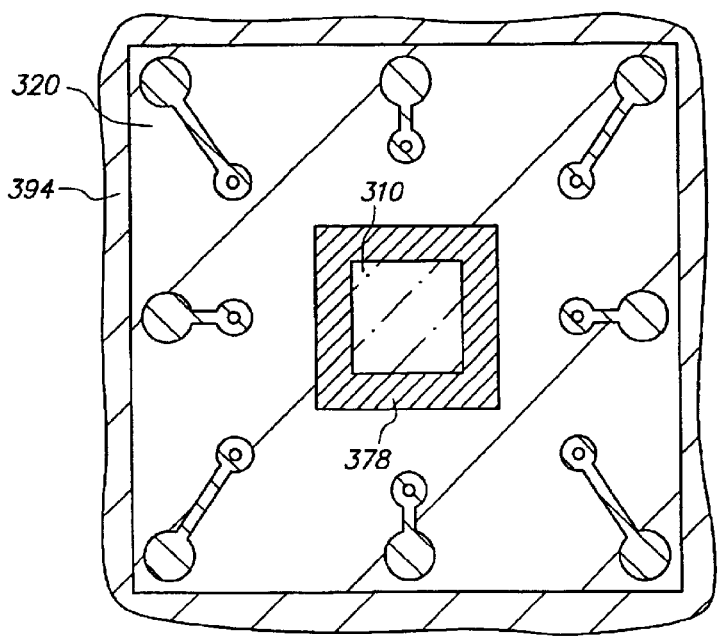

FIGS. 41A, 41B and 41C are cross-sectional, top and bottom views, respectively, of chip 310, conductive trace 370 and insulative base 394 mechanically attached to substrate 320 by adhesive 378.

Figure 42A:
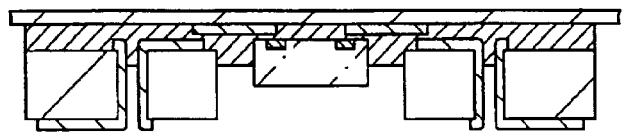
Figure 42B:
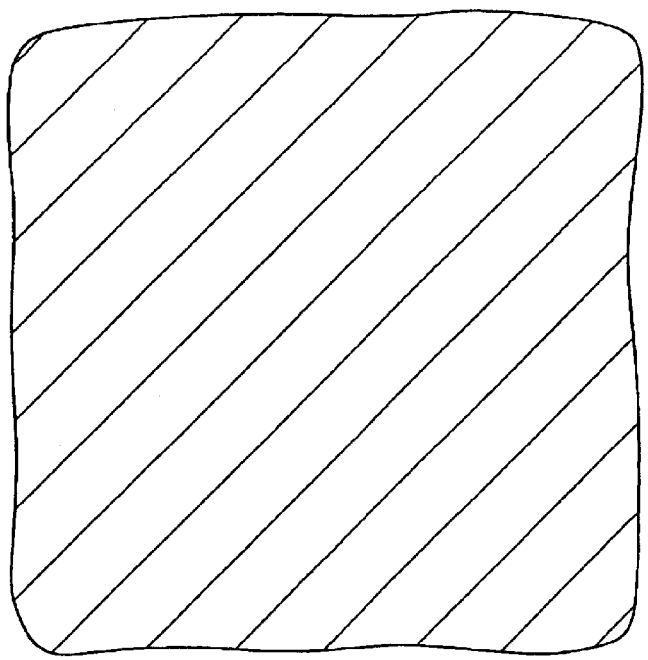
Figure 42C:
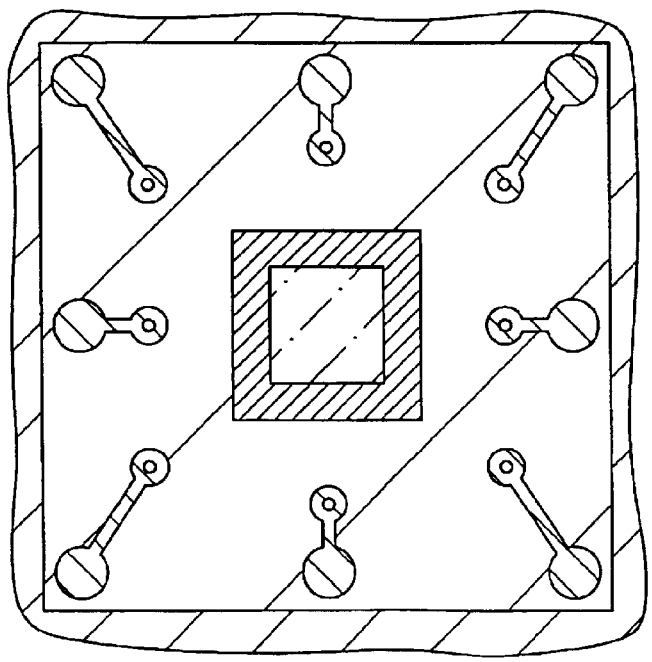

FIGS. 42A, 42B and 42C are cross-sectional, top and bottom views, respectively, of the structure after metal base 350 is removed. Metal base 350 is removed in the same manner that metal base 150 is removed. Namely, a wet chemical etch is applied to surface 352 of metal base 350 using a solution containing alkaline ammonia that is highly selective of copper with respect to polyimide. Therefore, no appreciable amount of insulative base 394 is removed. In addition, conductive trace 370 is protected from the wet chemical etch by insulative base 394.

Figure 43A:
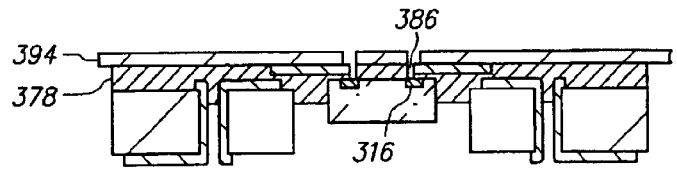
Figure 43B:
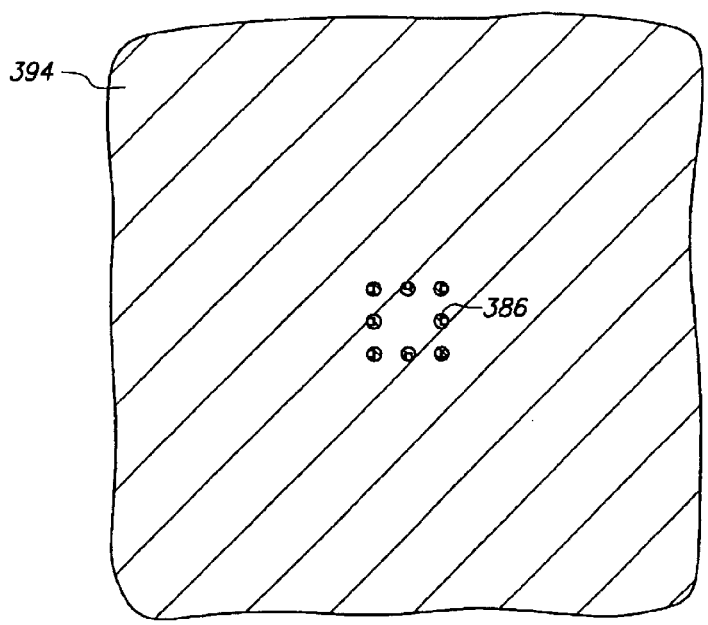
Figure 43C:
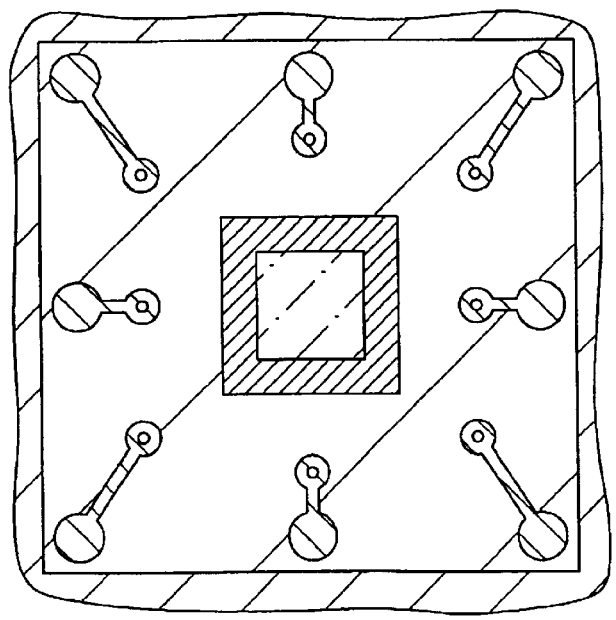

FIGS. 43A, 43B and 43C are cross-sectional, top and bottom views, respectively, of opening 386 that is formed through adhesive 378 and insulative base 394 and exposes pad 316.

Opening 386 is formed through adhesive 378 and insulative base 394 in essentially the same manner as opening 186. Namely, a selective TEA $CO_2$ laser etch is directed at and axially aligned with and centered relative to pad 316. The laser has a spot size of 70 microns, and pad 316 has a length and width of 100 microns. As a result, the laser strikes pad 316 and portions of conductive trace 370, adhesive 378 and insulative base 394 that overlap pad 316 and ablates adhesive 378 and insulative base 394.

The laser drills through and removes portions of adhesive 378 and insulative base 394. However, portions of adhesive 378 and insulative base 394 that overlap the peripheral edges of pad 316 are outside the scope of the laser and remain intact. Likewise, conductive trace 370 shields the underlying adhesive 378 from the laser etch, and portions of adhesive 378 sandwiched between pad 316 and conductive trace 370 remain intact.

Opening 386 is formed in and extends vertically through adhesive 378 and insulative base 394, is axially aligned with and centered relative to and exposes pad 316 and has a diameter of 70 microns.

Figure 43D:
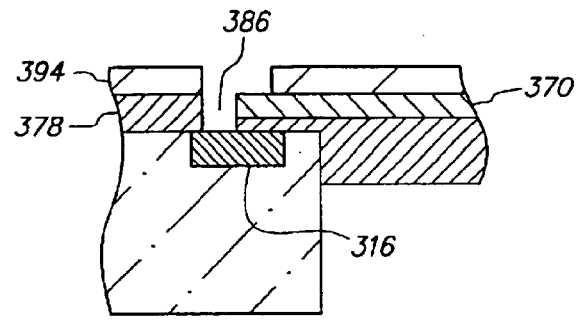
FIGS. 43D, 43E and 43F are enlarged cross-sectional, top and cross-sectional views, respectively, of the opening in FIG. 43A.
Figure 43E:
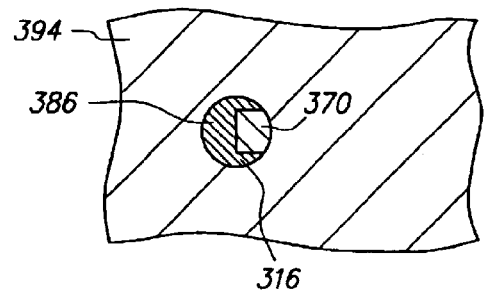
Figure 43F:
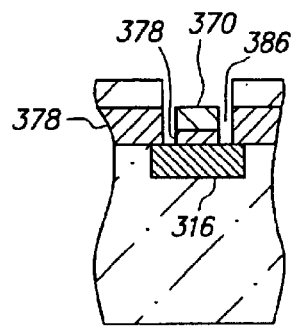

FIGS. 43D, 43E and 43F are enlarged cross-sectional, top and cross-sectional views, respectively, of opening 386. FIG. 43F is oriented orthogonally with respect to FIG. 43D. As is seen, opening 386 extends through adhesive 378 and insulative base 394 to pad 316 and exposes surface 372 and peripheral sidewalls 376 of conductive trace 370, and adhesive 378 remains in contact with and sandwiched between pad 316 and conductive trace 370.

Figure 44A:
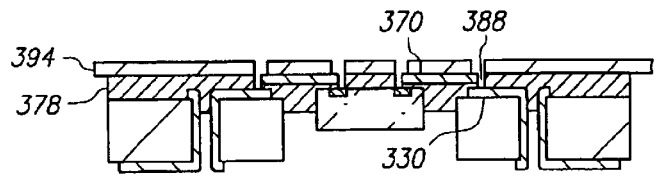
Figure 44B:
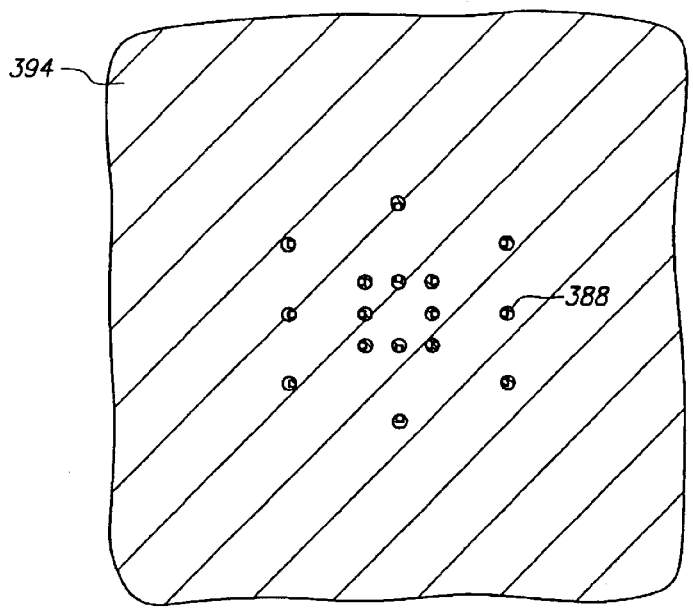
Figure 44C:
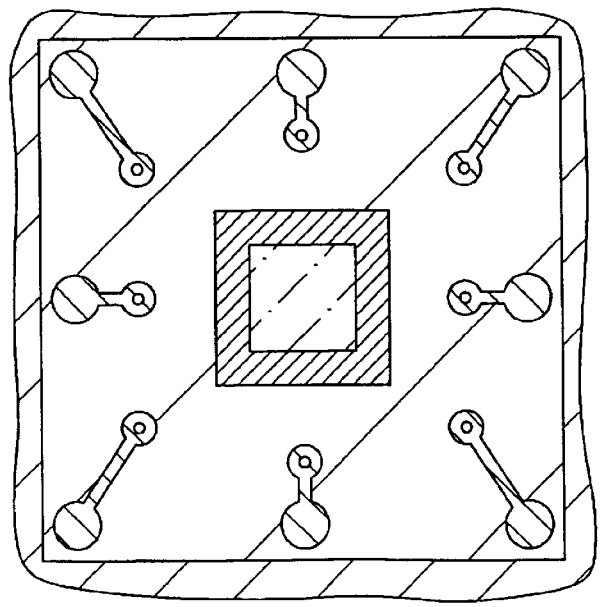

FIGS. 44A, 44B and 44C are cross-sectional, top and bottom views, respectively, of via 388 that is formed through adhesive 378 and insulative base 394 and exposes first contact terminal 330.

Via 388 is formed through adhesive 378 and insulative base 394 in essentially the same manner as via 188. Namely, a selective TEA $CO_2$ laser etch is directed at and axially aligned with and centered relative to first contact terminal 330. The laser has a spot size of 70 microns, and first contact terminal 330 has a diameter of 200 microns. As a result, the laser strikes first contact terminal 330 and portions of conductive trace 370, adhesive 378 and insulative base 394 that overlap first contact terminal 330 and ablates adhesive 378 and insulative base 394.

The laser drills through and removes portions of adhesive 378 and insulative base 394. However, portions of adhesive 378 that overlap the peripheral edges of first contact terminal 330 are outside the scope of the laser and remain intact. Likewise, conductive trace 370 shields the underlying adhesive 378 from the laser etch, and portions of adhesive 378 sandwiched between first contact terminal 330 and conductive trace 370 remain intact.

Via 388 is formed in and extends vertically through adhesive 378 and insulative base 394 is axially aligned with and centered relative to and exposes first contact terminal 330 and has a diameter of 70 microns.

Figure 44D:
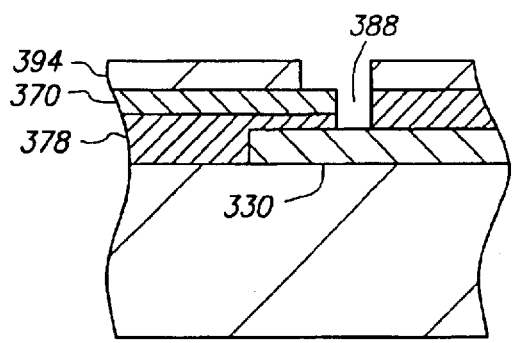
FIGS. 44D, 44E and 44F are enlarged cross-sectional, top and cross-sectional views, respectively, of the via in FIG. 44A.
Figure 44E:
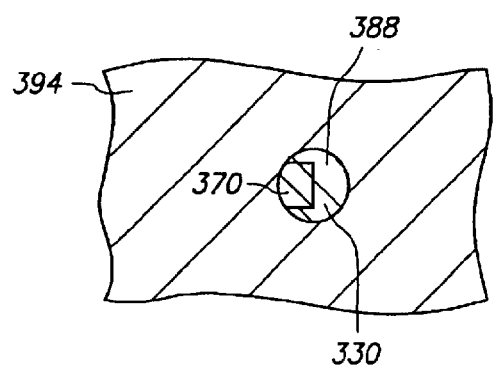
Figure 44F:
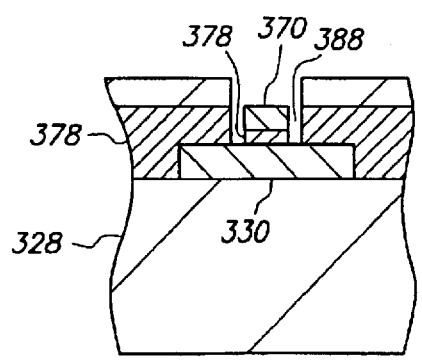

FIGS. 44D, 44E and 44F are enlarged cross-sectional, top and cross-sectional views, respectively, of via 388. FIG. 44F is oriented orthogonally with respect to FIG. 44D. As is seen, via 388 extends through adhesive 378 and insulative base 394 to first contact terminal 330 and exposes surface 372 and peripheral sidewalls 376 of conductive trace 370, and adhesive 378 remains in contact with and sandwiched between first contact terminal 330 and conductive trace 370.

Figure 45A:
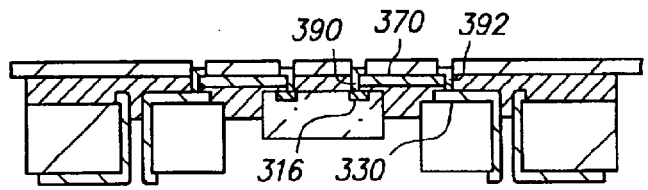
Figure 45B:
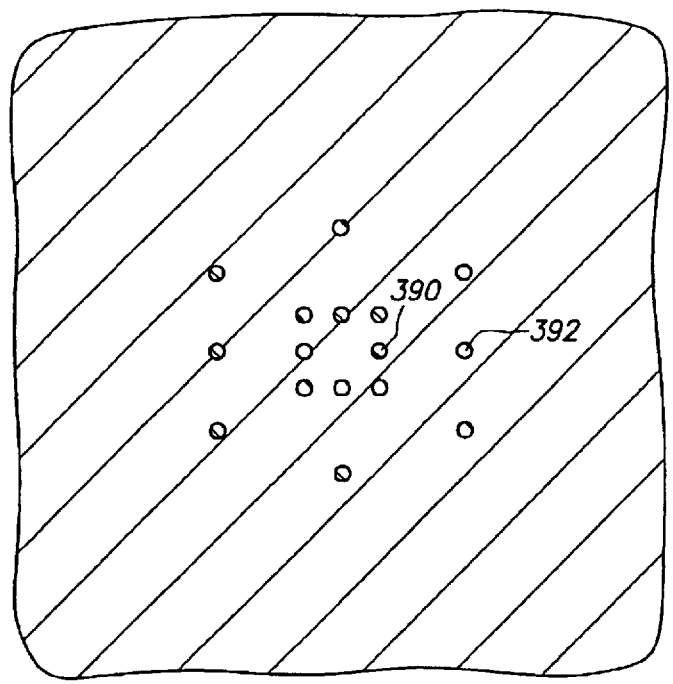
Figure 45C:
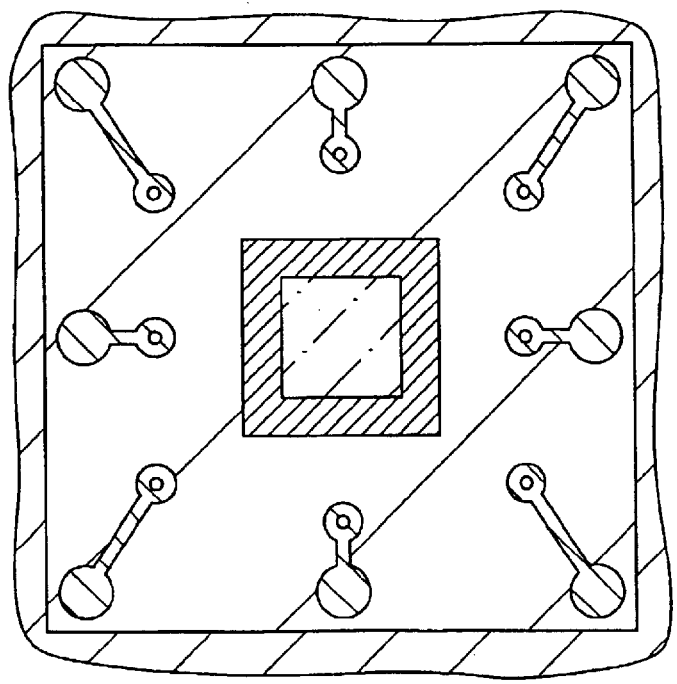

FIGS. 45A, 45B and 45C are cross-sectional, top and bottom views, respectively, of connection joint 390 formed on pad 316 and conductive trace 370, and interconnect 392 formed on first contact terminal 330 and conductive trace 370.

Connection joint 390 and interconnect 392 are formed by an electroless plating operation.

The structure is submerged in an electroless nickel plating solution such as Enthone Enplate NI-424 at 85° C. As a result, connection joint 390 begins to plate on pad 316. However, connection joint 390 does not initially deposit on conductive trace 370 since conductive trace 370 is copper and is not catalytic to electroless nickel. Likewise, interconnect 392 does not initially deposit on first contact terminal 330 or conductive trace 370 since conductive terminal 326 and conductive trace 370 are copper.

As the electroless plating operation continues, connection joint 390 continues to plate on pad 316 and expand axially in opening 386 towards conductive trace 370. Eventually connection joint 390 contacts conductive trace 370 and changes the electrochemical potential of conductive trace 370 by a small amount such as 0.2 volts. As a result, conductive trace 370 becomes catalytic to electroless nickel, and connection joint 390 and interconnect 392 begin to plate on conductive trace 370 as well.

As the electroless plating operation continues, interconnect 392 continues to plate on conductive trace 370 and expand axially in via 388 towards first contact terminal 330. Eventually interconnect 392 contacts first contact terminal 330 and changes the electrochemical potential of first contact terminal 330 by a small amount such as 0.2 volts. As a result, first contact terminal 330 becomes catalytic to electroless nickel, and interconnect 392 begins to plate on first contact terminal 330 as well.

The nickel electroless plating operation continues until connection joint 390 and interconnect 392 are about 15 microns thick. Connection joint 390 is slightly thicker than interconnect 392 due to the head-start during the electroless plating operation. Thereafter, the structure is removed from the electroless nickel plating solution and rinsed in distilled water.

In this manner connection joint 390 and interconnect 392 are simultaneously formed during a single electroless plating operation.

Connection joint 390 extends into but not through opening 386 and contacts and electrically connects pad 316 and conductive trace 370. Likewise, interconnect 392 extends into but not through via 388 and contacts and electrically connects first contact terminal 330 and conductive trace 370. Connection joint 390 and interconnect 392 are electrically connected to one another by conductive trace 370, however connection joint 390 and interconnect 392 are spaced and separated from one another.

Figure 45D:
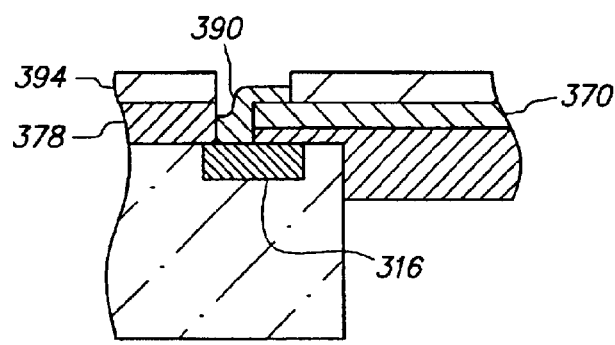
FIGS. 45D, 45E and 45F are enlarged cross-sectional, top and cross-sectional views, respectively, of the connection joint in FIG. 45A.
Figure 45E:
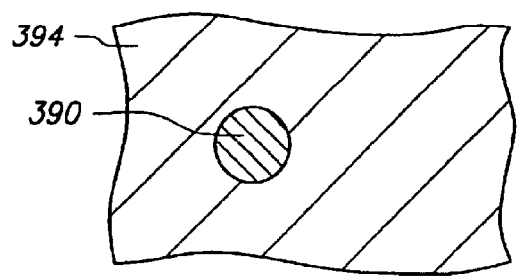
Figure 45F:
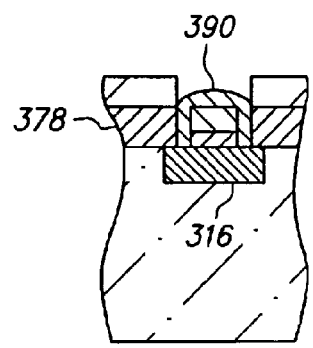

FIGS. 45D, 45E and 45F are enlarged cross-sectional, top and cross-sectional views, respectively, of connection joint 390. FIG. 45F is oriented orthogonally with respect to FIG. 45D. As is seen, connection joint 390 extends into opening 386 and contacts and electrically connects pad 316 and conductive trace 370. Furthermore, connection joint 390 contacts surface 372 and peripheral sidewalls 376 of conductive trace 370, and adhesive 378 remains in contact with and sandwiched between pad 316 and conductive trace 370.

Figure 45G:
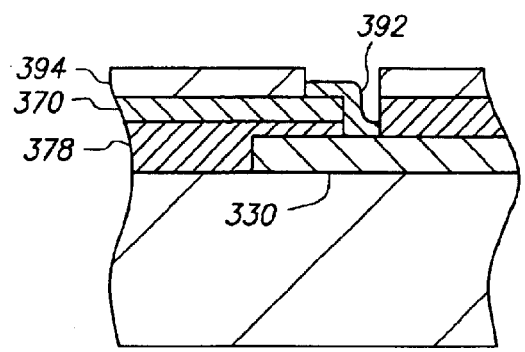
FIGS. 45G, 45H and 45I are enlarged cross-sectional, top and cross-sectional views, respectively, of the interconnect in FIG. 45A.
Figure 45H:
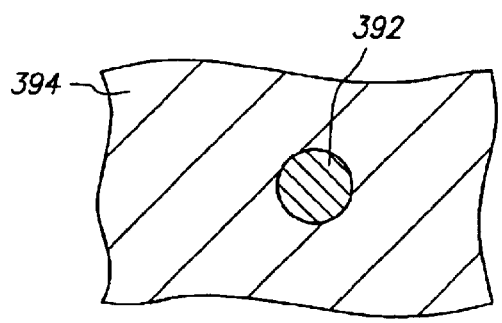
Figure 45I:
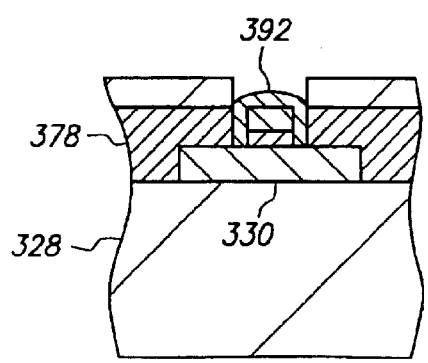

FIGS. 45G, 45H and 45I are enlarged cross-sectional, top and cross-sectional views, respectively, of interconnect 392. FIG. 45I is oriented orthogonally with respect to FIG. 45G. As is seen, interconnect 392 extends into via 388 and contacts and electrically connects first contact terminal 330 and conductive trace 370. Furthermore, interconnect 392 contacts surface 372 and peripheral sidewalls 376 of conductive trace 370, and adhesive 378 remains in contact with and sandwiched between first contact terminal 330 and conductive trace 370.

Figure 46A:
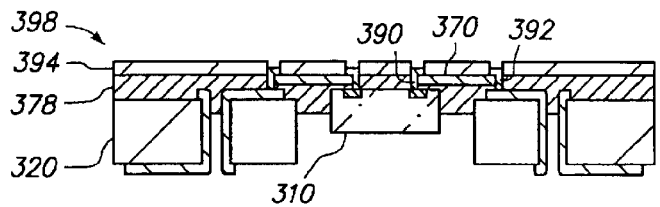
Figure 46B:
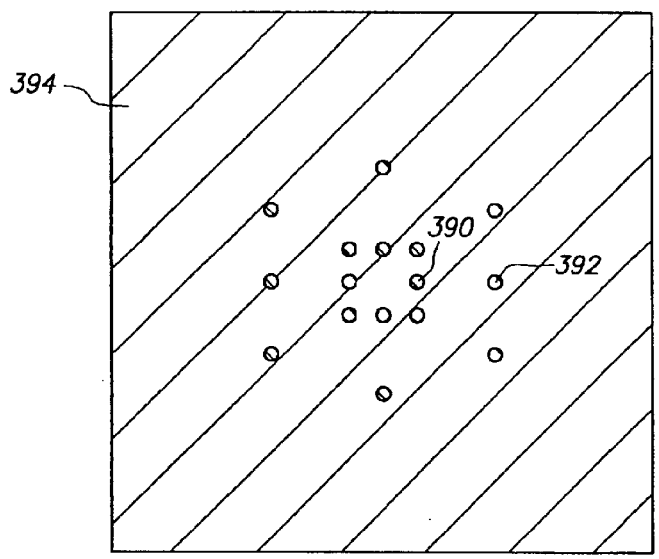
Figure 46C:
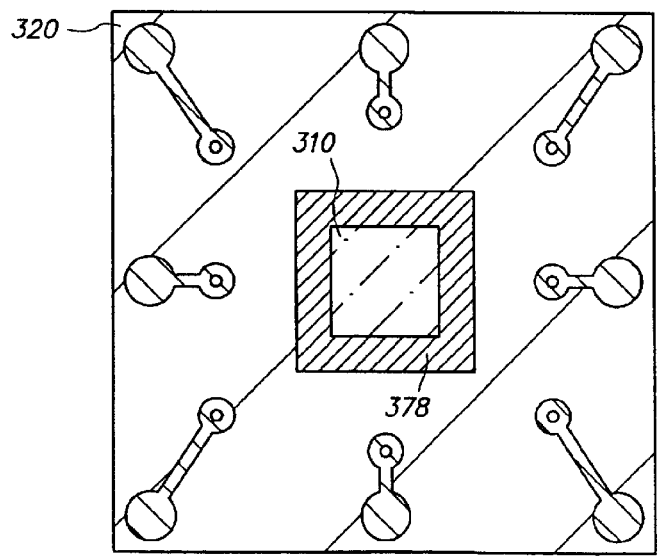

FIGS. 46A, 46B and 46C are cross-sectional, top and bottom views, respectively, of the structure after cutting insulative base 394 with an excise blade so that the peripheral edges of substrate 320 and insulative base 394 are aligned with one another.

At this stage, the manufacture of semiconductor chip assembly 398 that includes chip 310, substrate 320, conductive trace 370 adhesive 378, connection joint 390, interconnect 392 and insulative base 394 can be considered complete.

FIGS. 47A–61A, 47B–61B and 47C–61C are cross-sectional, top and bottom views, respectively, of a method of making a semiconductor chip assembly in accordance with a fourth embodiment of the present invention. In the fourth embodiment, the adhesive includes a first adhesive disposed between the conductive trace and the chip and a second adhesive disposed between the conductive trace and the substrate, and the second adhesive contacts the conductive trace and then the substrate. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, substrate 420 corresponds to substrate 120, etc.

Figure 47A:
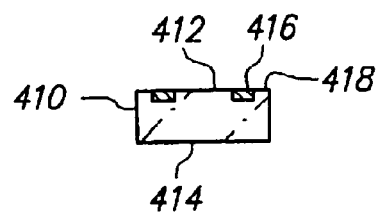
Figure 47B:
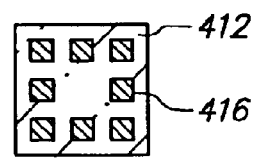
Figure 47C:
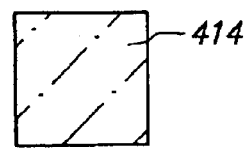

FIGS. 47A, 47B and 47C are cross-sectional, top and bottom views, respectively, of semiconductor chip 410 which includes opposing major surfaces 412 and 414. Surface 412 includes conductive pad 416 and passivation layer 418.

Figure 48A:
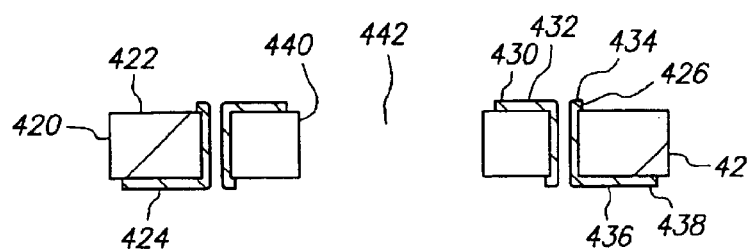
Figure 48B:
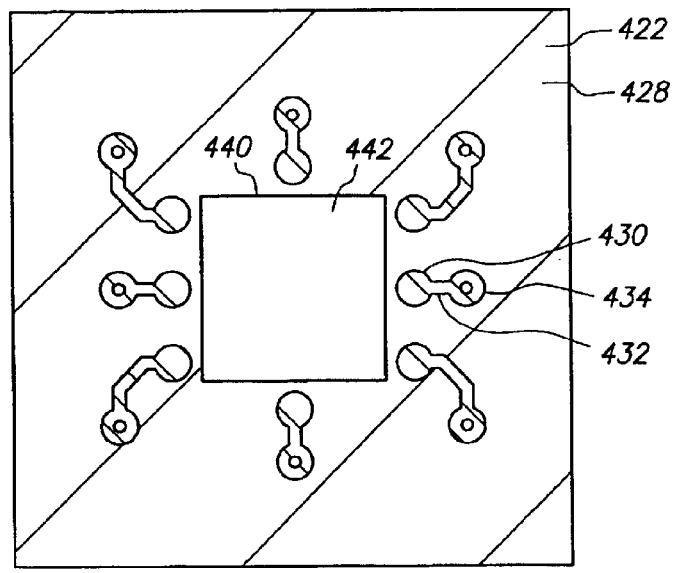
Figure 48C:
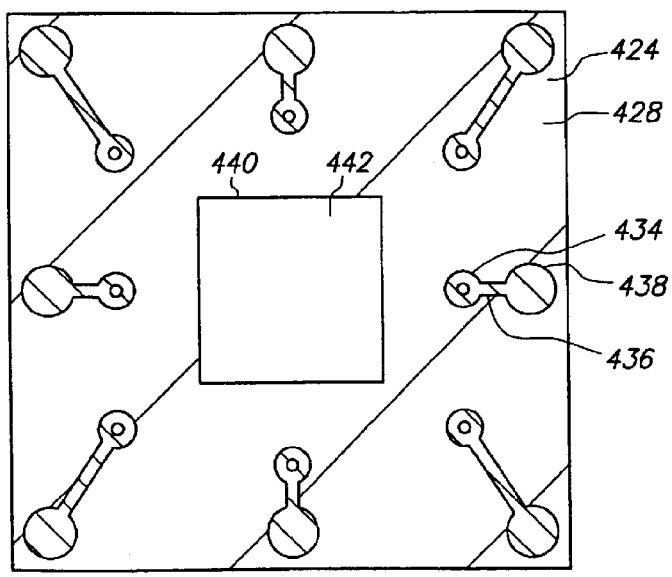

FIGS. 48A, 48B and 48C are cross-sectional, top and bottom views, respectively, of substrate 420 which includes opposing major surfaces 422 and 424, conductive terminal 426 and dielectric base 428. Conductive terminal 426 includes first contact terminal 430, first routing line 432, vertical connection 434, second routing line 436 and second contact terminal 438. Dielectric base 428 includes inner sidewalls 440 that bound cavity 442.

Figure 49A:
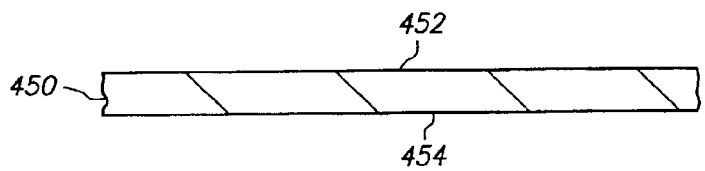
Figure 49B:
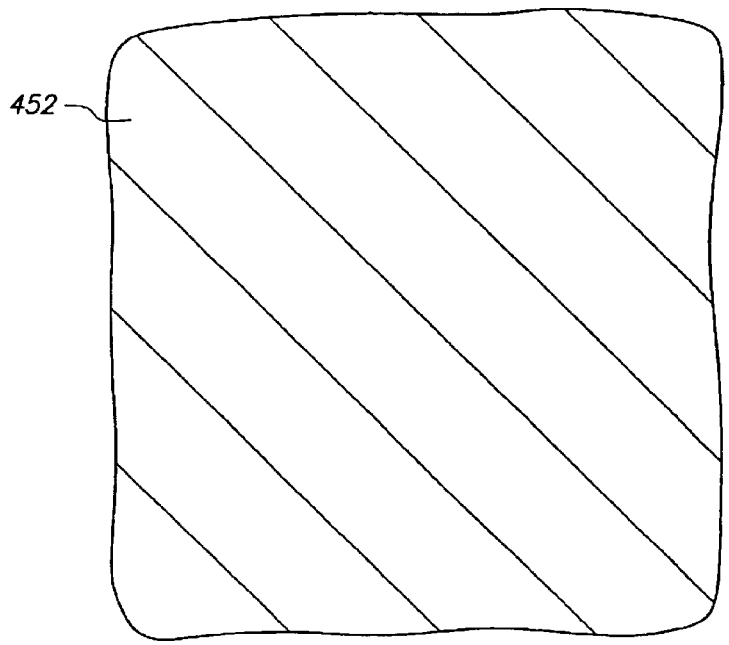
Figure 49C:
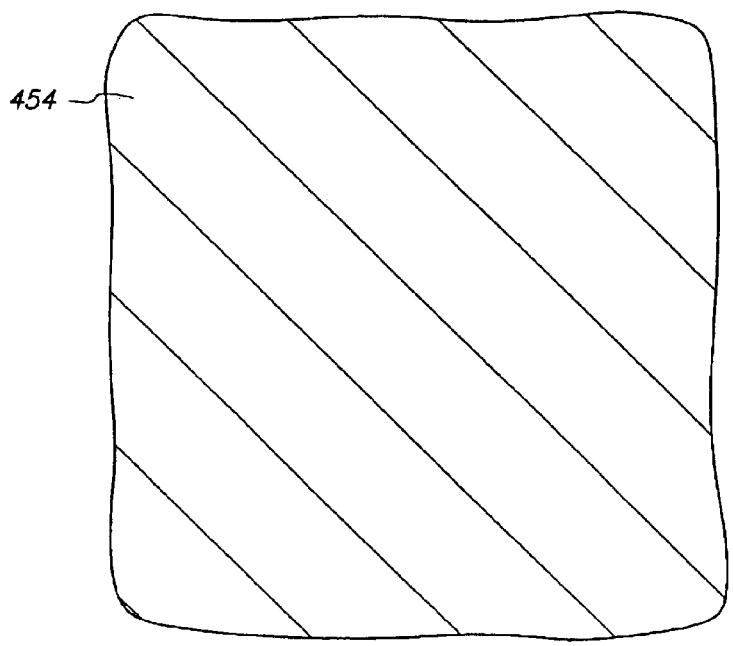

FIGS. 49A, 49B and 49C are cross-sectional, top and bottom views, respectively, of metal base 450 which includes opposing major surfaces 452 and 454.

Figure 50A:
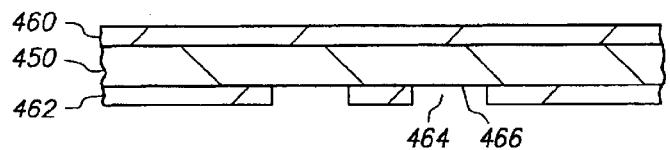
Figure 50B:
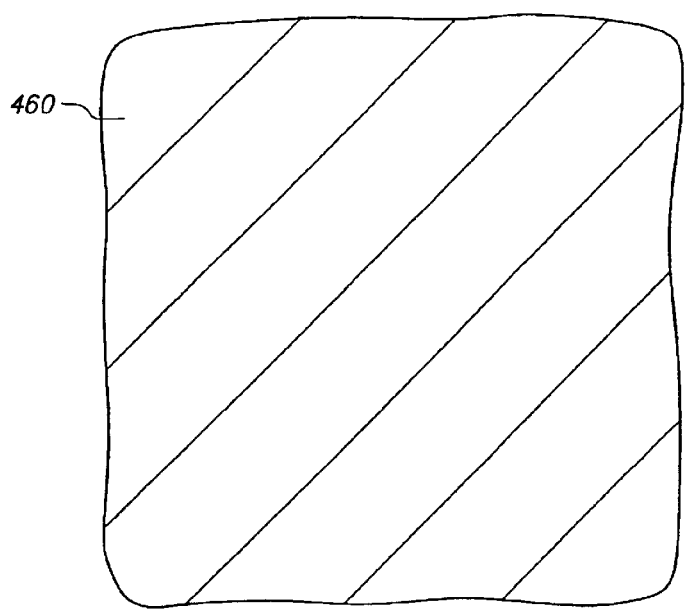
Figure 50C:
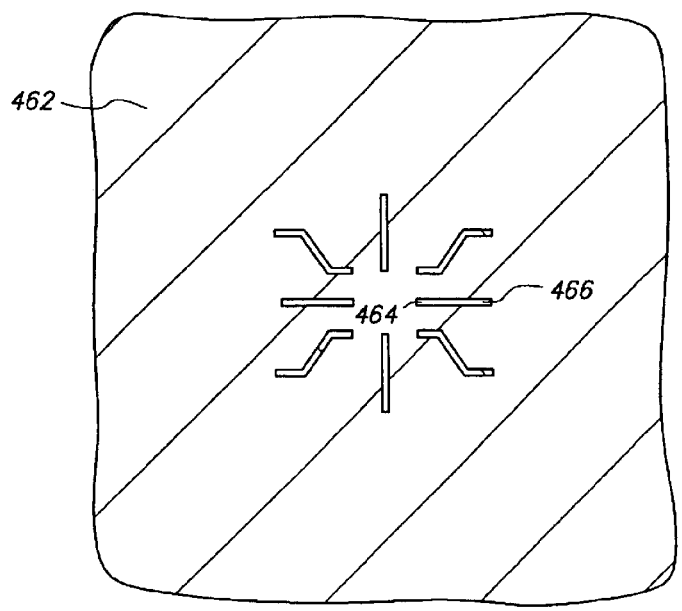

FIGS. 50A, 50B and 50C are cross-sectional, top and bottom views, respectively, of photoresist layers 460 and 462 formed on metal base 450. Photoresist layer 462 contains opening 464 that selectively exposes portion 466 of surface 454.

Figure 51A:
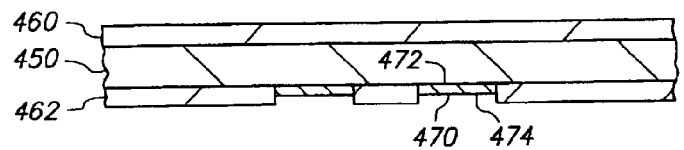
Figure 51B:
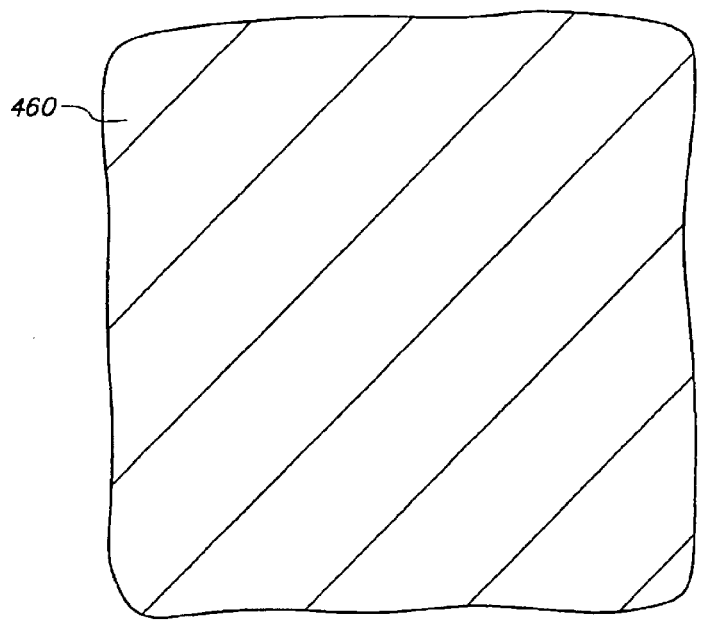
Figure 51C:
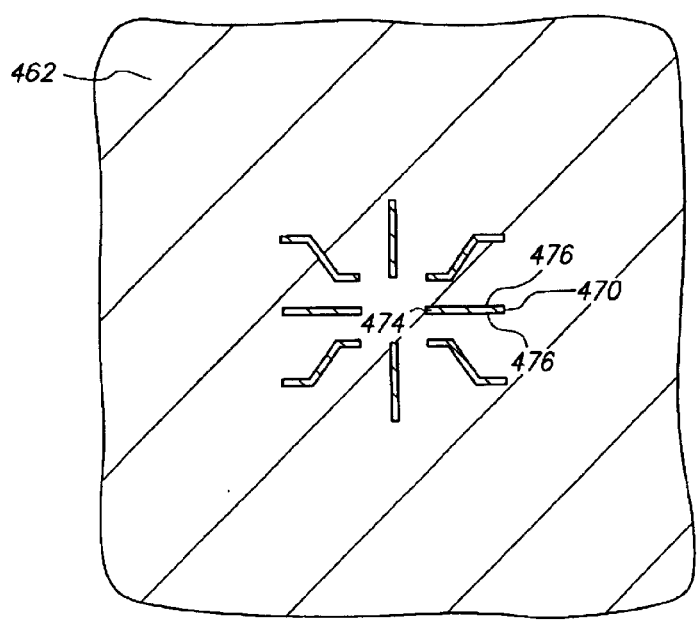

FIGS. 51A, 51B and 51C are cross-sectional, top and bottom views, respectively, of conductive trace 470 formed on metal base 450 by electroplating. Conductive trace 470 includes opposing major surfaces 472 and 474 and peripheral sidewalls 476.

Figure 52A:
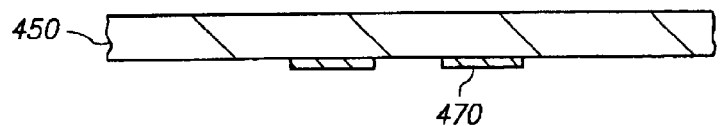
Figure 52B:
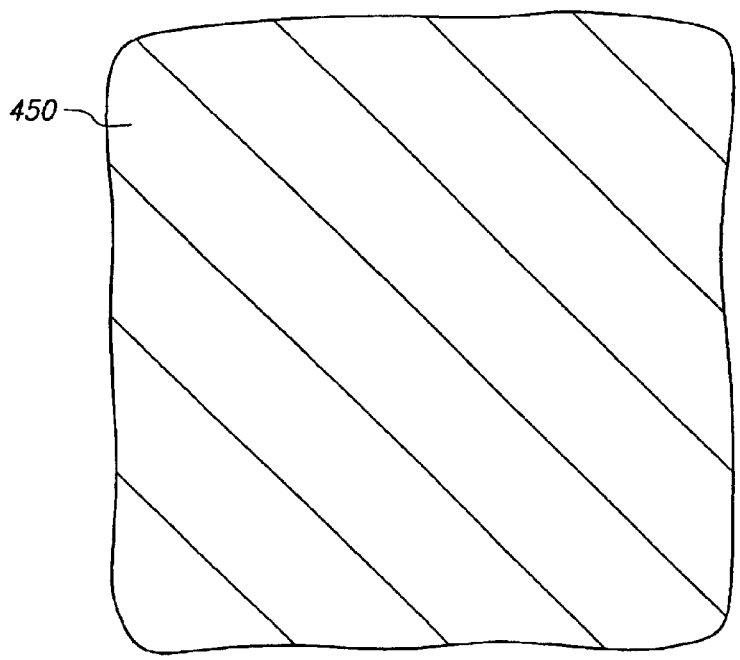
Figure 52C:
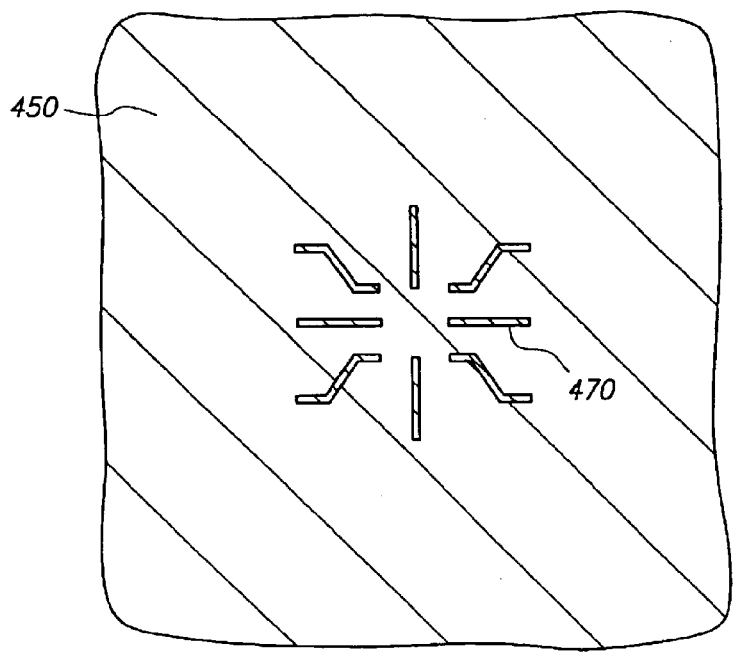

FIGS. 52A, 52B and 52C are cross-sectional, top and bottom views, respectively, of metal base 450 and conductive trace 470 after photoresist layers 460 and 462 are stripped.

Figure 53A:
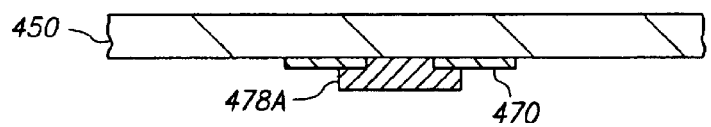
Figure 53B:
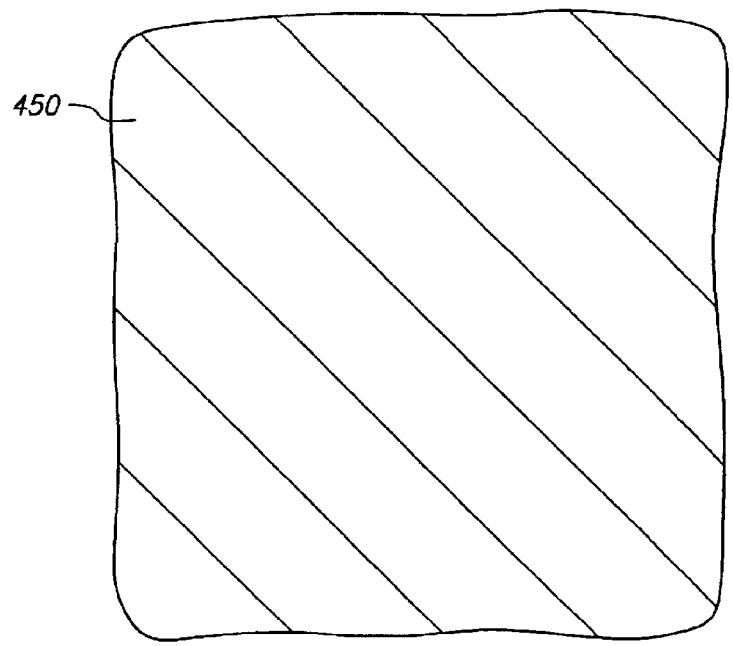
Figure 53C:
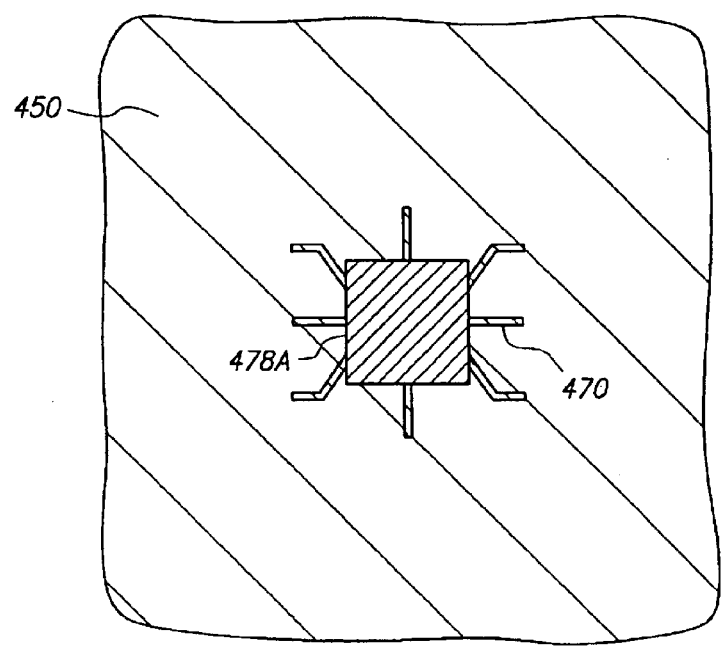

FIGS. 53A, 53B and 53C are cross-sectional, top and bottom views, respectively, of first adhesive 478A formed on metal base 450 and conductive trace 470. First adhesive 478A is identical to adhesive 178 except that first adhesive 478A has a smaller surface area that corresponds to the periphery of chip 410. Thus, first adhesive 478A contacts and covers the inner distal end of conductive trace 470 but not the outer distal end of conductive trace 470.

Figure 54A:
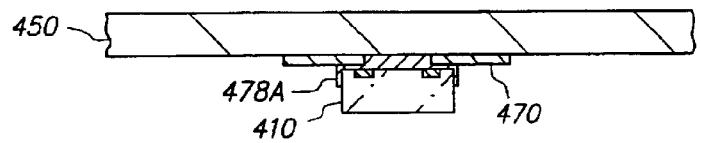
Figure 54B:
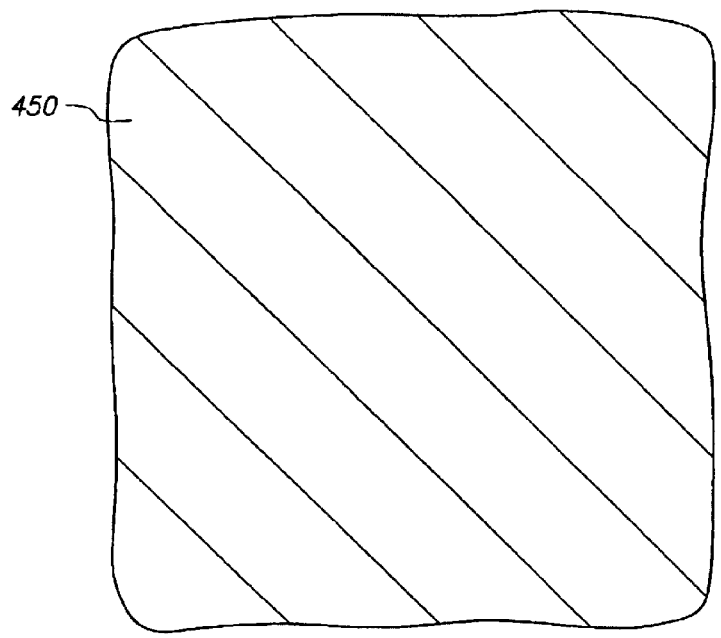
Figure 54C:
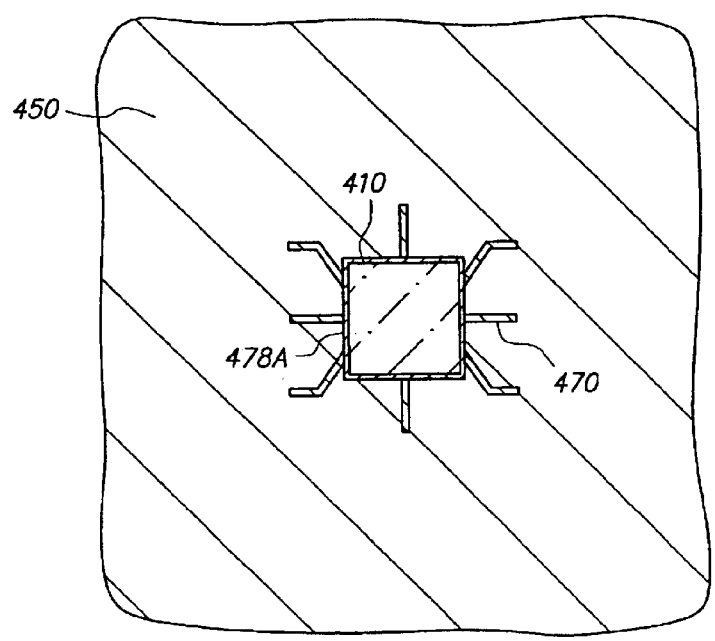

FIGS. 54A, 54B and 54C are cross-sectional, top and bottom views, respectively, of chip 410 mechanically attached to metal base 450 and conductive trace 470 by first adhesive 478A. First adhesive 478A covers and extends slightly outside the periphery of chip 410. First adhesive 478A is heated by the pick-up head that places chip 410 on first adhesive 478A. As a result, first adhesive 478A is partially polymerized (B stage) and forms a gel but is not fully cured. Furthermore, since all of first adhesive 478A is proximate to chip 410, none of first adhesive 478A remains a liquid resin (A stage).

Figure 55A:
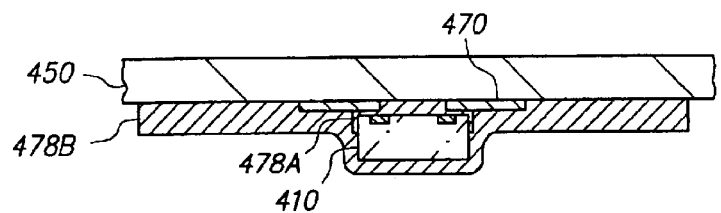
Figure 55B:
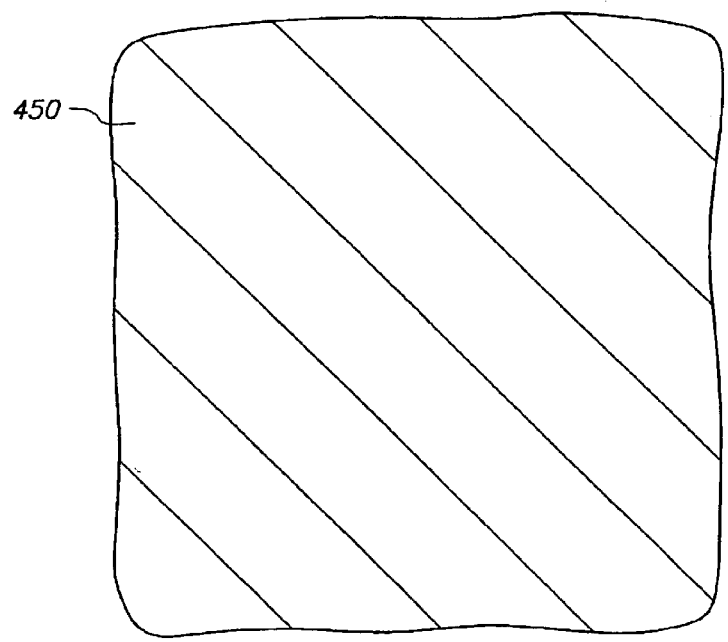
Figure 55C:
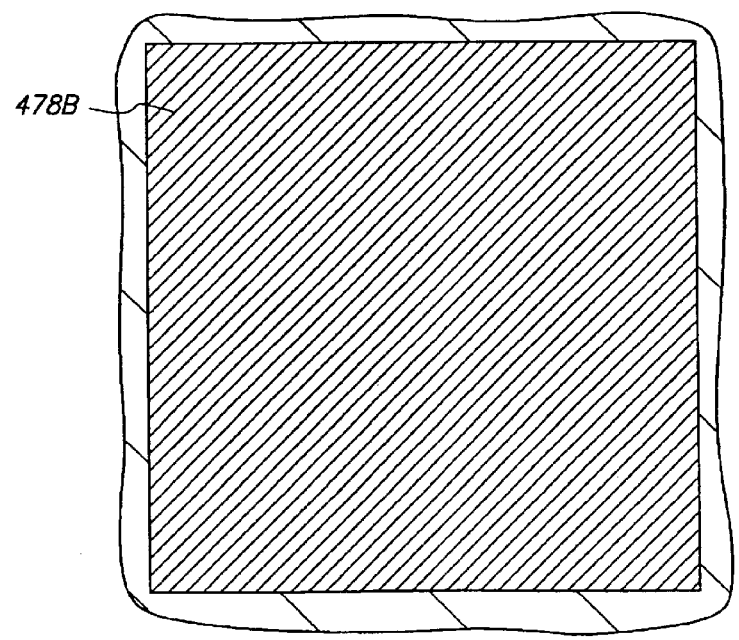

FIGS. 55A, 55B and 55C are cross-sectional, top and bottom views, respectively, of second adhesive 478B formed on chip 410, metal base 450, conductive trace 470 and first adhesive 478A. Second adhesive 478B is identical to adhesive 178 except that second adhesive 478B is deposited by dispensing after chip 410 and conductive trace 470 are mechanically attached to one another by first adhesive 478A. Second adhesive 478B contacts chip 410, metal base 450, conductive trace 470 and first adhesive 478A, and covers chip 410, conductive trace 470 and first adhesive 478A.

Second adhesive 478B provides back-side environmental protection such as moisture resistance and particle protection for chip 410.

Figure 56A:
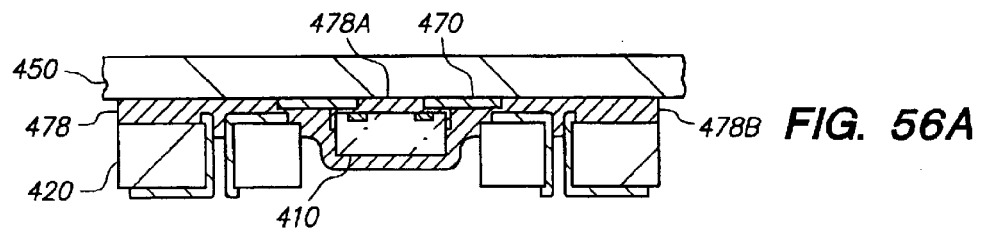
Figure 56B:
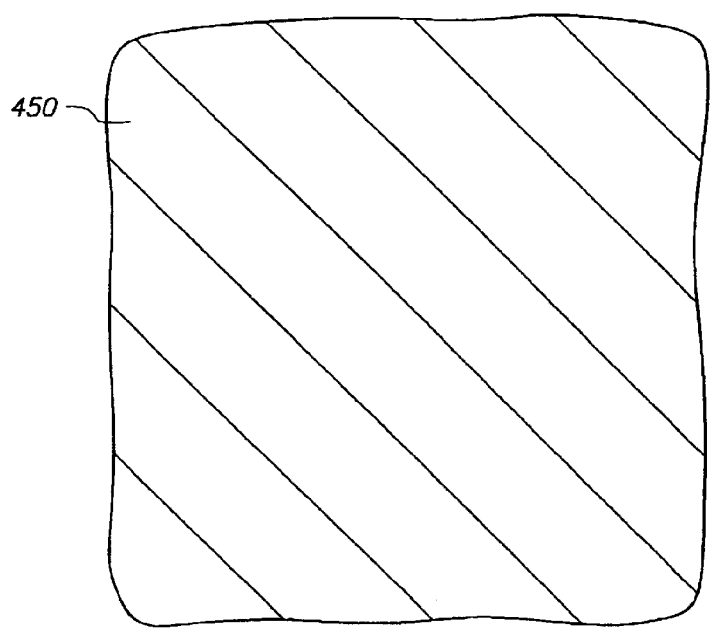
Figure 56C:
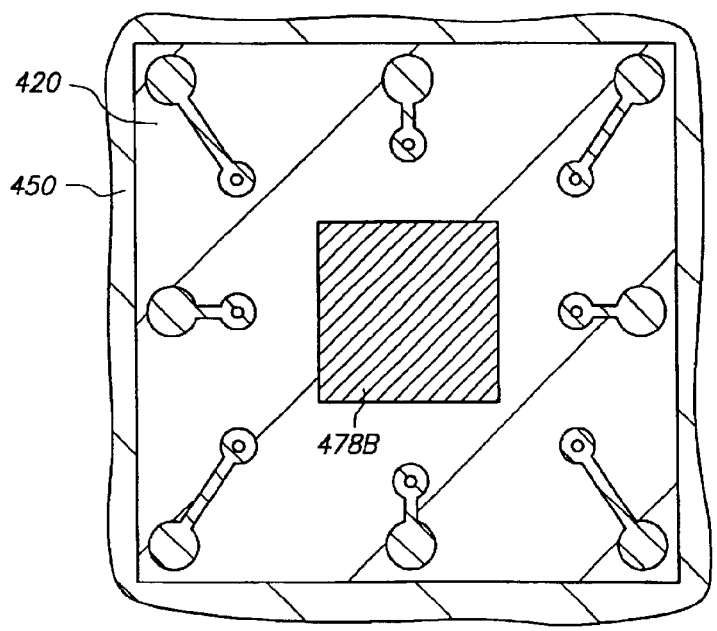

FIGS. 56A, 56B and 56C are cross-sectional, top and bottom views, respectively, of chip 410, metal base 450 and conductive trace 470 mechanically attached to substrate 420 by second adhesive 478B.

Second adhesive 478B contacts and covers substrate 420 and extends into cavity 442 between chip 410 and substrate 420. Second adhesive 478B is heated by the pick-up head that places substrate 420 on second adhesive 478B. As a result, second adhesive 478B proximate to substrate 420 is partially polymerized (B stage) and forms a gel but is not fully cured.

Thereafter, the structure is placed in an oven and first adhesive 478A and second adhesive 478B are fully cured. Adhesive 478 is composed of first adhesive 478A and second adhesive 478B. Thus, adhesive 478 is a double-piece adhesive.

Figure 57A:
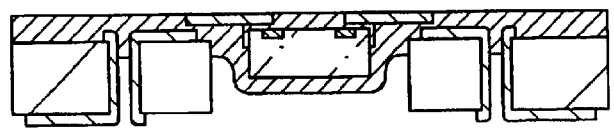
Figure 57B:
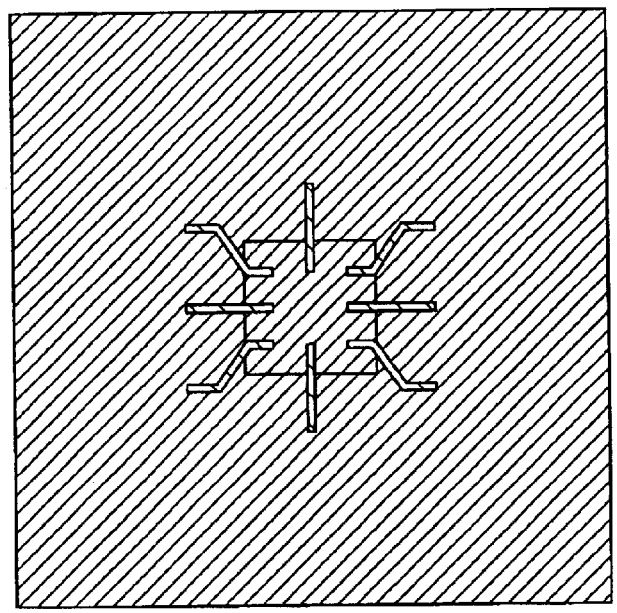
Figure 57C:
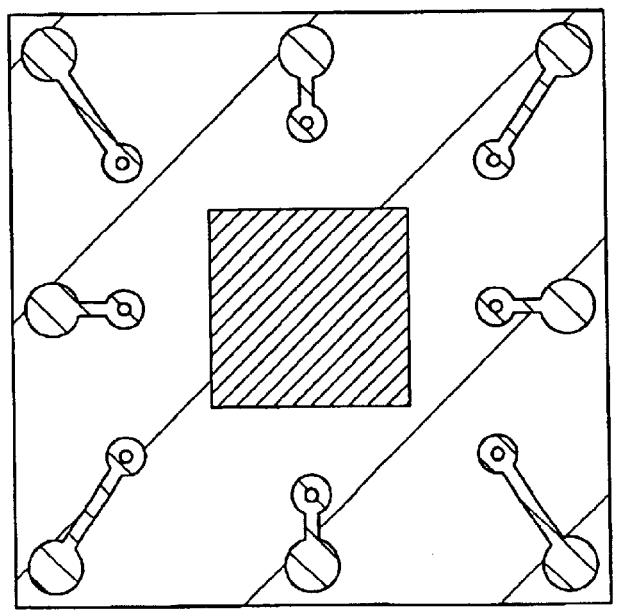

FIGS. 57A, 57B and 57C are cross-sectional, top and bottom views, respectively, of the structure after metal base 450 is removed.

Figure 58A:
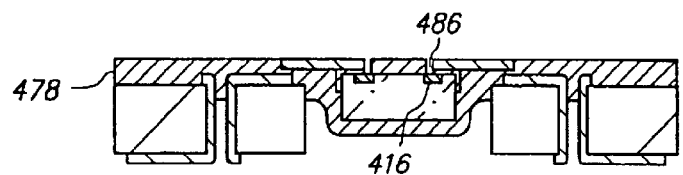
Figure 58B:
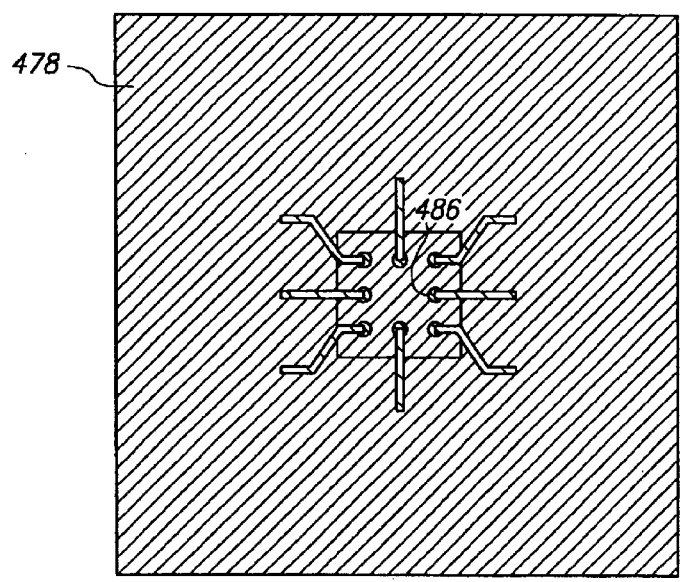
Figure 58C:
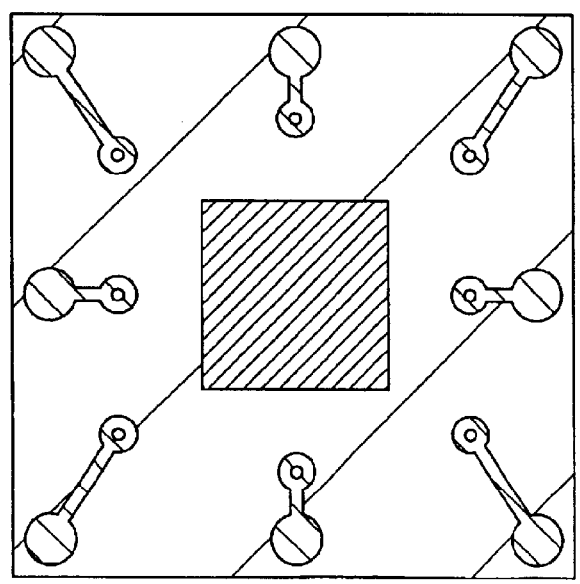

FIGS. 58A, 58B and 58C are cross-sectional, top and bottom views, respectively, of opening 486 that is formed through adhesive 478 and exposes pad 416.

Figure 59A:
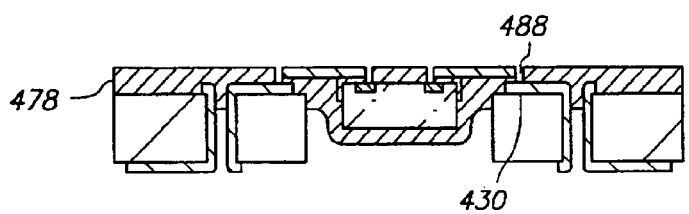
Figure 59B:
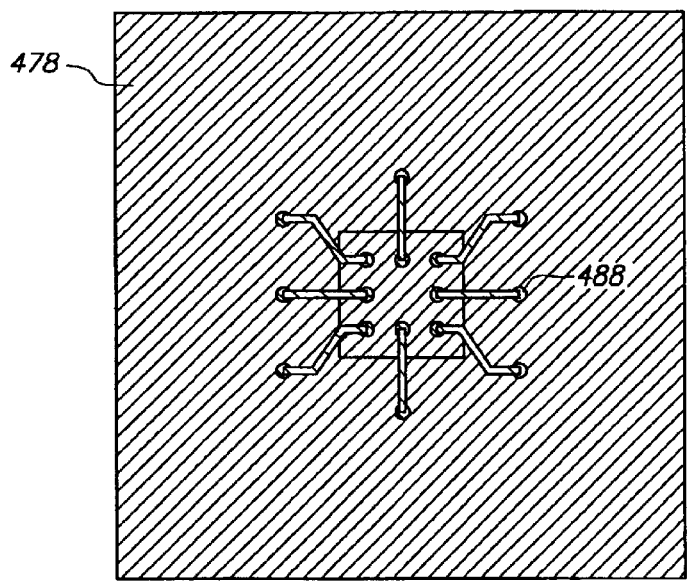
Figure 59C:
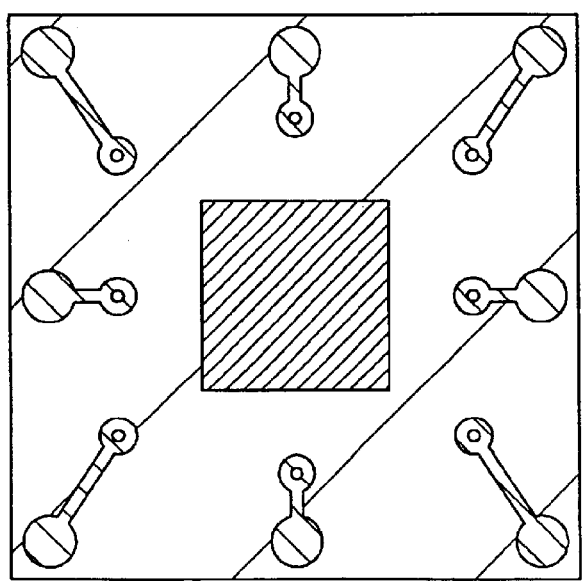

FIGS. 59A, 59B and 59C are cross-sectional, top and bottom views, respectively, of via 488 that is formed through adhesive 478 and exposes first contact terminal 430.

Figure 60A:
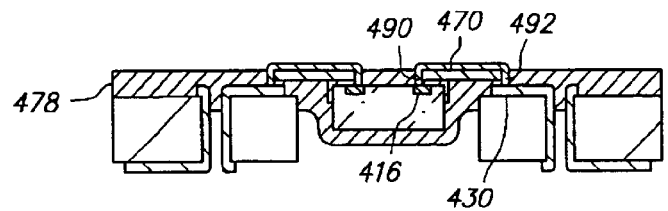
Figure 60B:
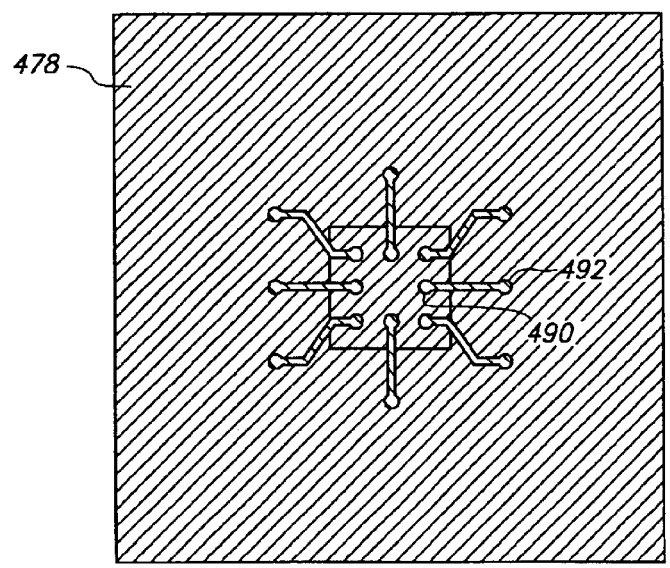
Figure 60C:
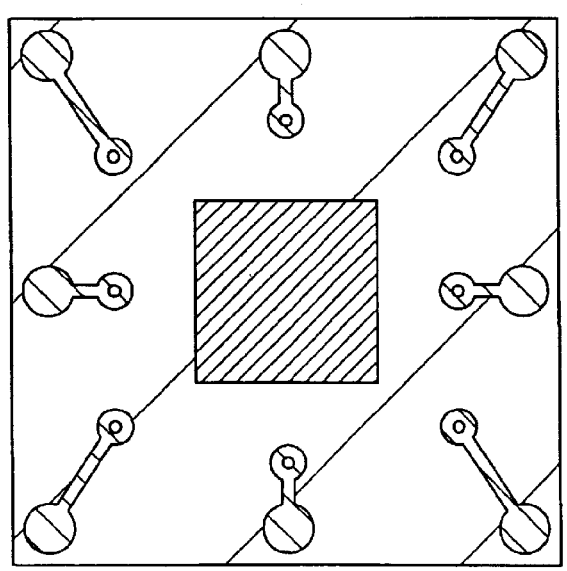

FIGS. 60A, 60B and 60C are cross-sectional, top and bottom views, respectively, of connection joint 490 formed on pad 416 and conductive trace 470, and interconnect 492 formed on first contact terminal 430 and conductive trace 470.

Figure 61A:
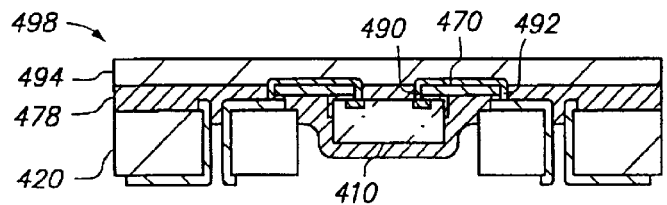
Figure 61B:
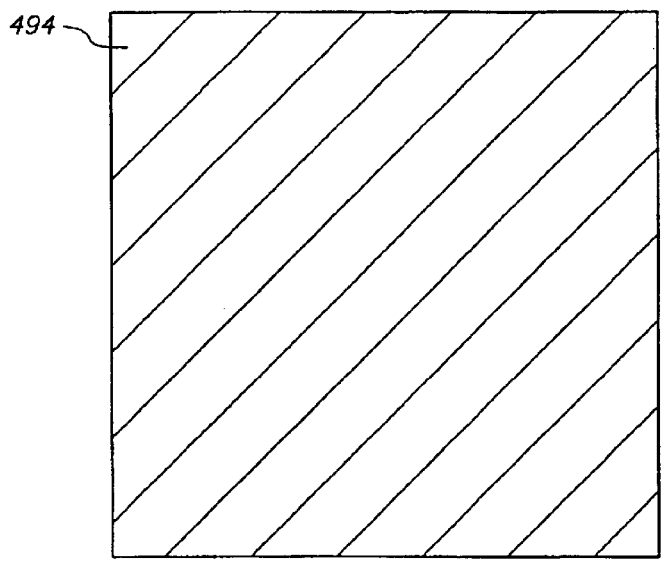
Figure 61C:
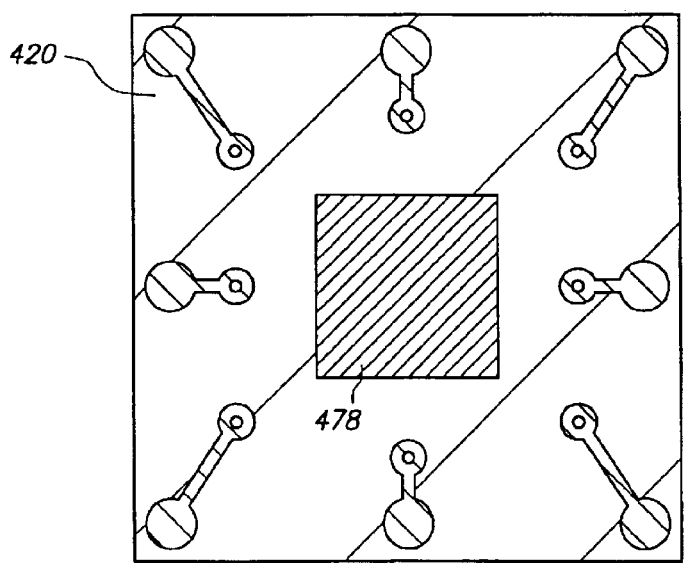

FIGS. 61A, 61B and 61C are cross-sectional, top and bottom views, respectively, of insulative base 494 formed over conductive trace 470, adhesive 478, connection joint 490 and interconnect 492.

At this stage, the manufacture of semiconductor chip assembly 498 that includes chip 410, substrate 420, conductive trace 470, adhesive 478, connection joint 490, interconnect 492 and insulative base 494 can be considered complete.

FIGS. 62A–76A, 62B–76B and 62C–76C are cross-sectional, top and bottom views, respectively, of a method of making a semiconductor chip assembly in accordance with a fifth embodiment of the present invention. In the fifth embodiment, the adhesive includes a first adhesive disposed between the conductive trace and the chip and a second adhesive disposed between the conductive trace and the substrate, and the second adhesive contacts the substrate and then the conductive trace. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, substrate 520 corresponds to substrate is 120, etc.

Figure 62A:
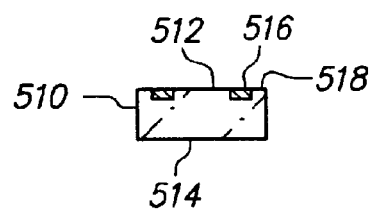
Figure 62B:
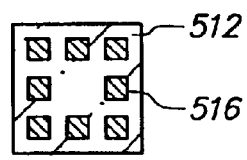
Figure 62C:

FIGS. 62A, 62B and 62C are cross-sectional, top and bottom views, respectively, of semiconductor chip 510 which includes opposing major surfaces 512 and 514. Surface 512 includes conductive pad 516 and passivation layer 518.

Figure 63A:
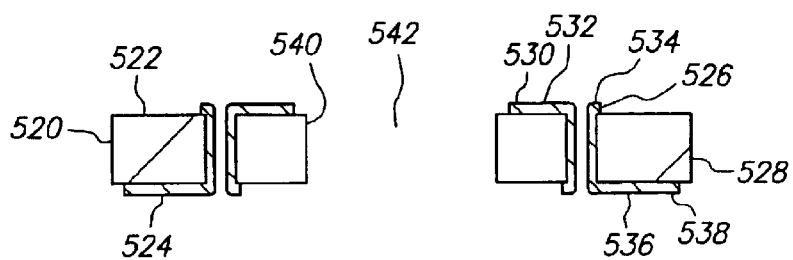
Figure 63B:
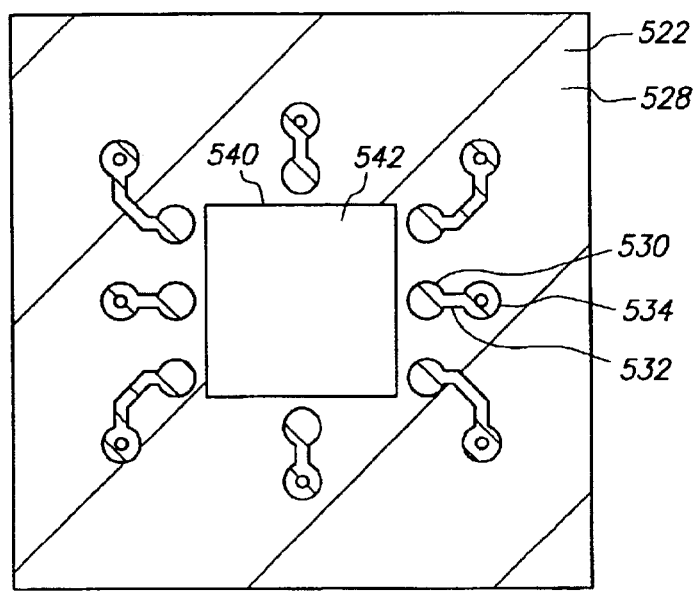
Figure 63C:
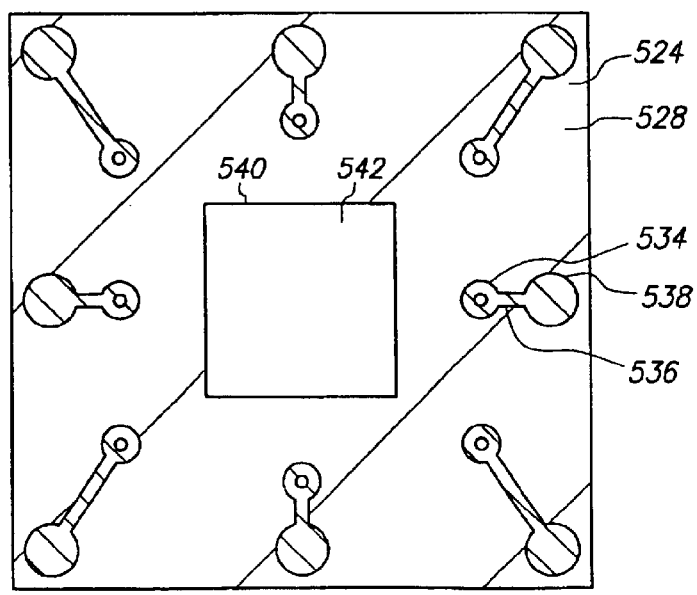

FIGS. 63A, 63B and 63C are cross-sectional, top and bottom views, respectively, of substrate 520 which includes opposing major surfaces 522 and 524, conductive terminal 526 and dielectric base 528. Conductive terminal 526 includes first contact terminal 530, first routing line 532, vertical connection 534, second routing line 536 and second contact terminal 538. Dielectric base 528 includes inner sidewalls 540 that bound cavity 542.

Figure 64A:
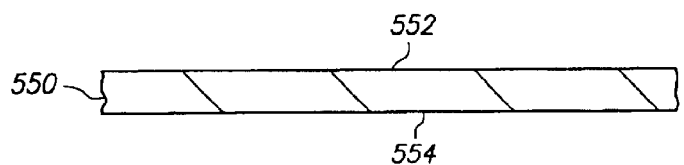
Figure 64B:
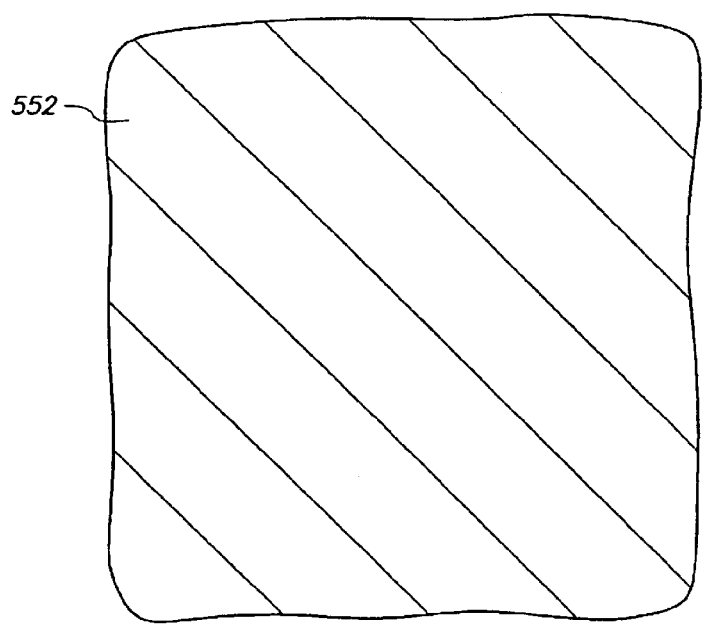
Figure 64C:
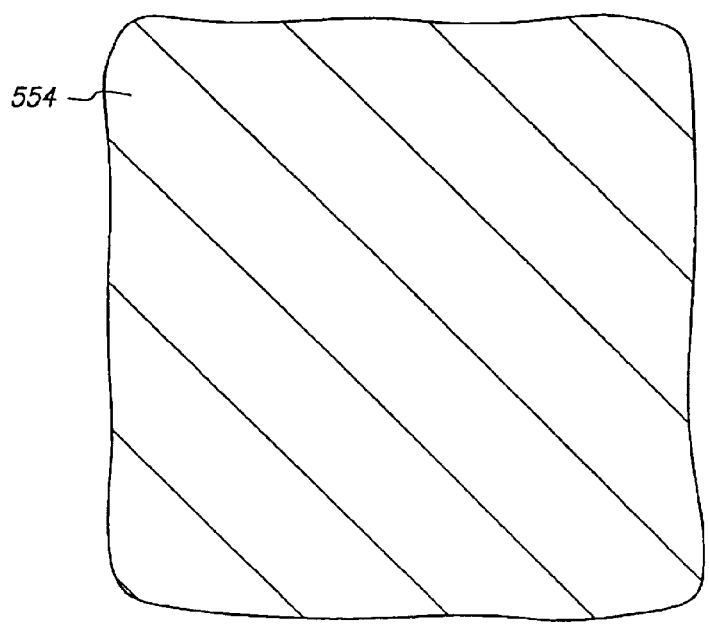

FIGS. 64A, 64B and 64C are cross-sectional, top and bottom views, respectively, of metal base 550 which includes opposing major surfaces 552 and 554.

Figure 65A:
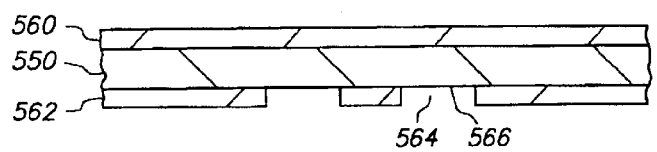
Figure 65B:
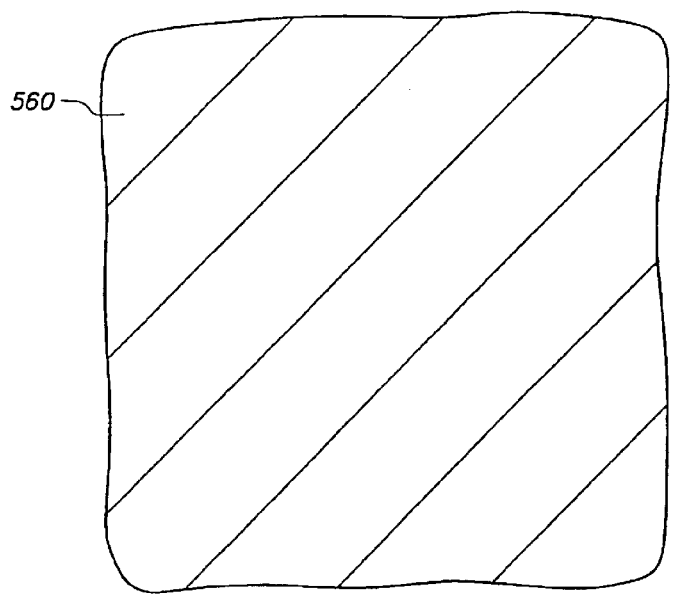
Figure 65C:
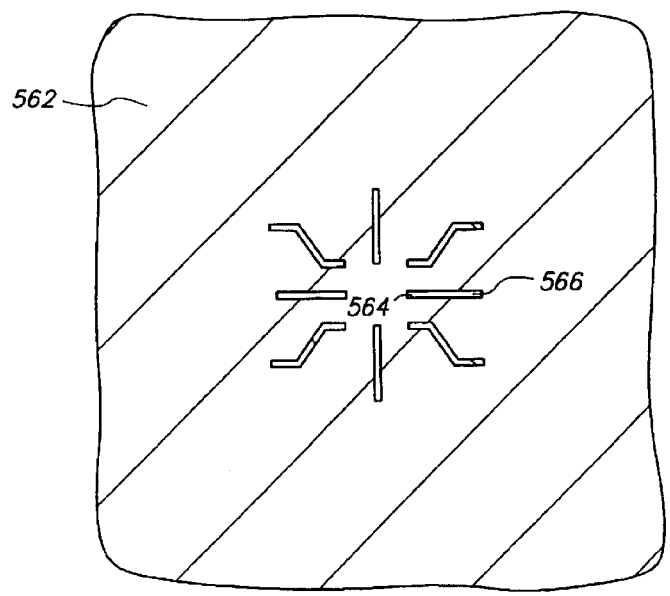

FIGS. 65A, 65B and 65C are cross-sectional, top and bottom views, respectively, of photoresist layers 560 and 562 formed on metal base 550. Photoresist layer 562 contains opening 564 that selectively exposes portion 566 of surface 554.

Figure 66A:
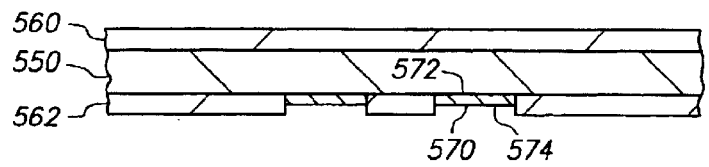
Figure 66B:
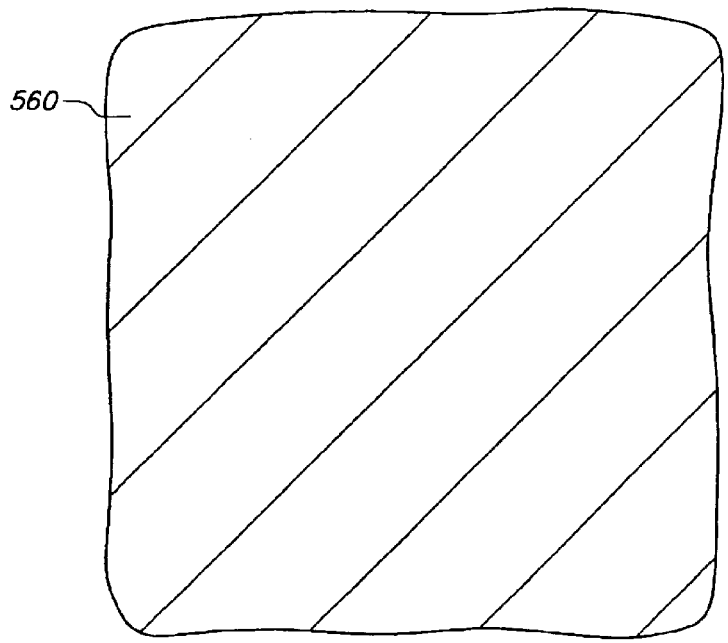
Figure 66C:
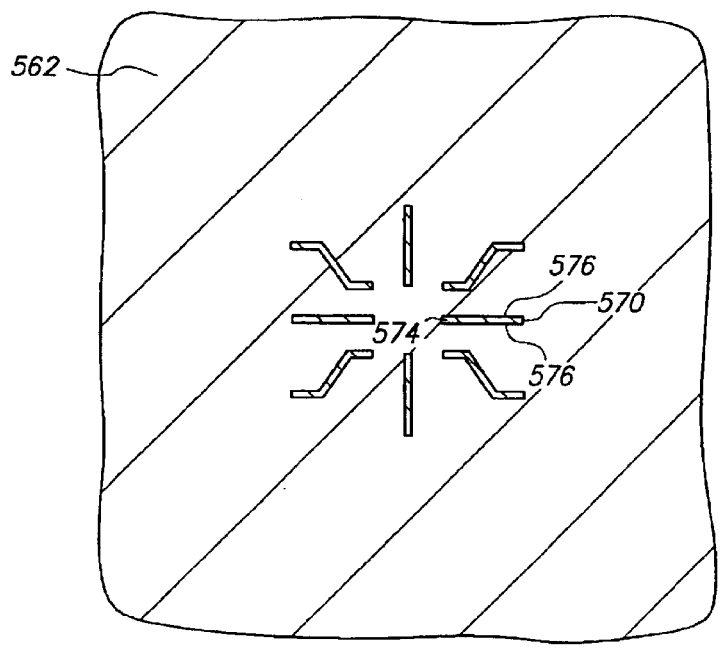

FIGS. 66A, 66B and 66C are cross-sectional, top and bottom views, respectively, of conductive trace 570 formed on metal base 550 by electroplating. Conductive trace 570 includes opposing major surfaces 572 and 574 and peripheral sidewalls 576.

Figure 67A:
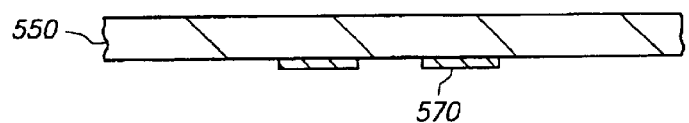
Figure 67B:
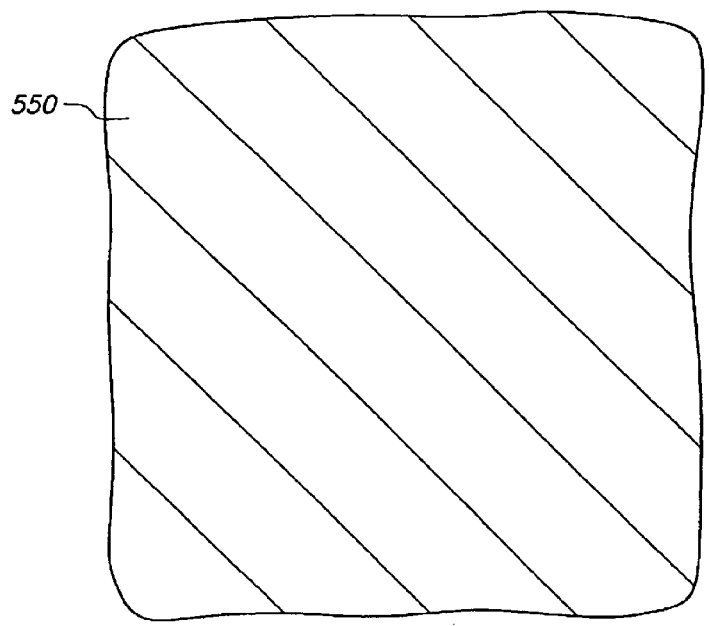
Figure 67C:
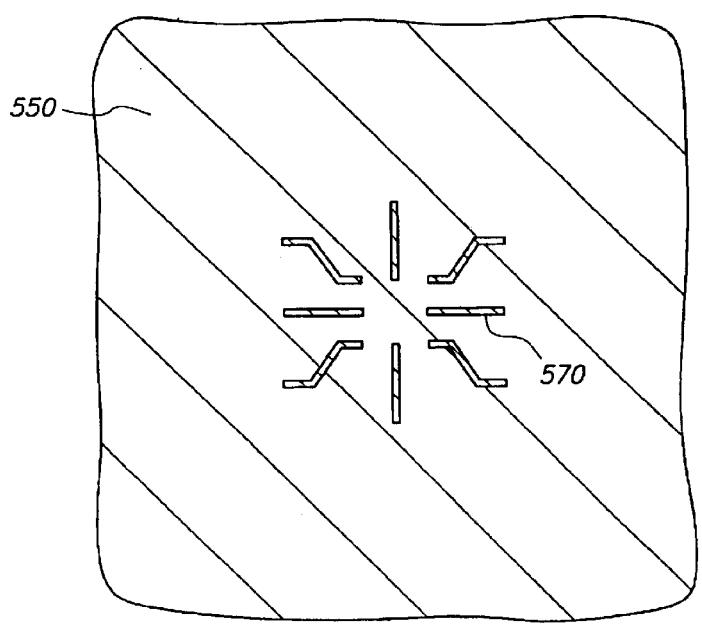

FIGS. 67A, 67B and 67C are cross-sectional, top and bottom views, respectively, of metal base 550 and conductive trace 570 after photoresist layers 560 and 562 are stripped.

Figure 68A:
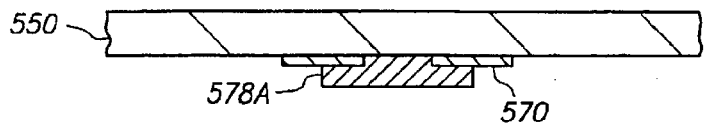
Figure 68B:
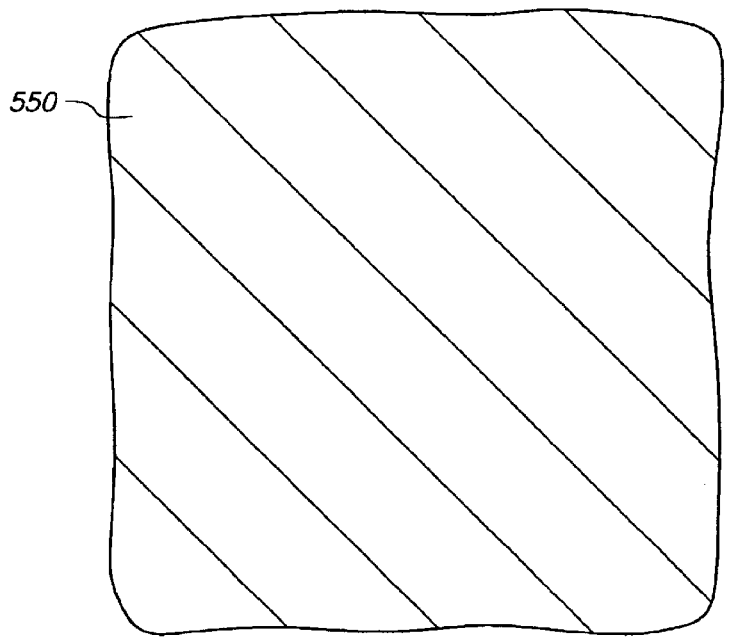
Figure 68C:
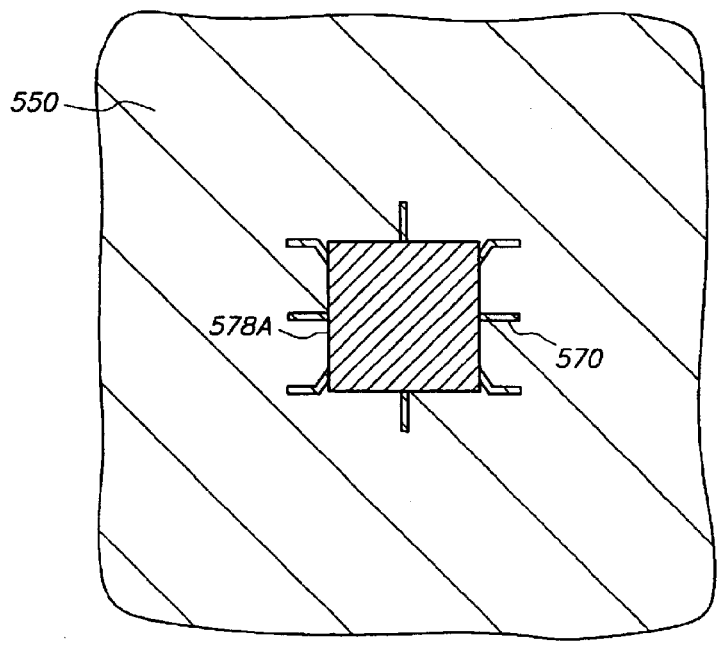

FIGS. 68A, 68B and 68C are cross-sectional, top and bottom views, respectively, of first adhesive 578A formed on metal base 550 and conductive trace 570. First adhesive 578A is identical to adhesive 178 except that first adhesive 578A has a smaller surface area that corresponds to the periphery of chip 510 extended outwardly by 250 microns beyond each peripheral edge. Thus, first adhesive 578A contacts and covers the inner distal end of conductive trace 570 but not the outer distal end of conductive trace 570.

Figure 69A:
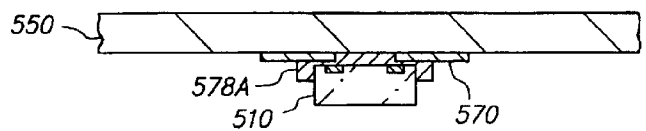
Figure 69B:
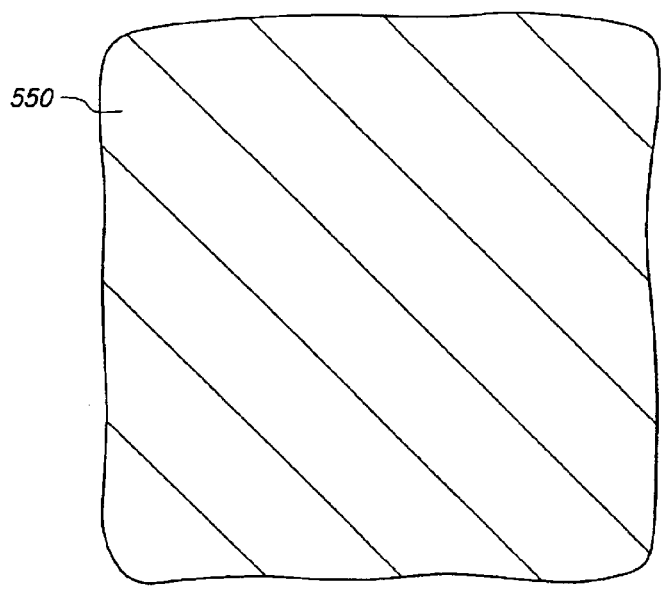
Figure 69C:
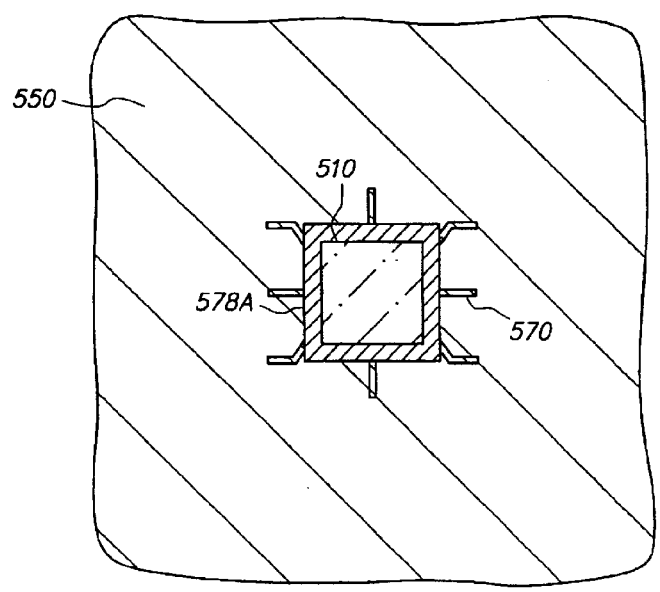

FIGS. 69A, 69B and 69C are cross-sectional, top and bottom views, respectively, of chip 510 mechanically attached to metal base 550 and conductive trace 570 by first adhesive 578A. First adhesive 578A covers and extends outside the periphery of chip 510. First adhesive 578A is heated by the pick-up head that places chip 510 on first adhesive 578A. As a result, first adhesive 578A proximate to chip 510 is partially polymerized (B stage) and forms a gel but is not fully cured.

Figure 70A:
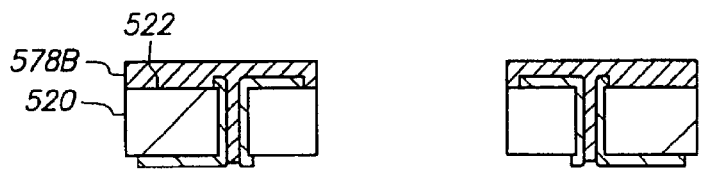
Figure 70B:
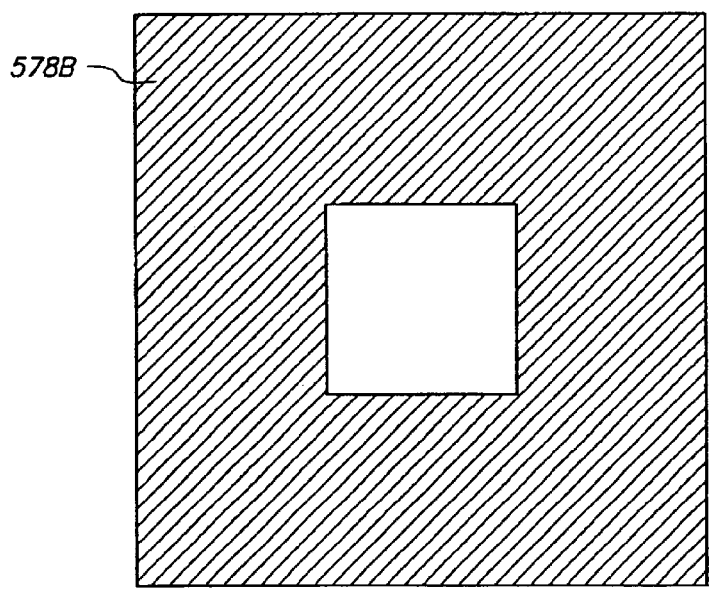
Figure 70C:
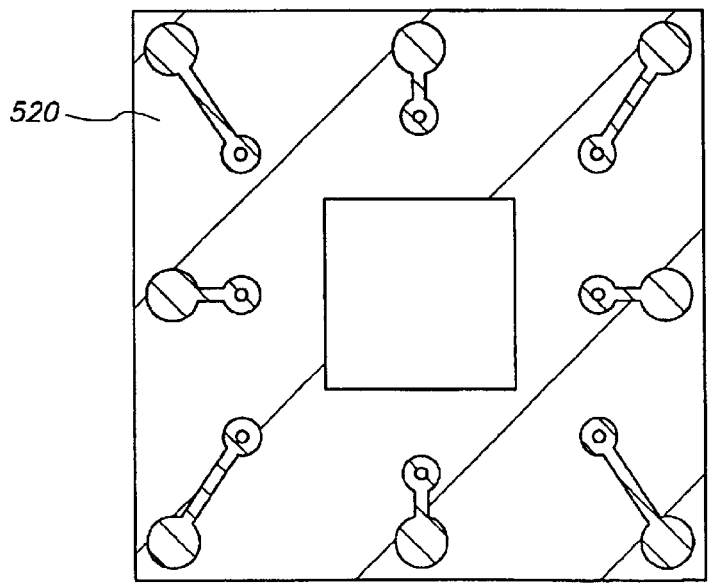

FIGS. 70A, 70B and 70C are cross-sectional, top and bottom views, respectively, of second adhesive 578B formed on substrate 520. Second adhesive 578B is identical to adhesive 178 except that second adhesive 578B initially contacts and covers surface 522 of substrate 520 and thus has a smaller surface area with a frame-like shape that corresponds to the periphery of substrate 520.

Figure 71A:
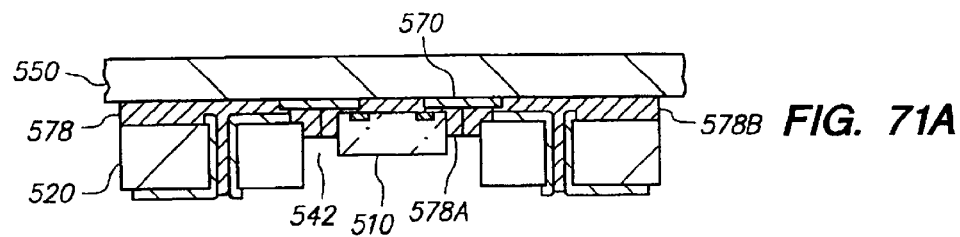
Figure 71B:
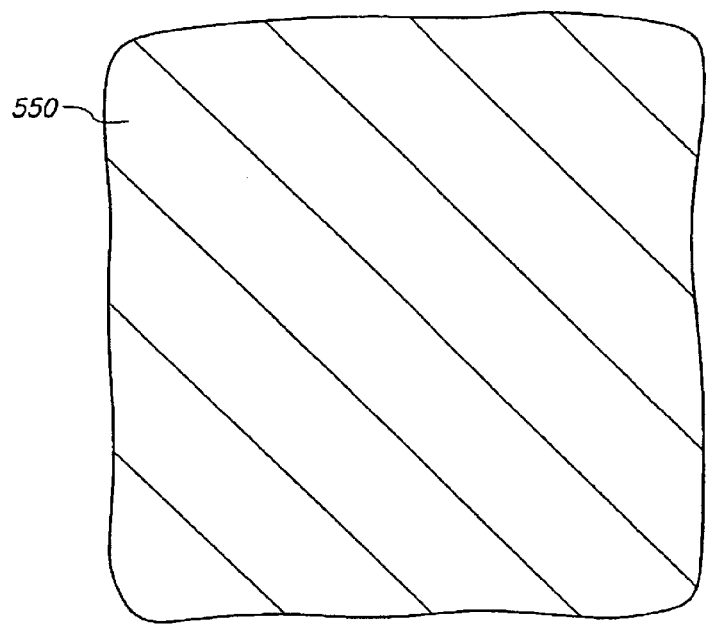
Figure 71C:
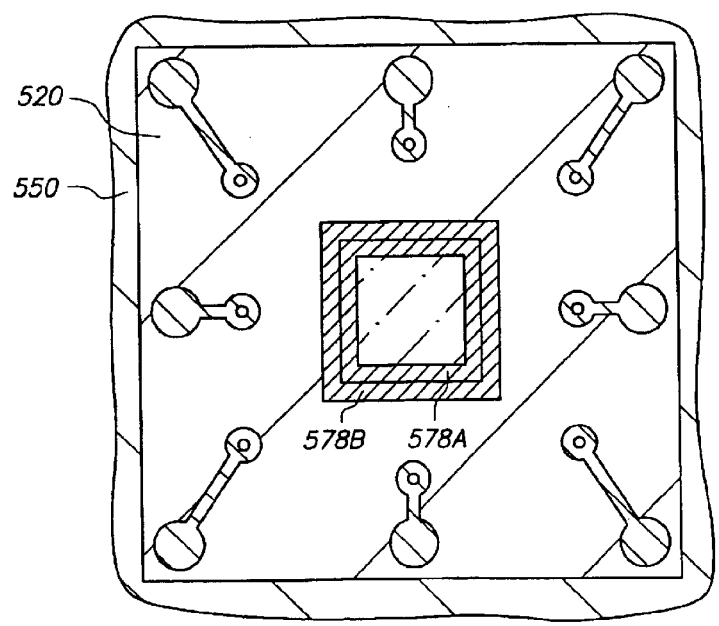

FIGS. 71A, 71B and 71C are cross-sectional, top and bottom views, respectively, of chip 510, metal base 550 and conductive trace 570 mechanically attached to substrate 520 by second adhesive 578B.

Second adhesive 578B contacts metal base 550, conductive trace 570 and first adhesive 578A, covers substrate 520 and extends into cavity 542 between chip 510 and substrate 520. The pickup head that places substrate 520 and second adhesive 578B on metal base 550 and conductive trace 570 is not heated. Instead, metal base 550 is mounted on a hotplate (not shown) heated to a relatively low temperature such as 150° C., and second adhesive 578B receives heat from the hotplate transferred through metal base 550 and conductive trace 570. As a result, second adhesive 578B is partially polymerized (B stage) and forms a gel but is not fully cured. Furthermore, since all of second adhesive 578B is proximate to metal base 550, conductive trace 570 or both, none of second adhesive 578B remains a liquid resin (A stage).

Thereafter, the structure is placed in an oven and first adhesive 578A and second adhesive 578B are fully cured. Adhesive 578 is composed of first adhesive 578A and second adhesive 578B. Thus, adhesive 578 is a double-piece adhesive.

Figure 72A:
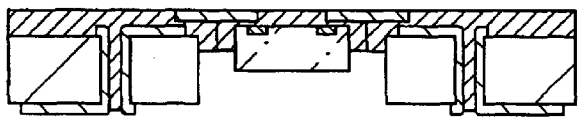
Figure 72B:
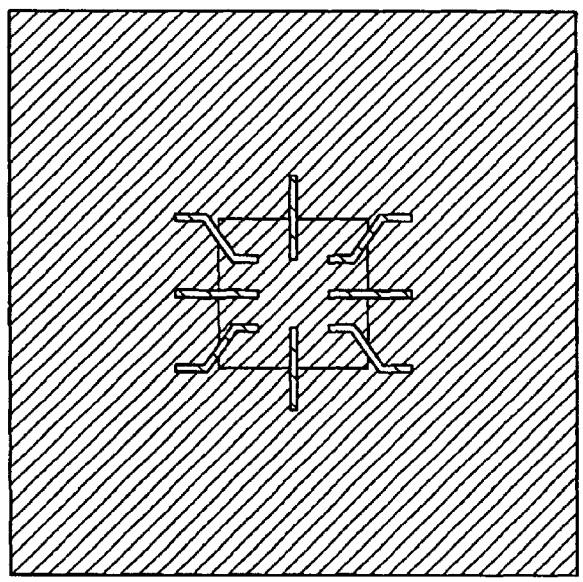
Figure 72C:
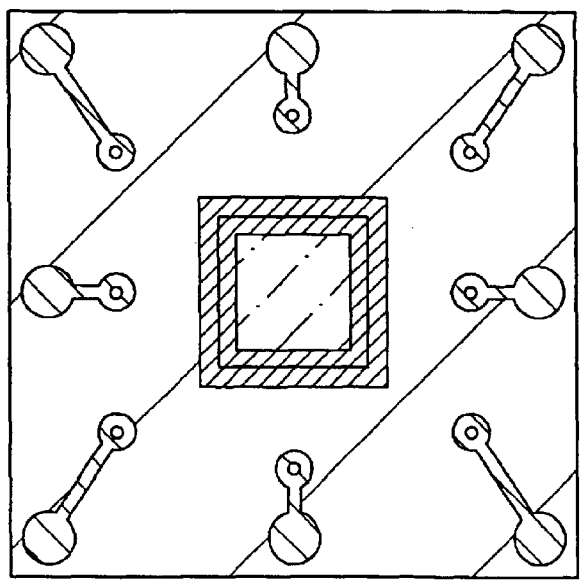

FIGS. 72A, 72B and 72C are cross-sectional, top and bottom views, respectively, of the structure after metal base 550 is removed.

Figure 73A:
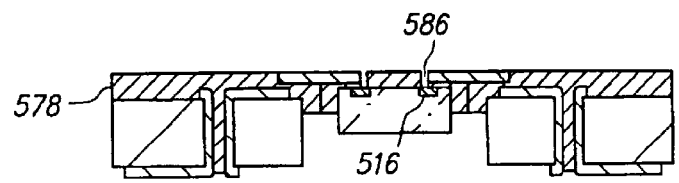
Figure 73B:
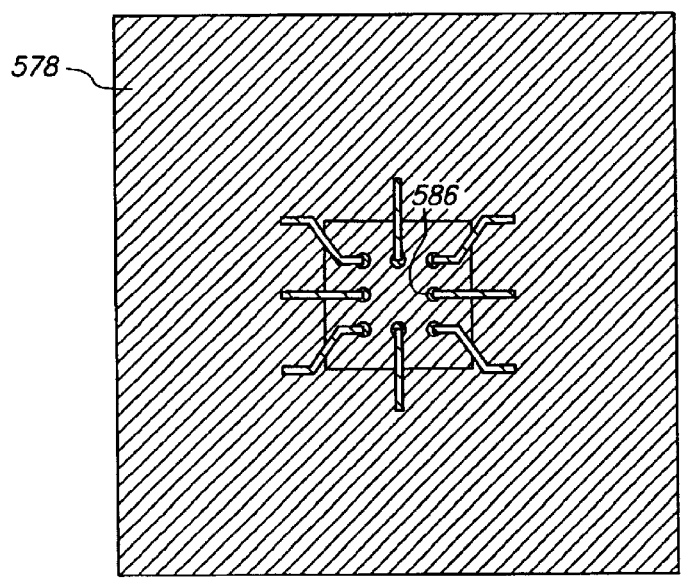
Figure 73C:
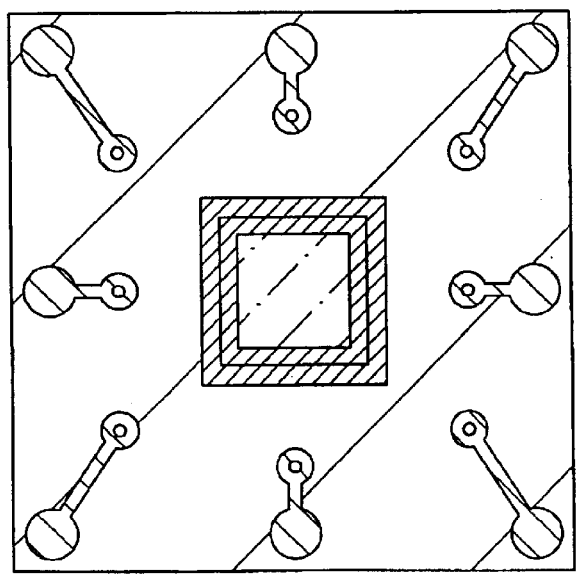

FIGS. 73A, 73B and 73C are cross-sectional, top and bottom views, respectively, of opening 586 that is formed through adhesive 578 and exposes pad 516.

Figure 74A:
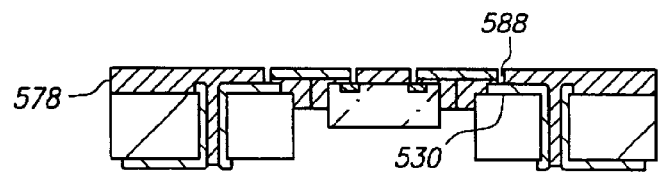
Figure 74B:
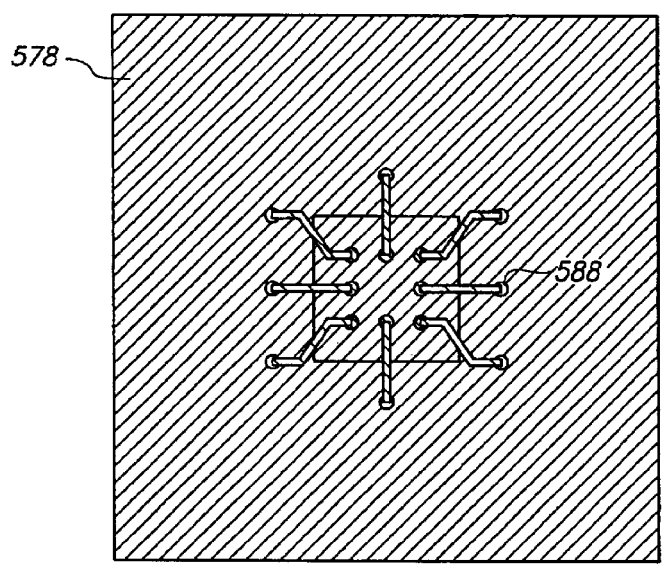
Figure 74C:
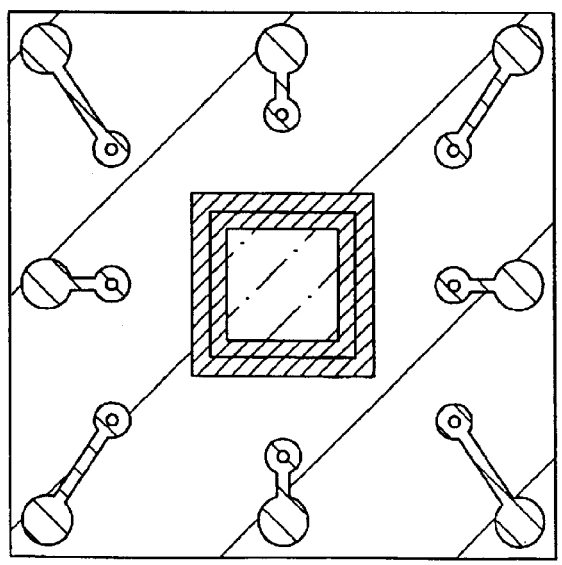

FIGS. 74A, 74B and 74C are cross-sectional, top and bottom views, respectively, of via 588 that is formed through adhesive 578 and exposes first contact terminal 530.

Figure 75A:
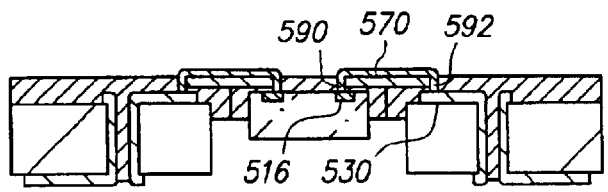
Figure 75B:
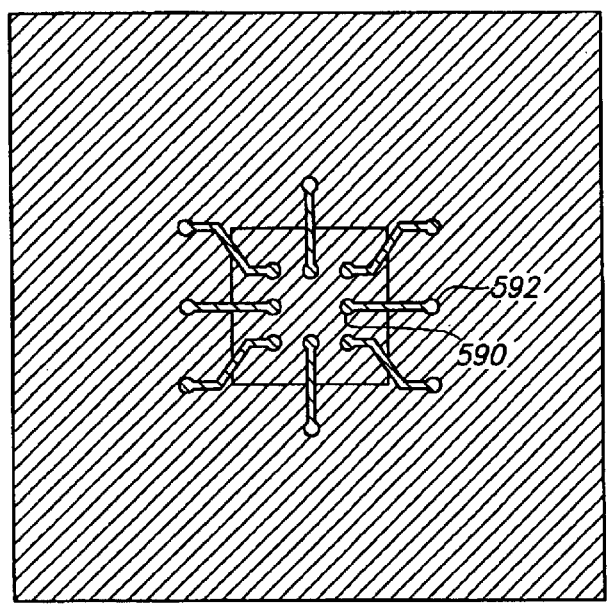
Figure 75C:
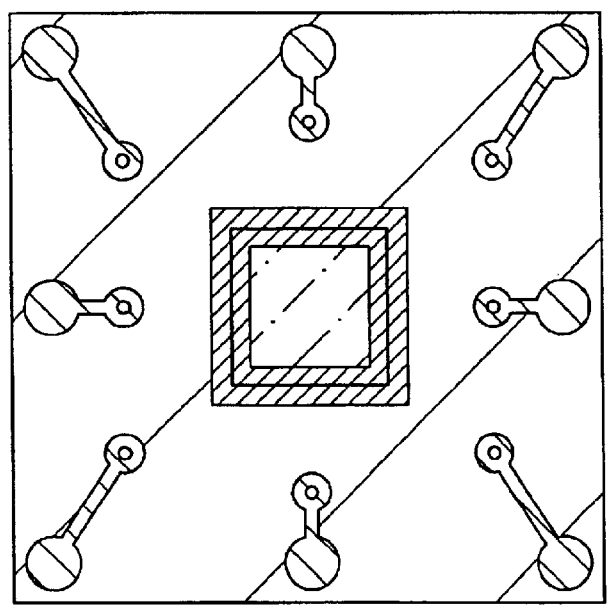

FIGS. 75A, 75B and 75C are cross-sectional, top and bottom views, respectively, of connection joint 590 formed on pad 516 and conductive trace 570, and interconnect 592 formed on first contact terminal 530 and conductive trace 570.

Figure 76A:
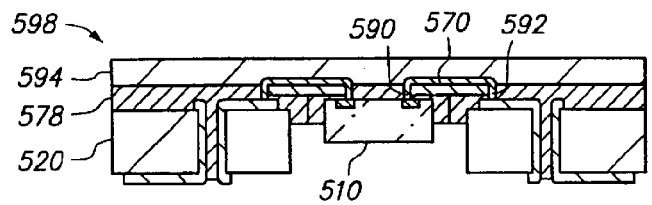
Figure 76B:
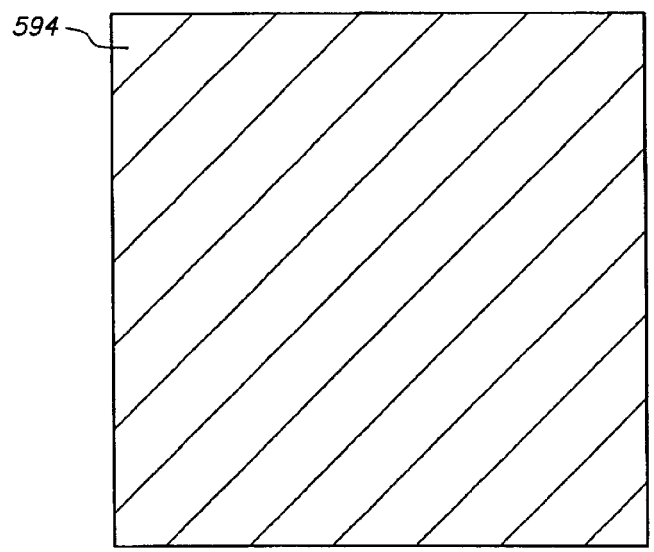
Figure 76C:
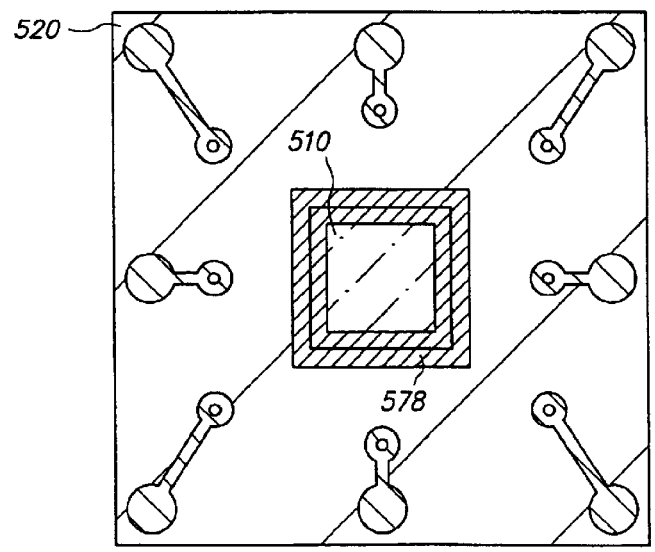

FIGS. 76A, 76B and 76C are cross-sectional, top and bottom views, respectively, of insulative base 594 formed over conductive trace 570, adhesive 578, connection joint 590 and interconnect 592.

At this stage, the manufacture of semiconductor chip assembly 598 that includes chip 510, substrate 520, conductive trace 570, adhesive 578, connection joint 590, interconnect 592 and insulative base 594 can be considered complete.

FIGS. 77A–92A, 77B–92B and 77C–92C are cross-sectional, top and bottom views, respectively, of a method of making a semiconductor chip assembly in accordance with a sixth embodiment of the present invention. In the sixth embodiment, the adhesive includes a first adhesive disposed between the conductive trace and the chip, a second adhesive disposed between the conductive trace and the substrate, and a third adhesive that is confined to the cavity. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip. 110, substrate 620 corresponds to substrate 120, etc.

Figure 77A:
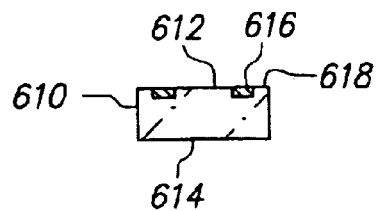
Figure 77B:
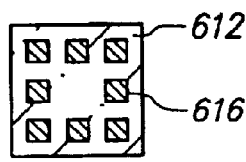
Figure 77C:
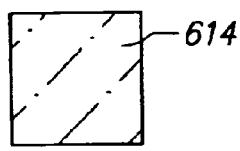

FIGS. 77A, 77B and 77C are cross-sectional, top and bottom views, respectively, of semiconductor chip 610 which includes opposing major surfaces 612 and 614. Surface 612 includes conductive pad 616 and passivation layer 618.

Figure 78A:
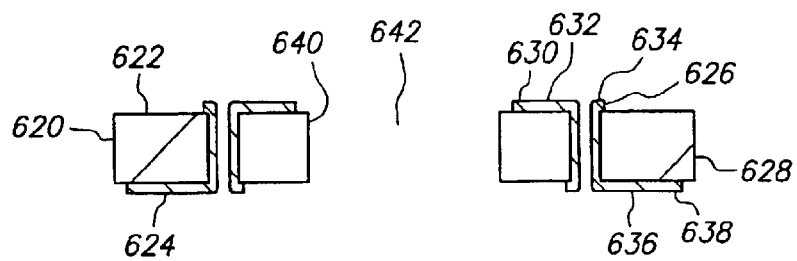
Figure 78B:
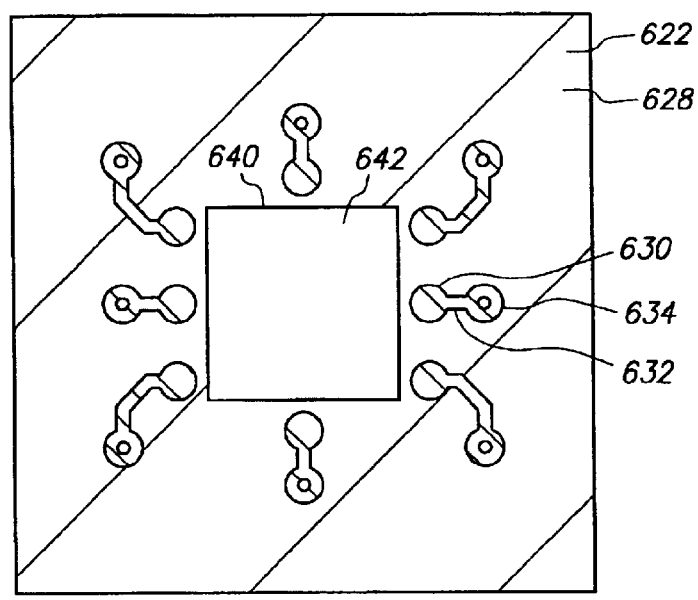
Figure 78C:
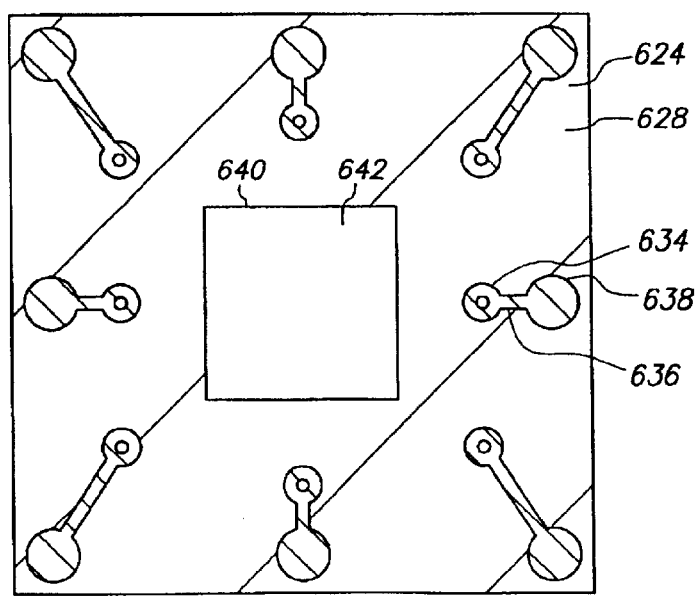

FIGS. 78A, 78B and 78C are cross-sectional, top and bottom views, respectively, of substrate 620 which includes opposing major surfaces 622 and 624, conductive terminal 626 and dielectric base 628. Conductive terminal 626 includes first contact terminal 630, first routing line 632, vertical connection 634, second routing line 636 and second contact terminal 638. Dielectric base 628 includes inner sidewalls 640 that bound cavity 642.

Figure 79A:
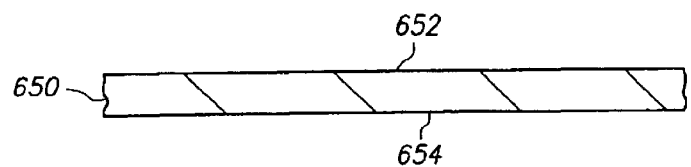
Figure 79B:
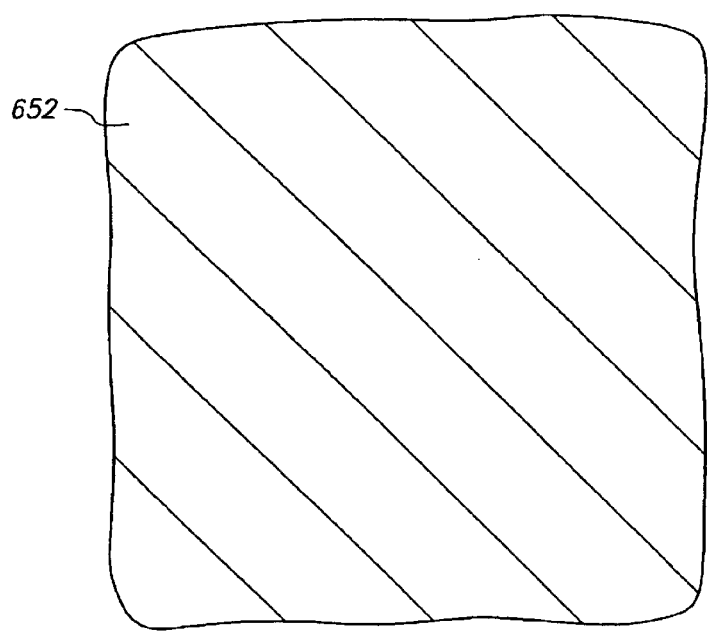
Figure 79C:
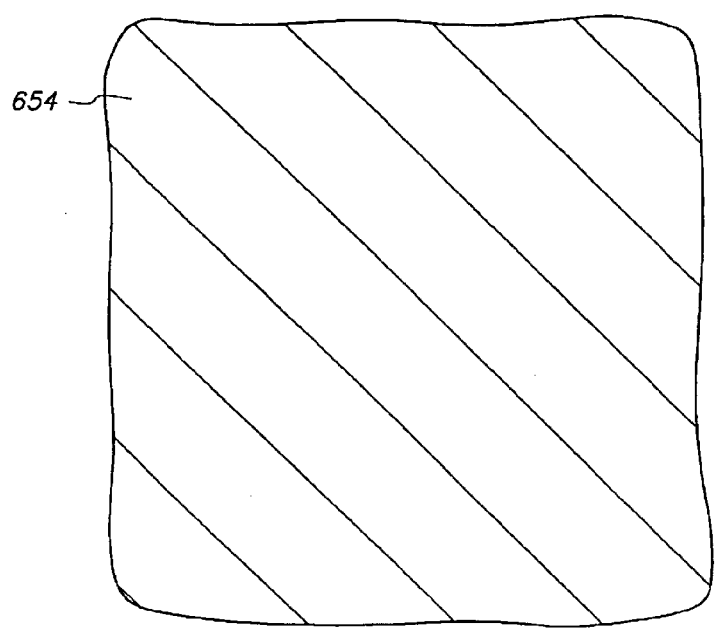

FIGS. 79A, 79B and 79C are cross-sectional, top and bottom views, respectively, of metal base 650 which includes opposing major surfaces 652 and 654.

Figure 80A:
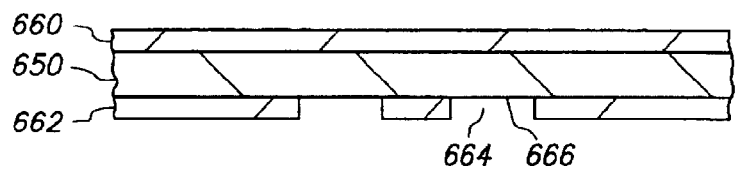
Figure 80B:
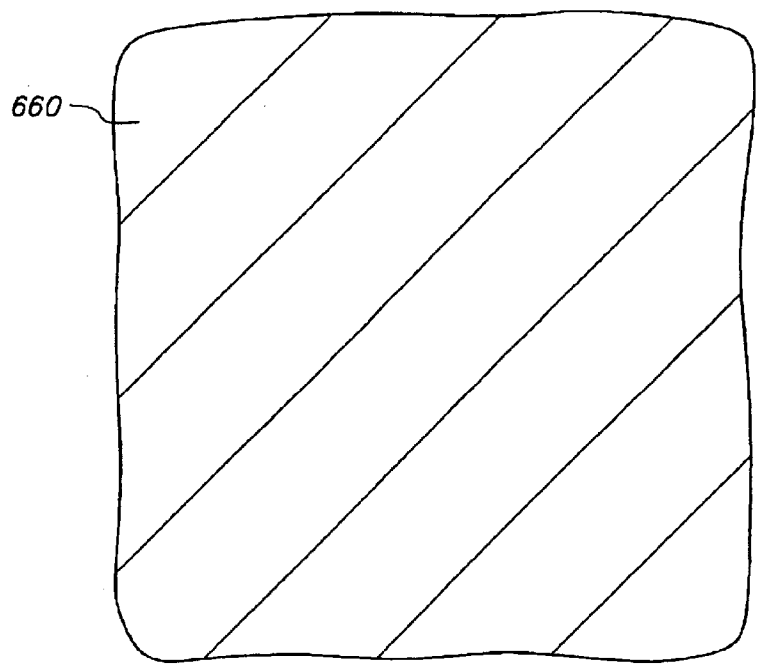
Figure 80C:
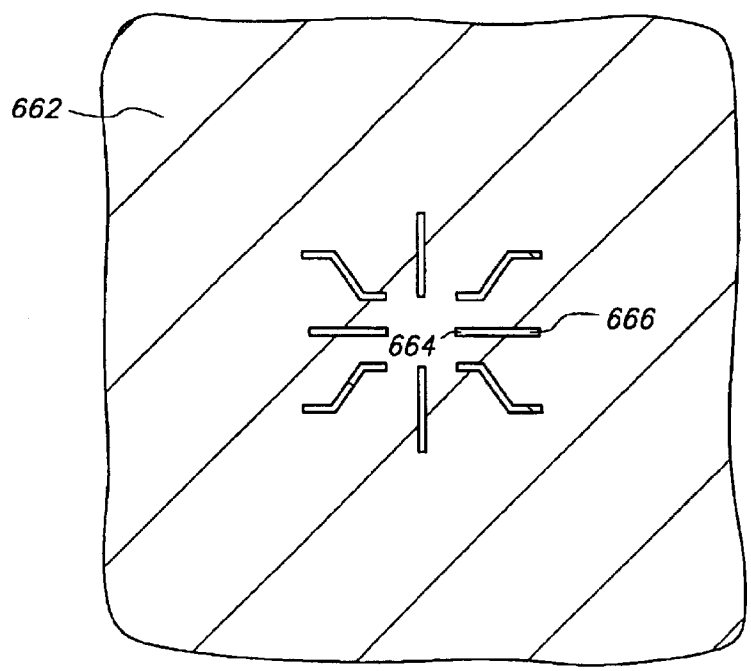

FIGS. 80A, 80B and 80C are cross-sectional, top and bottom views, respectively, of photoresist layers 660 and 662 formed on metal base 650. Photoresist layer 662 contains opening 664 that selectively exposes portion 666 of surface 654.

Figure 81A:
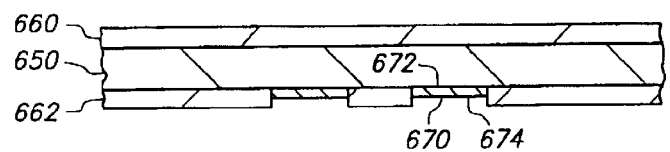
Figure 81B:
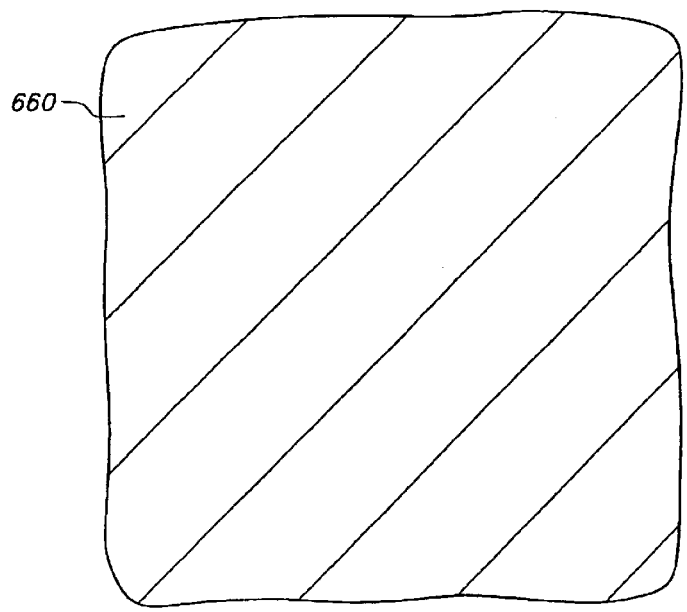
Figure 81C:
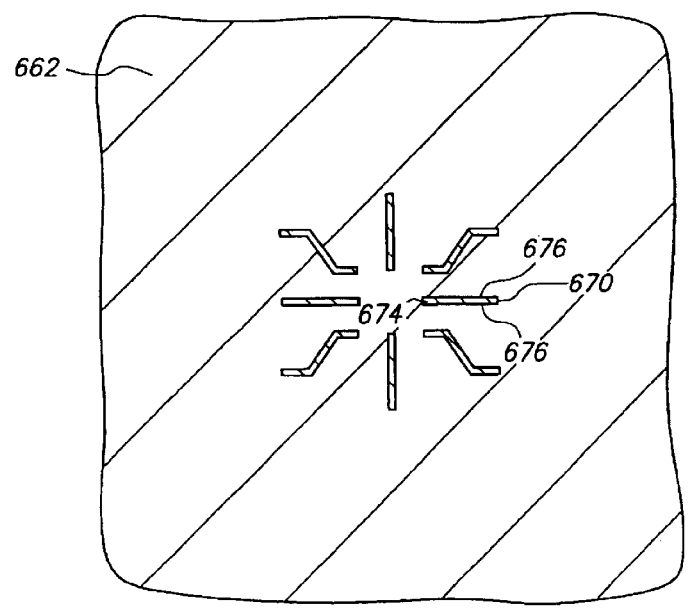

FIGS. 81A, 81B and 81C are cross-sectional, top and bottom views, respectively, of conductive trace 670 formed on metal base 650 by electroplating. Conductive trace 670 includes opposing major surfaces 672 and 674 and peripheral sidewalls 676.

Figure 82A:
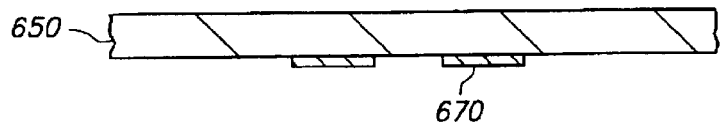
Figure 82B:
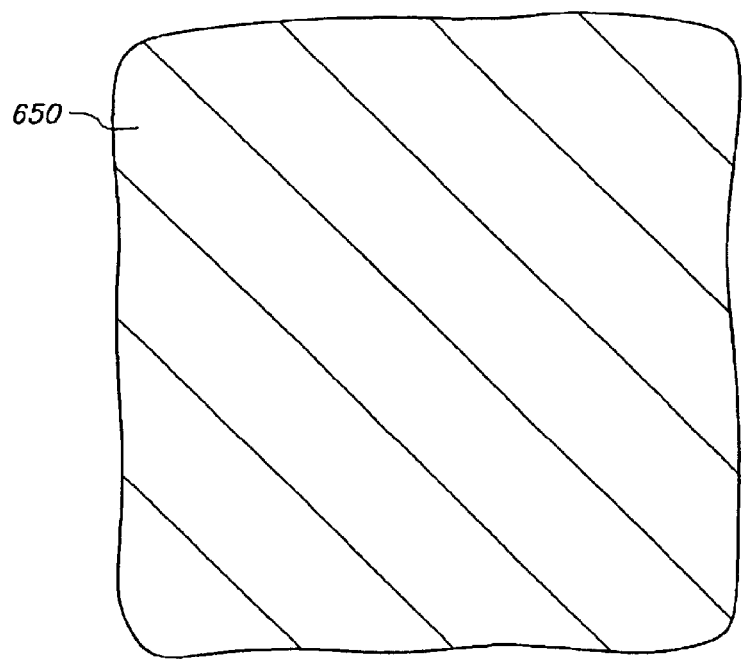
Figure 82C:
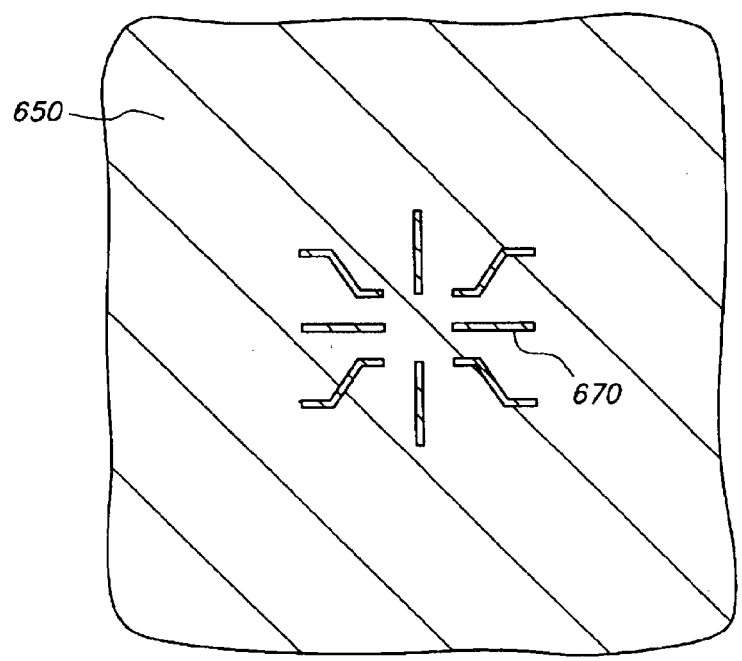

FIGS. 82A, 82B and 82C are cross-sectional, top and bottom views, respectively, of metal base 650 and conductive trace 670 after photoresist layers 660 and 662 are stripped.

Figure 83A:
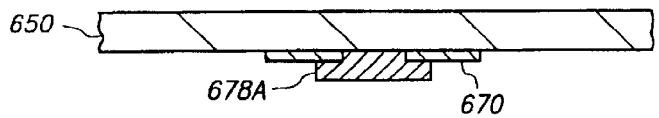
Figure 83B:
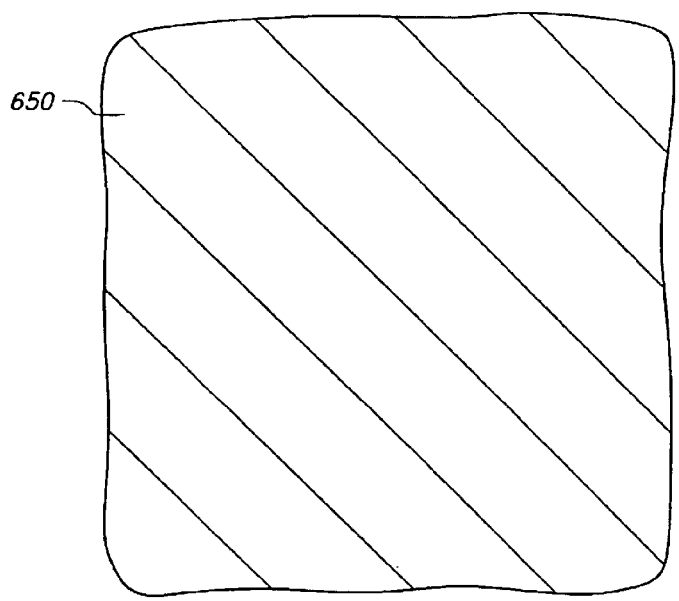
Figure 83C:
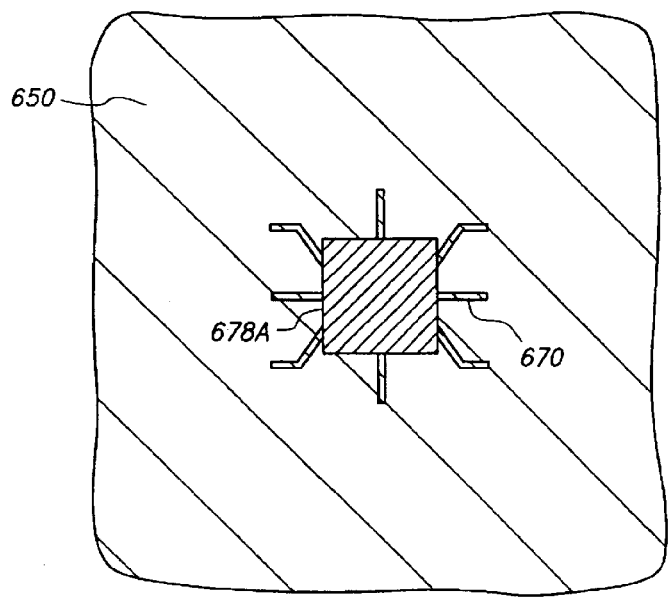

FIGS. 83A, 83B and 83C are cross-sectional, top and bottom views, respectively, of first adhesive 678A formed on metal base 650 and conductive trace 670. First adhesive 678A is identical to adhesive 178 except that first adhesive 678A has a smaller surface area that corresponds to the periphery of chip 610. Thus, first adhesive 678A contacts and covers the inner distal end of conductive trace 670 but not the outer distal end of conductive trace 670.

Figure 84A:
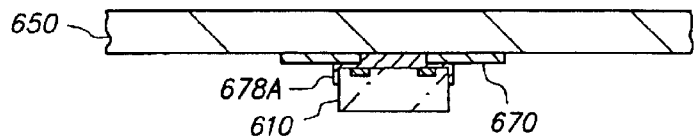
Figure 84B:
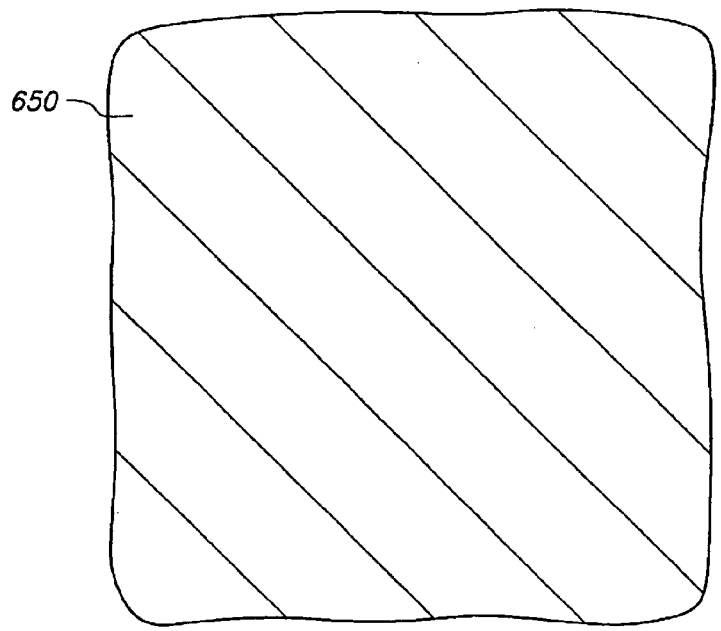
Figure 84C:
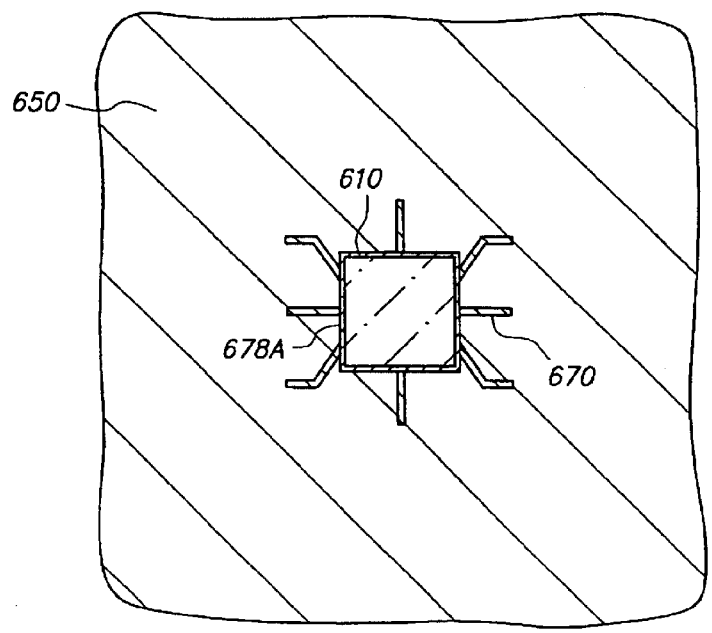

FIGS. 84A, 84B and 84C are cross-sectional, top and bottom views, respectively, of chip 610 mechanically attached to metal base 650 and conductive trace 670 by first adhesive 678A. First adhesive 678A covers and extends slightly outside the periphery of chip 610. First adhesive 678A is heated by the pick-up head that places chip 610 on first adhesive 678A. As a result, first adhesive 678A is partially polymerized (B stage) and forms a gel but is not fully cured. Furthermore, since all of first adhesive 678A is proximate to chip 610, none of first adhesive 678A remains a liquid resin (A stage).

Figure 85A:
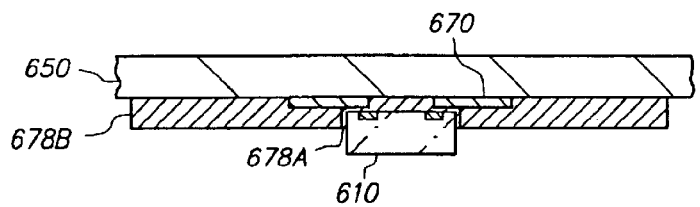
Figure 85B:
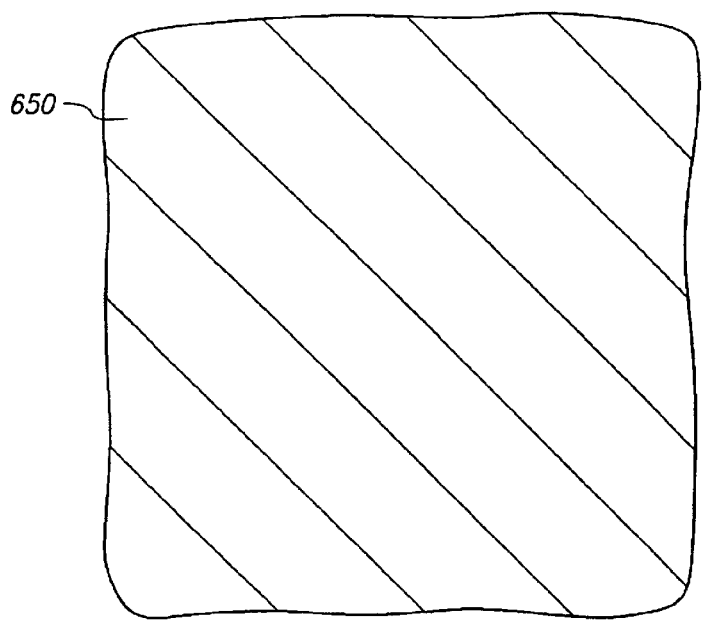
Figure 85C:
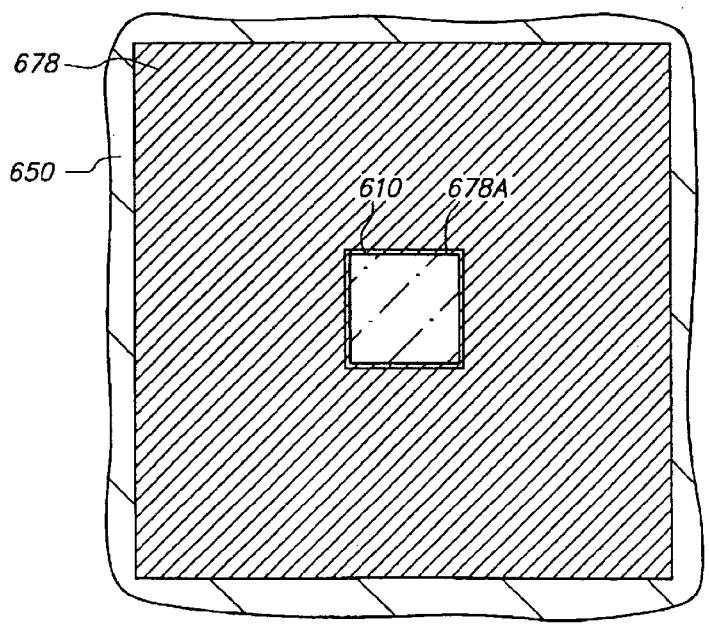

FIGS. 85A, 85B and 85C are cross-sectional, top and bottom views, respectively, of second adhesive 678B formed on metal base 650, conductive trace 670 and first adhesive 678A. Second adhesive 678B is identical to adhesive 178 except that second adhesive 678B has a smaller surface area with a frame-like shape that corresponds to the periphery of substrate 620 and cavity 642 outside chip 610. Thus, second adhesive 678B contacts and covers the outer distal end of conductive trace 670 but not the inner distal end of conductive trace 670.

Figure 86A:
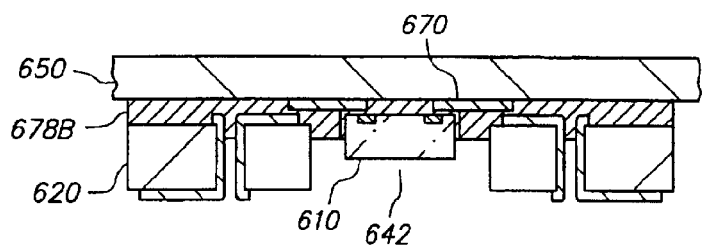
Figure 86B:
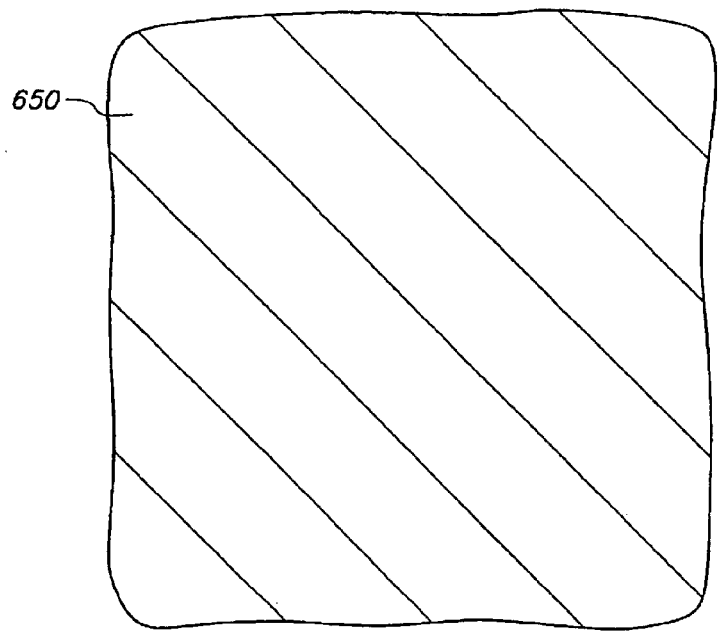
Figure 86C:
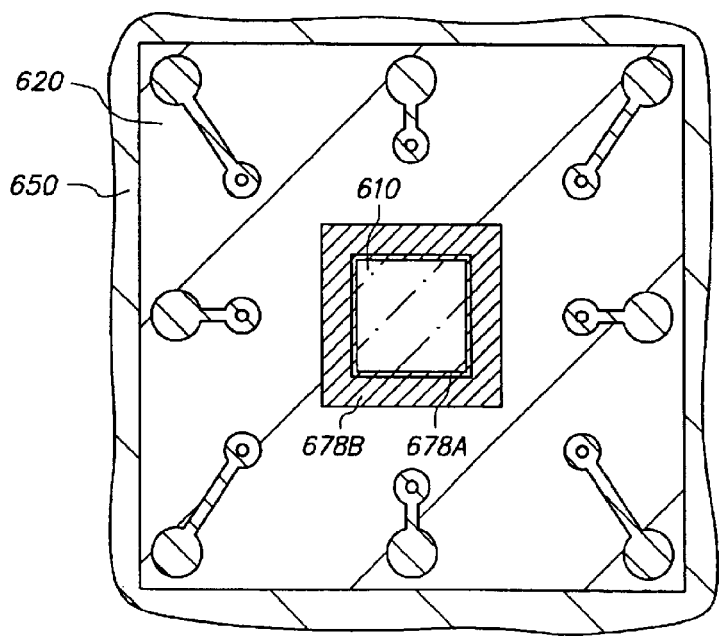

FIGS. 86A, 86B and 86C are cross-sectional, top and bottom views, respectively, of chip 610, metal base 650 and conductive trace 670 mechanically attached to substrate 620 by second adhesive 678B.

Second adhesive 678B contacts and covers substrate 620 and extends into cavity 642 between chip 610 and substrate 620. Second adhesive 678B is heated by the pick-up head that places substrate 620 on second adhesive 678B. As a result, second adhesive 678B proximate to substrate 620 is partially polymerized (B stage) and forms a gel but is not fully cured.

Figure 87A:
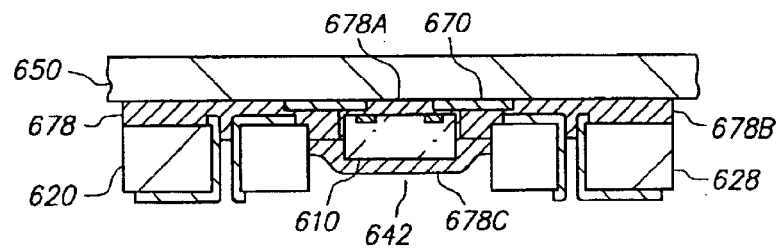
Figure 87B:
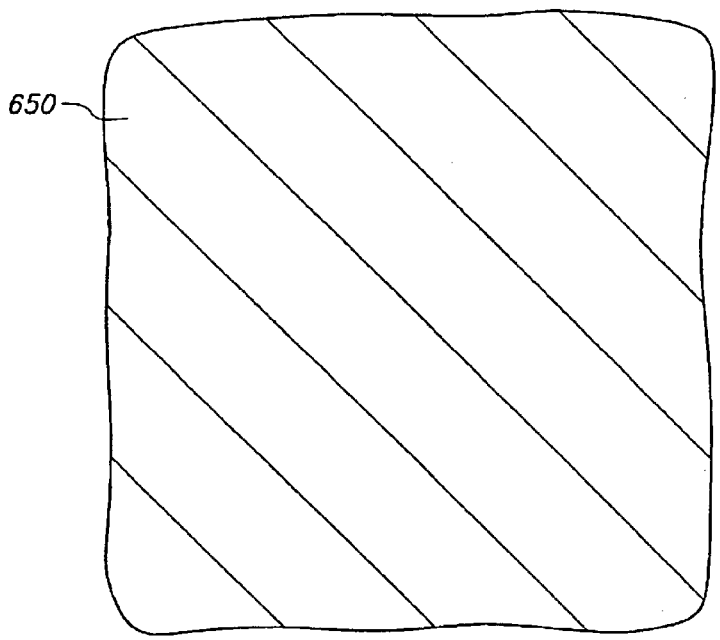
Figure 87C:
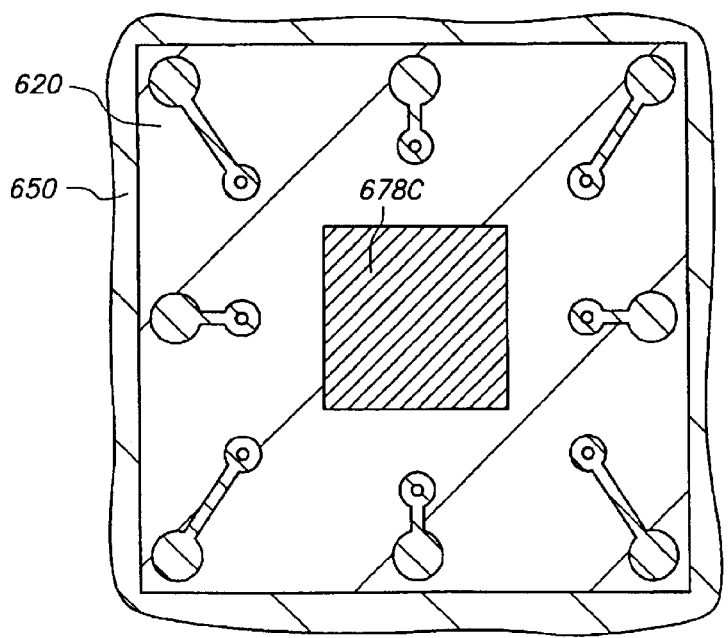

FIGS. 87A, 87B and 87C are cross-sectional, top and bottom views, respectively, of third adhesive 678C formed on chip 610 and substrate 620 in cavity 642.

Third adhesive 678B is identical to adhesive 178 except that third adhesive 678C is deposited into cavity 642 from surface 624 of substrate 620 by dispensing after chip 610, substrate 620 and conductive trace 670 are mechanically attached to one another by first adhesive 678A and second adhesive 678B. Third adhesive 678C contacts chip 610, dielectric base 628, first adhesive 678A and second adhesive 678B, and covers chip 610 and first adhesive 678A. Furthermore, third adhesive 678C is confined to cavity 642.

Third adhesive 678C provides back-side environmental protection such as moisture resistance and particle protection for chip 610 as well as enhanced mechanical coupling between chip 610 and substrate 620.

First adhesive 678A and second adhesive 678B are partially polymerized (B stage) as third adhesive 678C is deposited into cavity 642 as a liquid resin (A stage). Thereafter, the structure is placed in an oven and first adhesive 678A, second adhesive 678B and third adhesive 678C are fully cured. Adhesive 678 is composed of first adhesive 678A, second adhesive 678B and third adhesive 678C. Thus, adhesive 678 is a triple-piece adhesive.

Figure 88A:
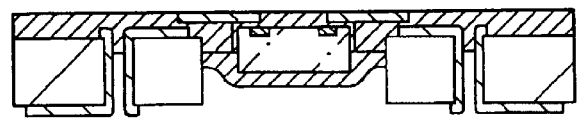
Figure 88B:
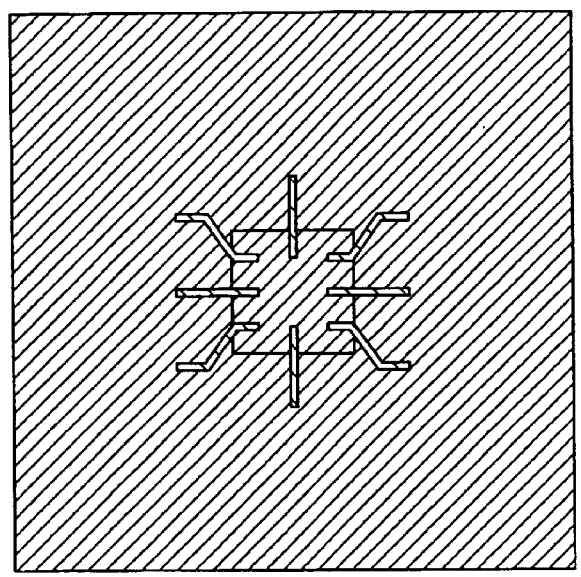
Figure 88C:
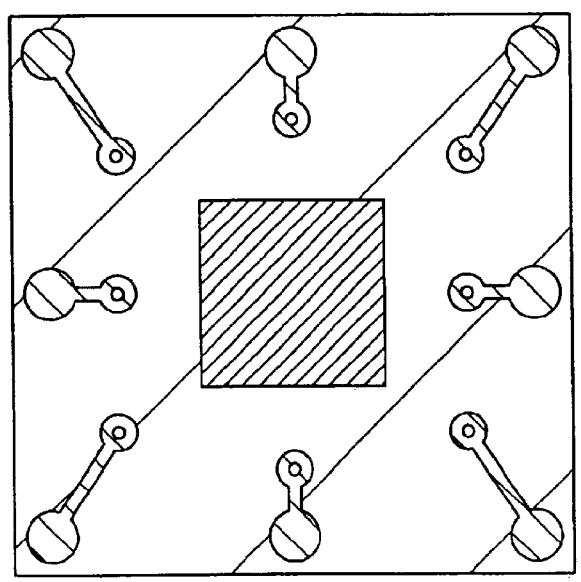

FIGS. 88A, 88B and 88C are cross-sectional, top and bottom views, respectively, of the structure after metal base 650 is removed.

Figure 89A:
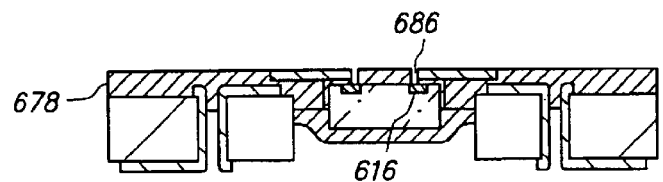
Figure 89B:
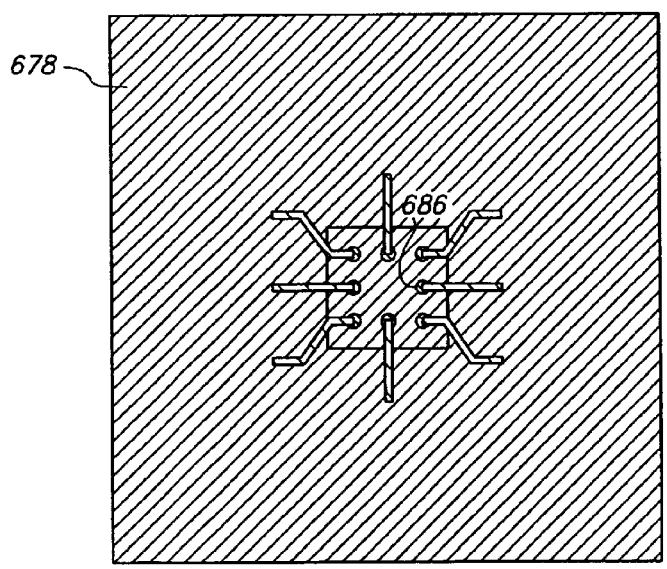
Figure 89C:
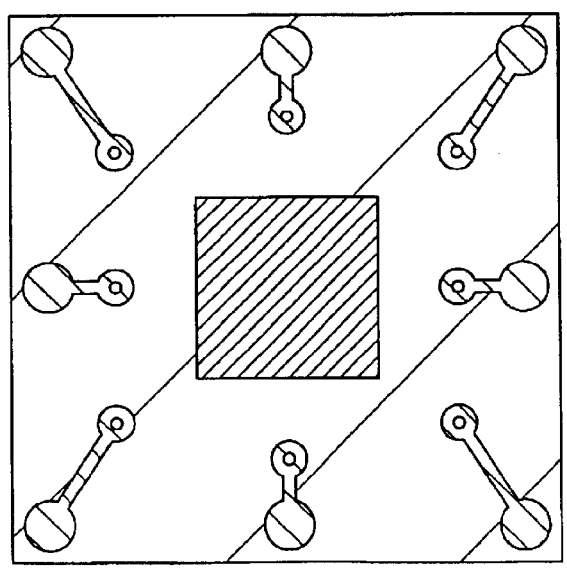

FIGS. 89A, 89B and 89C are cross-sectional, top and bottom views, respectively, of opening 686 that is formed through adhesive 678 and exposes pad 616.

Figure 90A:
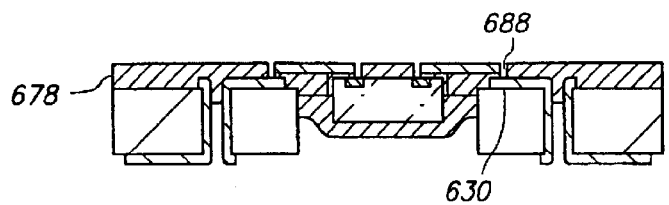
Figure 90B:
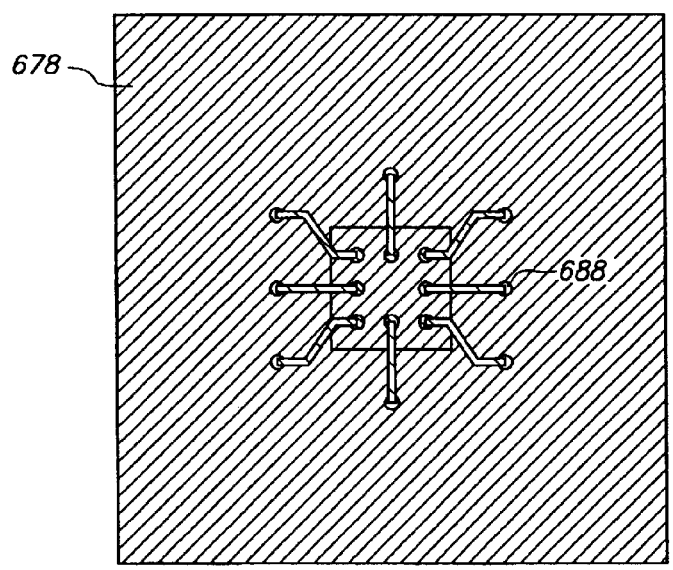
Figure 90C:
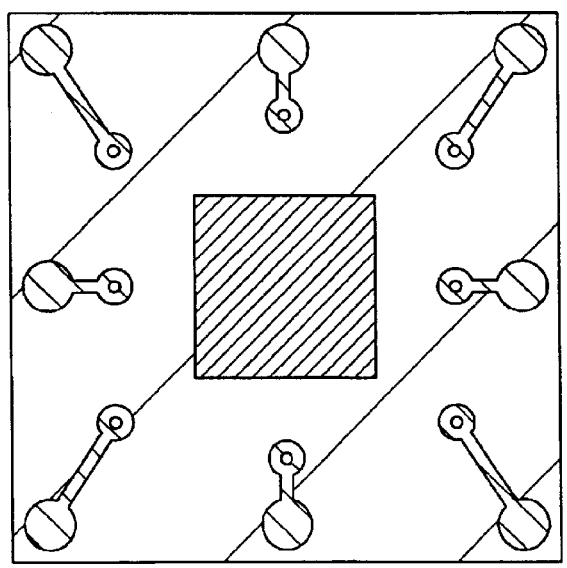

FIGS. 90A, 90B and 90C are cross-sectional, top and bottom views, respectively, of via 688 that is formed through adhesive 678 and exposes first contact terminal 630.

Figure 91A:
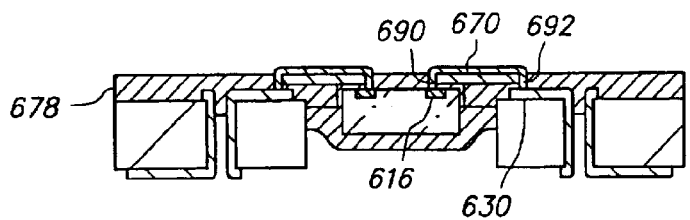
Figure 91B:
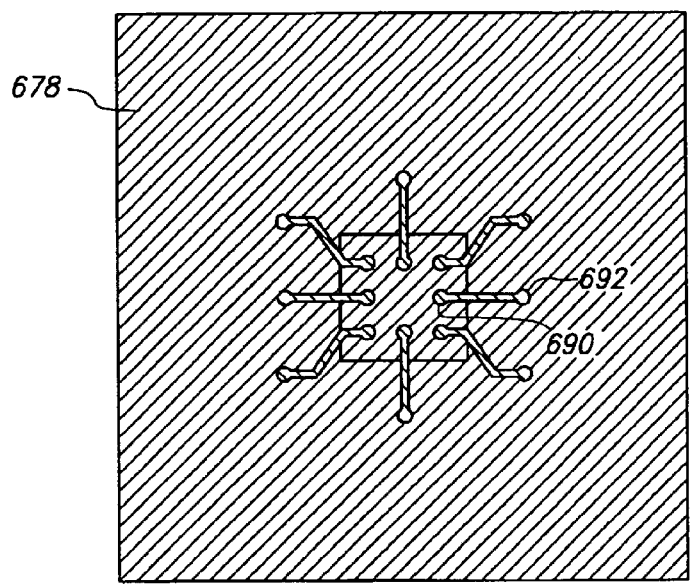
Figure 91C:
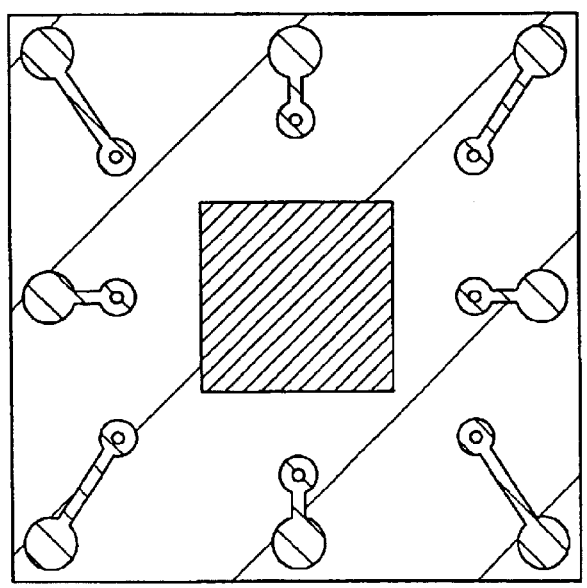

FIGS. 91A, 91B and 91C are cross-sectional, top and bottom views, respectively, of connection joint 690 formed on pad 616 and conductive trace 670, and interconnect 692 formed on first contact terminal 630 and conductive trace 670.

Figure 92A:
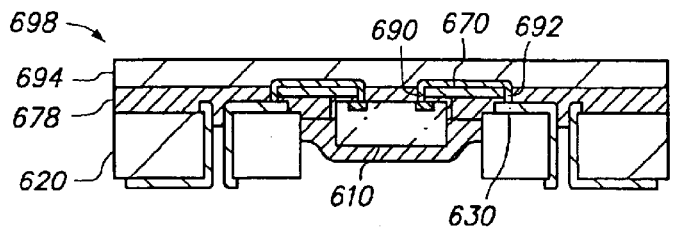
Figure 92B:
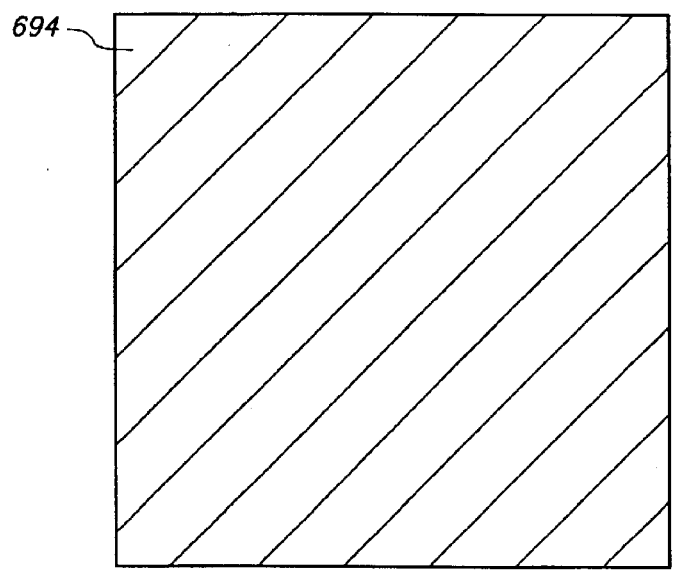
Figure 92C:
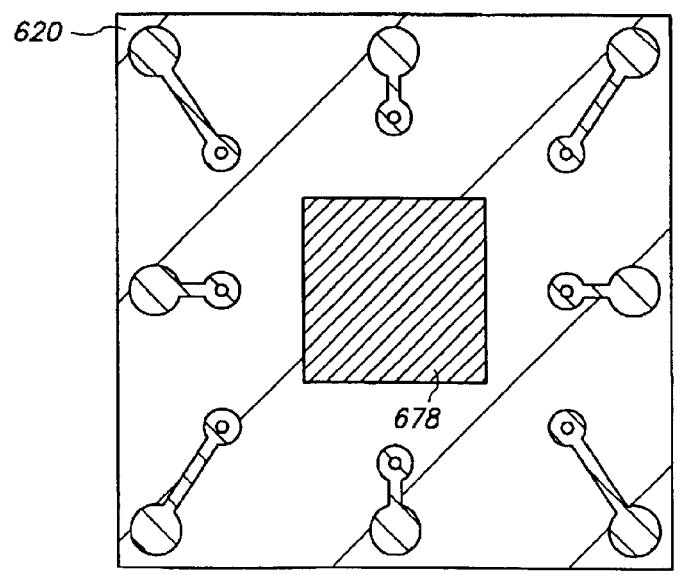

FIGS. 92A, 92B and 92C are cross-sectional, top and bottom views, respectively, of insulative base 694 formed over conductive trace 670, adhesive 678, connection joint 690 and interconnect 692.

At this stage, the manufacture of semiconductor chip assembly 698 that includes chip 610, substrate 620, conductive trace 670, adhesive 678, connection joint 690, interconnect 692 and insulative base 696 can be considered complete.

FIGS. 93A–107A, 93B–107B and 93C–107C are cross-sectional, top and bottom views, respectively, of a method of making a semiconductor chip assembly in accordance with a seventh embodiment of the present invention. In the seventh embodiment, the conductive trace and the chip are mechanically attached to the substrate, then the opening and the connection joint are formed, and then the via and the interconnect are formed. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, substrate 720 corresponds to substrate 120, etc.

Figure 93A:
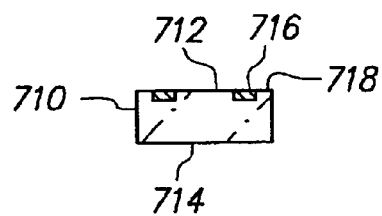
Figure 93B:
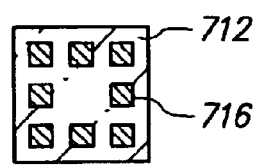
Figure 93C:

FIGS. 93A, 93B and 93C are cross-sectional, top and bottom views, respectively, of semiconductor chip 710 which includes opposing major surfaces 712 and 714. Surface 712 includes conductive pad 716 and passivation layer 718.

Figure 94A:
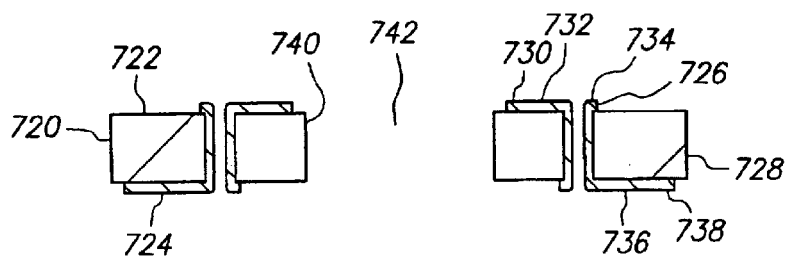
Figure 94B:
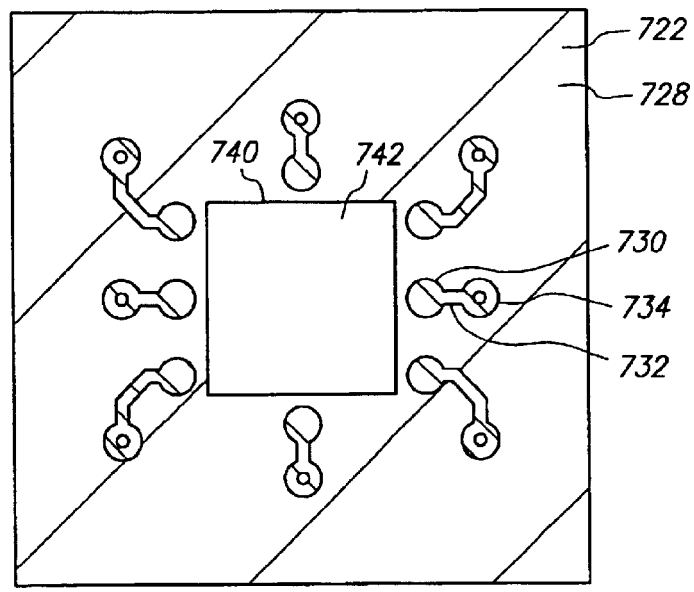
Figure 94C:
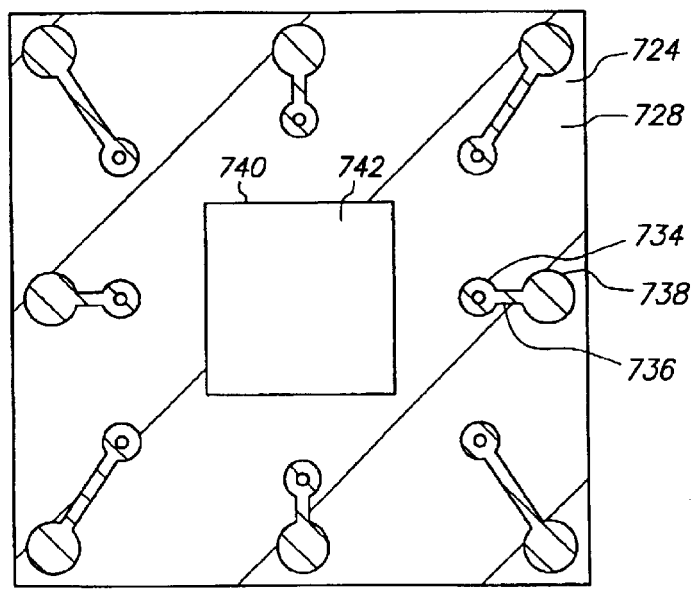

FIGS. 94A, 94B and 94C are cross-sectional, top and bottom views, respectively, of substrate 720 which includes opposing major surfaces 722 and 724, conductive terminal 726 and dielectric base 728. Conductive terminal 726 includes first contact terminal 730, first routing line 732, vertical connection 734, second routing line 736 and second contact terminal 738. Dielectric base 728 includes inner sidewalls 740 that bound cavity 742.

Figure 95A:
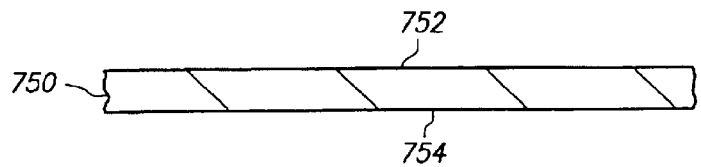
Figure 95B:
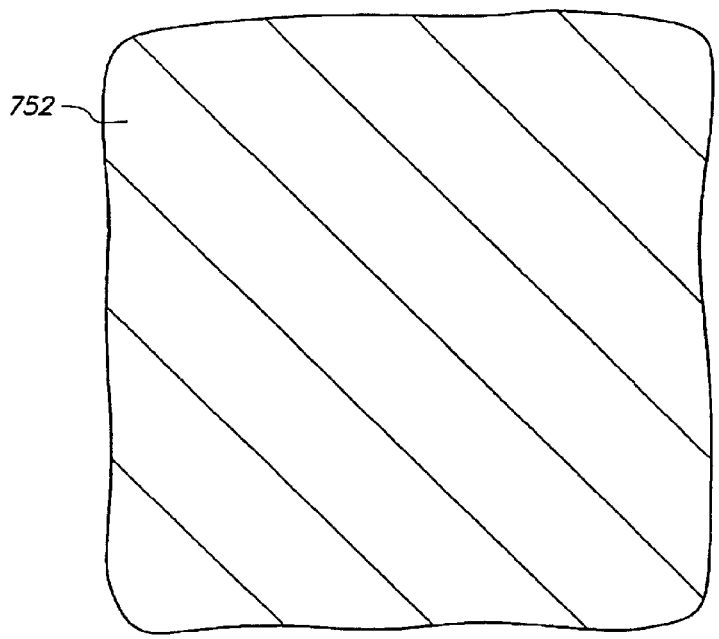
Figure 95C:
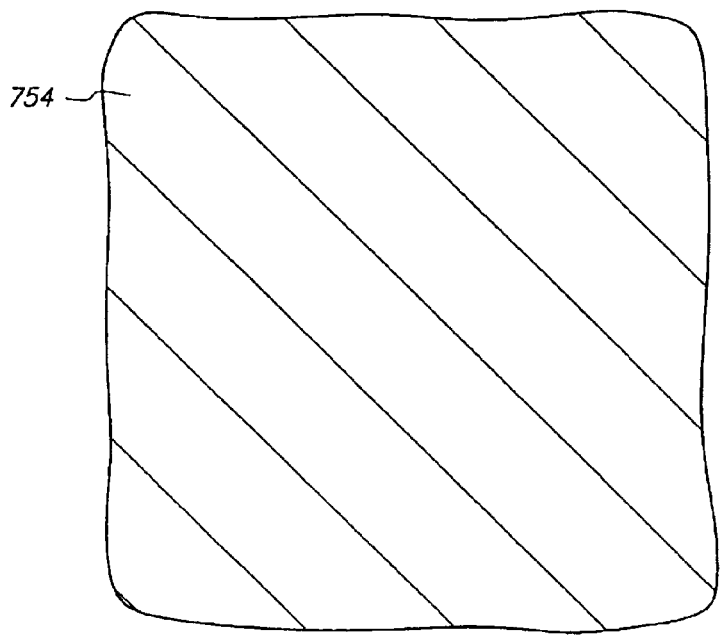

FIGS. 95A, 95B and 95C are cross-sectional, top and bottom views, respectively, of metal base 750 which includes opposing major surfaces 752 and 754.

Figure 96A:
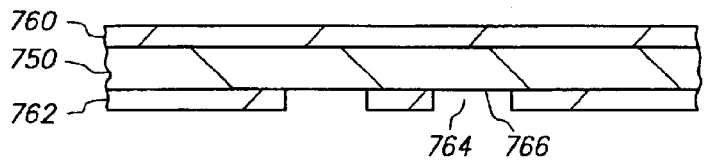
Figure 96B:
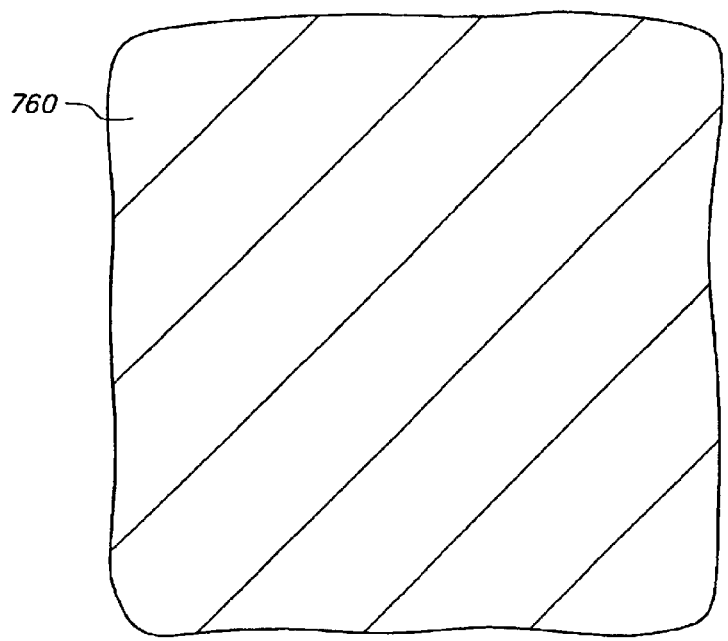
Figure 96C:
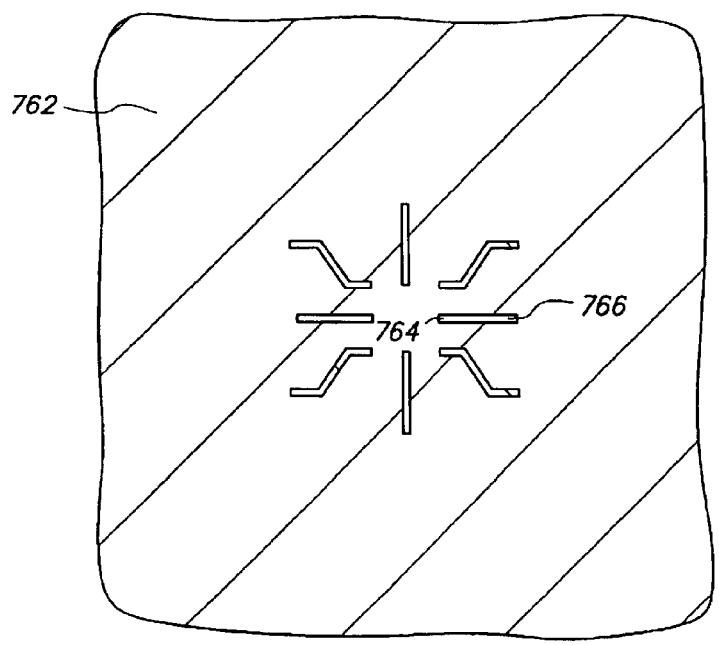

FIGS. 96A, 96B and 96C are cross-sectional, top and bottom views, respectively, of photoresist layers 760 and 762 formed on metal base 750. Photoresist layer 762 contains opening 764 that selectively exposes portion 766 of surface 754.

Figure 97A:
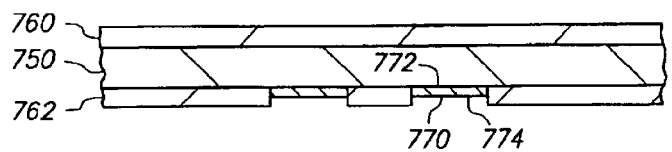
Figure 97B:
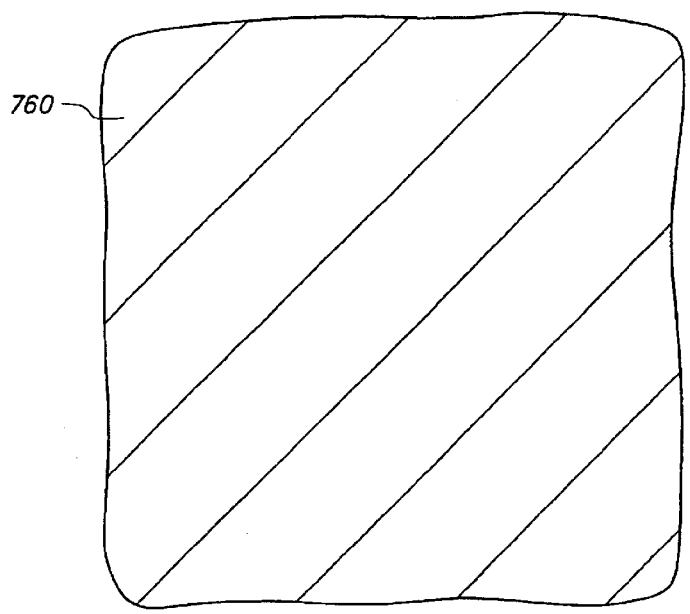
Figure 97C:
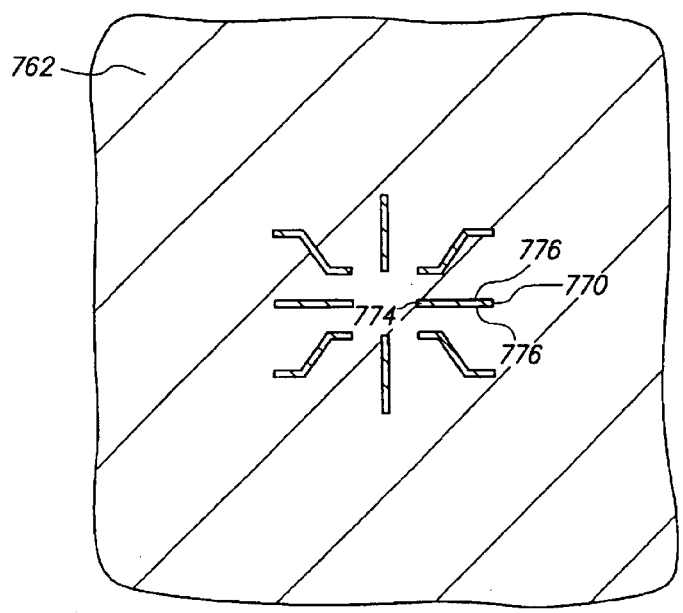

FIGS. 97A, 97B and 97C are cross-sectional, top and bottom views, respectively, of conductive trace 770 formed on metal base 750 by electroplating. Conductive trace 770 includes opposing major surfaces 772 and 774 and peripheral sidewalls 776.

Figure 98A:
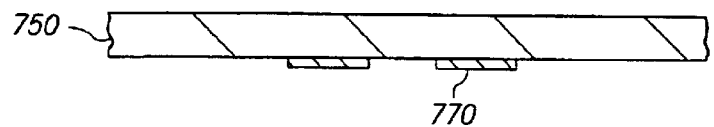
Figure 98B:
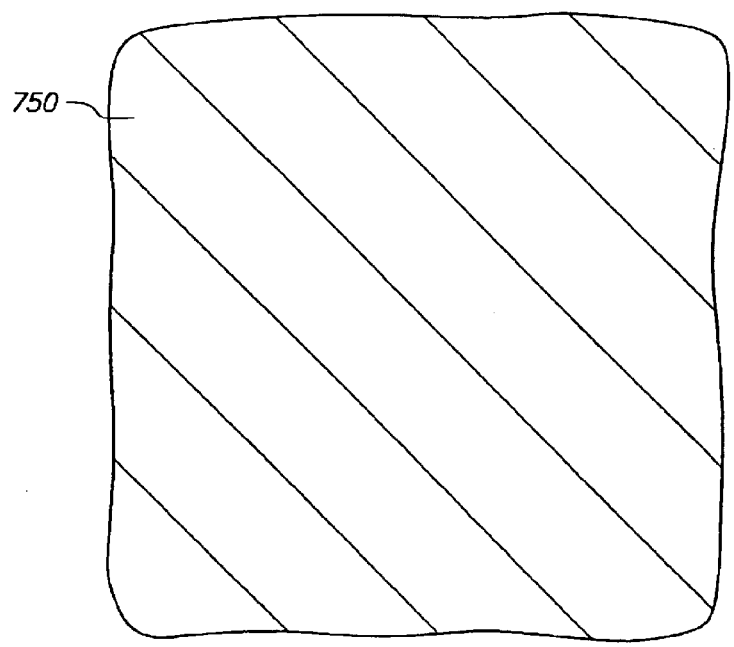
Figure 98C:
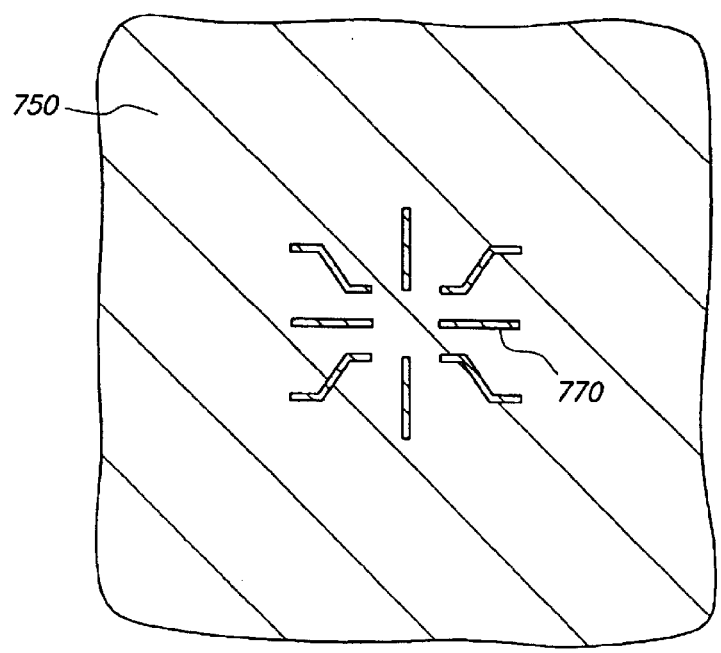

FIGS. 98A, 98B and 98C are cross-sectional, top and bottom views, respectively, of metal base 750 and conductive trace 770 after photoresist layers 760 and 762 are stripped.

Figure 99A:
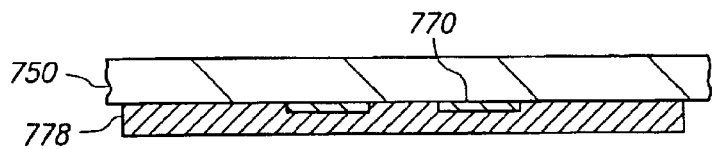
Figure 99B:
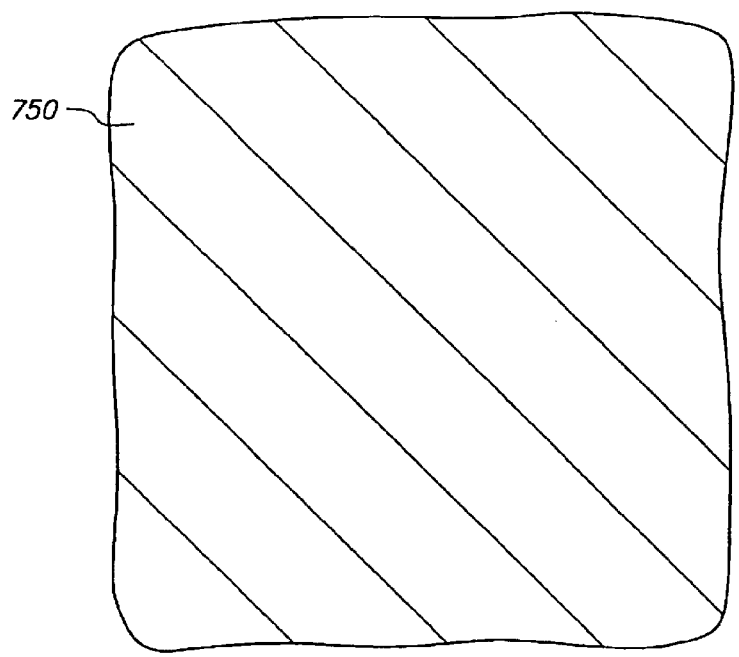
Figure 99C:
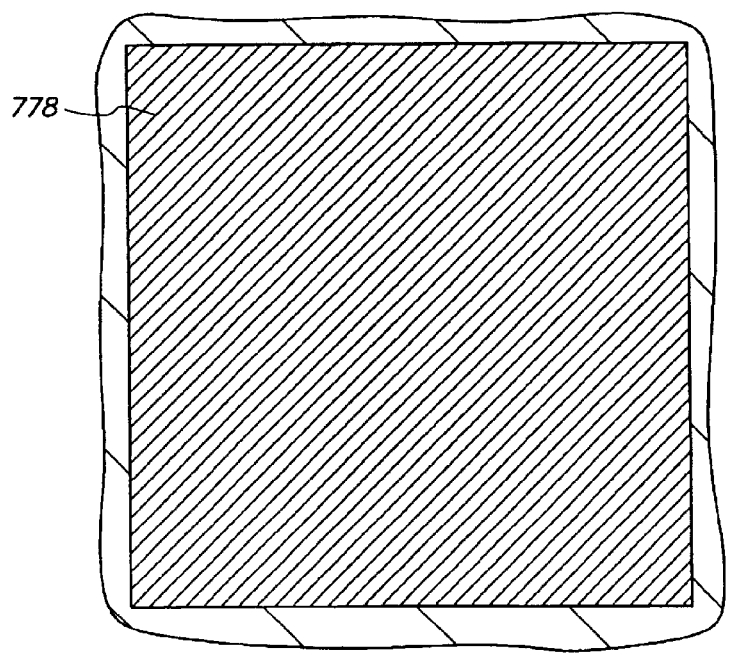

FIGS. 99A, 99B and 99C are cross-sectional, top and bottom views, respectively, of adhesive 778 formed on metal base 750 and conductive trace 770.

Figure 100A:
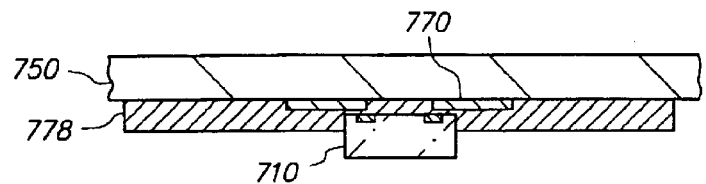
Figure 100B:
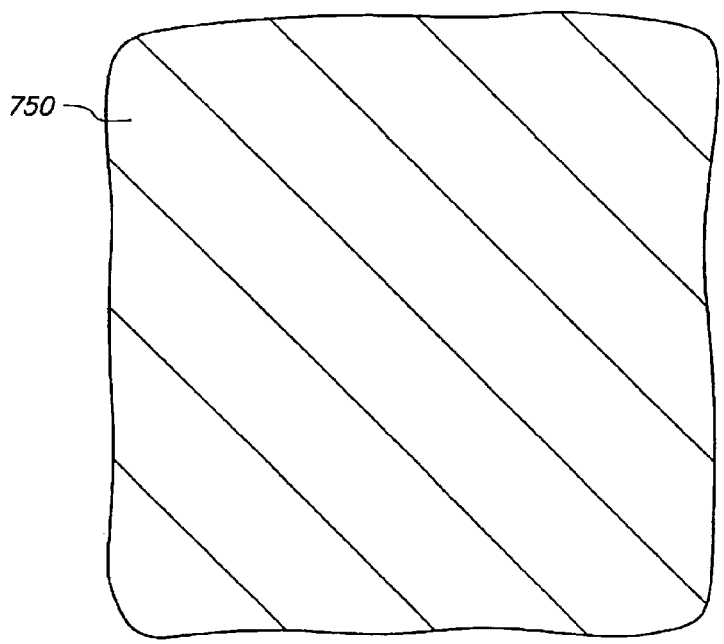
Figure 100C:
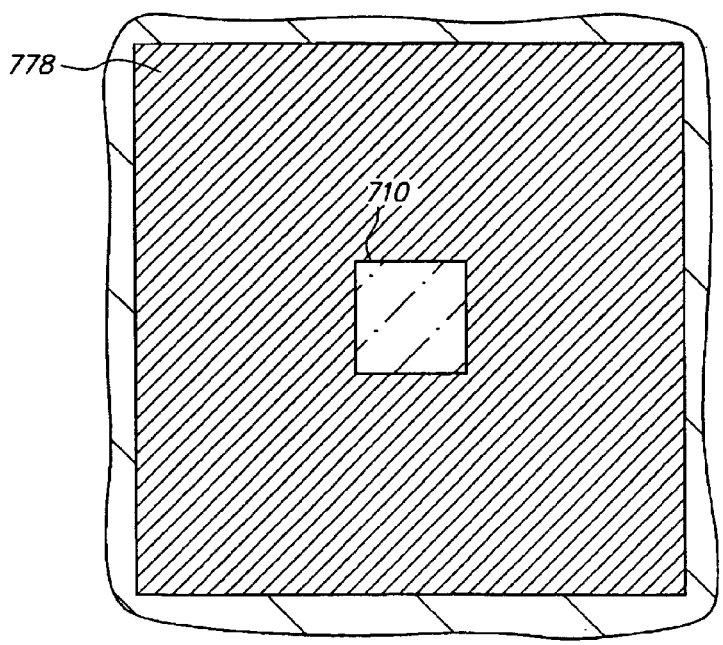

FIGS. 100A, 100B and 100C are cross-sectional, top and bottom views, respectively, of chip 710 mechanically attached to metal base 750 and conductive trace 770 by adhesive 778.

Figure 101A:
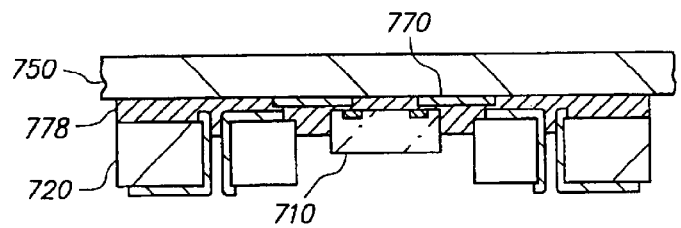
Figure 101B:
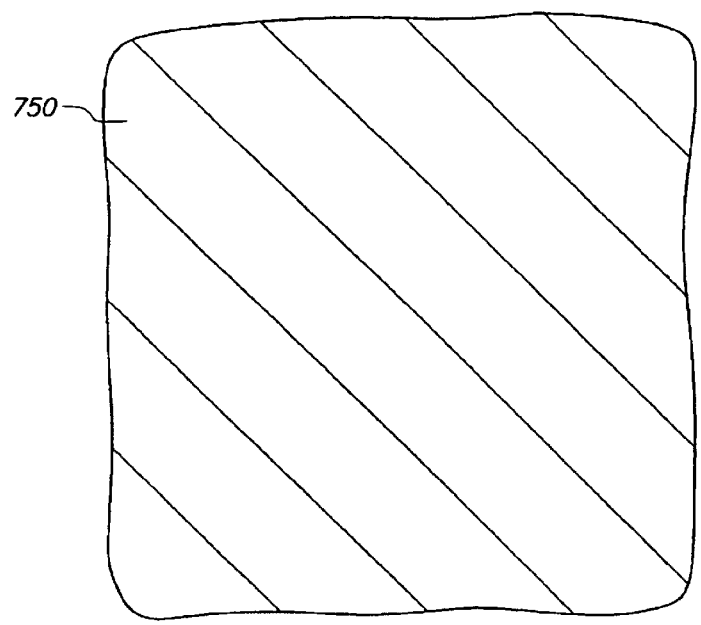
Figure 101C:
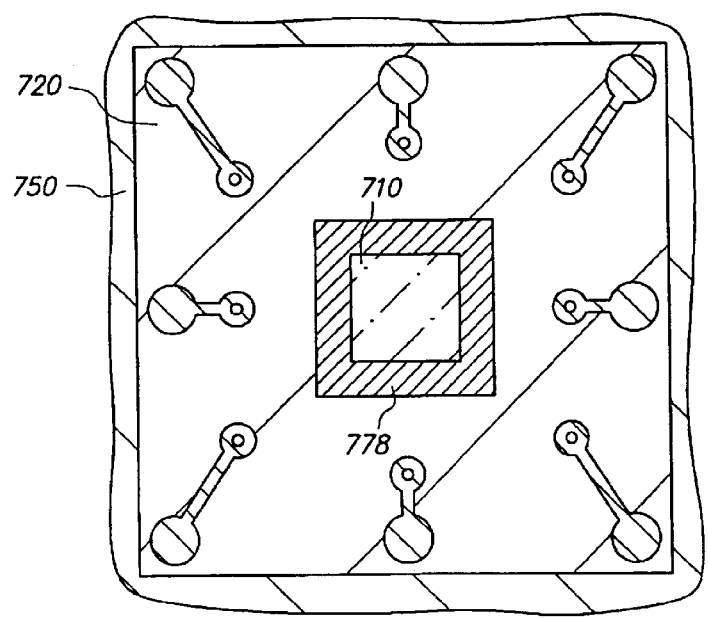

FIGS. 101A, 101B and 101C are cross-sectional, top and bottom views, respectively, of chip 710, metal base 750 and conductive trace 770 mechanically attached to substrate 720 by adhesive 778.

Figure 102A:
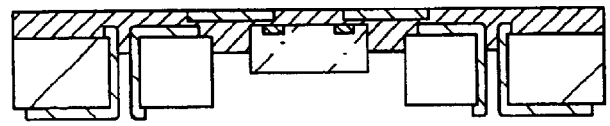
Figure 102B:
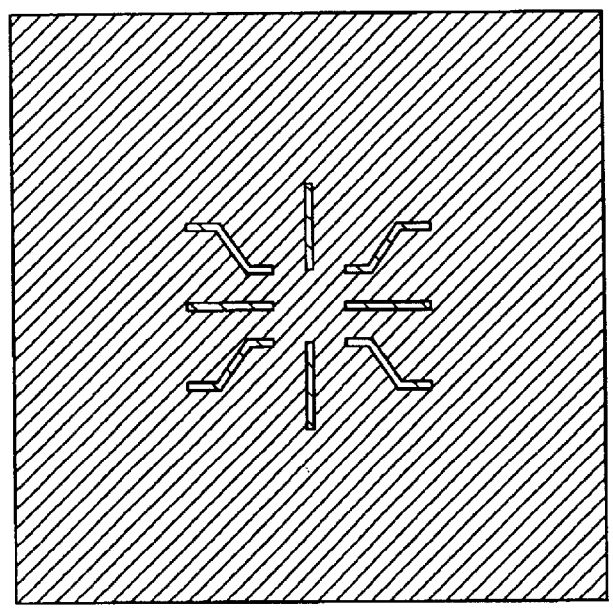
Figure 102C:
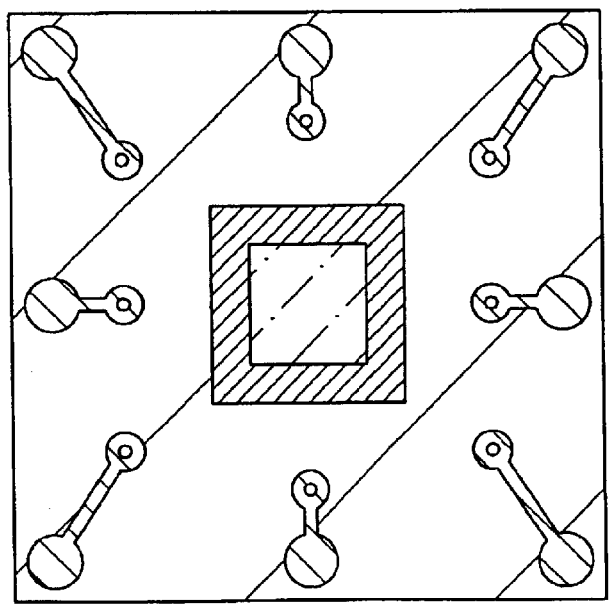

FIGS. 102A, 102B and 102C are cross-sectional, top and bottom views, respectively, of the structure after metal base 750 is removed.

Figure 103A:
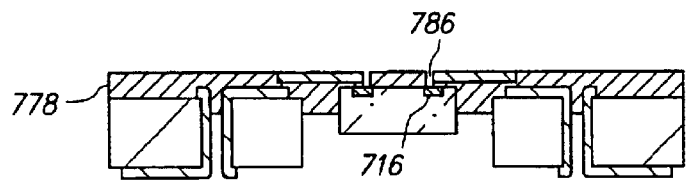
Figure 103B:
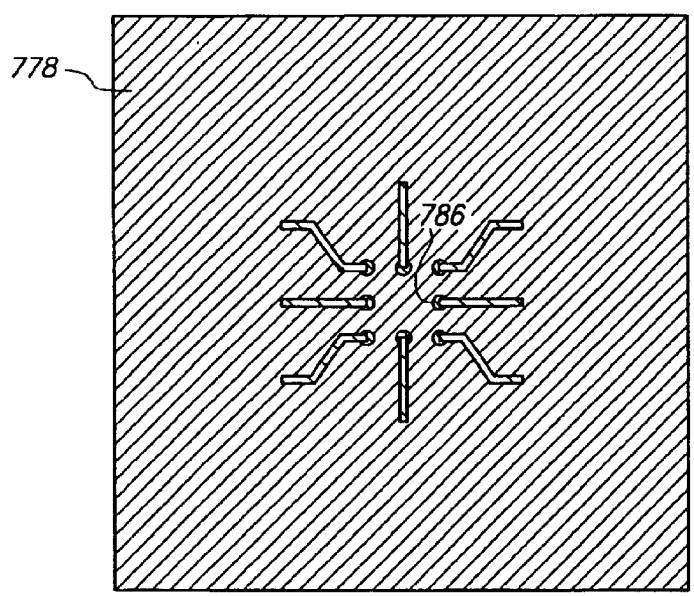
Figure 103C:
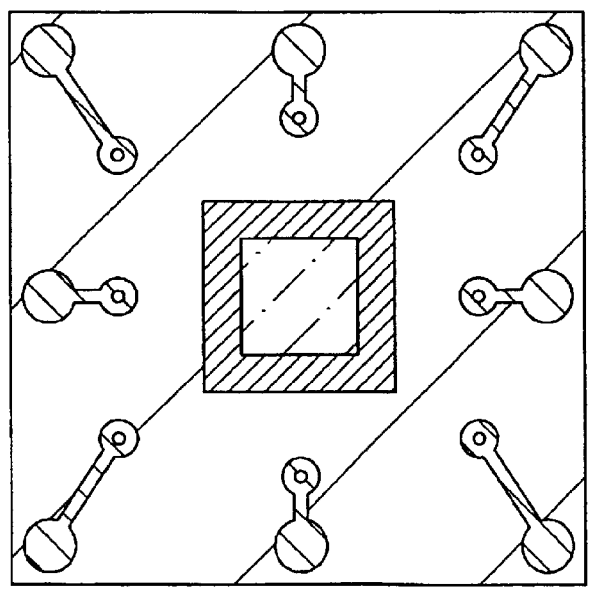

FIGS. 103A, 103B and 103C are cross-sectional, top and bottom views, respectively, of opening 786 that is formed through adhesive 778 and exposes pad 716.

Figure 104A:
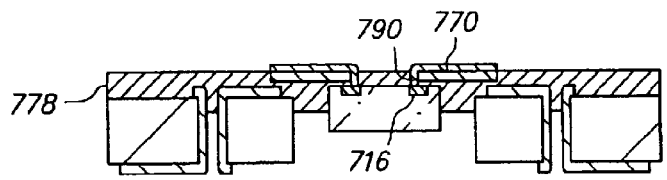
Figure 104B:
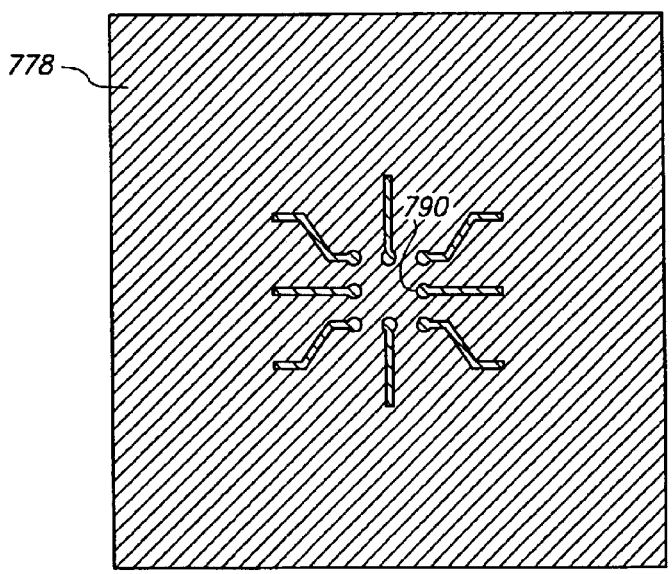
Figure 104C:
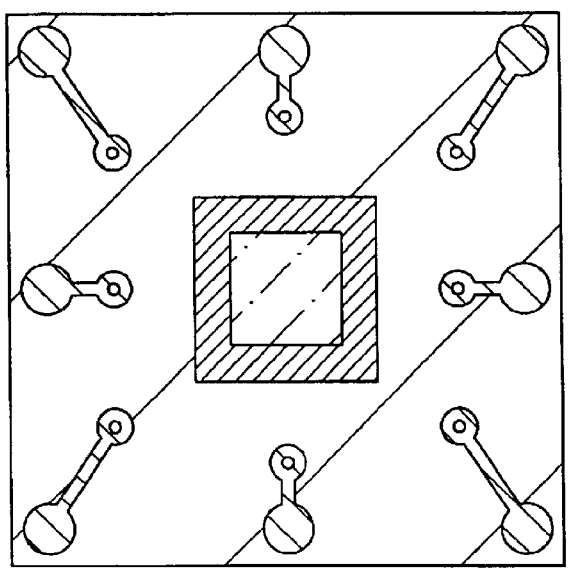

FIGS. 104A, 104B and 104C are cross-sectional, top and bottom views, respectively, of connection joint 790 formed on pad 716 and conductive trace 770.

Figure 105A:
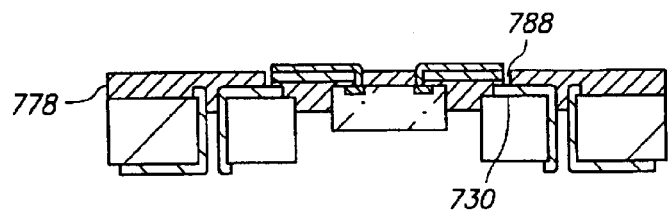
Figure 105B:
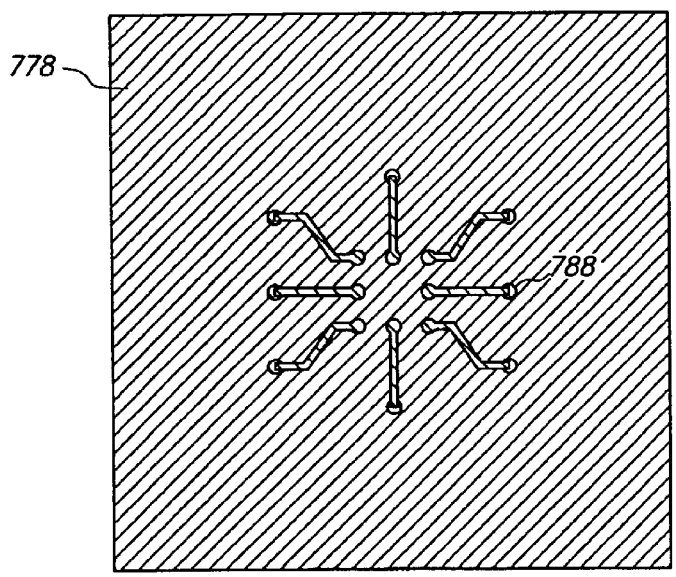
Figure 105C:
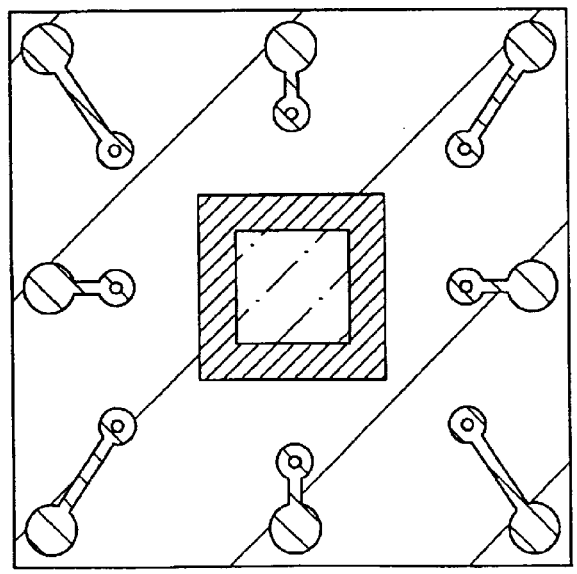

FIGS. 105A, 105B and 105C are cross-sectional, top and bottom views, respectively, of via 788 that is formed through adhesive 778 and exposes first contact terminal 730.

Figure 106A:
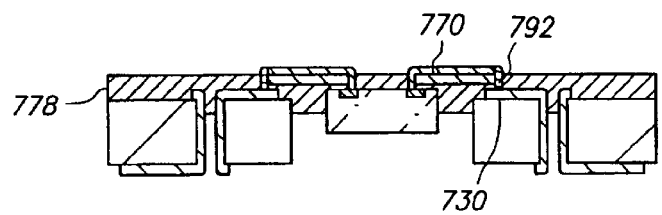
Figure 106B:
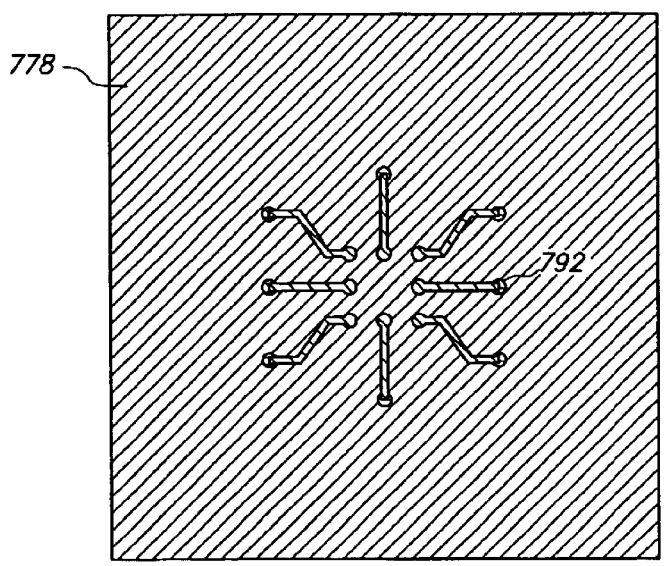
Figure 106C:
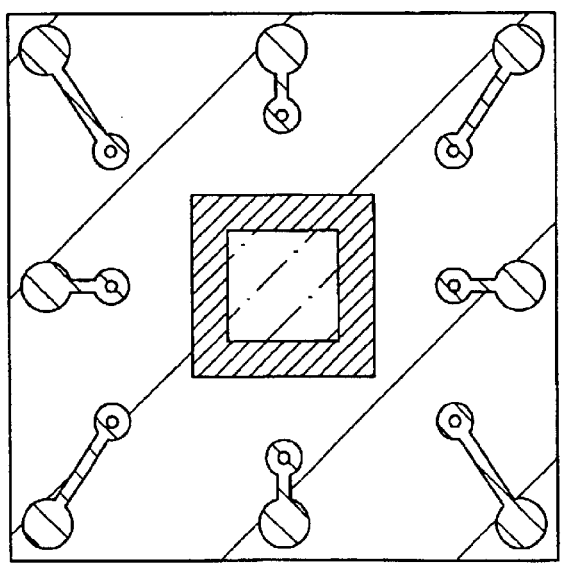

FIGS. 106A, 106B and 106C are cross-sectional, top and bottom views, respectively, of interconnect 792 formed on first contact terminal 730 and conductive trace 770. Interconnect 792 is composed of solder.

Interconnect 792 is deposited into via 788 by solder paste printing followed by solder reflow. The solder paste includes finely powdered tin-lead solder particles mixed in a viscous organic resin containing a fluxing agent. The solder paste is deposited into via 788 using stencil printing. During the stencil printing process, a stencil (not shown) with a thickness of 100 microns is placed over adhesive 778, a stencil opening with a diameter of 70 microns is axially aligned with via 788, and then a squeegee (not shown) pushes the solder paste along the surface of the stencil opposite adhesive 778, through the stencil opening and into via 788. The solder paste is compliant enough at room temperature to conform to virtually any shape. As a result, the solder paste fills via 788 and extends above via 788 in the stencil opening. Thereafter, the structure is heated to a temperature of about 210° C. The heat causes the flux in the solder paste to react with and remove oxides from first contact terminal 730 and conductive trace 770 and the solder particles in the solder paste, renders the solder particles in the solder paste molten such that they coalesce, and vaporizes the organic resin in the solder paste. As a result, the solder paste contracts from its original size and solder reflow occurs. Thereafter, the heat is removed and the molten solder particles cool and solidify into a hardened solder joint that provides interconnect 792.

Figure 107A:
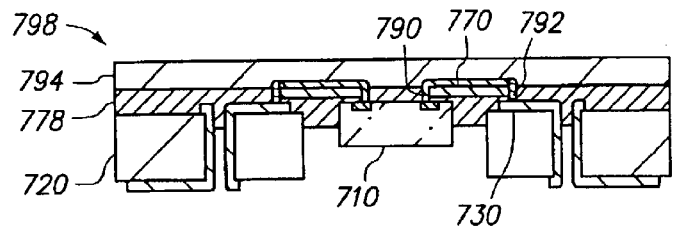
Figure 107B:
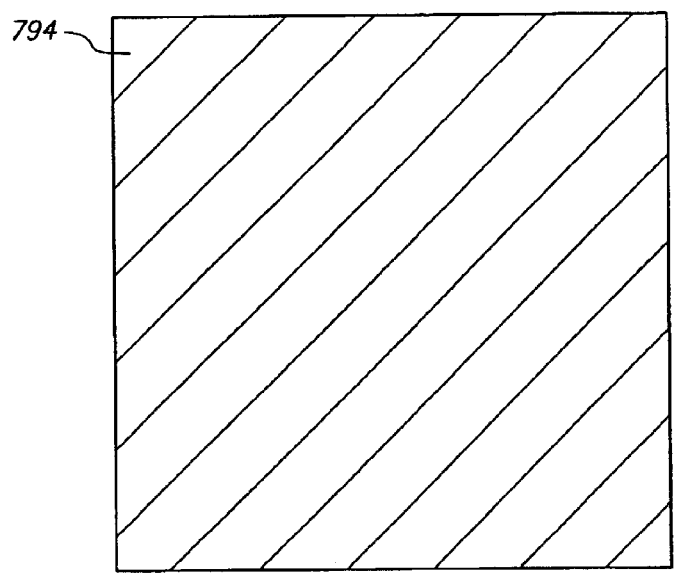
Figure 107C:
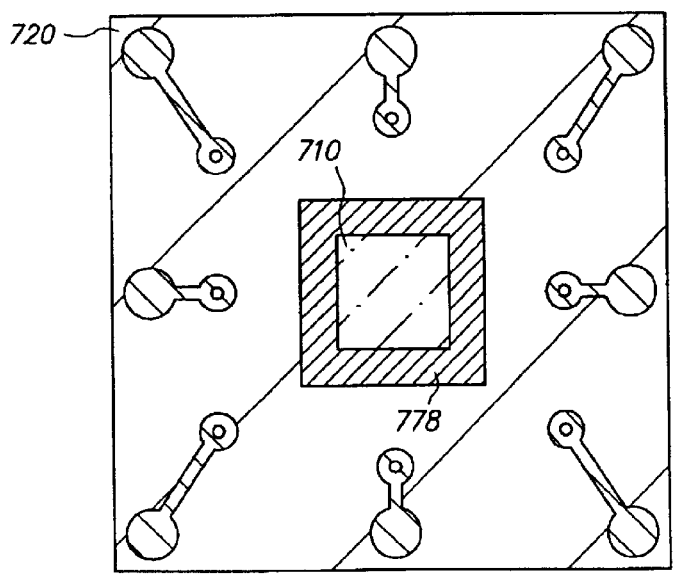

FIGS. 107A, 107B and 107C are cross-sectional, top and bottom views, respectively, of insulative base 794 formed over conductive trace 770, adhesive 778, connection joint 790 and interconnect 792.

At this stage, the manufacture of semiconductor chip assembly 798 that includes chip 710, substrate 720, conductive trace 770, adhesive 778, connection joint 790, interconnect 792 and insulative base 794 can be considered complete.

FIGS. 108A–127A, 108B–127B and 101C–127C are cross-sectional, top and bottom views, respectively, of a method of making a semiconductor chip assembly in accordance with an eighth embodiment of the present invention. In the eighth embodiment, the conductive trace is mechanically attached to the chip, then the opening and the connection joint are formed, then the conductive trace and the chip are mechanically attached to the substrate, and then the via and the interconnect are formed. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, substrate 820 corresponds to substrate 120, etc.

Figure 108A:
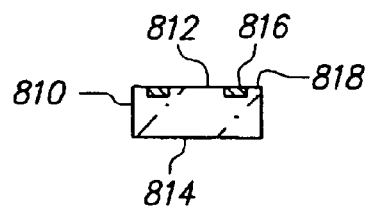
Figure 108B:
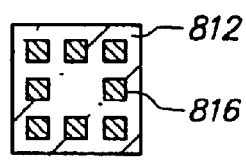
Figure 108C:
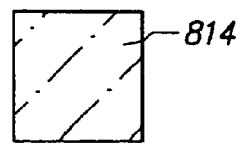

FIGS. 108A, 108B and 108C are cross-sectional, top and bottom views, respectively, of semiconductor chip 810 which includes opposing major surfaces 812 and 814. Surface 812 includes conductive pad 816 and passivation layer 818.

Figure 109A:
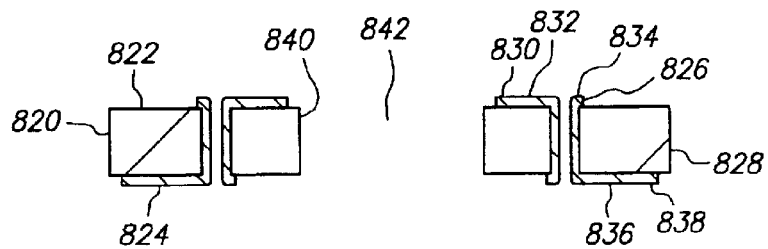
Figure 109B:
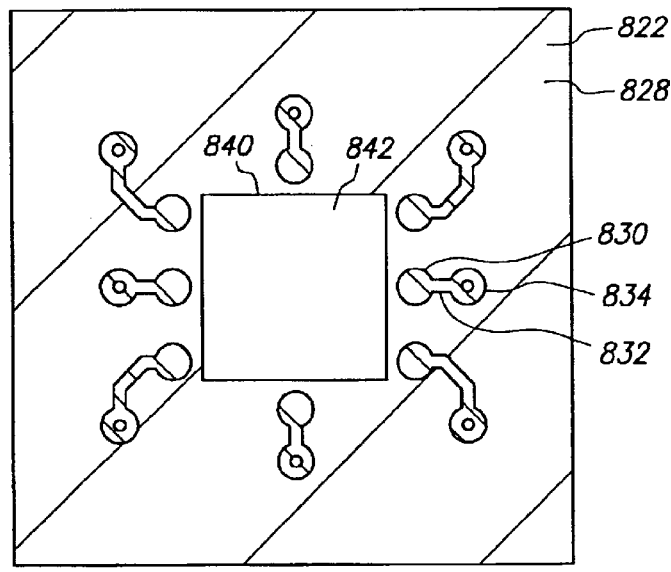
Figure 109C:
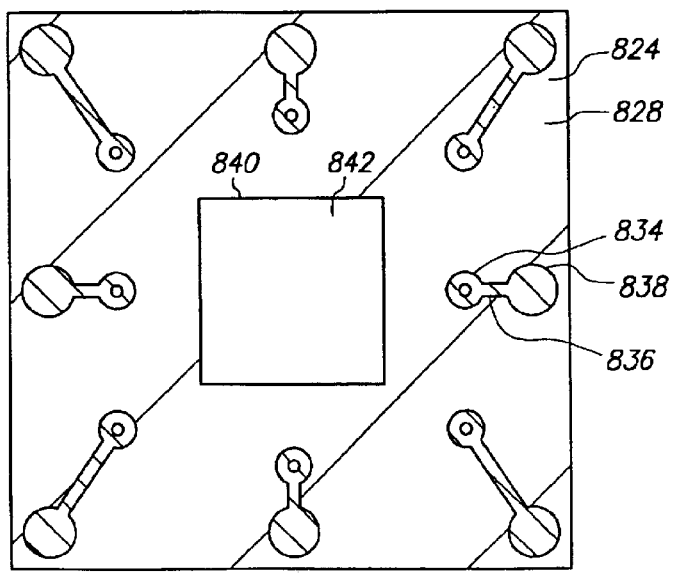

FIGS. 109A, 109B and 109C are cross-sectional, top and bottom views, respectively, of substrate 820 which includes opposing major surfaces 822 and 824, conductive terminal 826 and dielectric base 828. Conductive terminal 826 includes first contact terminal 830, first routing line 832, vertical connection 834, second routing line 836 and second contact terminal 838. Dielectric base 828 includes inner sidewalls 840 that bound cavity 842.

Figure 110A:
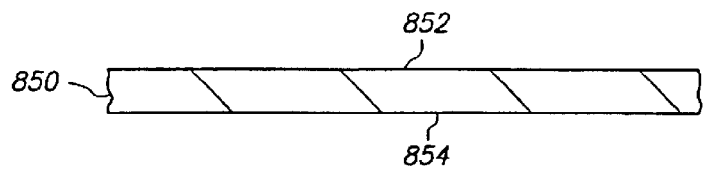
Figure 110B:
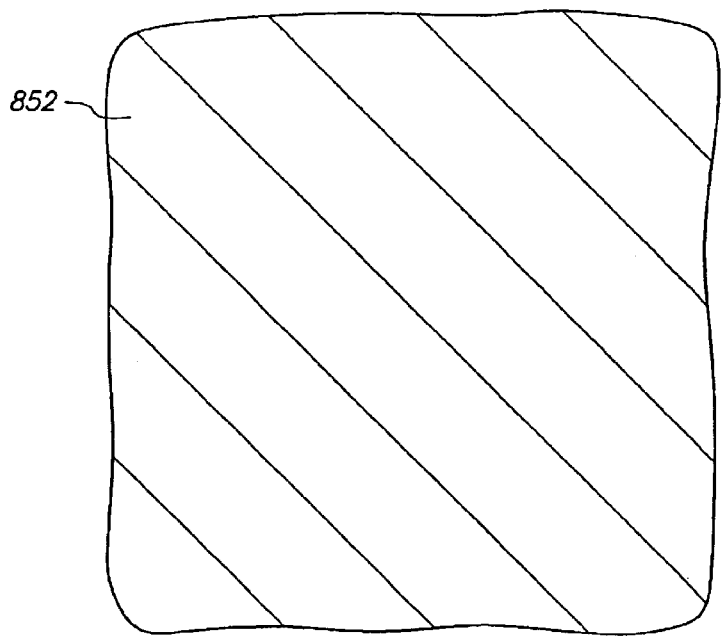
Figure 110C:
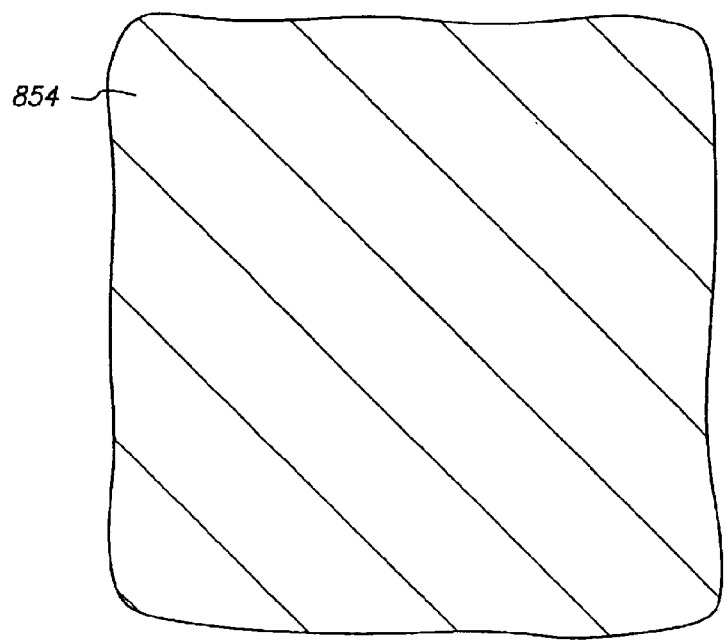

FIGS. 110A, 110B and 110C are cross-sectional, top and bottom views, respectively, of metal base 850 which includes opposing major surfaces 852 and 854.

Figure 111A:
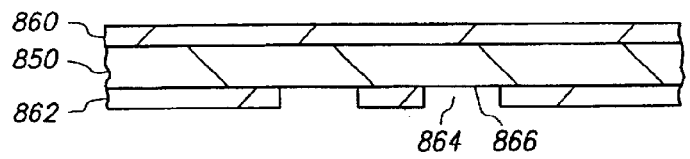
Figure 111B:
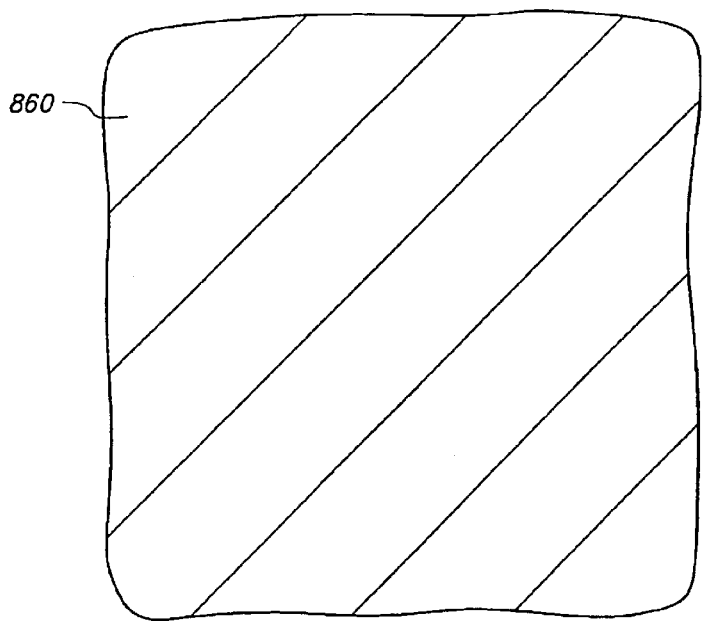
Figure 111C:
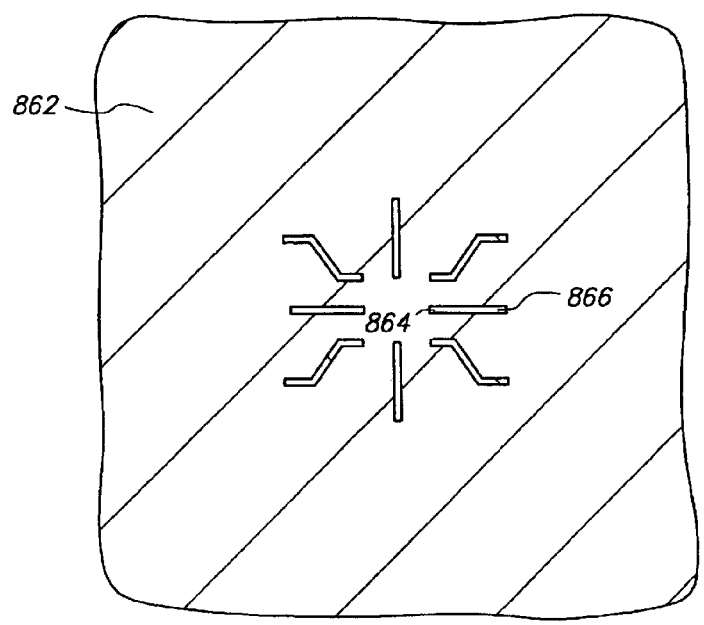

FIGS. 111A, 111B and 111C are cross-sectional, top and bottom views, respectively, of photoresist layers 860 and 862 formed on metal base 850. Photoresist layer 862 contains opening 864 that selectively exposes portion 866 of surface 854.

Figure 112A:
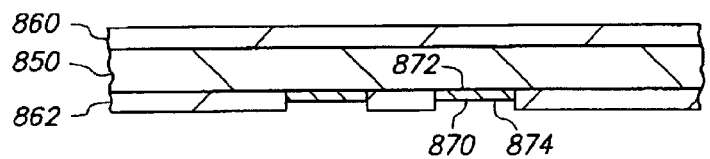
Figure 112B:
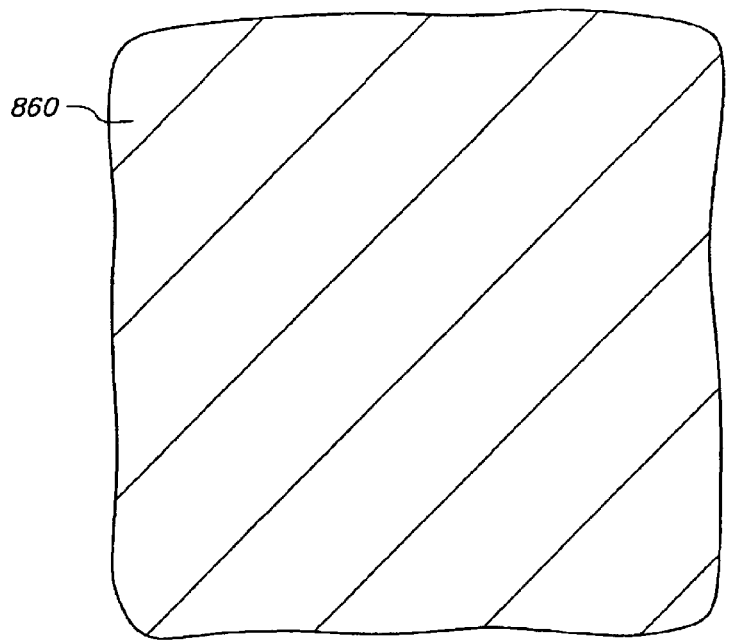
Figure 112C:
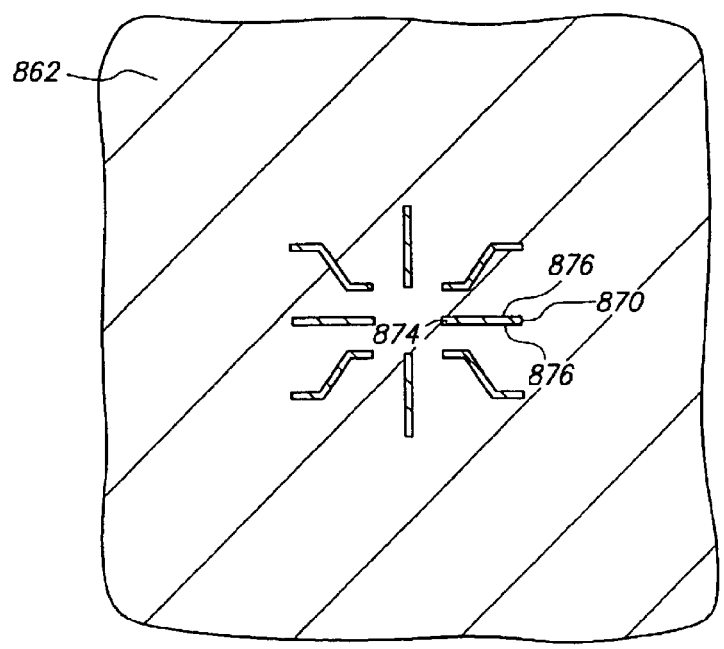

FIGS. 112A, 112B and 112C are cross-sectional, top and bottom views, respectively, of conductive trace 870 formed on metal base 850 by electroplating. Conductive trace 870 includes opposing major surfaces 872 and 874 and peripheral sidewalls 876.

Figure 113A:
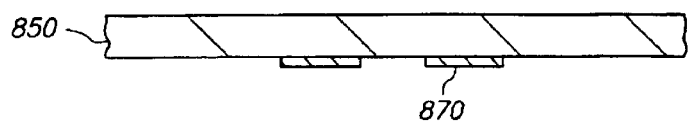
Figure 113B:
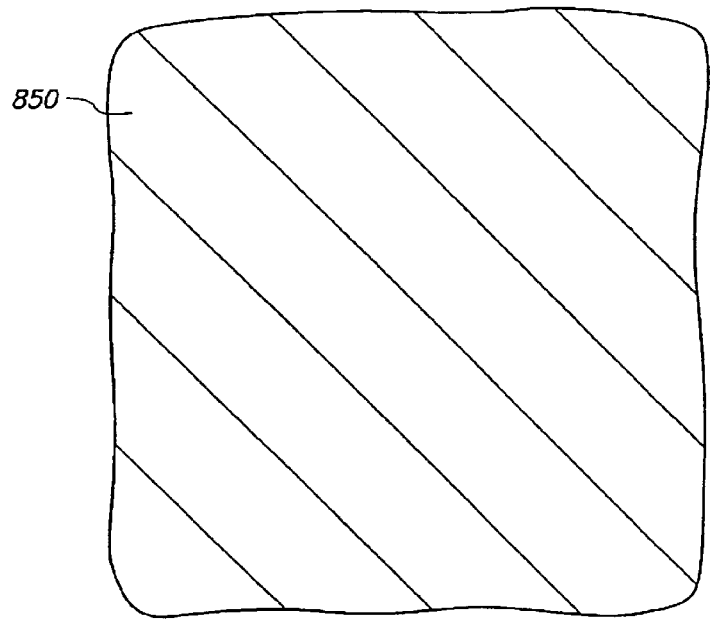
Figure 113C:
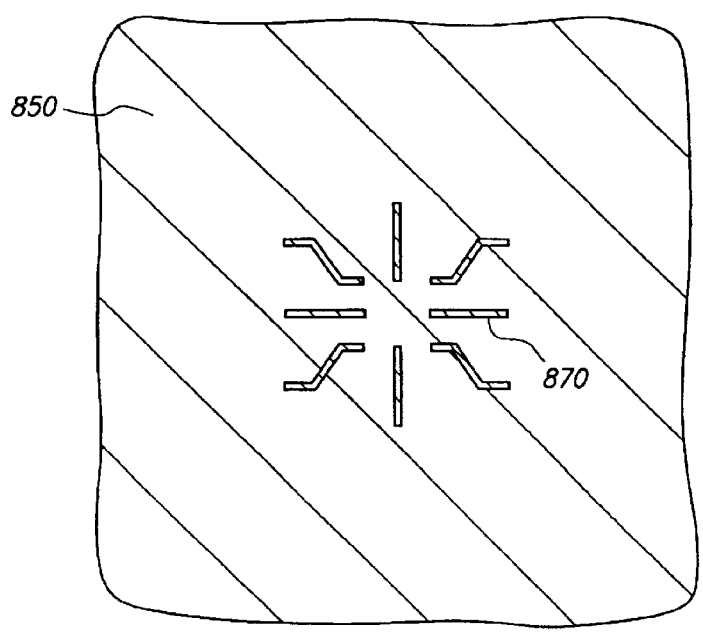

FIGS. 113A, 113B and 113C are cross-sectional, top and bottom views, respectively, of metal base 850 and conductive trace 870 after photoresist layers 860 and 862 are stripped.

Figure 114A:
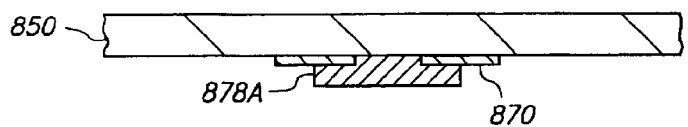
Figure 114B:
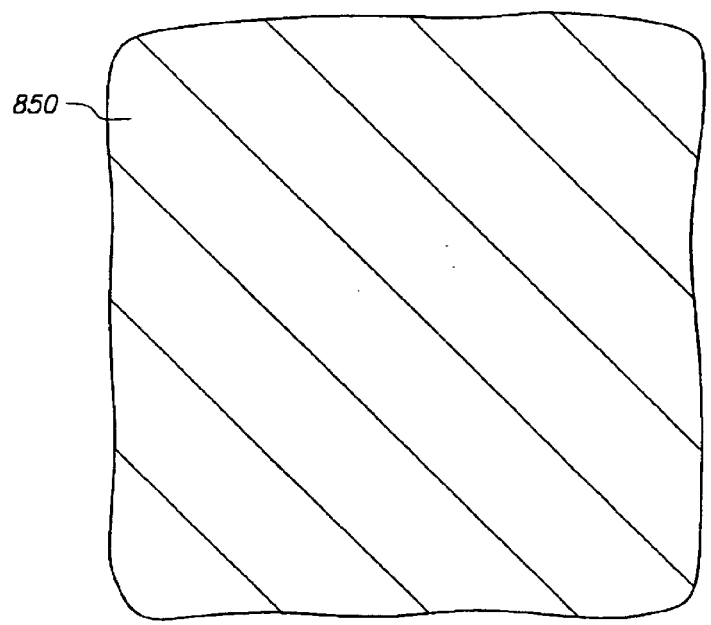
Figure 114C:
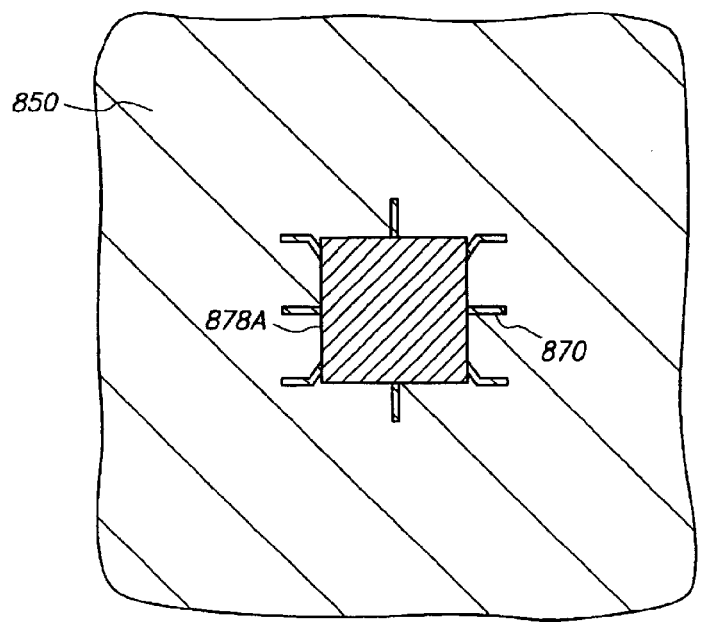

FIGS. 114A, 114B and 114C are cross-sectional, top and bottom views, respectively, of first adhesive 878A formed on metal base 850 and conductive trace 870. First adhesive 878A is identical to adhesive 178 except that first adhesive 878A has a smaller surface area that corresponds to the periphery of chip 810 extended outwardly by 250 microns beyond each peripheral edge. Thus, first adhesive 878A contacts and covers the inner distal end of conductive trace 870 but not the outer distal end of conductive trace 870.

Figure 115A:
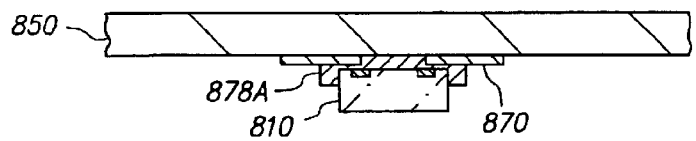
Figure 115B:
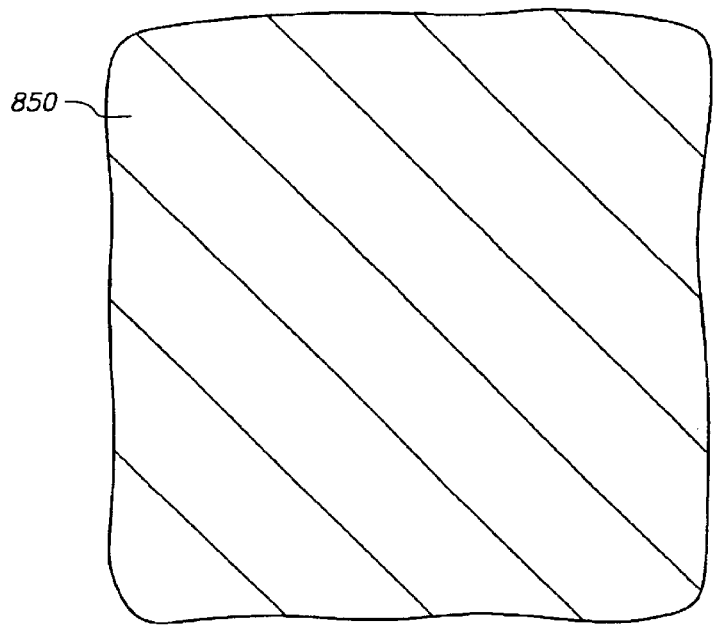
Figure 115C:
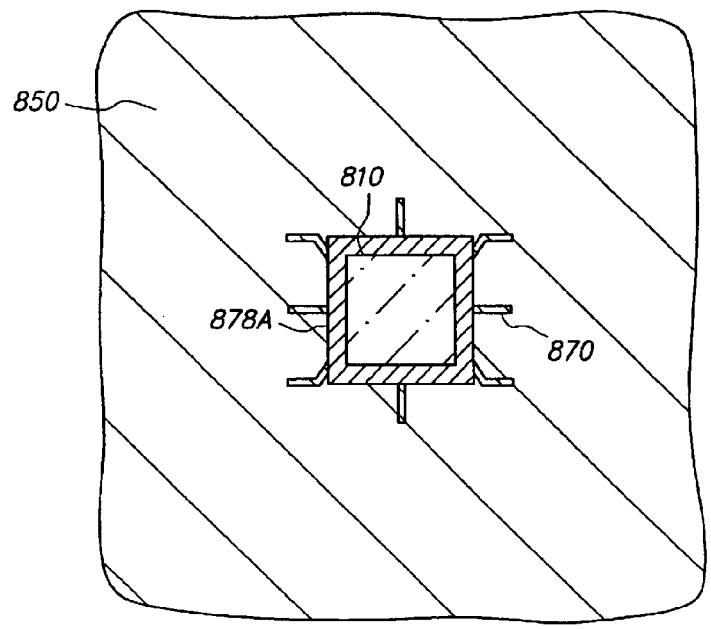

FIGS. 115A, 115B and 115C are cross-sectional, top and bottom views, respectively, of chip 810 mechanically attached to metal base 850 and conductive trace 870 by first adhesive 878A. First adhesive 878A covers and extends outside the periphery of chip 810. First adhesive 878A is heated by the pick-up head that places chip 810 on first adhesive 878A. As a result, first adhesive 878A proximate to chip 810 is partially polymerized (B stage) and forms a gel but is not fully cured. Thereafter, the structure is placed in an oven and first adhesive 878A is fully cured.

Figure 116A:
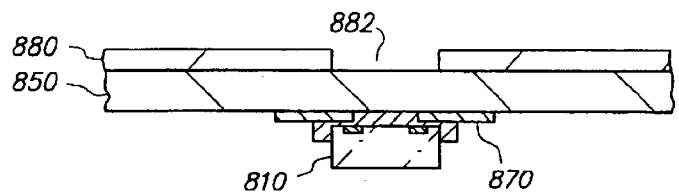
Figure 116B:
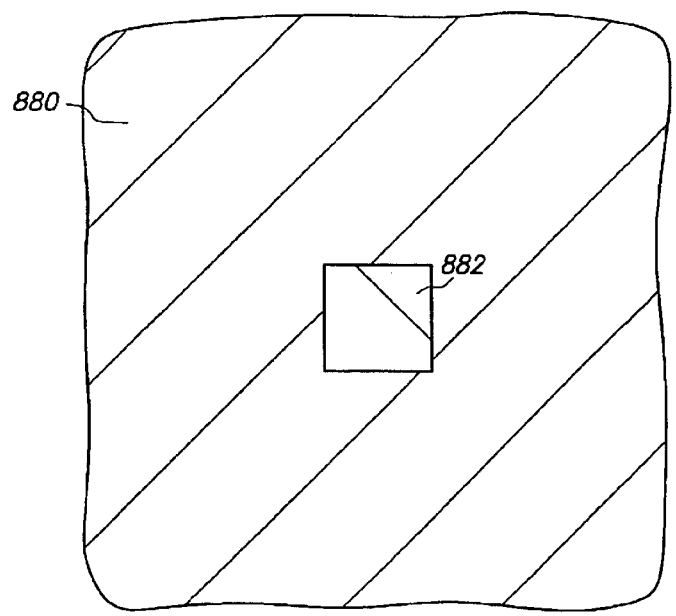
Figure 116C:
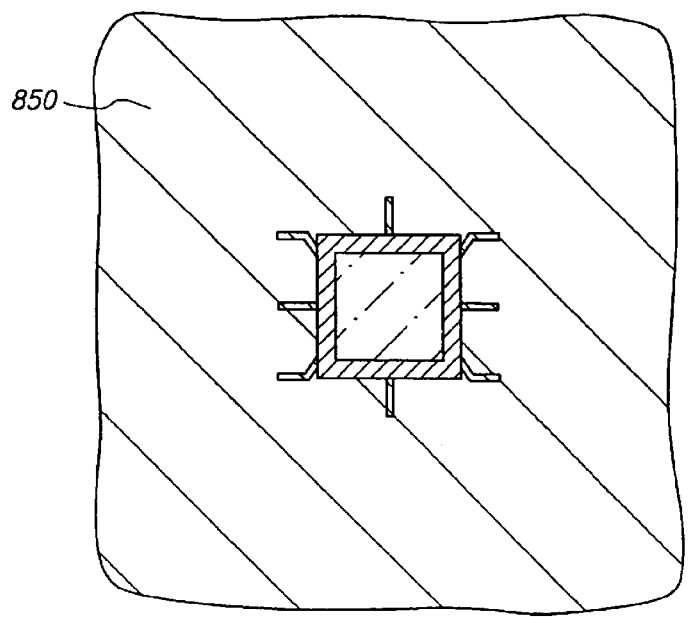

FIGS. 116A, 116B and 116C are cross-sectional, top and bottom views, respectively, of photoresist layer 880 formed on metal base 850. Photoresist layer 880 is deposited using a dry film lamination process in which a hot roll presses photoresist layer 880 onto metal base 850. Thereafter, photoresist layer 880 is patterned by selectively applying light through a reticle (not shown), applying a developer solution to remove the photoresist portions rendered soluble by the light, and then hard baking, as is conventional. As a result, photoresist layer 880 contains opening 882 that selectively exposes metal base 850 and is axially aligned with and co-extensive with chip 810. Photoresist layer 880 has a thickness of 25 microns.

Figure 117A:
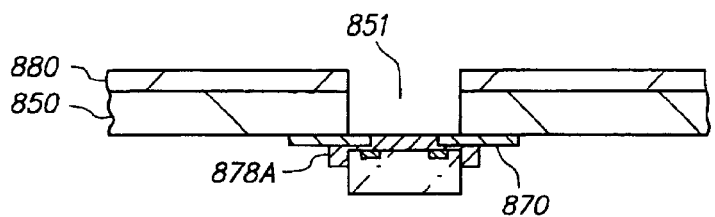
Figure 117B:
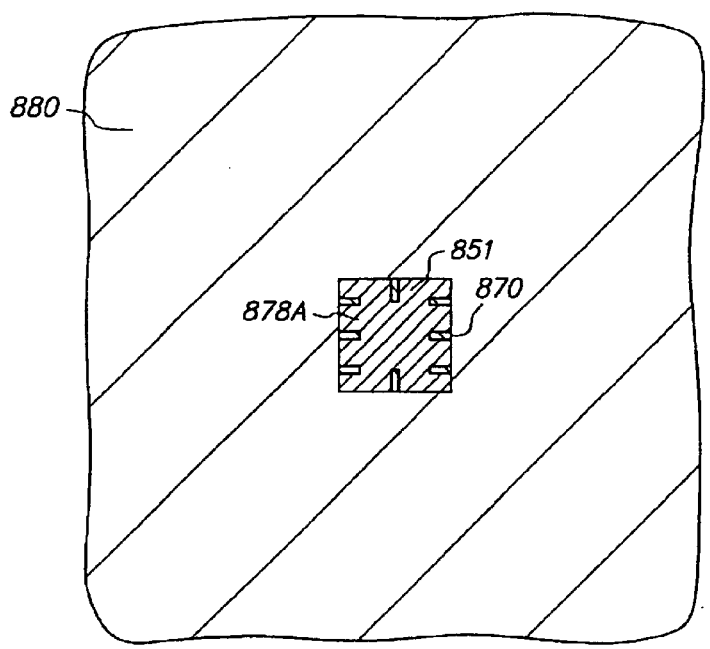
Figure 117C:
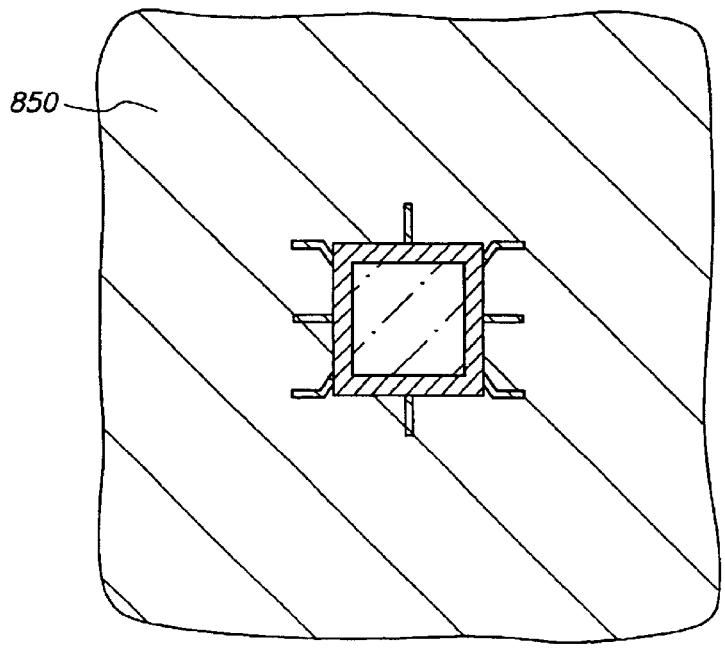

FIGS. 117A, 117B and 117C are cross-sectional, top and bottom views, respectively, of opening 851 that extends through metal base 850 and exposes conductive trace 870 and first adhesive 878A.

Opening 851 is formed through metal base 850 by wet chemical etching using photoresist layer 880 as an etch mask. A "front-side" wet chemical etch is applied to the exposed portion of surface 852 of metal base 850. For instance, the wet chemical etch can be sprayed on surface 852, or a protective mask can be deposited on surface 854 and then the structure can be dipped in the wet chemical etch. The wet chemical etch is highly selective of copper with respect to nickel and polyimide. Therefore, no appreciable amount of conductive trace 870 or first adhesive 878A is removed. A suitable wet chemical etch can be provided by a solution containing alkaline ammonia. The optimal etch time for exposing metal base 850 to the wet chemical etch in order to remove the portion of metal base 850 that overlaps chip 810 without excessively undercutting metal base 850 can be established through trial and error.

The wet chemical etch etches completely through metal base 850, thereby effecting a pattern transfer of photoresist layer 880 onto metal base 850. Opening 851 is axially aligned with and co-extensive with chip 810.

Furthermore, since conductive trace 870 and the other conductive traces extend outside the periphery of opening 851, metal base 850 continues to contact and electrically connect the conductive traces.

Figure 118A:
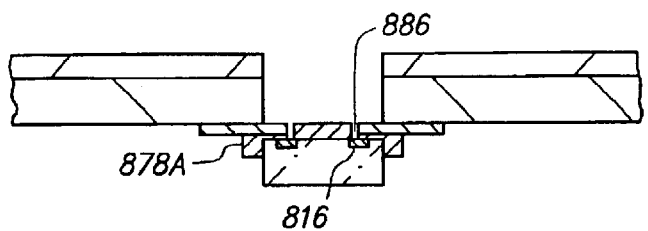
Figure 118B:
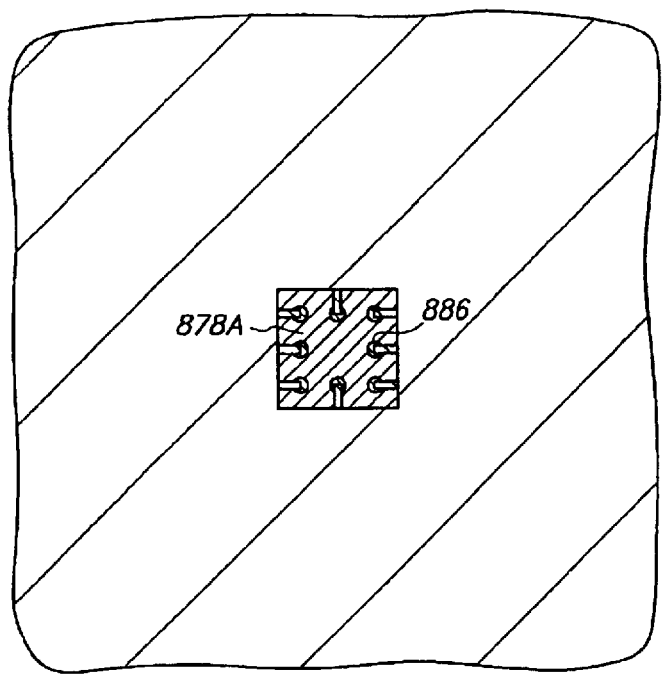
Figure 118C:
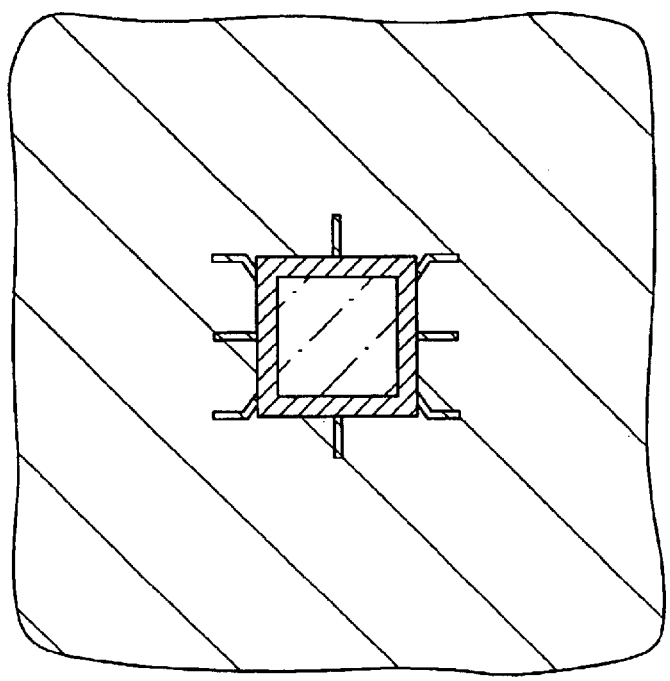

FIGS. 118A, 118B and 118C are cross-sectional, top and bottom views, respectively, of opening 886 that is formed through first adhesive 878A and exposes pad 816.

Figure 119A:
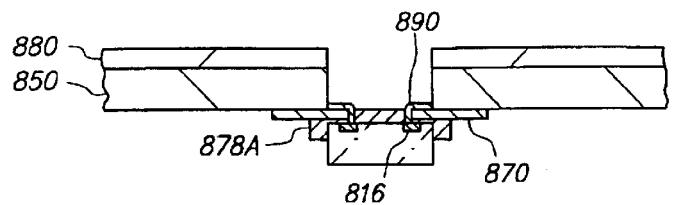
Figure 119B:
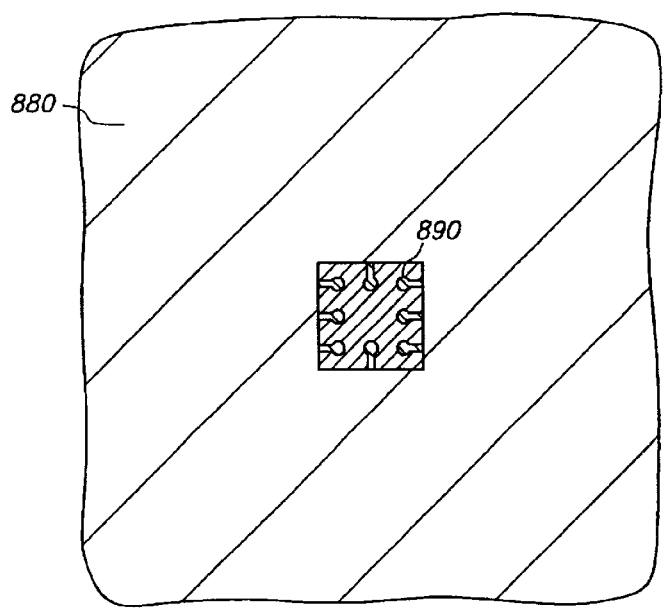
Figure 119C:
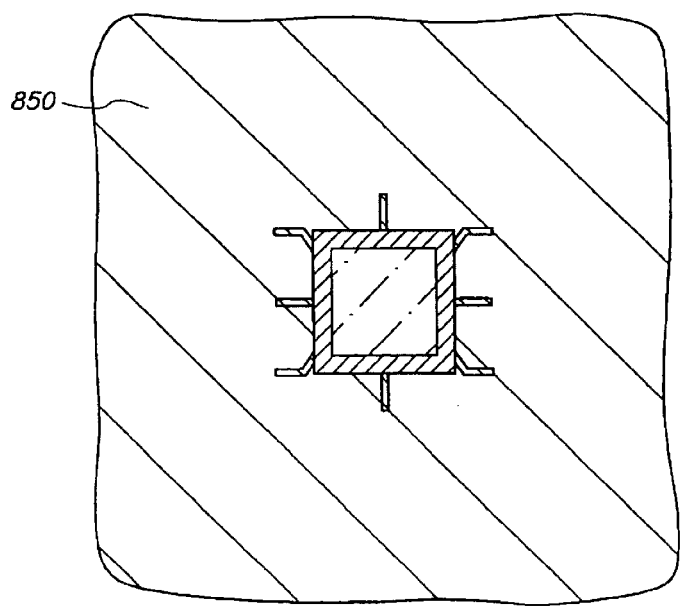

FIGS. 119A, 119B and 119C are cross-sectional, top and bottom views, respectively of connection joint 890 formed on pad 816 and conductive trace 870.

Connection joint 890 is formed by an electroplating operation using photoresist layer 880 as a plating mask.

Metal base 850 is connected to a plating bus (not shown), current is applied to the plating bus from an external power source, and the structure is submerged in an electrolytic copper plating solution such as Sel-Rex CUBATH M™ at room temperature. Conductive trace 870 is electrically connected to metal base 850. As a result, connection joint 890 begins to plate on conductive trace 870. However, connection joint 890 does not initially deposit on pad 816 since first adhesive 878A is an electrical insulator that cannot supply current from the plating bus to generate electroplating and pad 816 is electrically isolated from the plating bus.

As the electroplating operation continues, connection joint 890 continues to plate on conductive trace 870 and expand axially in opening 886 towards pad 816. Eventually connection joint 890 contacts pad 816, and as a result, pad 816 is electrically connected to the plating bus by metal base 850, conductive trace 870 and connection joint 890, and connection joint 890 begins to plate on pad 816 as well. The copper electroplating operation continues until connection joint 890 is about 15 microns thick. Thereafter, the structure is removed from the electrolytic copper plating solution and rinsed in distilled water.

The copper electroplating operation also electroplates a copper layer on the exposed portions of metal base 850 in opening 851, thereby slightly offsetting the undercut beneath photoresist layer 880. For convenience of illustration, the copper layer is not shown.

Figure 120A:
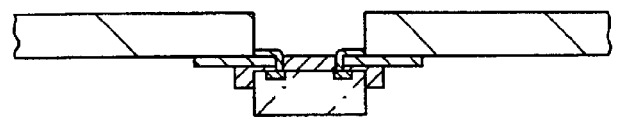
Figure 120B:
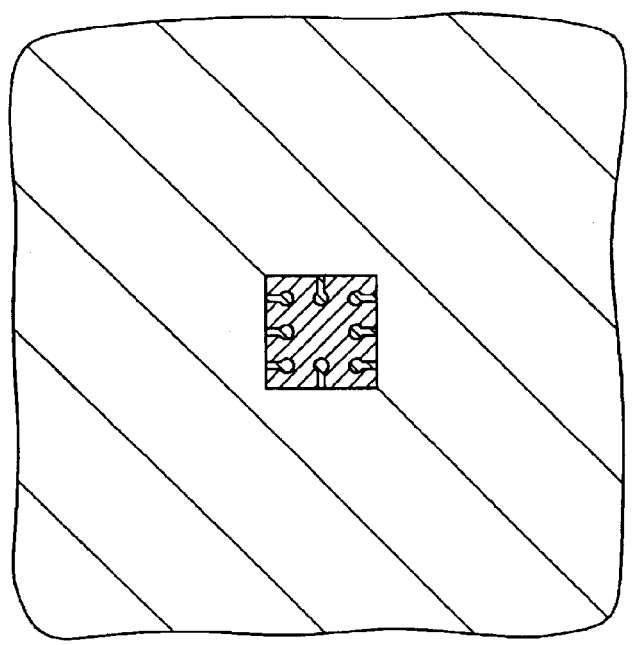
Figure 120C:
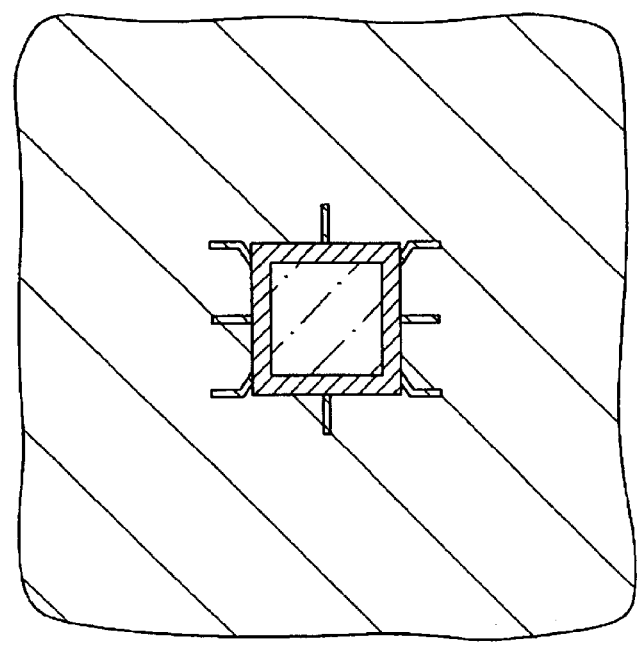

FIGS. 120A, 120B and 120C are cross-sectional, top and bottom views, respectively, of the structure after photoresist layer 880 is stripped. Photoresist layer 880 is removed using a solvent, such as a mild alkaline solution with a pH of 9, that is highly selective of photoresist with respect to copper, polyimide and silicon. Therefore, no appreciable amount of chip 810, metal base 850, first adhesive 878A or connection joint 890 is removed.

Figure 121A:
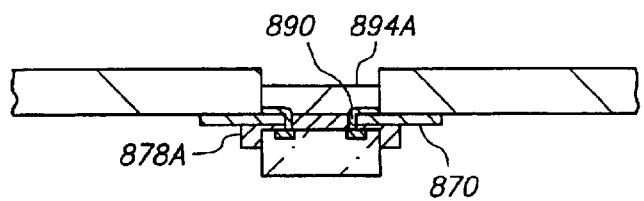
Figure 121B:
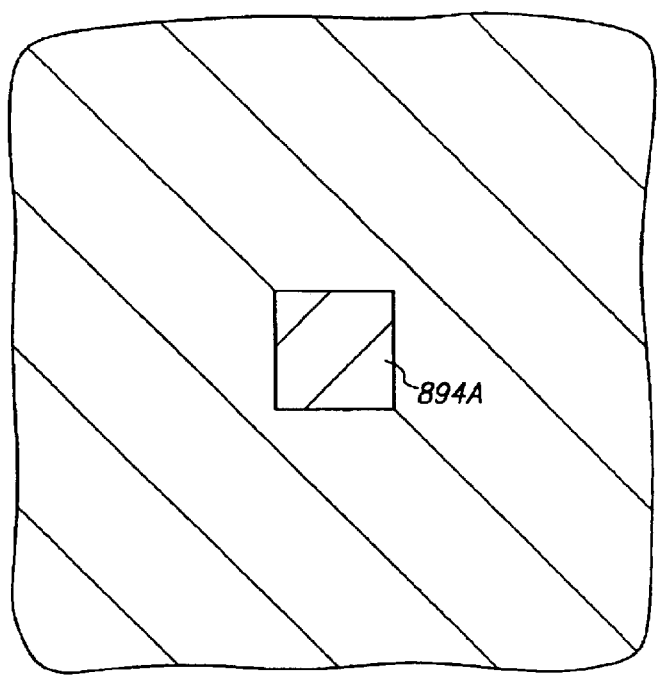
Figure 121C:
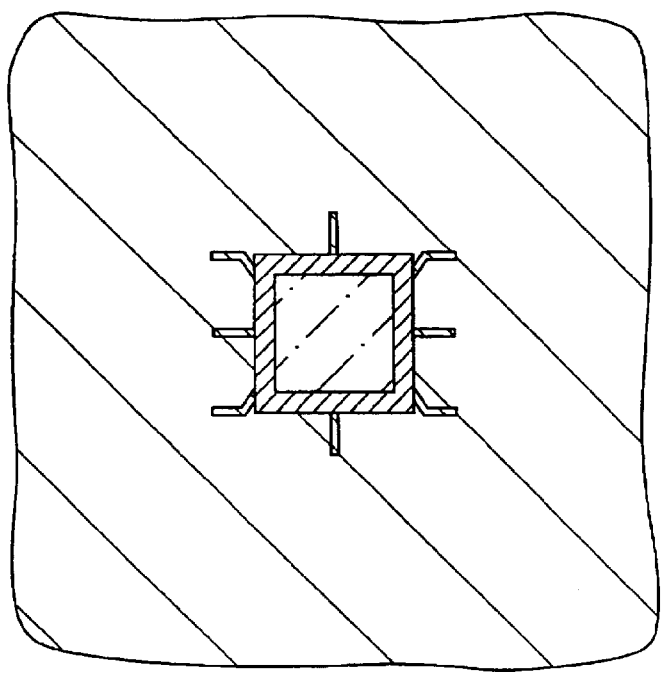

FIGS. 121A, 121B and 121C are cross-sectional, top and bottom views, respectively, of first insulative base 894A formed over conductive trace 870, first adhesive 878A and connection joint 890.

First insulative base 894A is initially an epoxy paste that is selectively deposited into opening 851 using stencil printing, and then the epoxy paste is cured to form a solid adherent insulator that provides a protective seal for connection joint 886.

First insulative base 894A is identical to insulative base 194 except that first insulative base 894A has a smaller surface area that corresponds to the periphery of chip 810.

Figure 122A:
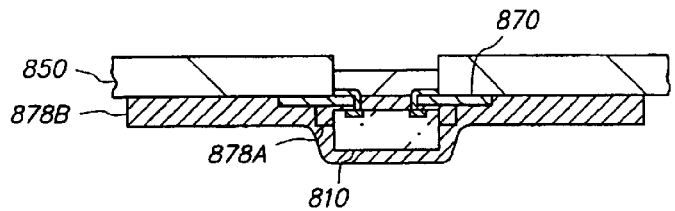
Figure 122B:
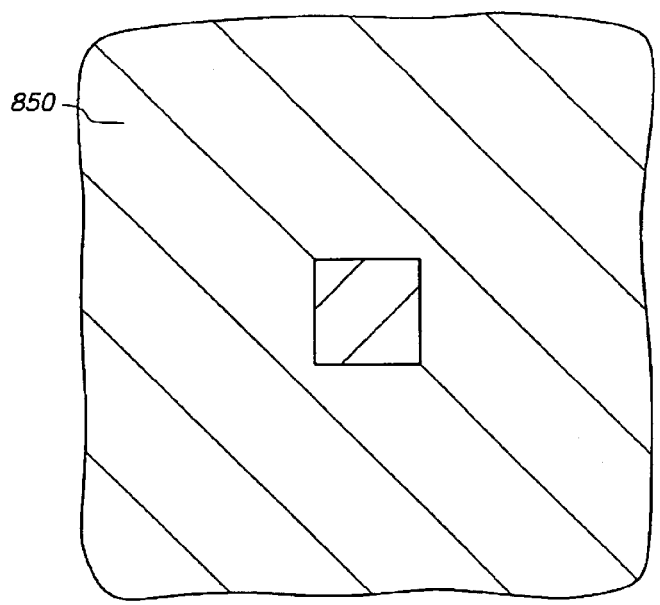
Figure 122C:
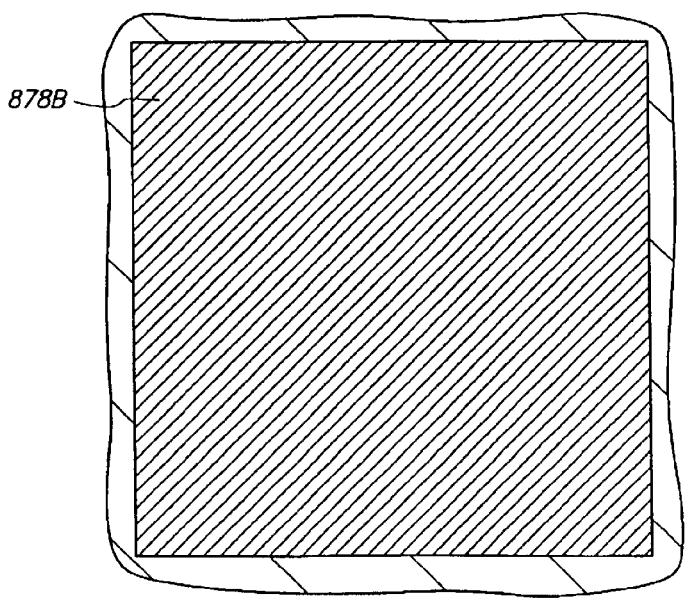

FIGS. 122A, 122B and 122C are cross-sectional, top and bottom views, respectively, of second adhesive 878B formed on chip 810, metal base 850, conductive trace 870 and first adhesive 878A. Second adhesive 878B is identical to adhesive 178 except that second adhesive 878B is deposited by dispensing after chip 810 and conductive trace 870 are mechanically attached to one another by first adhesive 878A. Second adhesive 878B contacts chip 810, metal base 850, conductive trace 870 and first adhesive 878A, and covers chip 810, conductive trace 870 and first adhesive 878A.

Figure 123A:
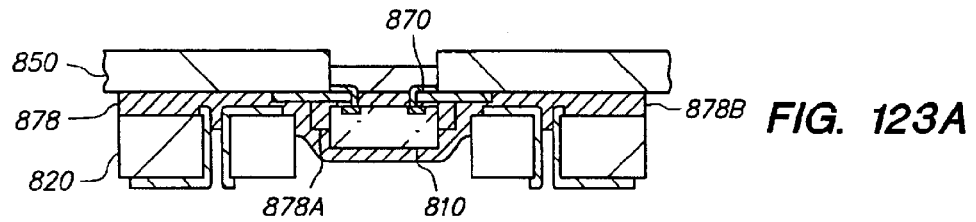
Figure 123B:
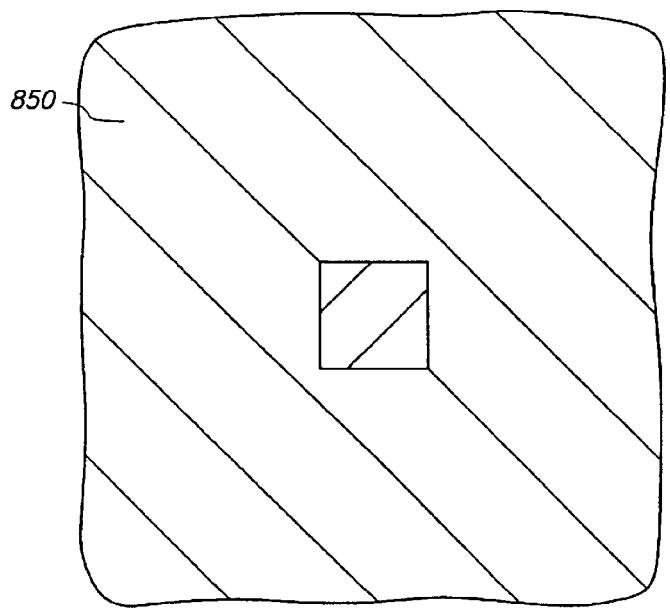
Figure 123C:
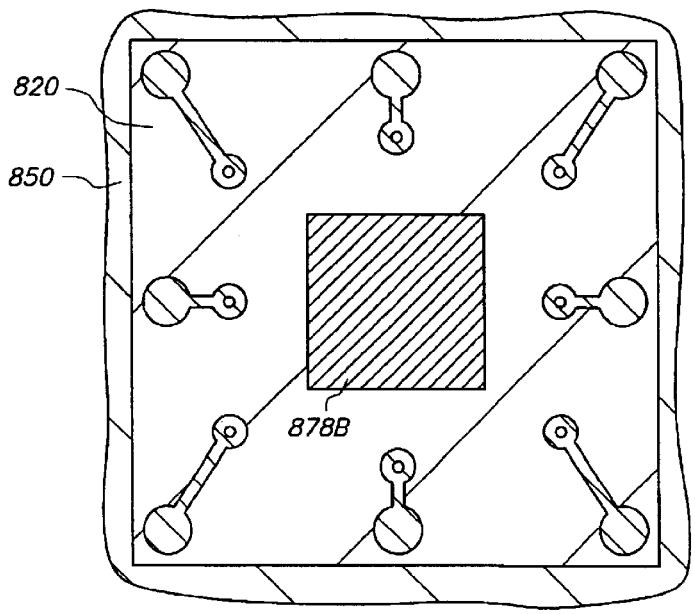

FIGS. 123A, 123B and 123C are cross-sectional, top and bottom views, respectively, of chip 810, metal base 850, conductive trace 870 and connection joint 890 mechanically attached to substrate 820 by second adhesive 878B.

Second adhesive 878B contacts and covers substrate 820 and extends into cavity 842 between chip 810 and substrate 820. Second adhesive 878B is heated by the pick-up head that places substrate 820 on second adhesive 878B. As a result, second adhesive 878B proximate to substrate 820 is partially polymerized (B stage) and forms a gel but is not fully cured. Thereafter, the structure is placed in an oven and second adhesive 878B is fully cured. Adhesive 878 is composed of first adhesive 878A and second adhesive 878B. Thus, adhesive 878 is a double-piece adhesive.

Figure 124A:
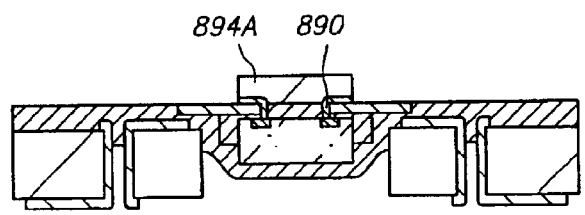
Figure 124B:
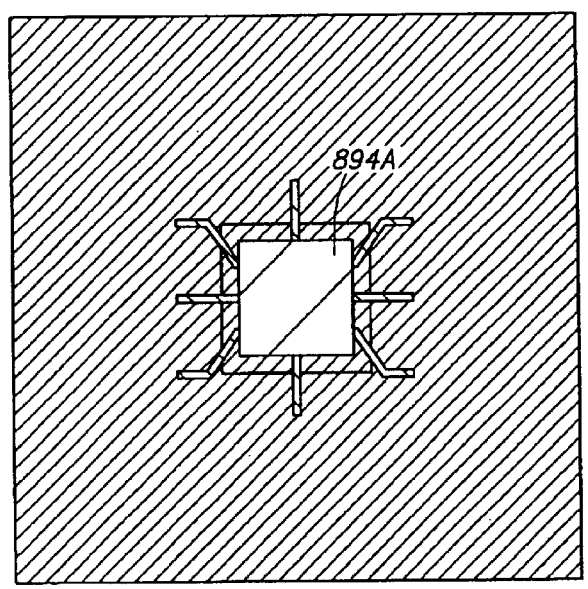
Figure 124C:
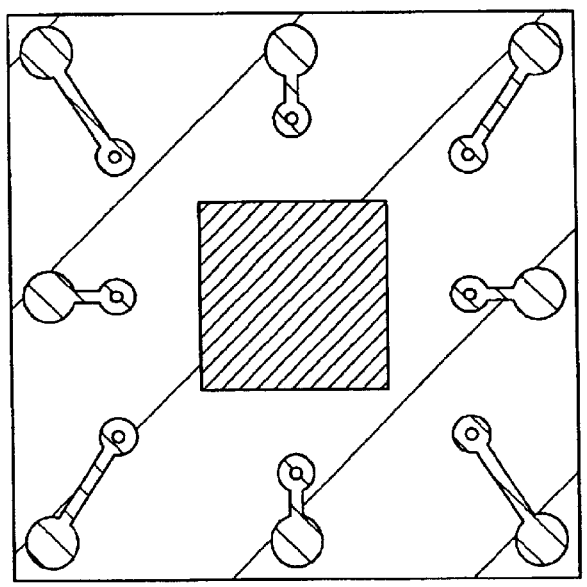

FIGS. 124A, 124B and 124C are cross-sectional, top and bottom views, respectively, of the structure after metal base 850 is removed. First insulative base 894A protects connection joint 890 from the wet chemical etch.

Figure 125A:
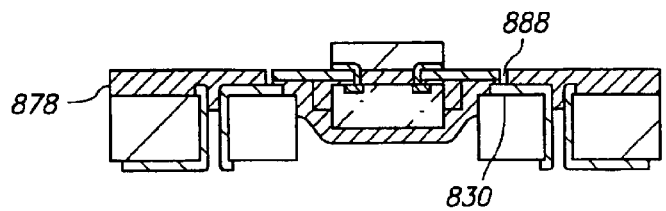
Figure 125B:
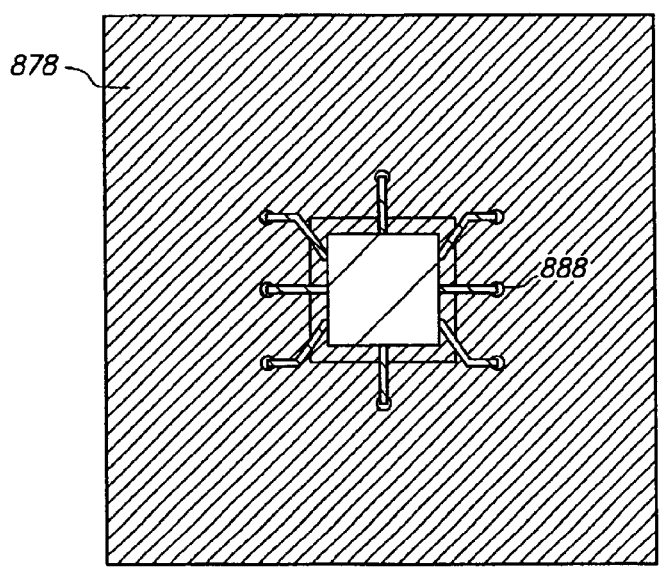
Figure 125C:
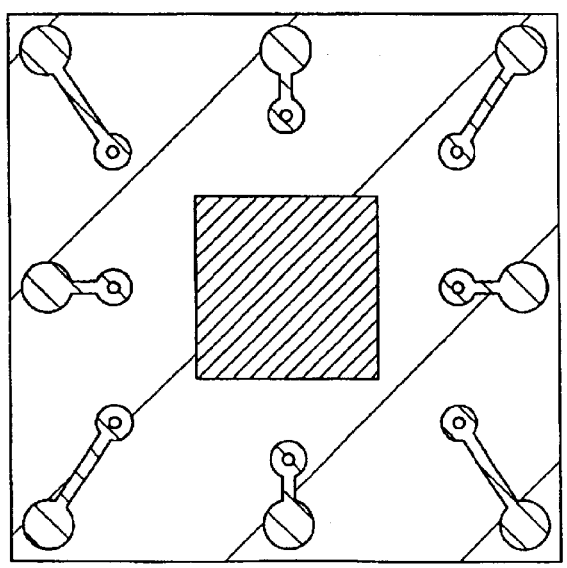

FIGS. 125A, 125B and 125C are cross-sectional, top and bottom views, respectively, of via 888 that is formed through adhesive 878 and exposes first contact terminal 830.

Figure 126A:
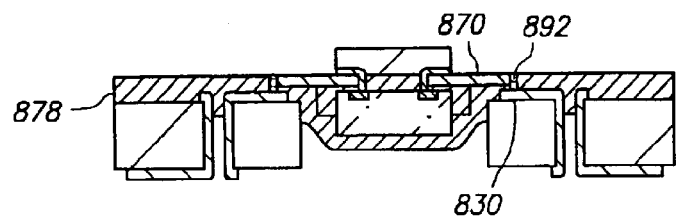
Figure 126B:
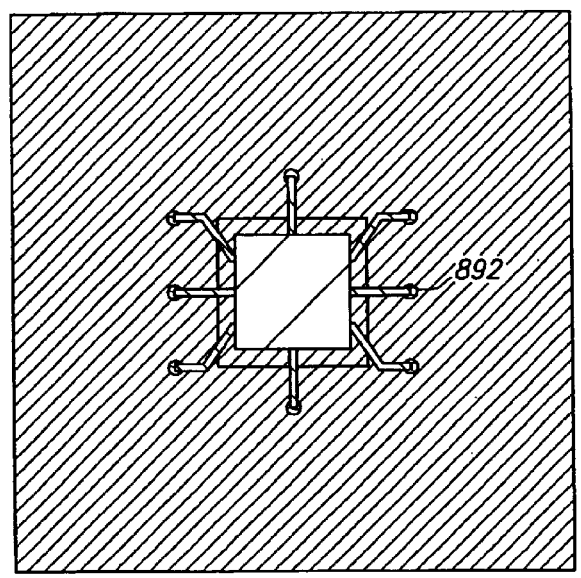
Figure 126C:
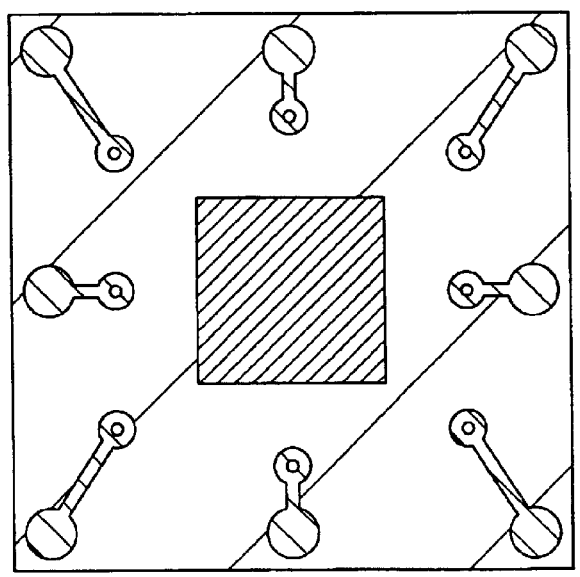

FIGS. 126A, 126B and 126C are cross-sectional, top and bottom views, respectively, of interconnect 892 formed on first contact terminal 830 and conductive trace 870. Interconnect 892 is composed of solder.

Interconnect 892 is deposited into via 888 by solder paste printing followed by solder reflow. The solder paste includes finely powdered tin-lead solder particles mixed in a viscous organic resin containing a fluxing agent. The solder paste is deposited into via 888 using stencil printing. During the stencil printing process, a stencil (not shown) with a thickness of 100 microns is placed over adhesive 878, a stencil opening with a diameter of 70 microns is axially aligned with via 888, and then a squeegee (not shown) pushes the solder paste along the surface of the stencil opposite adhesive 878, through the stencil opening and into via 888. The solder paste is compliant enough at room temperature to conform to virtually any shape. As a result, the solder paste fills via 888 and extends above via 888 in the stencil opening. Thereafter, the structure is heated to a temperature of about 210° C. The heat causes the flux in the solder paste to react with and remove oxides from first contact terminal 830 and conductive trace 870 and the solder particles in the solder paste, renders the solder particles in the solder paste molten such that they coalesce, and vaporizes the organic resin in the solder paste. As a result, the solder paste contracts from its original size and solder reflow occurs. Thereafter, the heat is removed and the molten solder particles cool and solidify into a hardened solder joint that provides interconnect 892.

Figure 127A:
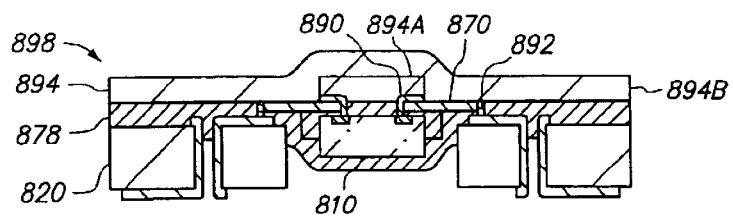
Figure 127B:
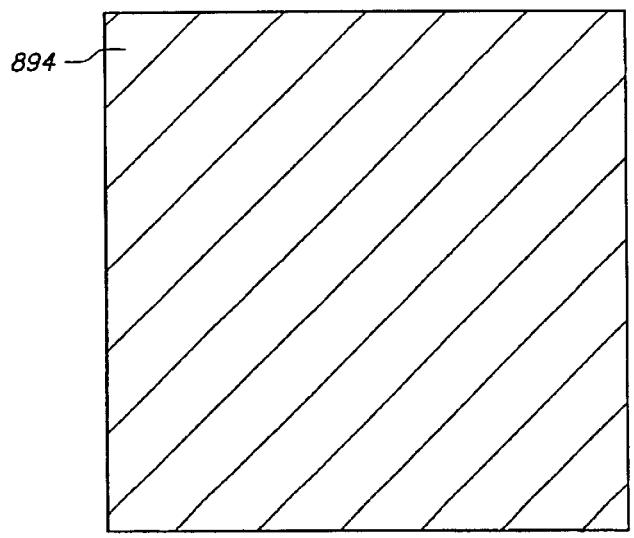
Figure 127C:
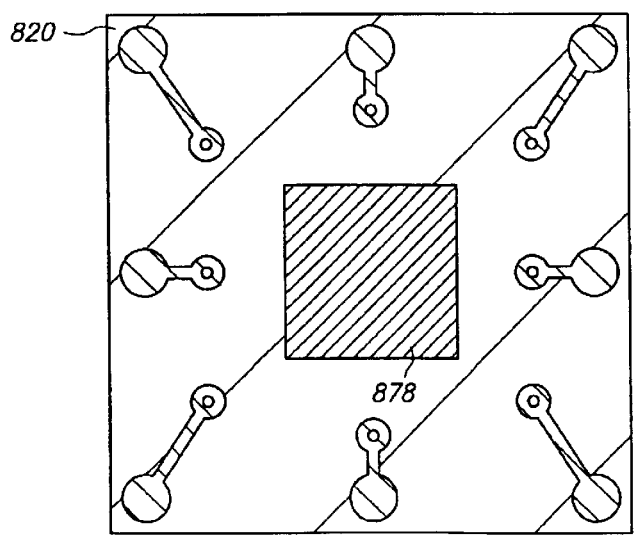

FIGS. 127A, 127B and 127C are cross-sectional, top and bottom views, respectively, of second insulative base 894B formed over conductive trace 870, adhesive 878, connection joint 890, interconnect 892 and first insulative base 894A.

Second insulative base 894B is identical to insulative base 194 except that second insulative base 894B contacts and covers first insulative base 894A and extends 100 microns above adhesive 878. Insulative base 894 is composed of first insulative base 894A and second insulative base 894B. Thus, insulative base 894 is a double-piece insulative base.

At this stage, the manufacture of semiconductor chip assembly 898 that includes chip 810, substrate 820, conductive trace 870, adhesive 878, connection joint 890, interconnect 892 and insulative base 894 can be considered complete.

FIGS. 128A–148A, 128B–148B and 128C–148C are cross-sectional, top and bottom views, respectively, of a method of making a semiconductor chip assembly in accordance with a ninth embodiment of the present invention. In the ninth embodiment, the conductive trace is mechanically attached to the chip, then the opening and the connection joint are formed, and then the conductive trace and the chip are mechanically attached and electrically connected to the substrate by the interconnect. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, substrate 920 corresponds to substrate 120, etc.

Figure 128A:
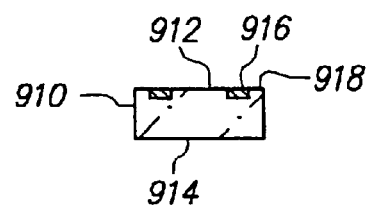
Figure 128B:
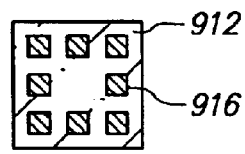
Figure 128C:

FIGS. 128A, 128B and 128C are cross-sectional, top and bottom views, respectively, of semiconductor chip 910 which includes opposing major surfaces 912 and 914. Surface 912 includes conductive pad 916 and passivation layer 918.

Figure 129A:
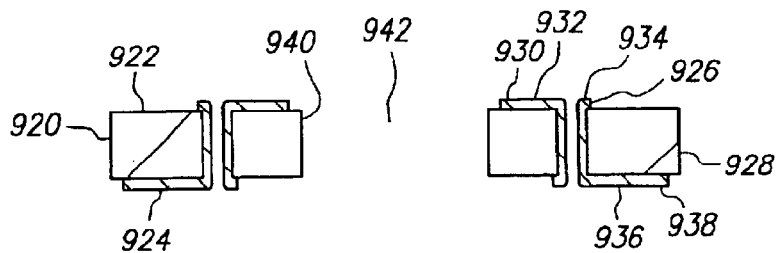
Figure 129B:
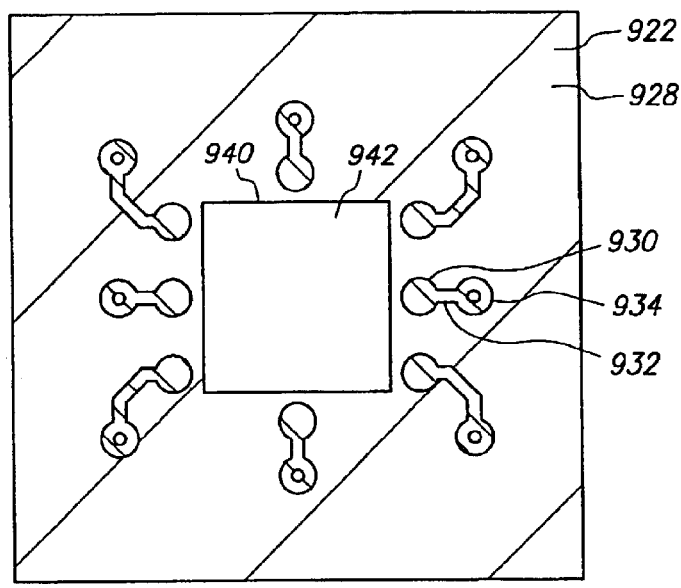
Figure 129C:
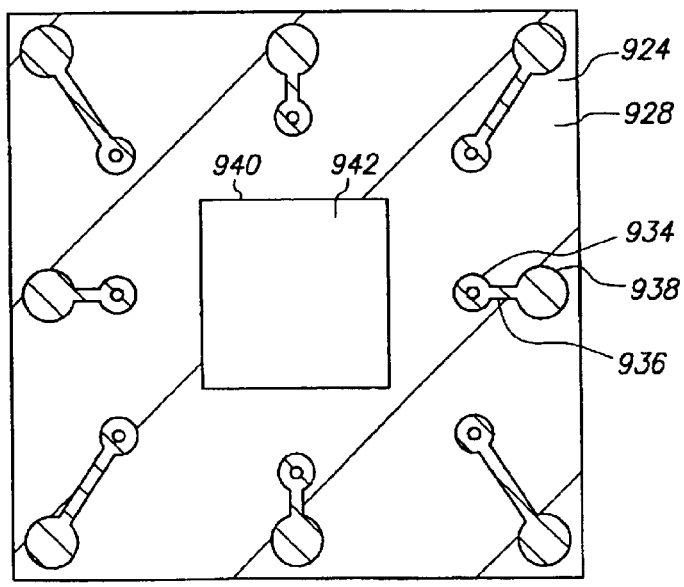

FIGS. 129A, 129B and 129C are cross-sectional, top and bottom views, respectively, of substrate 920. Substrate 920 includes opposing major surfaces 922 and 924, conductive terminal 926 and dielectric base 928. Conductive terminal 926 includes first contact terminal 930, first routing line 932, vertical connection 934, second routing line 936 and second contact terminal 938. Dielectric base 928 includes inner sidewalls 940 that bound cavity 942.

Figure 130A:
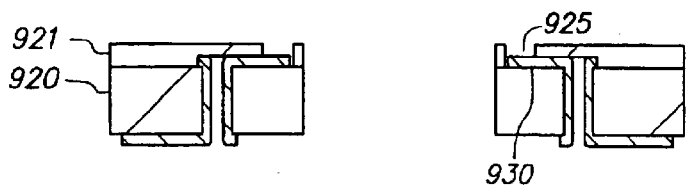
Figure 130B:
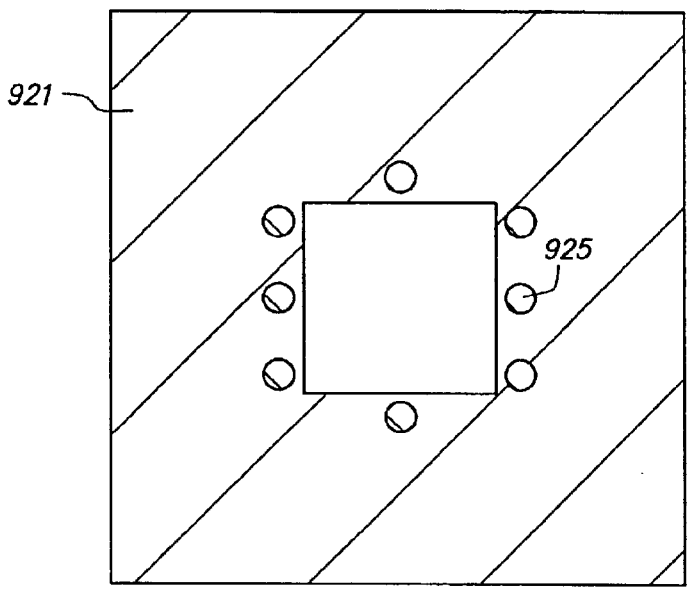
Figure 130C:
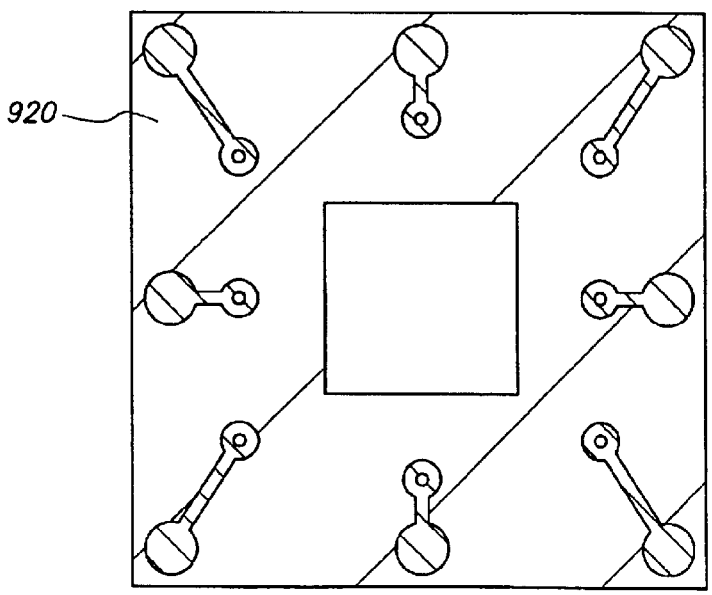

FIGS. 130A, 130B and 130C are cross-sectional, top and bottom views, respectively, of solder mask 921 formed on substrate 920. Solder mask 921 has a frame-like shape that corresponds to the periphery of substrate 920.

Solder mask 921 is initially a liquid resin that is selectively deposited onto surface 922 using stencil printing. Thereafter, solder mask 921 is patterned by selectively applying light through a reticle (not shown), applying a developer solution to remove the solder mask portions rendered soluble by the light, and then hard baking, as is conventional. As a result, solder mask 921 contains opening 925 that is axially aligned with and exposes first contact terminal 930 and has a diameter of 200 microns. Solder mask 921 has a thickness of 25 microns.

Solder mask 921 extends slightly outside the peripheral edges of substrate 920 and extends slightly into cavity 942. For convenience of illustration, the portions of solder mask 921 that extend outside the peripheral edges of substrate 920 and into cavity 942 are not shown.

Solder mask 921 contains many other openings that expose corresponding first contact terminals of substrate 920, and only eight openings are shown and a single opening 925 is labeled for convenience of illustration.

Figure 131A:
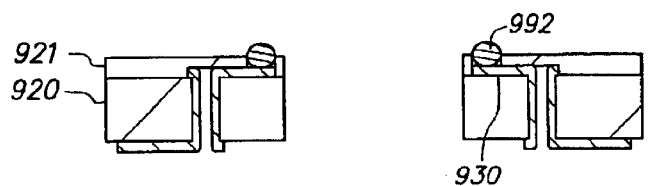
Figure 131B:
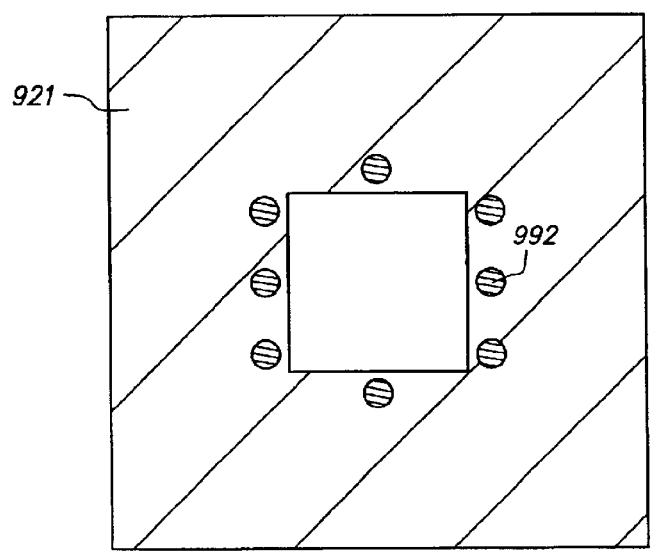
Figure 131C:
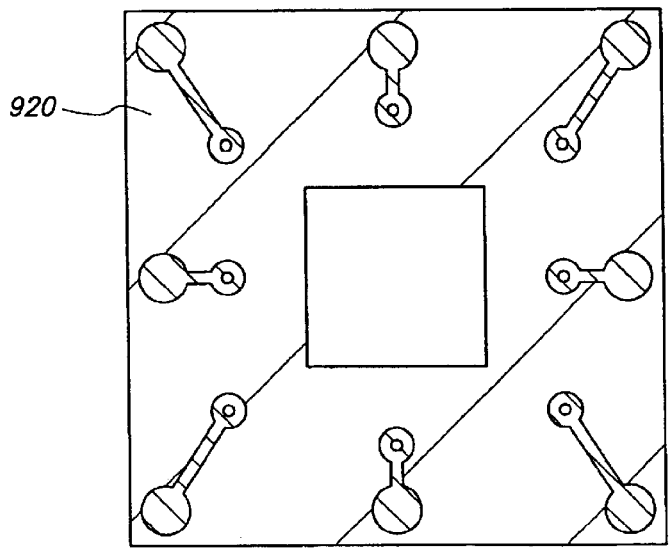

FIGS. 131A, 131B and 131C are cross-sectional, top and bottom views, respectively, of interconnect 992 formed on first contact terminal 930. Interconnect 992 is a solder ball with a thickness of 200 microns. Flux (not shown) is initially deposited over solder mask 921 using stencil printing. The flux extends into opening 925 and contacts first contact terminal 930. Thereafter, interconnect 992 is placed on the flux in opening 925 over first contact terminal 930, and the flux holds interconnect 992 in place in opening 925.

Figure 132A:
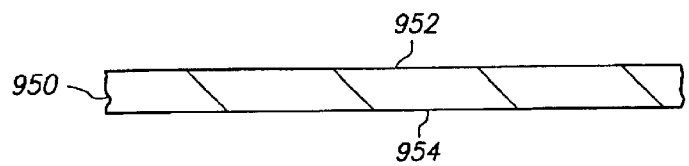
Figure 132B:
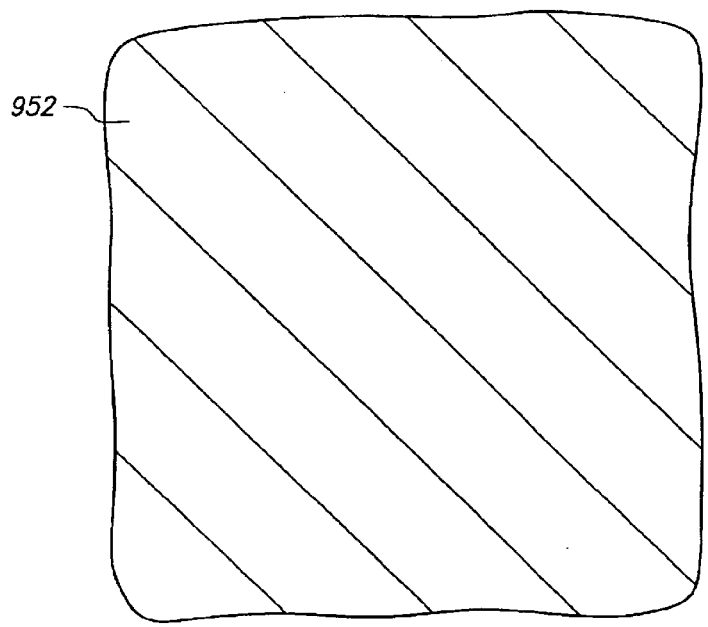
Figure 132C:
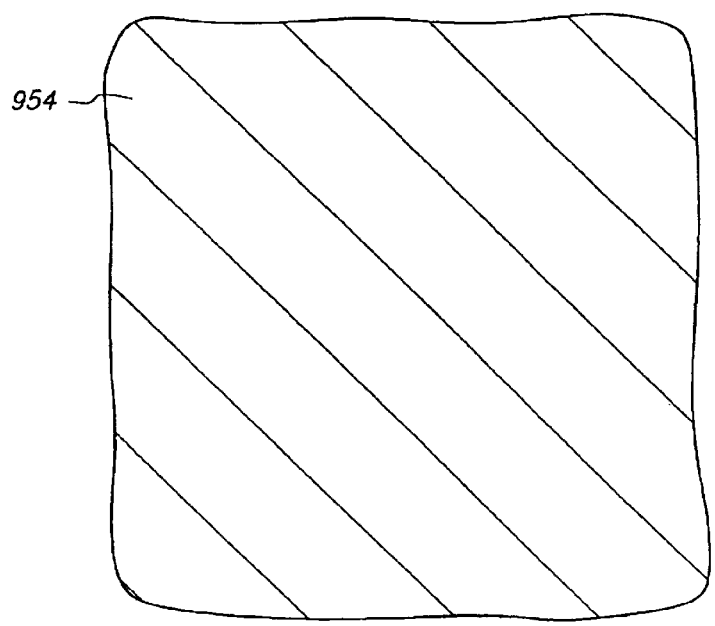

FIGS. 132A, 132B and 132C are cross-sectional, top and bottom views, respectively, of metal base 950 which includes opposing major surfaces 952 and 954.

Figure 133A:
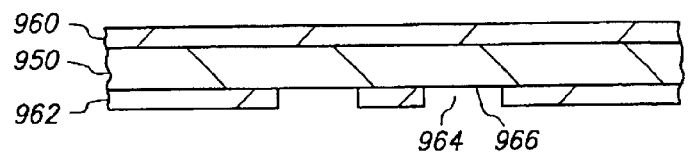
Figure 133B:
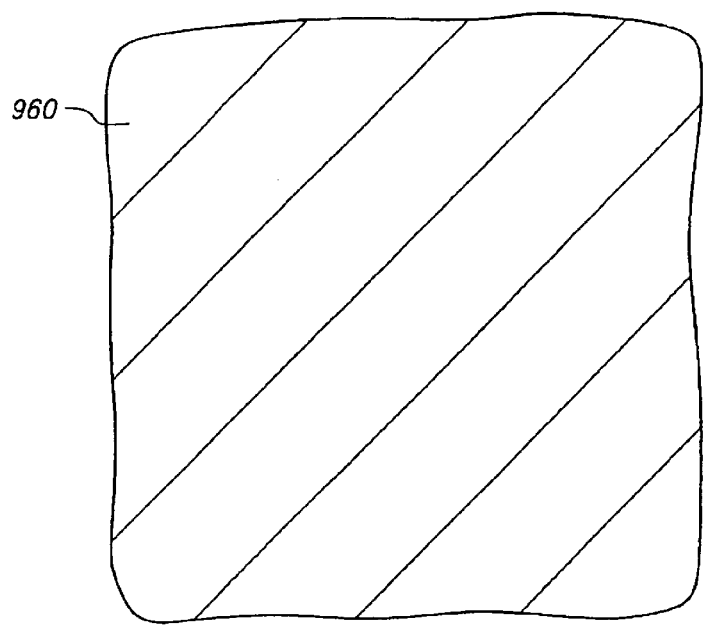
Figure 133C:
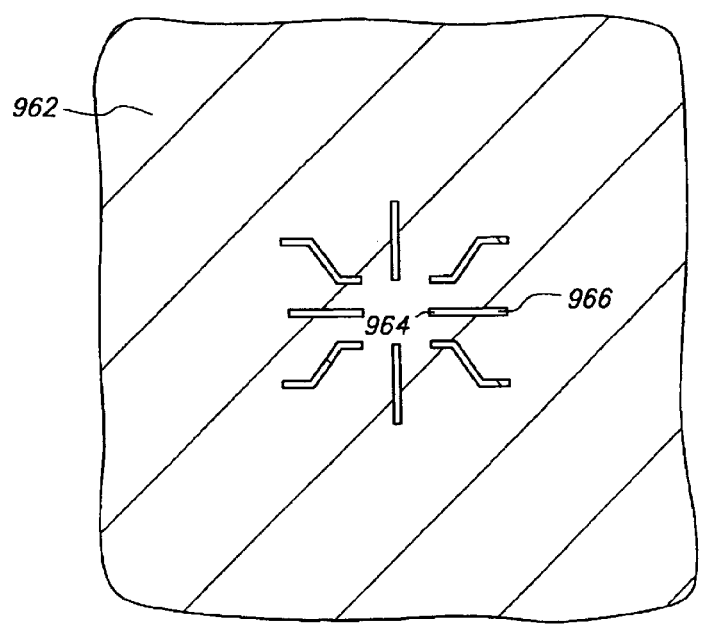

FIGS. 133A, 133B and 133C are cross-sectional, top and bottom views, respectively, of photoresist layers 960 and 962 formed on metal base 950. Photoresist layer 962 contains opening 964 that selectively exposes portion 966 of surface 954.

Figure 134A:
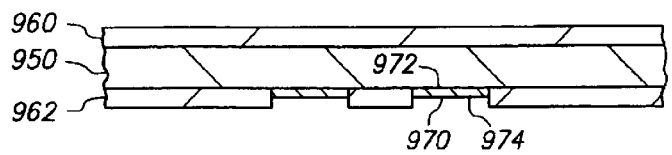
Figure 134B:
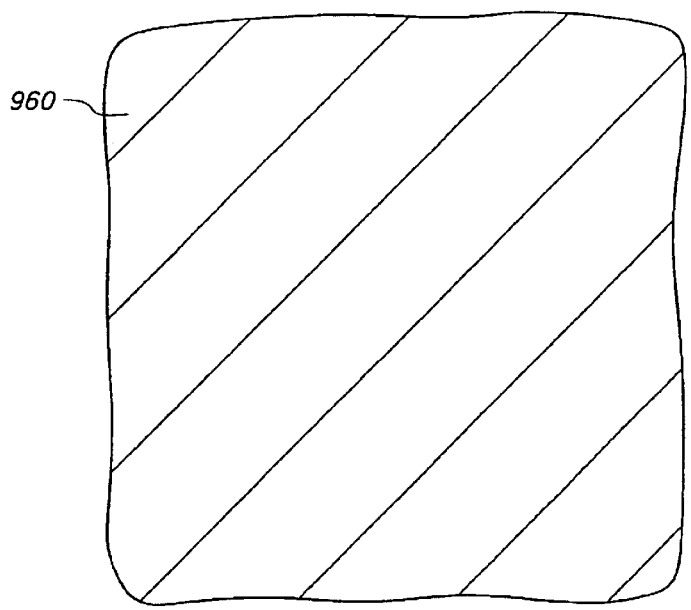
Figure 134C:
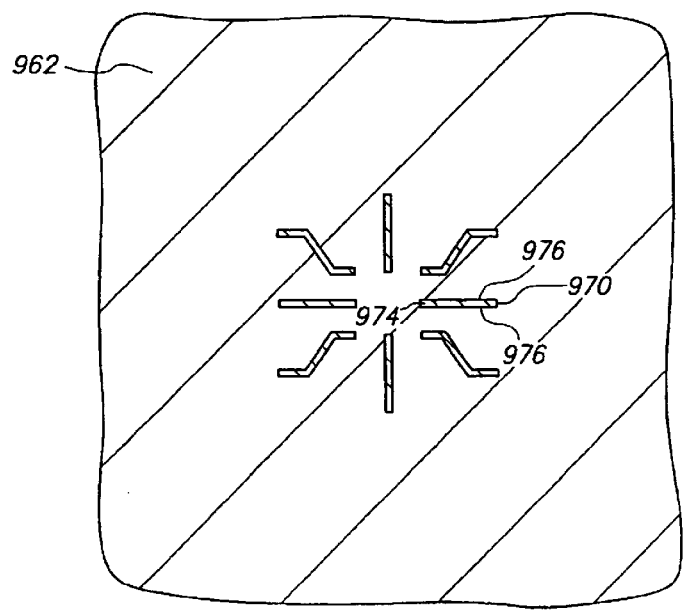

FIGS. 134A, 134B and 134C are cross-sectional, top and bottom views, respectively, of conductive trace 970 formed on metal base 950 by electroplating. Conductive trace 970 includes opposing major surfaces 972 and 974 and peripheral sidewalls 976.

Figure 135A:
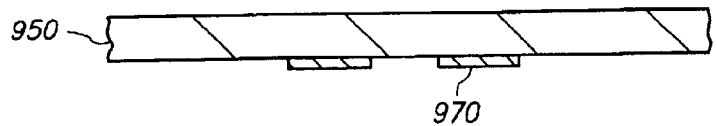
Figure 135B:
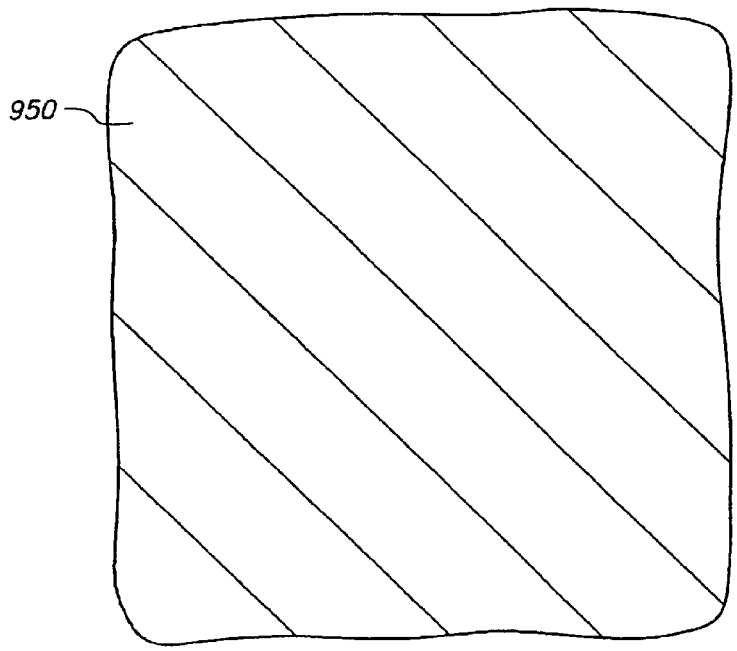
Figure 135C:
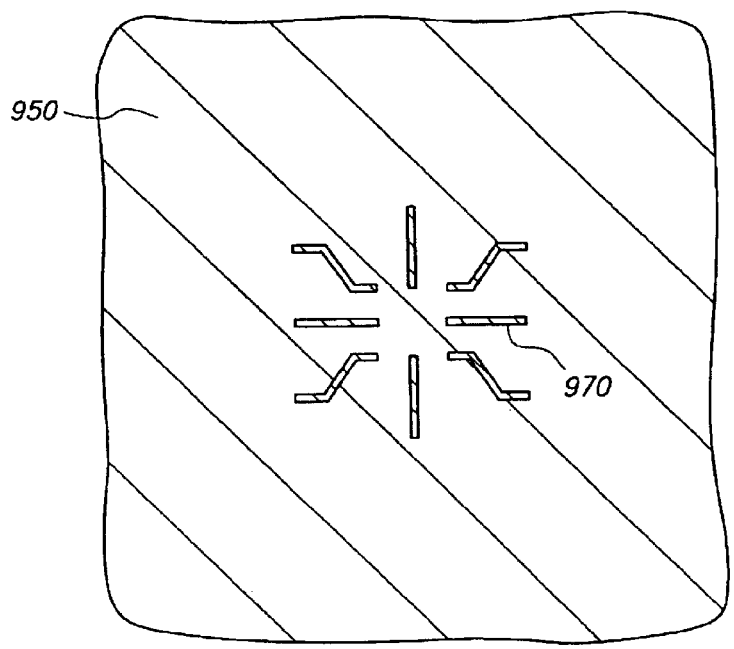

FIGS. 135A, 135B and 135C are cross-sectional, top and bottom views, respectively, of metal base 950 and conductive trace 970 after photoresist layers 960 and 962 are stripped.

Figure 136A:
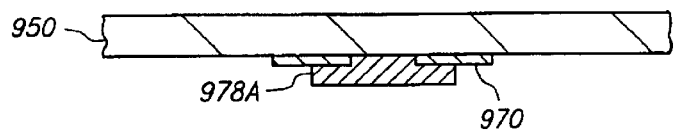
Figure 136B:
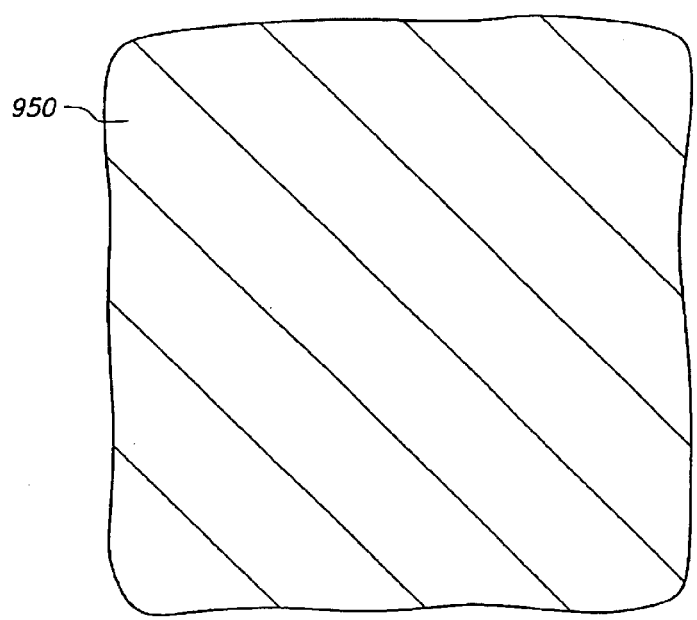
Figure 136C:
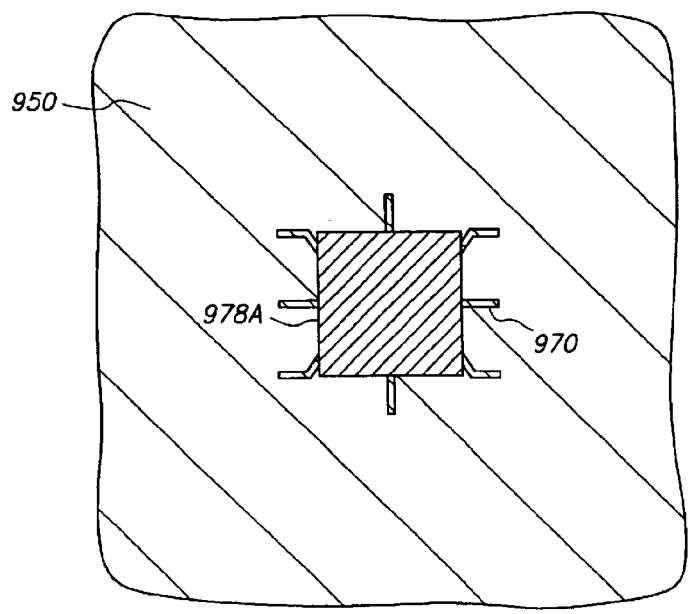

FIGS. 136A, 136B and 136C are cross-sectional, top and bottom views, respectively, of first adhesive 978A formed on metal base 950 and conductive trace 970. First adhesive 978A is identical to adhesive 178 except that first adhesive 978A has a smaller surface area that corresponds to the periphery of chip 910 extended outwardly by 250 microns beyond each peripheral edge. Thus, first adhesive 978A contacts and covers the inner distal end of conductive trace 970 but not the outer distal end of conductive trace 970.

Figure 137A:
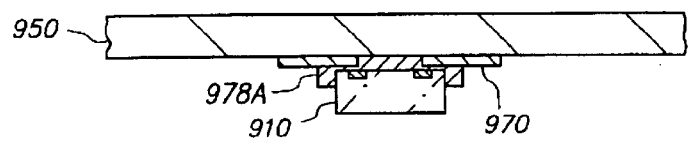
Figure 137B:
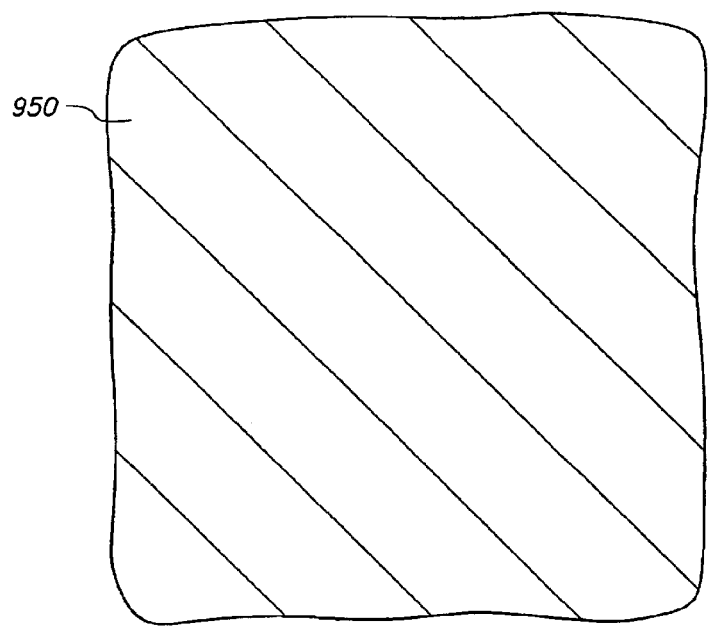
Figure 137C:
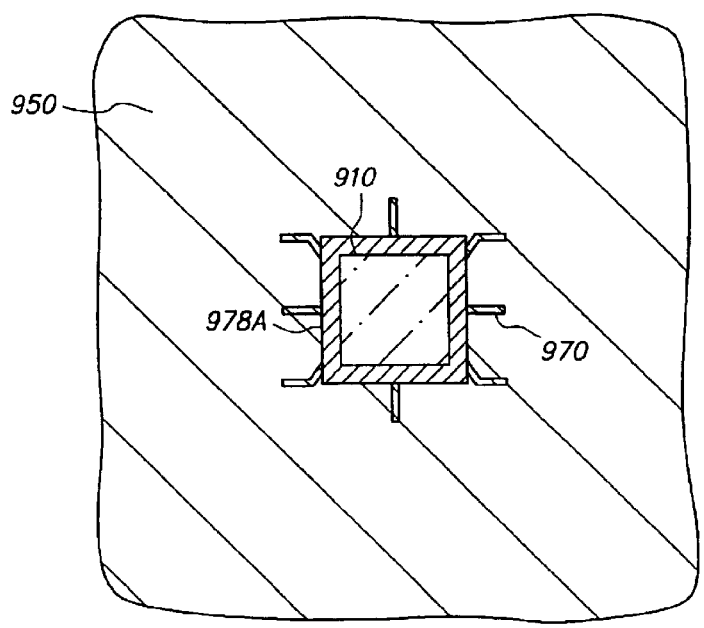

FIGS. 137A, 137B and 137C are cross-sectional, top and bottom views, respectively, of chip 910 mechanically attached to metal base 950 and conductive trace 970 by first adhesive 978A. First adhesive 978A covers and extends outside the periphery of chip 910. First adhesive 978A is heated by the pick-up head that places chip 910 on first adhesive 978A. As a result, first adhesive 978A proximate to chip 910 is partially polymerized (B stage) and forms a gel but is not fully cured. Thereafter, the structure is placed in an oven and first adhesive 978A is fully cured.

Figure 138A:
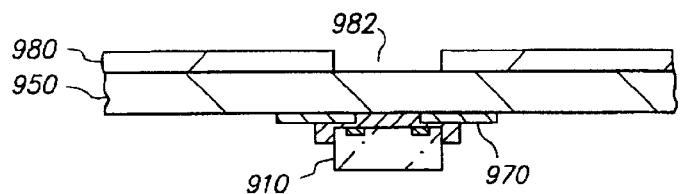
Figure 138B:
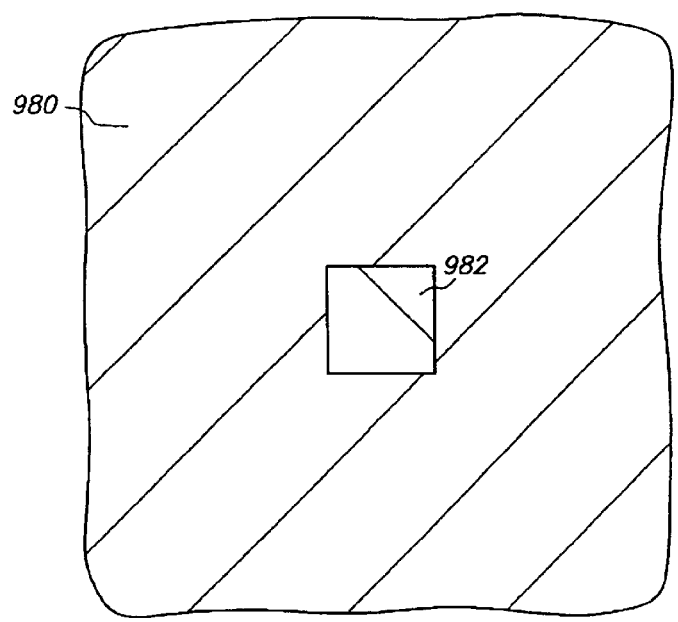
Figure 138C:
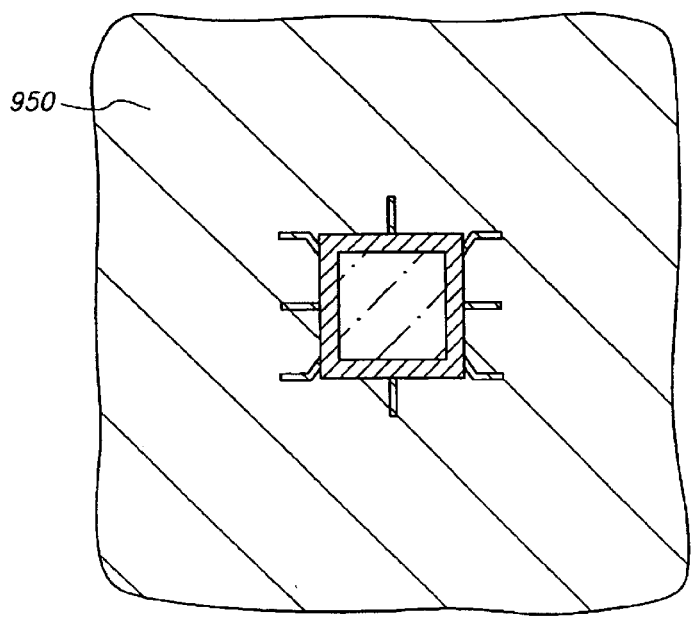

FIGS. 138A, 138B and 138C are cross-sectional, top and bottom views, respectively, of photoresist layer 980 formed on metal base 950. Photoresist layer 980 is deposited using a dry film lamination process in which a hot roll presses photoresist layer 980 onto metal base 950. Thereafter, photoresist layer 980 is patterned by selectively applying light through a reticle (not shown), applying a developer solution to remove the photoresist portions rendered soluble by the light, and then hard baking, as is conventional. As a result, photoresist layer 980 contains opening 982 that selectively exposes metal base 950 and is axially aligned with and co-extensive with chip 910. Photoresist layer 980 has a thickness of 25 microns.

Figure 139A:
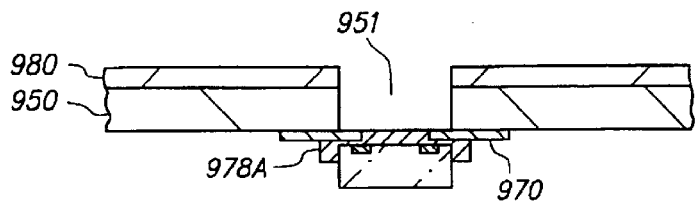
Figure 139B:
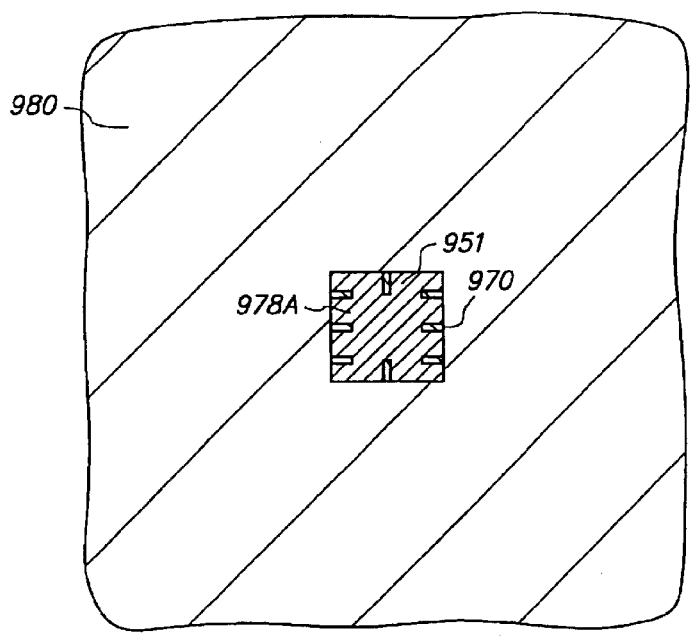
Figure 139C:
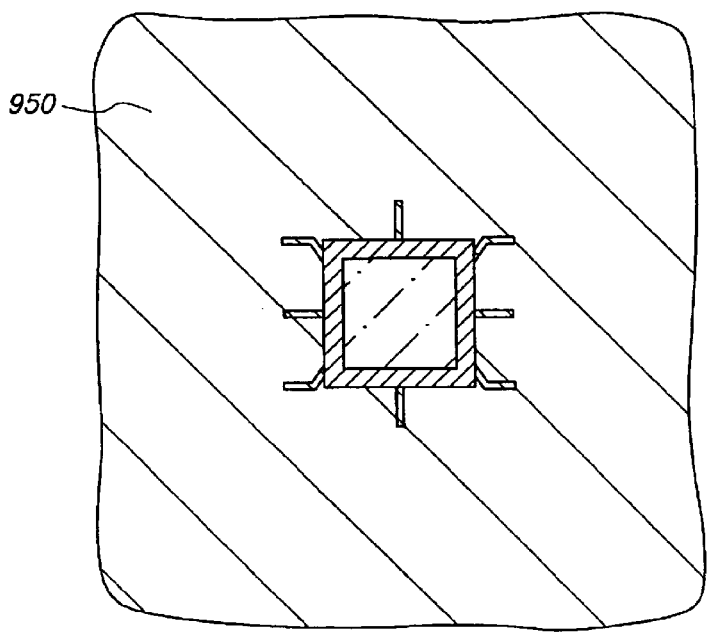

FIGS. 139A, 139B and 139C are cross-sectional, top and bottom views, respectively, of opening 951 that is formed through metal base 950 and exposes conductive trace 970 and first adhesive 978A.

Opening 951 is formed through metal base 950 by wet chemical etching using photoresist layer 980 as an etch mask. A "front-side" wet chemical etch is applied to the exposed portion of surface 952 of metal base 950. For instance, the wet chemical etch can be sprayed on surface 952, or a protective mask can be deposited on surface 954 and then the structure can be dipped in the wet chemical etch. The wet chemical etch is highly selective of copper with respect to nickel and polyimide. Therefore, no appreciable amount of conductive trace 970 or first adhesive 978A is removed. A suitable wet chemical etch can be provided by a solution containing alkaline ammonia. The optimal etch time for exposing metal base 950 to the wet chemical etch in order to remove the portion of metal base 950 that overlaps chip 910 without excessively undercutting metal base 950 can be established through trial and error.

The wet chemical etch etches completely through metal base 950, thereby effecting a pattern transfer of photoresist layer 980 onto metal base 950. Opening 951 is axially aligned with and coextensive with chip 910.

Furthermore, since conductive trace 970 and the other conductive traces extend outside the periphery of opening 951, metal base 950 continues to contact and electrically connect the conductive traces.

Figure 140A:
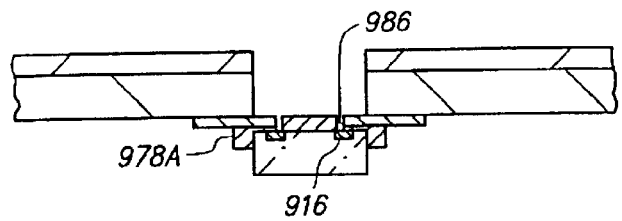
Figure 140B:
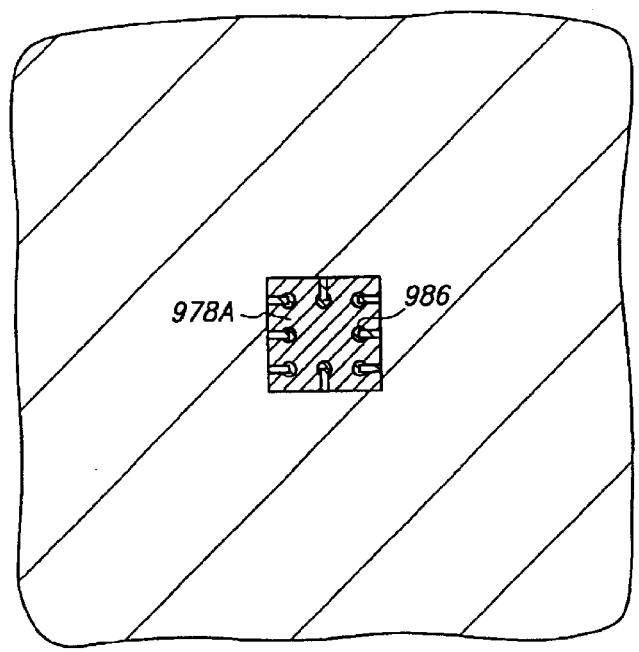
Figure 140C:
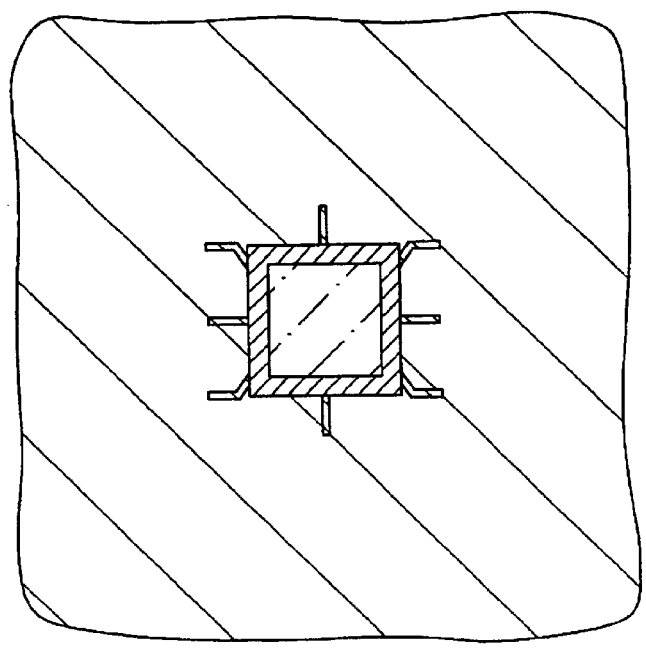

FIGS. 140A, 140B and 140C are cross-sectional, top and bottom views, respectively, of opening 986 that is formed through first adhesive 978A and exposes pad 916.

Figure 141A:
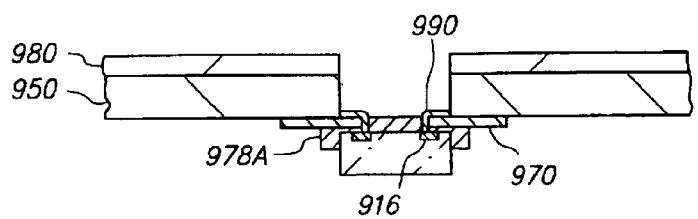
Figure 141B:
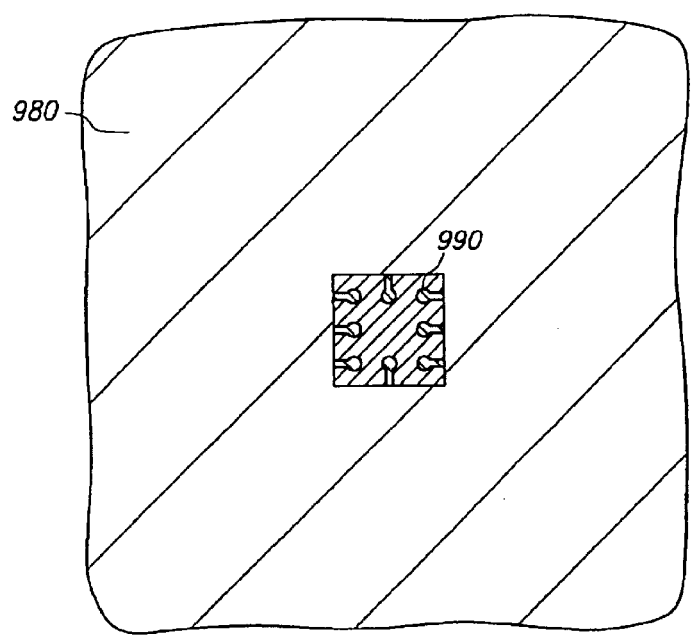
Figure 141C:
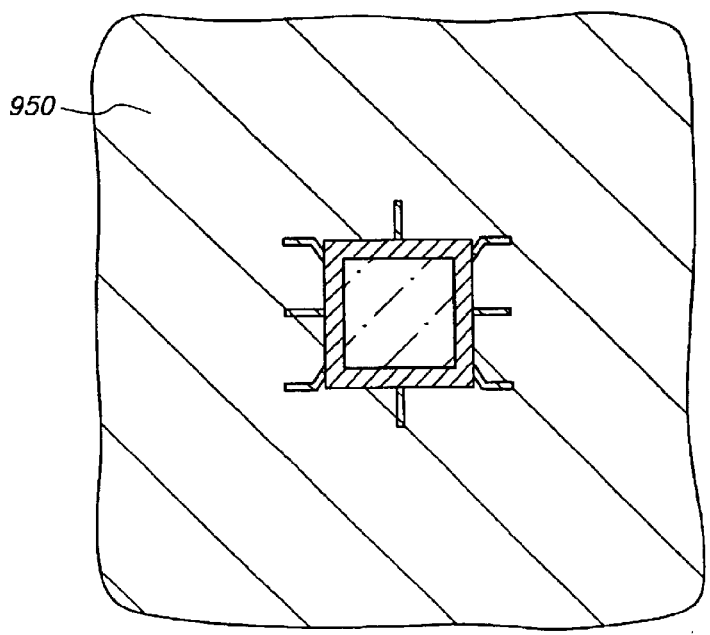

FIGS. 141A, 141B and 141C are cross-sectional, top and bottom views, respectively, of connection joint 990 formed on pad 916 and conductive trace 970.

Connection joint 990 is formed by an electroplating operation using photoresist layer 980 as a plating mask.

Metal base 950 is connected to a plating bus (not shown), current is applied to the plating bus from an external power source, and the structure is submerged in an electrolytic copper plating solution such as Sel-Rex CUBATH M™ at room temperature. Conductive trace 970 is electrically connected to metal base 950. As a result, connection joint 990 begins to plate on conductive trace 970. However, connection joint 990 does not initially deposit on pad 916 since first adhesive 978A is an electrical insulator that cannot supply current from the plating bus to generate electroplating and pad 916 is electrically isolated from the plating bus.

As the electroplating operation continues, connection joint 990 continues to plate on conductive trace 970 and expand axially in opening 986 towards pad 916. Eventually connection joint 990 contacts pad 916, and as a result, pad 916 is electrically connected to the plating bus by metal base 950, conductive trace 970 and connection joint 990, and connection joint 990 begins to plate on pad 916 as well. The copper electroplating operation continues until connection joint 990 is about 15 microns thick. Thereafter, the structure is removed from the electrolytic copper plating solution and rinsed in distilled water.

The copper electroplating operation also electroplates a copper layer on the exposed portions of metal base 950 in opening 951, thereby slightly offsetting the undercut beneath photoresist layer 980. For convenience of illustration, the copper layer is not shown.

Figure 142A:
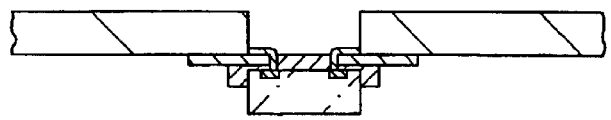
Figure 142B:
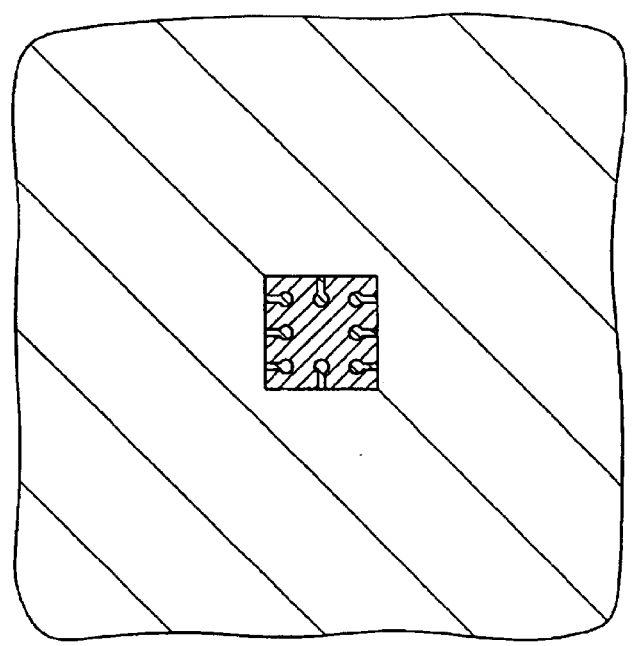
Figure 142C:
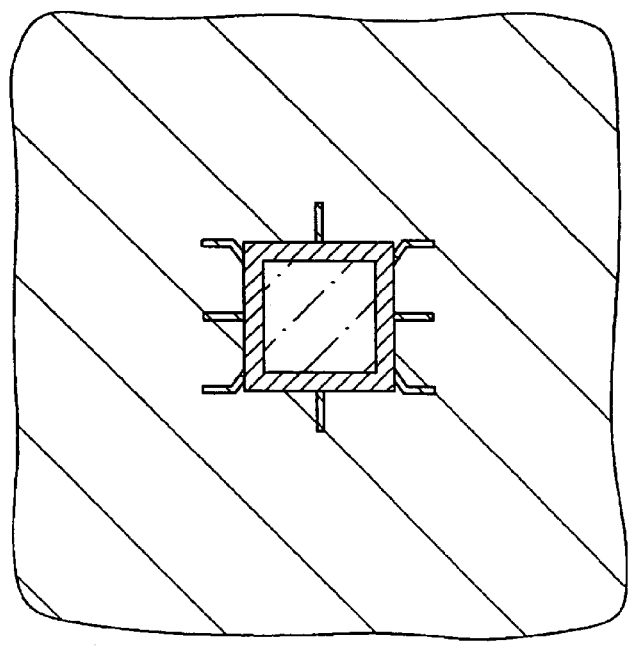

FIGS. 142A, 142B and 142C are cross-sectional, top and bottom views, respectively, of the structure after photoresist layer 980 is stripped. Photoresist layer 980 is removed using a solvent, such as a mild alkaline solution with a pH of 9, that is highly selective of photoresist with respect to copper, polyimide and silicon. Therefore, no appreciable amount of chip 910, metal base 950, first adhesive 978A or connection joint 990 is removed.

Figure 143A:
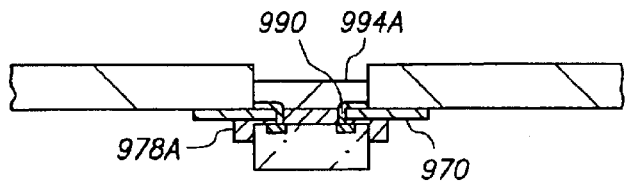
Figure 143B:
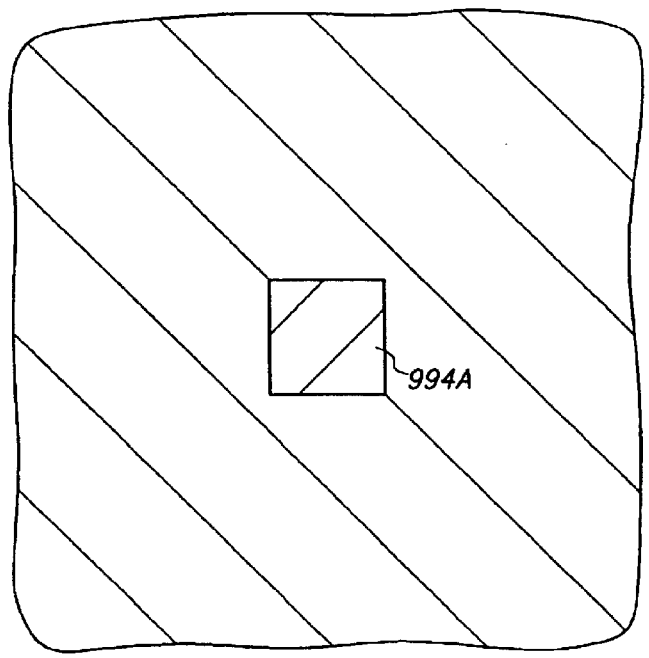
Figure 143C:
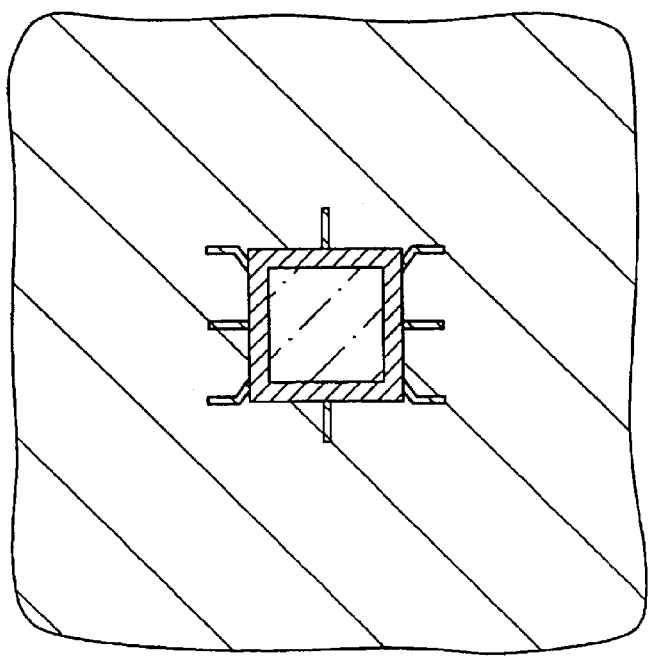

FIGS. 143A, 143B and 143C are cross-sectional, top and bottom views, respectively, of first insulative base 994A formed over conductive trace 970, first adhesive 978A and connection joint 990.

First insulative base 994A is initially an epoxy paste that is selectively deposited into opening 951 using stencil printing, and then the epoxy paste is cured to form a solid adherent insulator that provides a protective seal for connection joint 986.

First insulative base 994A is identical to insulative base 194 except that first insulative base 994A has a smaller surface area that corresponds to the periphery of chip 910.

Figure 144A:
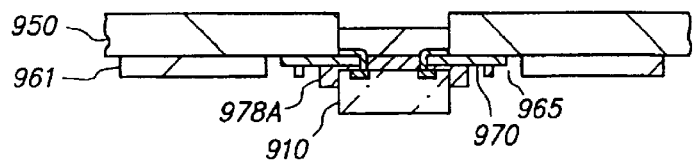
Figure 144B:
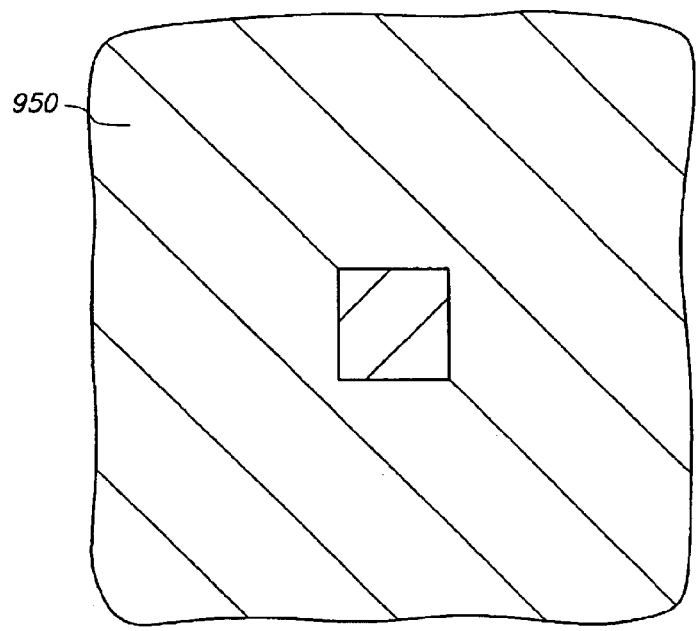
Figure 144C:
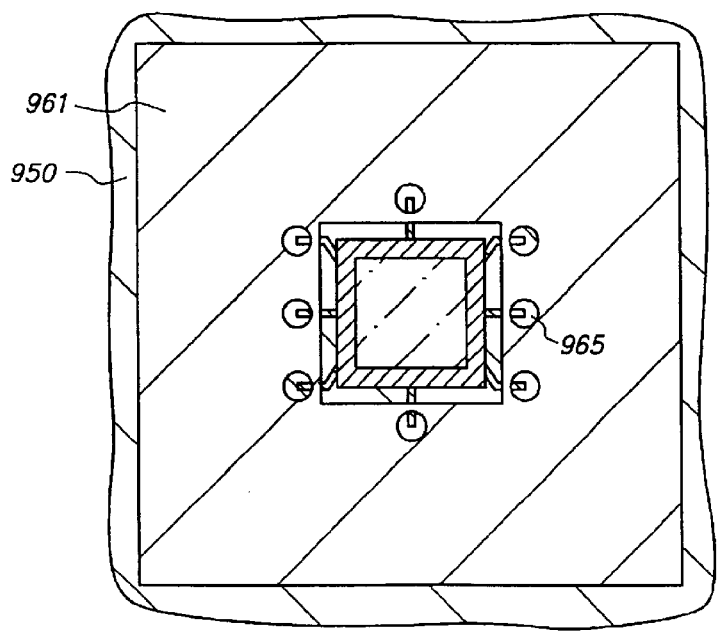

FIGS. 144A, 144B and 144C are cross-sectional, top and bottom views, respectively, of solder mask 961 formed on metal base 950 and conductive trace 970. Solder mask 961 has a frame-like shape that corresponds to the periphery of substrate 920. Thus, solder mask 961 is spaced and separated from chip 910 and first adhesive 978A.

Solder mask 961 is initially a liquid resin that is selectively deposited onto metal base 950 and conductive trace 970 using stencil printing. Thereafter, solder mask 961 is patterned by selectively applying light through a reticle (not shown), applying a developer solution to remove the solder mask portions rendered soluble by the light, and then hard baking, as is conventional. As a result, solder mask 961 contains opening 965 that is axially aligned with and exposes the outer distal end of conductive trace 970 and has a diameter of 200 microns. Solder mask 961 has a thickness of 25 microns.

Solder mask 961 contains many other openings that expose corresponding outer distal ends of the conductive traces, and only eight openings are shown and a single opening 965 is labeled for convenience of illustration.

For convenience of illustration, solder mask 961 is shown below metal base 950 to retain a single orientation throughout the figures for ease of comparison between the figures, although in this step metal base 950 would be inverted so that gravitational force would assist with the stencil printing.

Figure 145A:
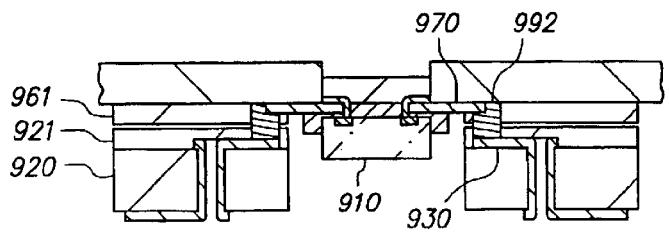
Figure 145B:
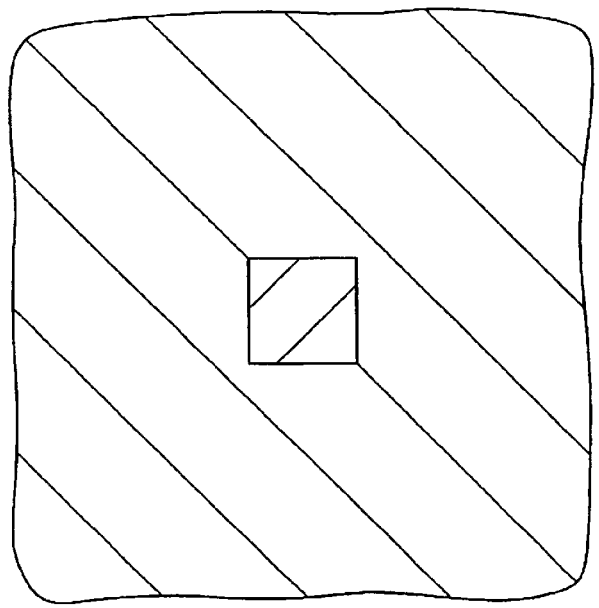
Figure 145C:
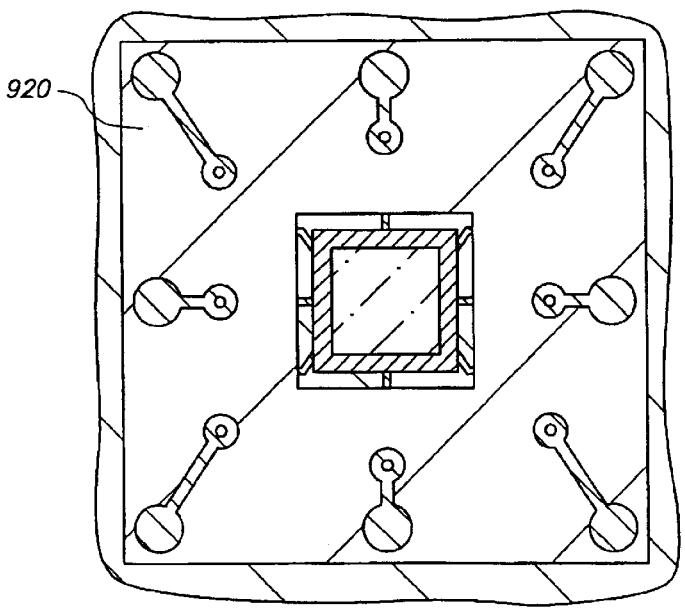

FIGS. 145A, 145B and 145C are cross-sectional, top and bottom views, respectively, of substrate 920 mechanically attached and electrically connected to conductive trace 970 by interconnect 992.

Flux (not shown) is initially deposited over solder mask 961 using screen printing. The flux extends into opening 965 and contacts the outer distal end of conductive trace 970. Thereafter, the pick-up head positions substrate 920 over chip 910 and conductive trace 970 such that chip 910 is centrally located in cavity 942, openings 925 and 965 are aligned with one another, and interconnect 992 is placed on the flux in opening 965 that covers the outer distal end of conductive trace 970. The flux holds interconnect 992 in place in opening 965.

Thereafter, the structure is heated to a temperature of about 210° C., and the heat melts and reflows interconnect 992. The flux provides wetting for interconnect 992 on first contact terminal 930 and conductive trace 970 in openings 925 and 965, respectively, and solder masks 921 and 961 confine interconnect 992 to openings 925 and 965, respectively, at their respective surfaces. Thereafter, the heat is removed and interconnect 992 cools and solidifies into a hardened solder joint that contacts and mechanically attaches and electrically connects first contact terminal 930 and conductive trace 970.

In this manner, the solder reflow operation transforms a loose mechanical bond between first contact terminal 930 and conductive trace 970 into a solid mechanical bond between first contact terminal 930 and conductive trace 970.

Figure 146A:
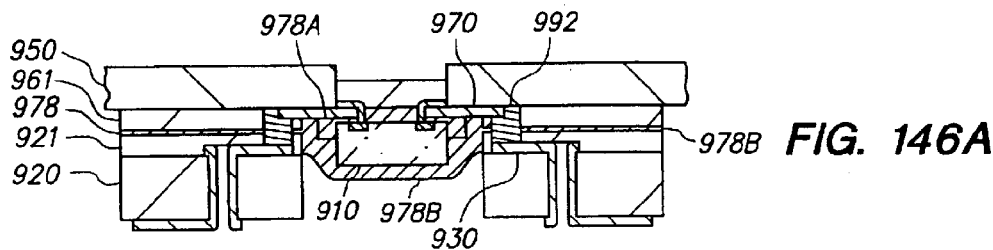
Figure 146B:
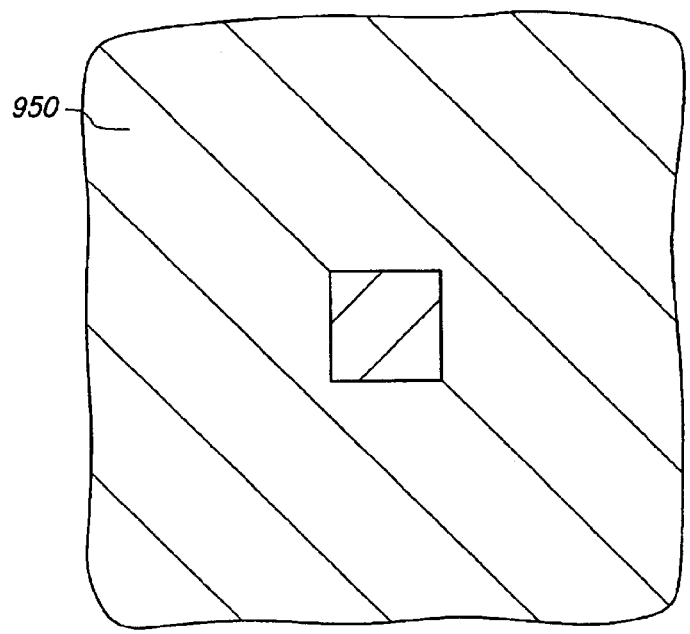
Figure 146C:
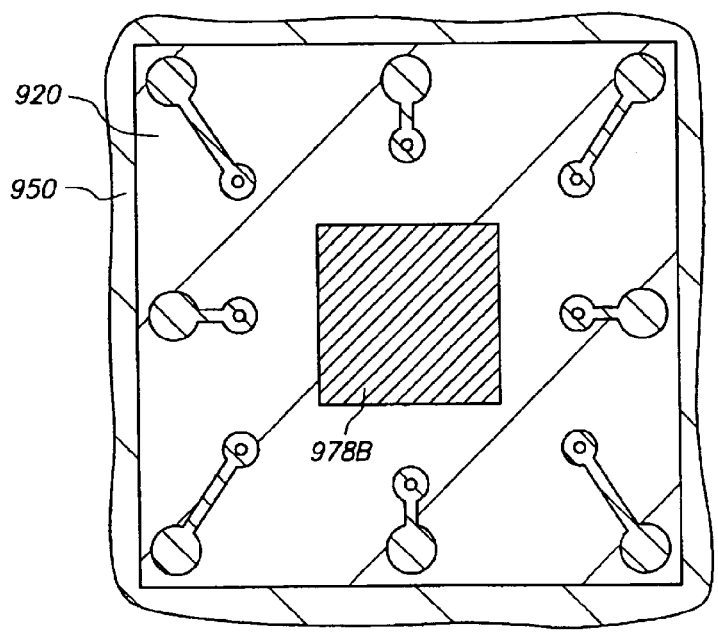

FIGS. 146A, 146B and 146C are cross-sectional, top and bottom views, respectively, of second adhesive 978B formed on chip 910 and substrate 920 in cavity 942 and formed between substrate 920 and metal base 950 and between substrate 920 and conductive trace 970 outside cavity 942.

Second adhesive 978B is deposited into cavity 942 from surface 924 of substrate 920 by dispensing after first adhesive 978A mechanically attaches chip 910 to conductive trace 970 and interconnect 992 mechanically attaches substrate 920 to conductive trace 970. Second adhesive 978B is a secondary underfill material such as Namics 1570, and thus has a different composition than adhesive 178 (and first adhesive 978A). Second adhesive 978B contacts chip 910, solder mask 921, dielectric base 928, metal base 950, solder mask 961, conductive trace 970, first adhesive 978A and interconnect 992, covers chip 910, and is sandwiched between solder masks 921 and 961.

Second adhesive 978B provides back-side environmental protection such as moisture resistance and particle protection for chip 910 as well as enhanced mechanical coupling between chip 910 and substrate 920. Second adhesive 978B also underfills substrate 920 relative to metal base 950.

Second adhesive 978B is deposited into cavity 942 as a liquid resin (A stage) and flows radially outward from cavity 942 between solder masks 921 and 961. Thereafter, the structure is placed in an oven and second adhesive 978B is fully cured at a relatively low temperature such as 150° C. Adhesive 978 is composed of first adhesive 978A and second adhesive 978B. Thus, adhesive 978 is a double-piece adhesive.

Figure 147A:
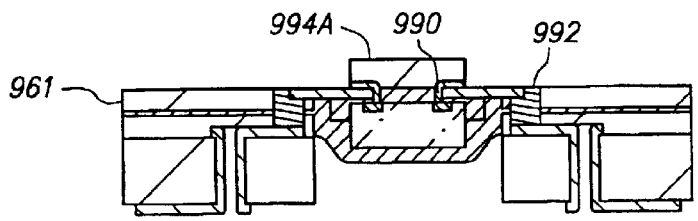
Figure 147B:
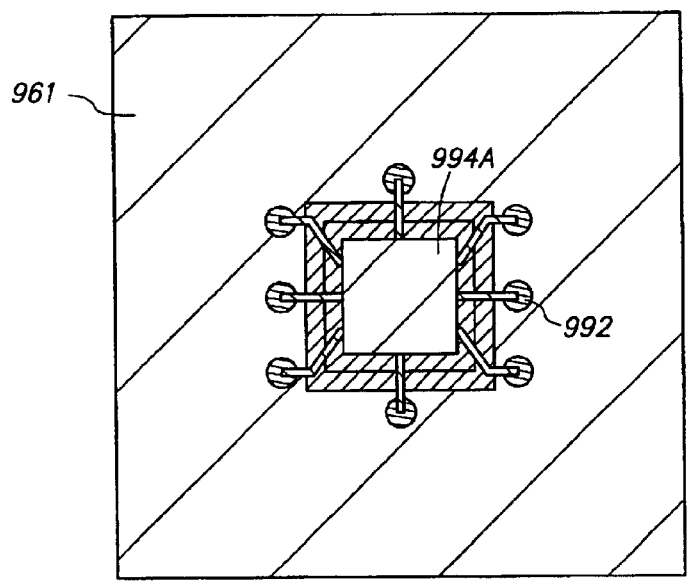
Figure 147C:
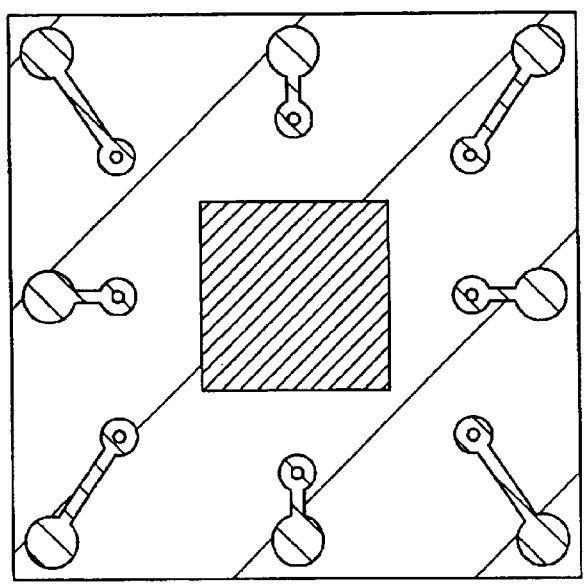

FIGS. 147A, 147B and 147C are cross-sectional, top and bottom views, respectively, of the structure after metal base 950 is removed. First insulative base 994A protects connection joint 990 from the wet chemical etch. Furthermore, since the wet chemical etch is highly selective of copper with respect to solder and solder resist, no appreciable amount of solder mask 961 or interconnect 992 is removed.

Figure 148A:
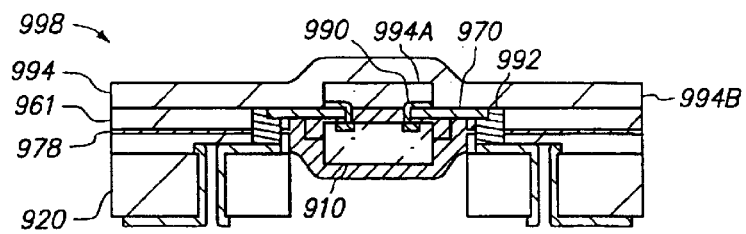
Figure 148B:
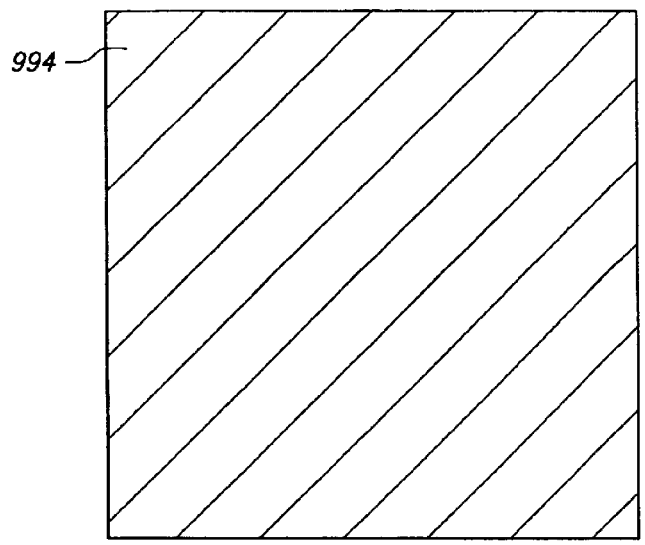
Figure 148C:
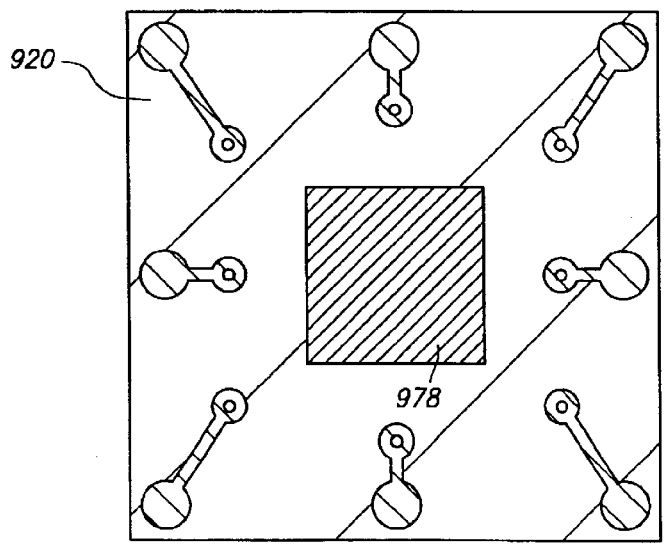

FIGS. 148A, 148B and 148C are cross-sectional, top and bottom views, respectively, of second insulative base 994B formed over solder mask 961, conductive trace 970, adhesive 978, connection joint 990, interconnect 992 and first insulative base 994A.

Second insulative base 994B is identical to insulative base 194 except that second insulative base 994B contacts and covers first insulative base 994A and extends 100 microns above adhesive 978. Insulative base 994 is composed of first insulative base 994A and second insulative base 994B. Thus, insulative base 994 is a double-piece insulative base.

At this stage, the manufacture of semiconductor chip assembly 998 that includes chip 910, substrate 920, solder masks 921 and 961, conductive trace 970, adhesive 978, connection joint 990, interconnect 992 and insulative base 994 can be considered complete.

FIGS. 149A–163A, 149B–163B and 149C–163C are cross-sectional, top and bottom views, respectively, of a method of making a semiconductor chip assembly in accordance with a tenth embodiment of the present invention. In the tenth embodiment, the conductive trace is mechanically attached and electrically connected to the chip by the connection joint, and then the conductive trace is mechanically attached and electrically connected to the substrate by the interconnect. For purposes of brevity, any description in the first embodiment is incorporated herein insofar as the same is applicable, and the same description need not be repeated. Likewise, elements of the tenth embodiment similar to those in the first embodiment have corresponding reference numerals indexed at ten-hundred rather than one-hundred. For instance, chip 1010 corresponds to chip 110, substrate 1020 corresponds to substrate 120, etc.

Figure 149A:
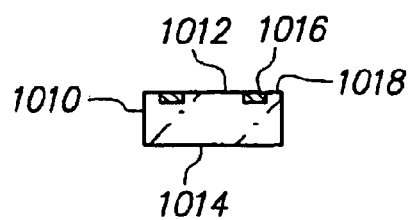
Figure 149B:
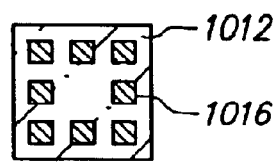
Figure 149C:
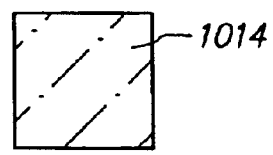

FIGS. 149A, 149B and 149C are cross-sectional, top and bottom views, respectively, of semiconductor chip 1010 which includes opposing major surfaces 1012 and 1014. Surface 1012 includes conductive pad 1016 and passivation layer 1018.

Figure 150A:
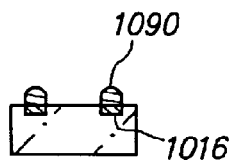
Figure 150B:
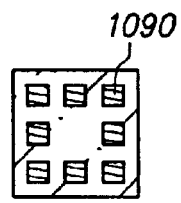
Figure 150C:
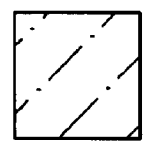

FIGS. 150A, 150B and 150C are cross-sectional, top and bottom views, respectively, of connection joint 1090 formed on pad 1016. Connection joint 1090 is a solder bump with a thickness of 100 microns. Connection joint 1090 is deposited on pad 1016 by electroless plating.

Figure 151A:
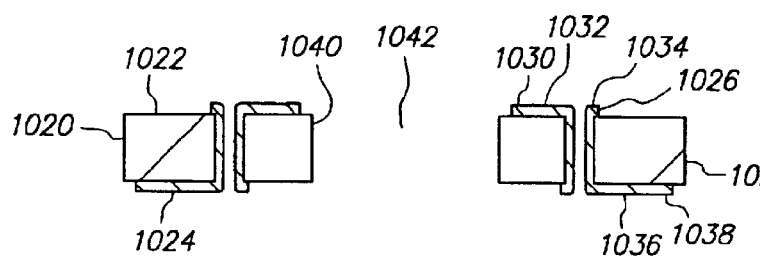
Figure 151B:
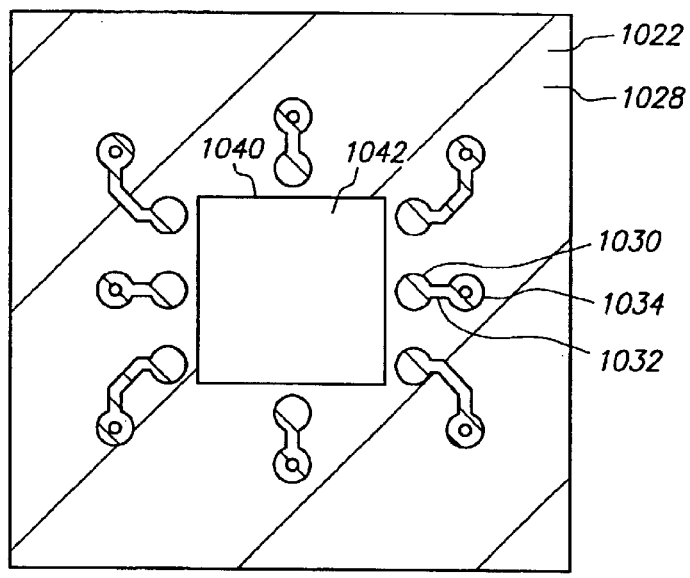
Figure 151C:
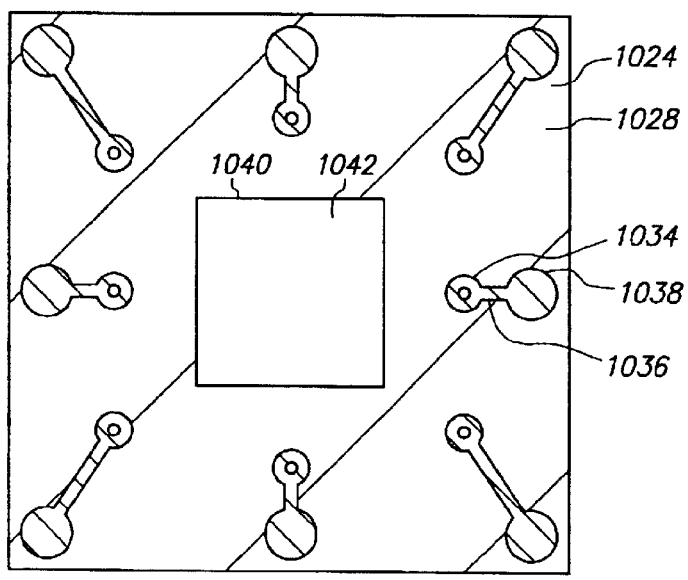

FIGS. 151A, 151B and 151C are cross-sectional, top and bottom views, respectively, of substrate 1020. Substrate 1020 includes opposing major surfaces 1022 and 1024, conductive terminal 1026 and dielectric base 1028. Conductive terminal 1026 includes first contact terminal 1030, first routing line 1032, vertical connection 1034, second routing line 1036 and second contact terminal 1038. Dielectric base 1028 includes inner sidewalls 1040 that bound cavity 1042.

Figure 152A:
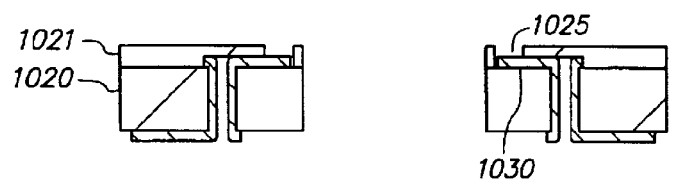
Figure 152B:
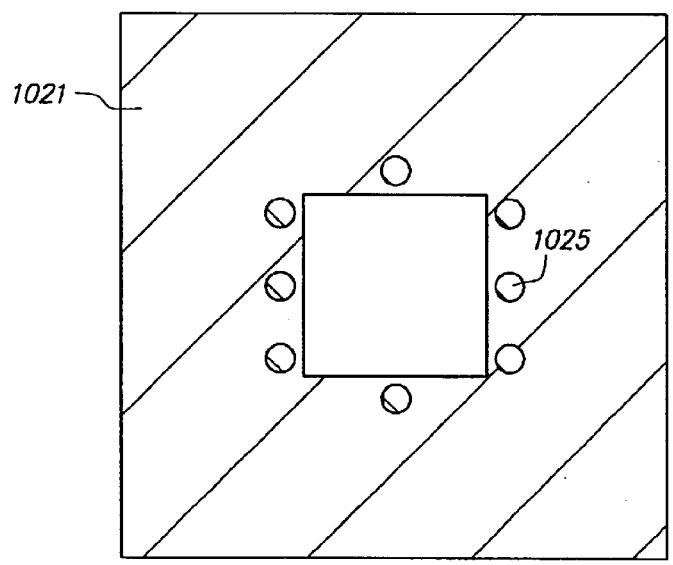
Figure 152C:
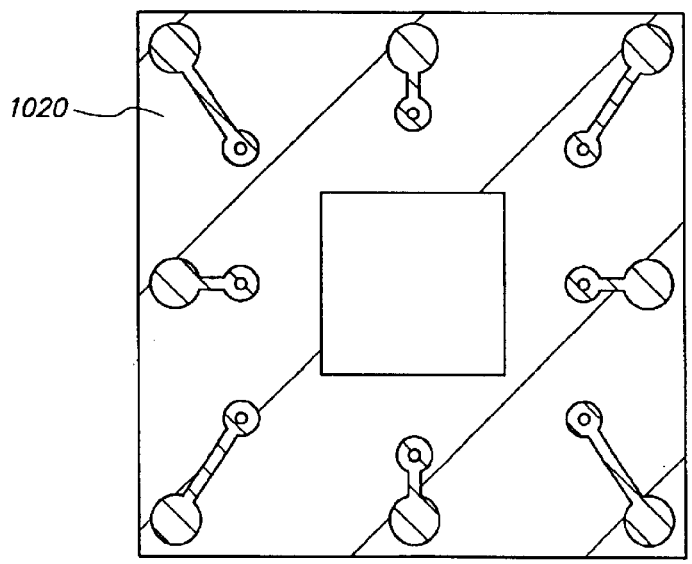

FIGS. 152A, 152B and 152C are cross-sectional, top and bottom views, respectively, of solder mask 1021 formed on substrate 1020. Solder mask 1021 has a frame-like shape that corresponds to the periphery of substrate 1020.

Solder mask 1021 is initially a liquid resin that is selectively deposited onto surface 1022 using stencil printing. Thereafter, solder mask 1021 is patterned by selectively applying light through a reticle (not shown), applying a developer solution to remove the solder mask portions rendered soluble by the light, and then hard baking, as is conventional. As a result, solder mask 1021 contains opening 1025 that is axially aligned with and exposes first contact terminal 1030 and has a diameter of 200 microns. Solder mask 1021 has a thickness of 25 microns.

Solder mask 1021 extends slightly outside the peripheral edges of substrate 1020 and extends slightly into cavity 1042. For convenience of illustration, the portions of solder mask 1021 that extend outside the peripheral edges of substrate 1020 and into cavity 1042 are not shown.

Solder mask 1021 contains many other openings that expose corresponding first contact terminals of substrate 1020, and only eight openings are shown and a single opening 1025 is labeled for convenience of illustration.

Figure 153A:
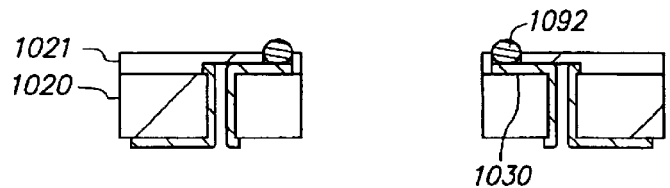
Figure 153B:
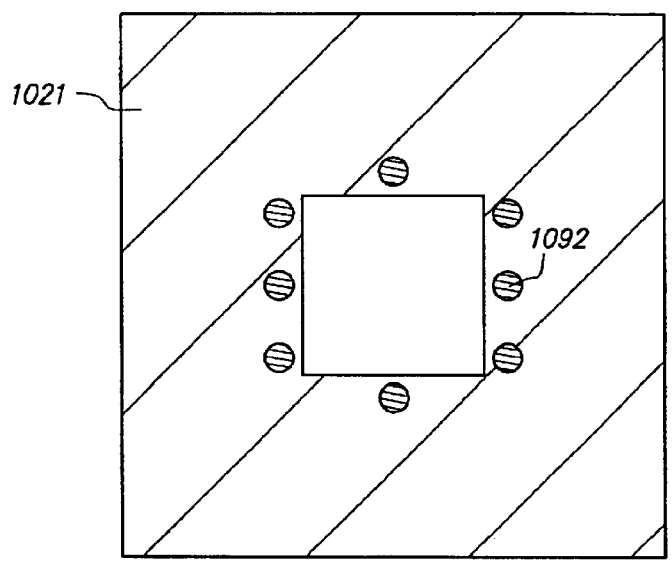
Figure 153C:
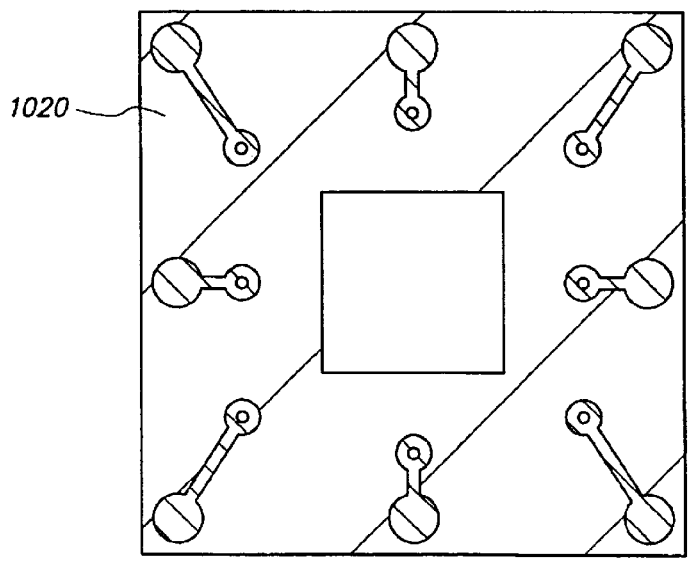

FIGS. 153A, 153B and 153C are cross-sectional, top and bottom views, respectively, of interconnect 1092 formed on first contact terminal 1030. Interconnect 1092 is a solder ball with a thickness of 200 microns. Flux (not shown) is initially deposited over solder mask 1021 using stencil printing. The flux extends into opening 1025 and contacts first contact terminal 1030. Thereafter, interconnect 1092 is placed on the flux in opening 1025 over first contact terminal 1030, and the flux holds interconnect 1092 in place in opening 1025.

Figure 154A:
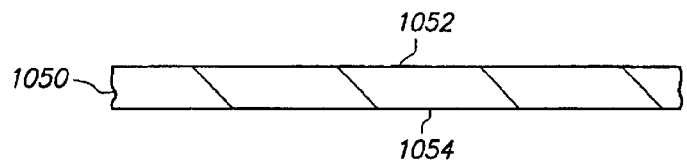
Figure 154B:
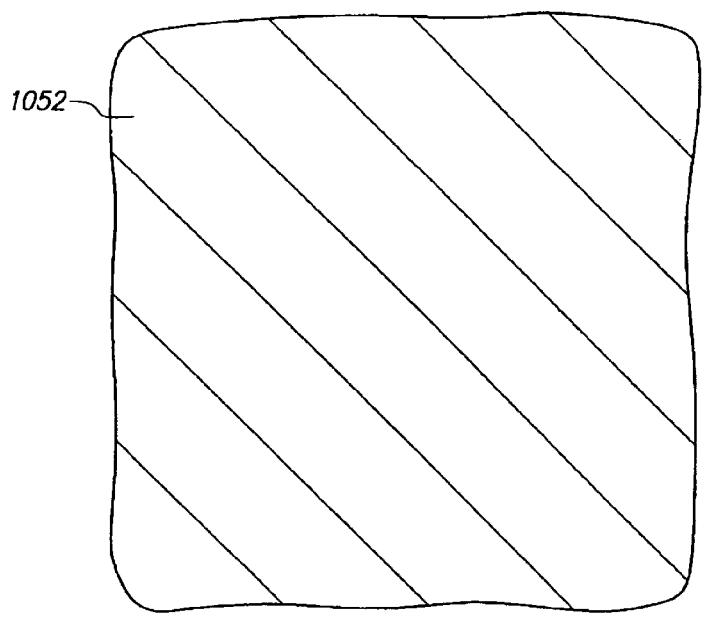
Figure 154C:
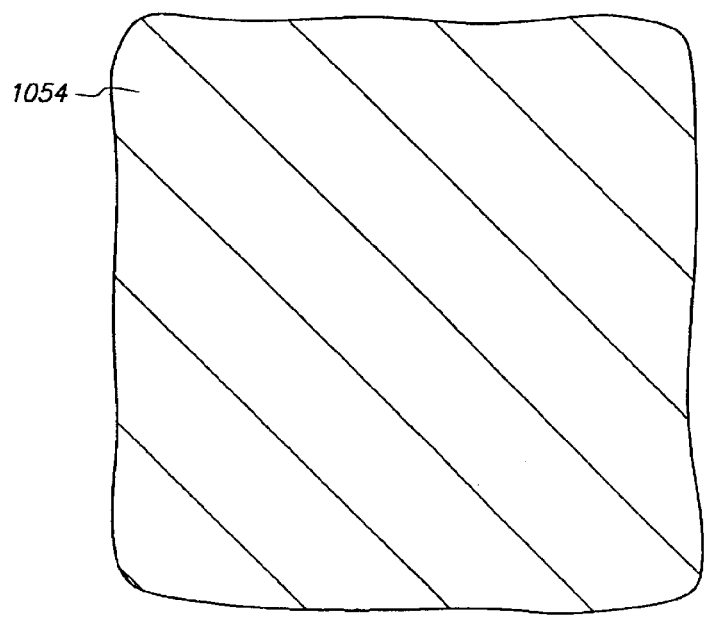

FIGS. 154A, 154B and 154C are cross-sectional, top and bottom views, respectively, of metal base 1050 which includes opposing major surfaces 1052 and 1054.

Figure 155A:
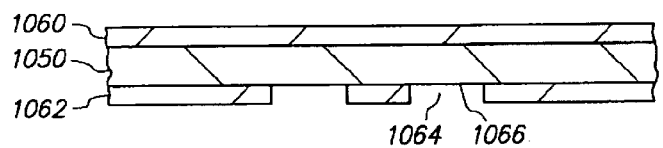
Figure 155B:
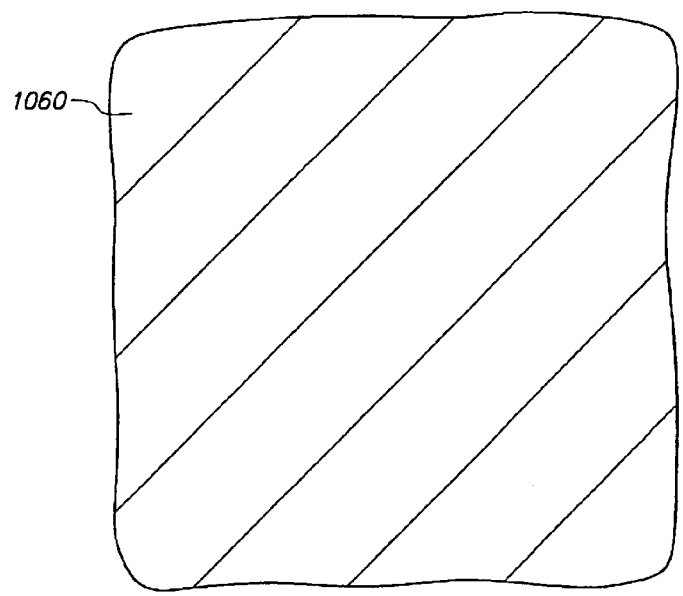
Figure 155C:
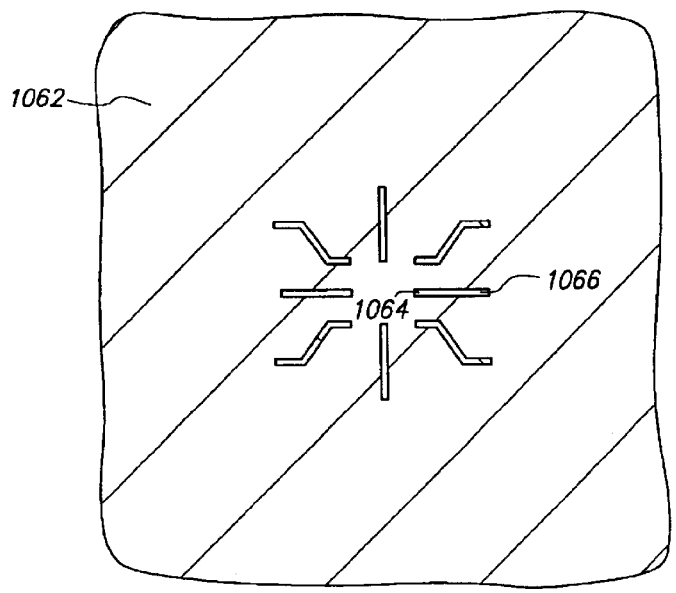

FIGS. 155A, 155B and 155C are cross-sectional, top and bottom views, respectively, of photoresist layers 1060 and 1062 formed on metal base 1050. Photoresist layer 1062 contains opening 1064 that selectively exposes portion 1066 of surface 1054.

Figure 156A:
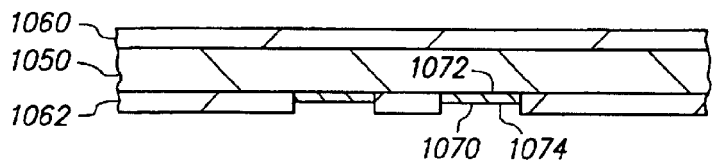
Figure 156B:
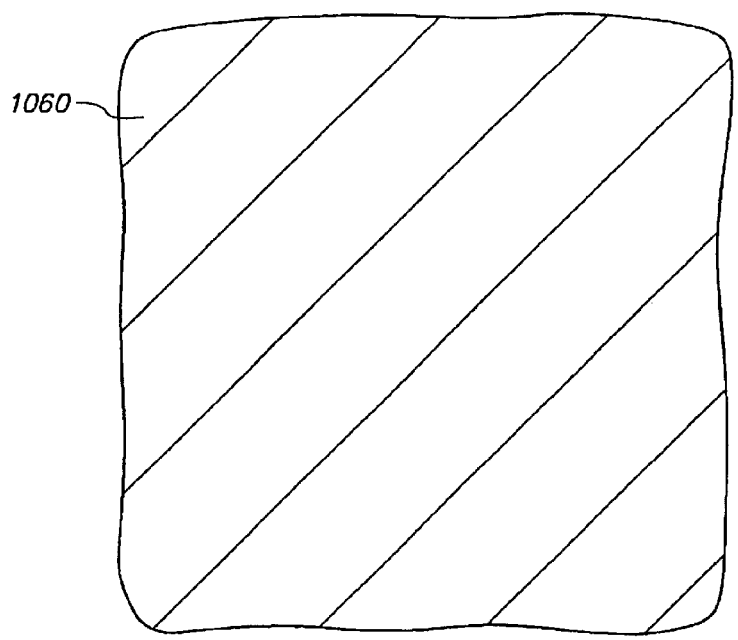
Figure 156C:
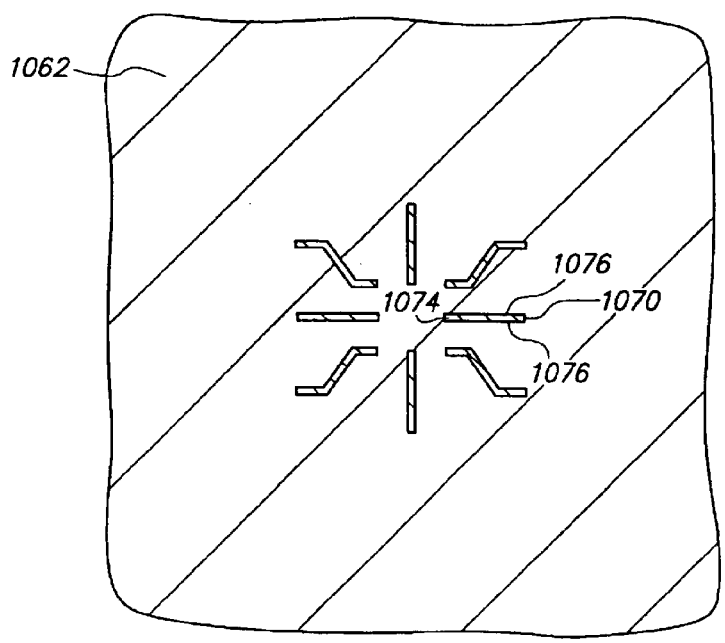

FIGS. 156A, 156B and 156C are cross-sectional, top and bottom views, respectively, of conductive trace 1070 formed on metal base 1050 by electroplating. Conductive trace 1070 includes opposing major surfaces 1072 and 1074 and peripheral sidewalls 1076.

Figure 157A:
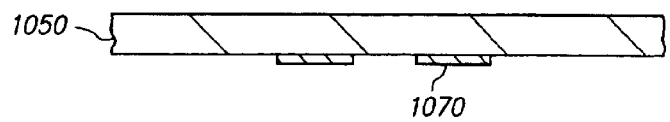
Figure 157B:
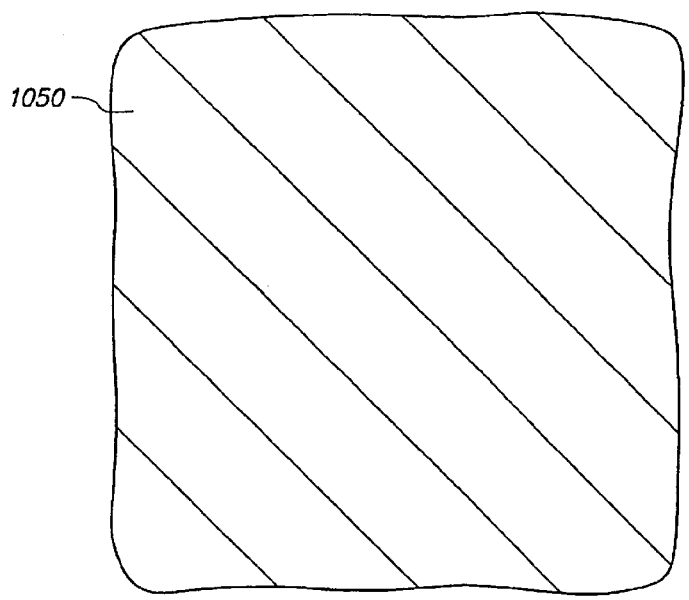
Figure 157C:
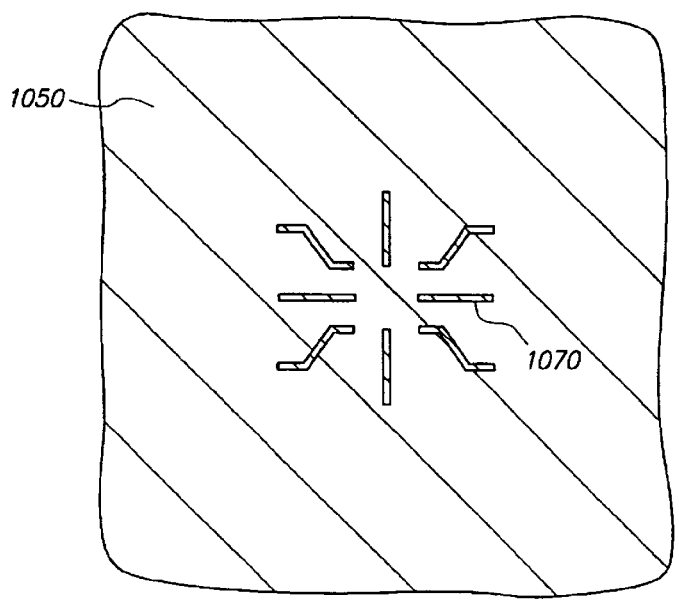

FIGS. 157A, 157B and 157C are cross-sectional, top and bottom views, respectively, of metal base 1050 and conductive trace 1070 after photoresist layers 1060 and 1062 are stripped.

Figure 158A:
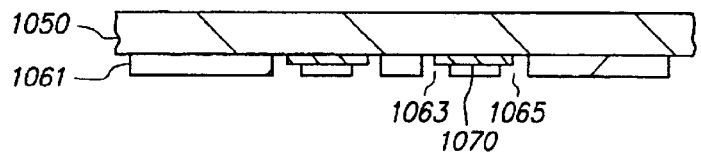
Figure 158B:
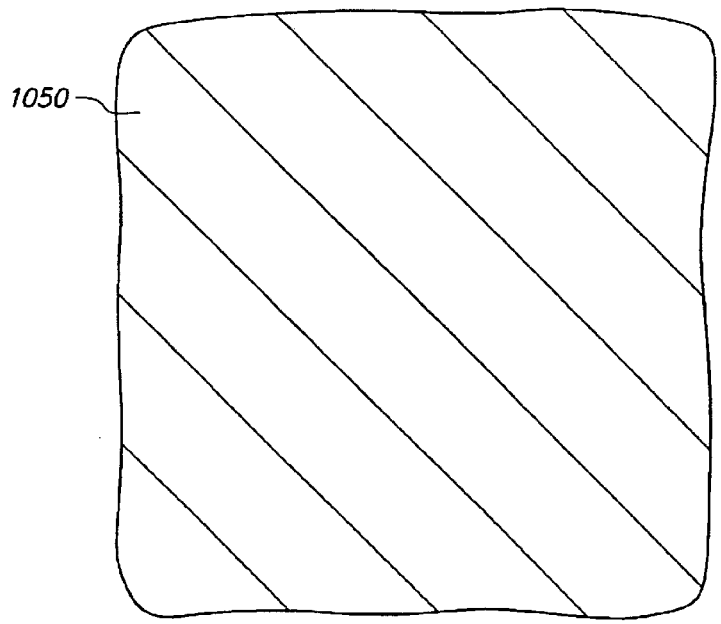
Figure 158C:
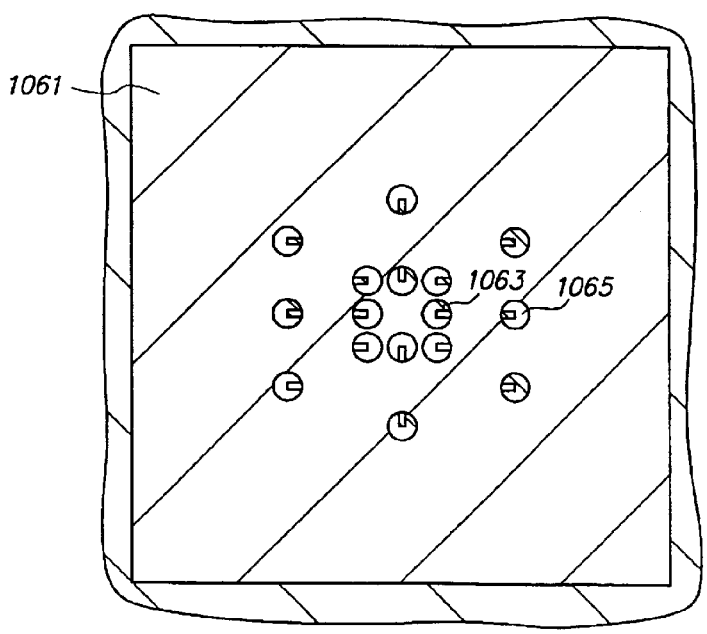

FIGS. 158A, 158B and 158C are cross-sectional, top and bottom views, respectively, of solder mask 1061 formed on metal base 1050 and conductive trace 1070.

Solder mask 1061 is initially a liquid resin that is selectively deposited onto metal base 1050 and conductive trace 1070 using stencil printing. Thereafter, solder mask 1061 is patterned by selectively applying light through a reticle (not shown), applying a developer solution to remove the solder mask portions rendered soluble by the light, and then hard baking, as is conventional. As a result, solder mask 1061 contains opening 1063 that is axially aligned with and exposes the inner distal end of conductive trace 1070 and has a diameter of 200 microns, and opening 1065 that is axially aligned with and exposes the outer distal end of conductive trace 1070 and has a diameter of 200 microns. Solder mask 1061 has a length and width of 40 millimeters and a thickness of 25 microns.

Solder mask 1061 contains many other openings that expose corresponding inner distal ends of the conductive traces, and only eight openings are shown and a single opening 1063 is labeled for convenience of illustration. Likewise, solder mask 1061 contains many other openings that expose corresponding outer distal ends of the conductive traces, and only eight openings are shown and a single opening 1065 is labeled for convenience of illustration.

For convenience of illustration, solder mask 1061 is shown below metal base 1050 to retain a single orientation throughout the figures for ease of comparison between the figures, although in this step metal base 1050 would be inverted so that gravitational force would assist with the stencil printing.

Figure 159A:
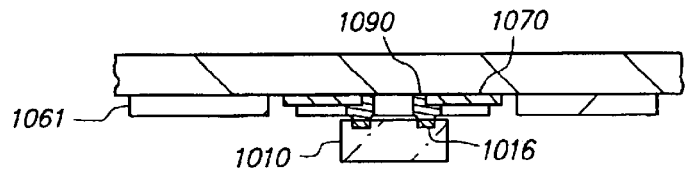
Figure 159B:
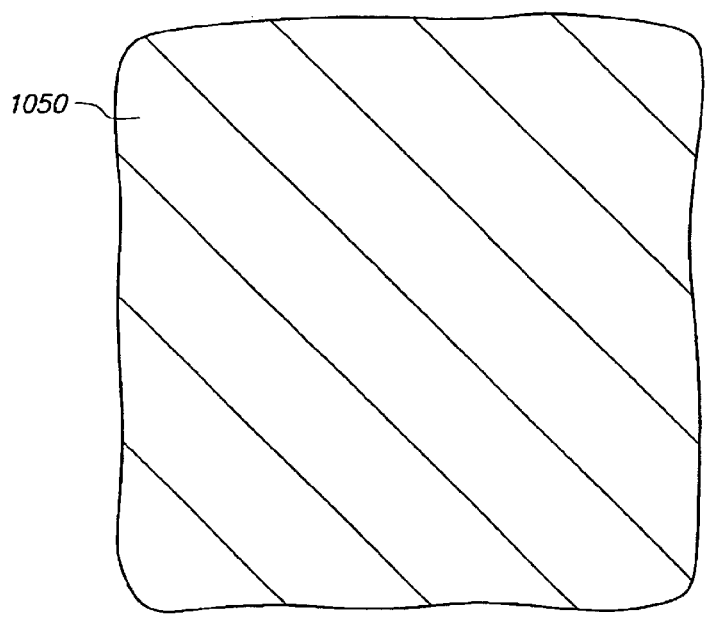
Figure 159C:
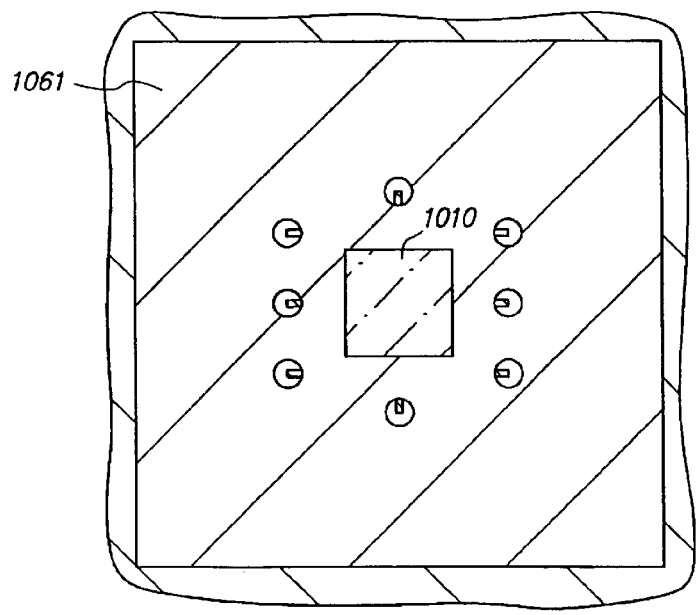

FIGS. 159A, 159B and 159C are cross-sectional, top and bottom views, respectively, of chip 1010 mechanically attached and electrically connected to conductive trace 1070 by connection joint 1090.

Flux (not shown) is initially deposited over solder mask 1061 using screen printing. The flux extends into opening 1063 and contacts the inner distal end of conductive trace 1070. Thereafter, the pick-up head positions chip 1010 over conductive trace 1070 such that connection joint 1090 is placed on the flux in opening 1063 that covers the inner distal end of conductive trace 1070. The flux holds connection joint 1090 in place in opening 1063.

Thereafter, the structure is heated to a temperature of about 210° C. and the heat melts and reflows connection joint 1090. The flux provides wetting for connection joint 1090 on conductive trace 1070 in opening 1063, passivation layer 1018 confines connection joint 1090 to pad 1016 at surface 1012, and solder mask 1061 confines connection joint 1090 to opening 1063 at its respective surface. Thereafter, the heat is removed and connection joint 1090 cools and solidifies into a hardened solder joint that contacts and mechanically attaches and electrically connects pad 1016 and conductive trace 1070.

In this manner, the first solder reflow operation transforms a loose mechanical bond between pad 1016 and conductive trace 1070 into a solid mechanical bond between pad 1016 and conductive trace 1070.

Figure 160A:
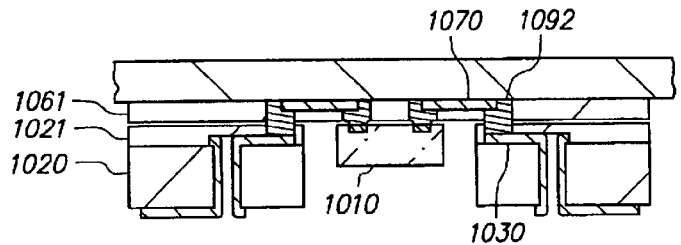
Figure 160B:
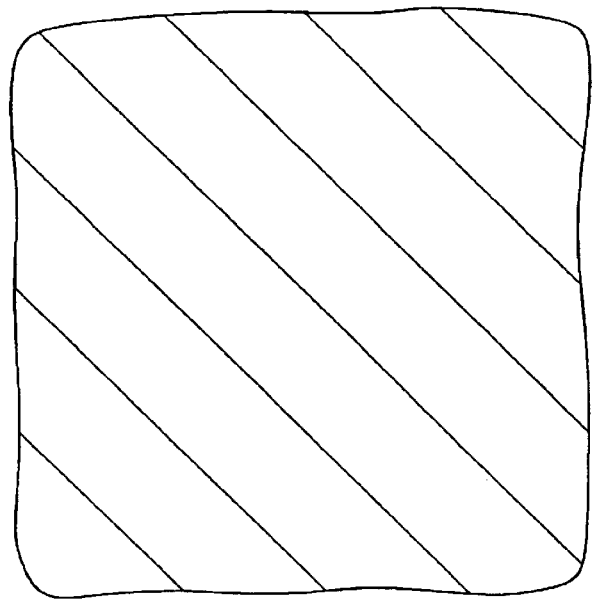
Figure 160C:
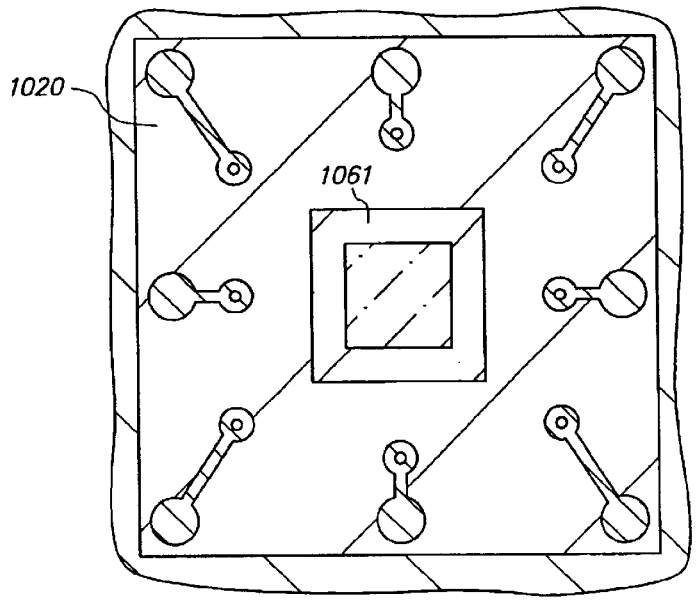

FIGS. 160A, 160B and 160C are cross-sectional, top and bottom views, respectively, of substrate 1020 mechanically attached and electrically connected to conductive trace 1070 by interconnect 1092.

Flux (not shown) is initially deposited over solder mask 1061 using screen printing. The flux extends into opening 1065 and contacts the outer distal end of conductive trace 1070. Thereafter, the pick-up head positions substrate 1020 over chip 1010 and conductive trace 1070 such that chip 1010 is centrally located in cavity 1042, openings 1025 and 1065 are aligned with one another, and interconnect 1092 is placed on the flux in opening 1065 that covers the outer distal end of conductive trace 1070. The flux holds interconnect 1092 in place in opening 1065.

Thereafter, the structure is heated to a temperature of about 210° C., and the heat melts and reflows interconnect 1092. The flux provides wetting for interconnect 1092 on first contact terminal 1030 and conductive trace 1070 in openings 1025 and 1065, respectively, and solder masks 1021 and 1061 confine interconnect 1092 to openings 1025 and 1065, respectively, at their respective surfaces. Thereafter, the heat is removed and interconnect 1092 cools and solidifies into a hardened solder joint that contacts and mechanically attaches and electrically connects first contact terminal 1030 and conductive trace 1070.

In this manner, the second solder reflow operation transforms a loose mechanical bond between first contact terminal 1030 and conductive trace 1070 into a solid mechanical bond between first contact terminal 1030 and conductive trace 1070.

Figure 161A:
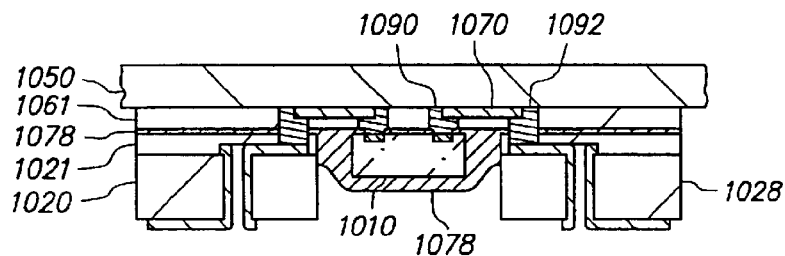
Figure 161B:
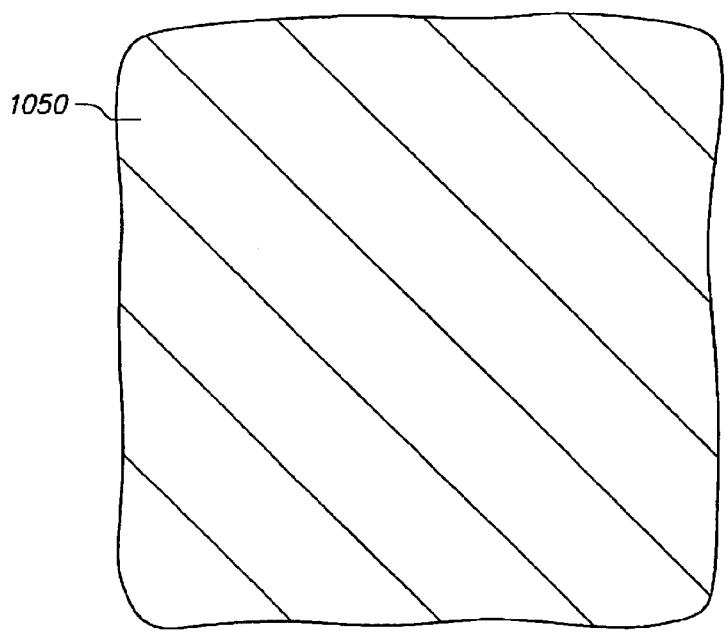
Figure 161C:
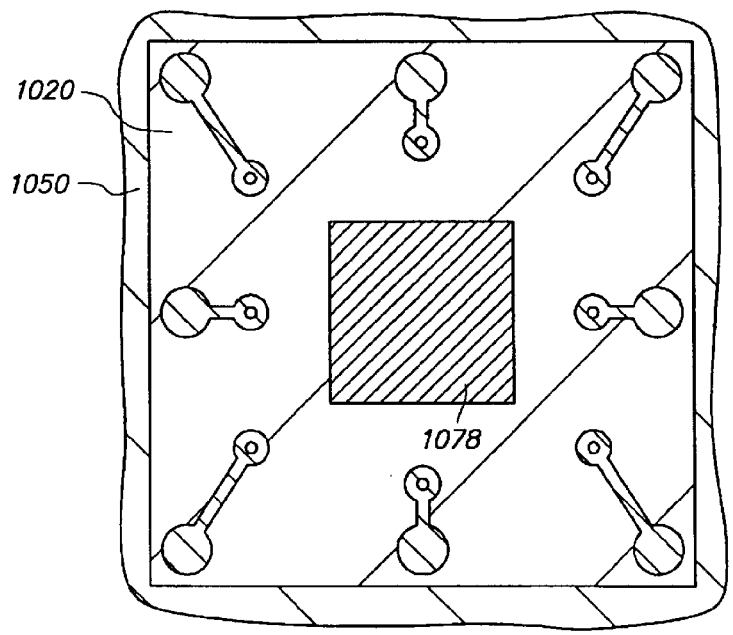

FIGS. 161A, 161B and 161C are cross-sectional, top and bottom views, respectively, of adhesive 1078 formed on chip 1010 and substrate 1020 in cavity 1042, formed between chip 1010 and metal base 1050 and between chip 1010 and conductive trace 1070 in cavity 1042, and formed between substrate 1020 and metal base 1050 and between substrate 1020 and conductive trace 1070 outside cavity 1042.

Adhesive 1078 is deposited into cavity 1042 from surface 1024 of substrate 1020 by dispensing after connection joint 1090 mechanically attaches chip 1010 to conductive trace 1070 and interconnect 1092 mechanically attaches substrate 1020 to conductive trace 1070. Adhesive 1078 is a secondary underfill material such as Namics 1570, and thus has a different composition than adhesive 178. Adhesive 1078 contacts chip 1010, solder mask 1021, dielectric base 1028, metal base 1050, solder mask 1061, conductive trace 1070, connection joint 1090 and interconnect 1092, and is sandwiched between solder masks 1021 and 1061.

Adhesive 1078 provides back-side environmental protection such as moisture resistance and particle protection for chip 1010 as well as enhanced mechanical coupling between chip 1010 and substrate 1020. Adhesive 1078 also underfills chip 1010 and substrate 1020 relative to metal base 1050.

Adhesive 1078 is deposited into cavity 1042 as a liquid resin (A stage), flows radially inward from chip 1010 between chip 1010 and solder mask 1061 and flows radially outward from cavity 1042 between solder masks 1021 and 1061. Thereafter, the structure is placed in an oven and adhesive 1078 is fully cured at a relatively low temperature such as 150° C.

Figure 162A:
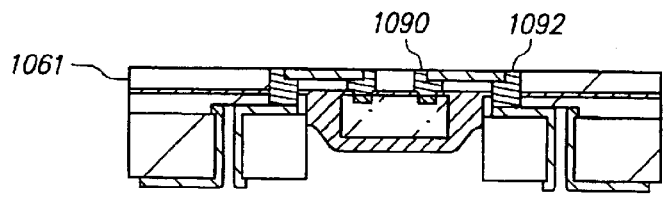
Figure 162B:
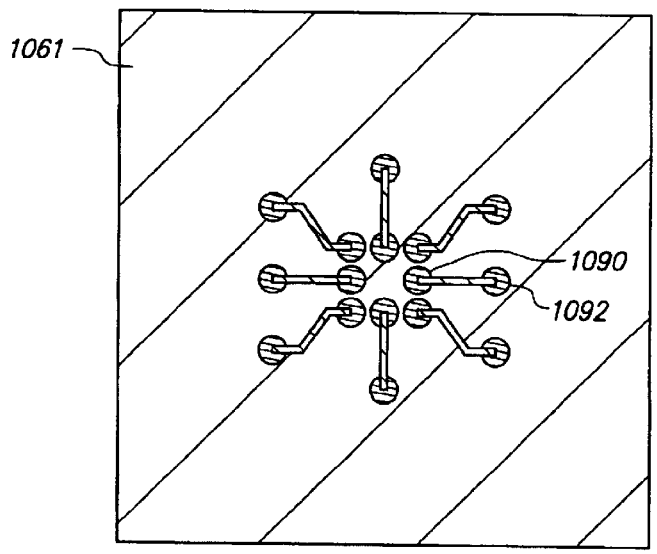
Figure 162C:
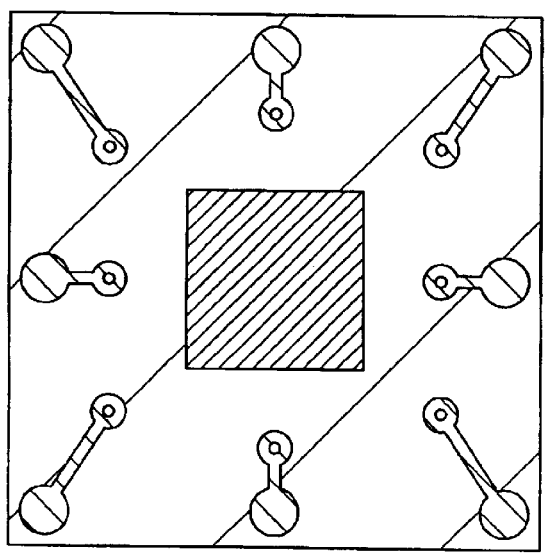

FIGS. 162A, 162B and 162C are cross-sectional, top and bottom views, respectively, of the structure after metal base 1050 is removed. Since the wet chemical etch is highly selective of copper with respect to solder and solder resist, no appreciable amount of solder mask 1061, connection joint 1090 or interconnect 1092 is removed.

Figure 163A:
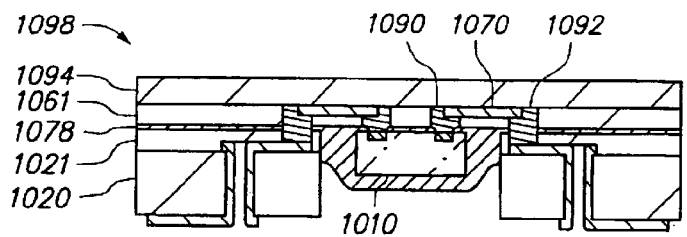
Figure 163B:
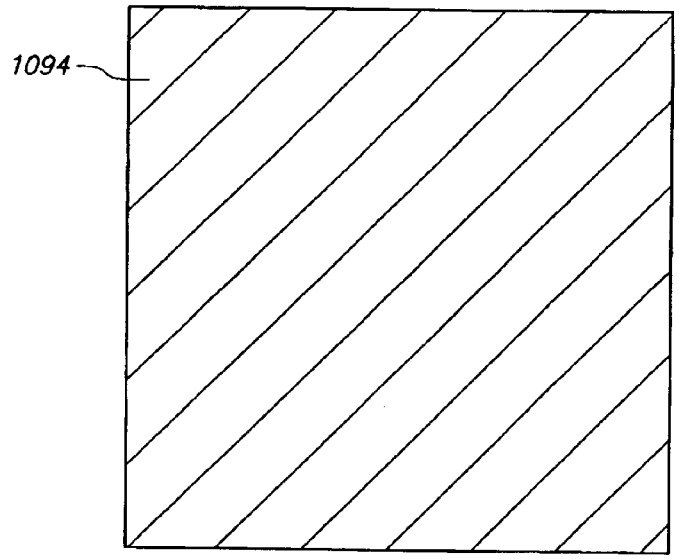
Figure 163C:
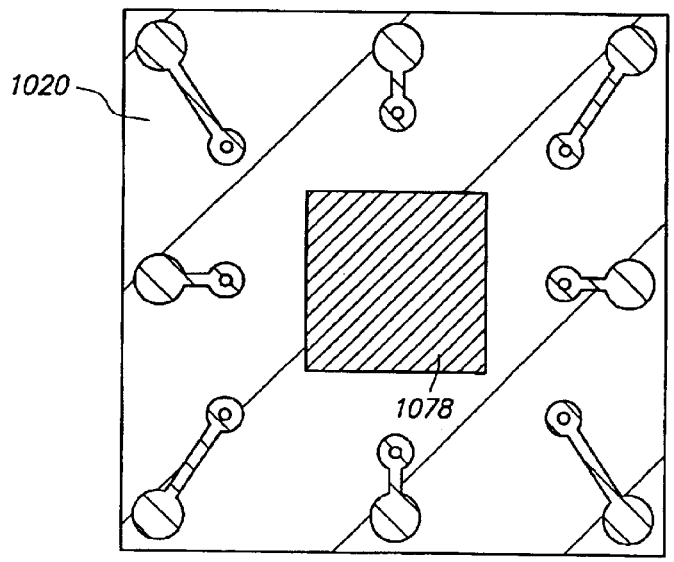

FIGS. 163A, 163B and 163C are cross-sectional, top and bottom views, respectively, of insulative base 1094 formed over solder mask 1061, conductive trace 1070, adhesive 1078, connection joint 1090 and interconnect 1092.

At this stage, the manufacture of semiconductor chip assembly 1098 that includes chip 1010, substrate 1020, solder masks 1021 and 1061, conductive trace 1070, adhesive 1078, connection joint 1090, interconnect 1092 and insulative base 1094 can be considered complete.

Figure 164A:
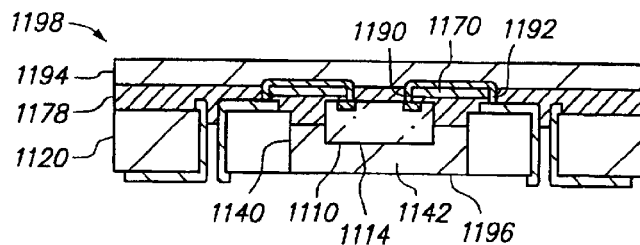
FIGS. 164A, 164B and 164C are cross-sectional, top and bottom views, respectively, of a semiconductor chip assembly in accordance with an eleventh embodiment of the present invention.
Figure 164B:
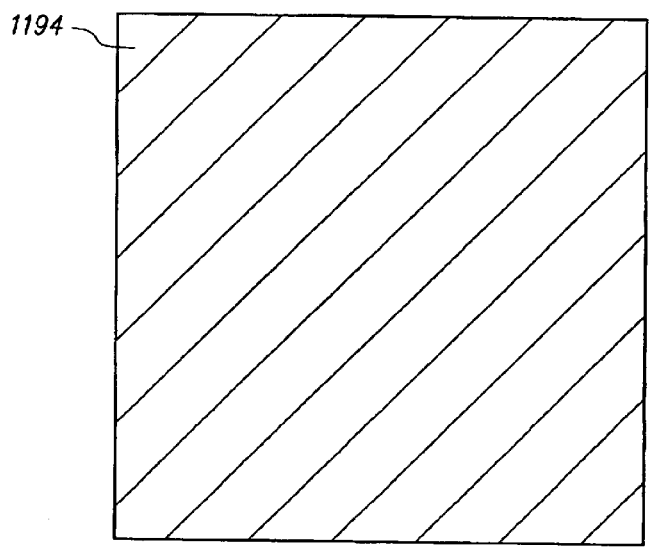
Figure 164C:
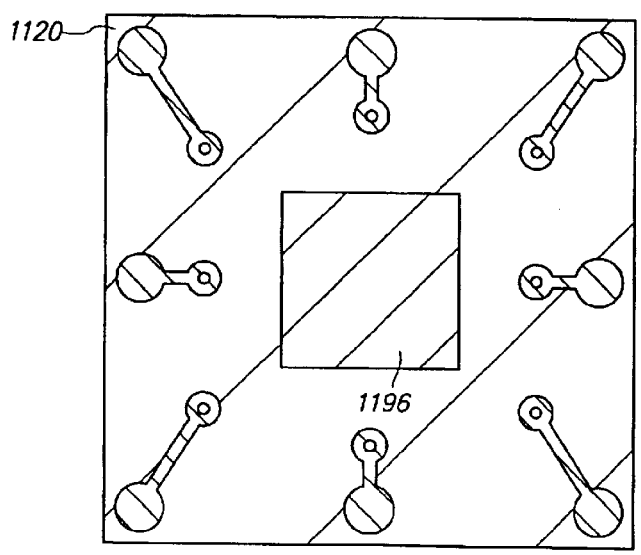

FIGS. 164A, 164B and 164C are cross-sectional, top and bottom views, respectively, of a semiconductor chip assembly in accordance with an eleventh embodiment of the present invention. In the eleventh embodiment, an insulative plug is deposited into the cavity and contacts and the covers the chip. For purposes of brevity, any description in the first embodiment is incorporated herein insofar as the same is applicable, and the same description need not be repeated. Likewise, elements of the of the eleventh embodiment similar to those in the first embodiments have corresponding reference numerals indexed at eleven-hundred rather than one-hundred. For instance, chip 1110 corresponds to chip 110, substrate 1120 corresponds to substrate 120, etc.

Insulative plug 1196 is deposited into cavity 1142 after chip 1110 and conductive trace 1170 are mechanically attached to substrate 1120 by adhesive 1178 and connection joint 1190 and interconnect 1192 are formed. Insulative plug 1196 contacts and covers surface 1114 of chip 1110. As a result, surface 1114 of chip 1110 is not exposed. Insulative plug 1196 also contacts and is sandwiched between chip 1110 and dielectric base 1128 and fills the remaining space between the peripheral edges of chip 1110 and inner sidewalls 1140 of dielectric base 1128. Insulative plug 1196 provides back-side environmental protection such as moisture resistance and particle protection for chip 1110 as well as enhanced mechanical coupling between chip 1110 and substrate 1120.

Insulative plug 1196 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited into cavity 1142 using stencil printing, and then the epoxy paste is cured or hardened at a relatively low temperature in the range of 100 to 250° C. to form a solid adherent insulative plug that provides a protective seal for chip 1110.

Semiconductor chip assembly 1198 includes chip 1110, substrate 1120, conductive trace 1170, adhesive 1178, connection joint 1190, interconnect 1192, insulative base 1194 and insulative plug 1196.

Figure 165A:
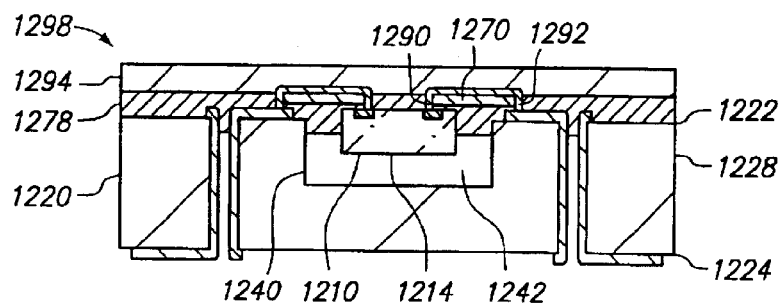
FIGS. 165A, 165B and 165C are cross-sectional, top and bottom views, respectively, of a semiconductor chip assembly in accordance with a twelfth embodiment of the present invention.
Figure 165B:
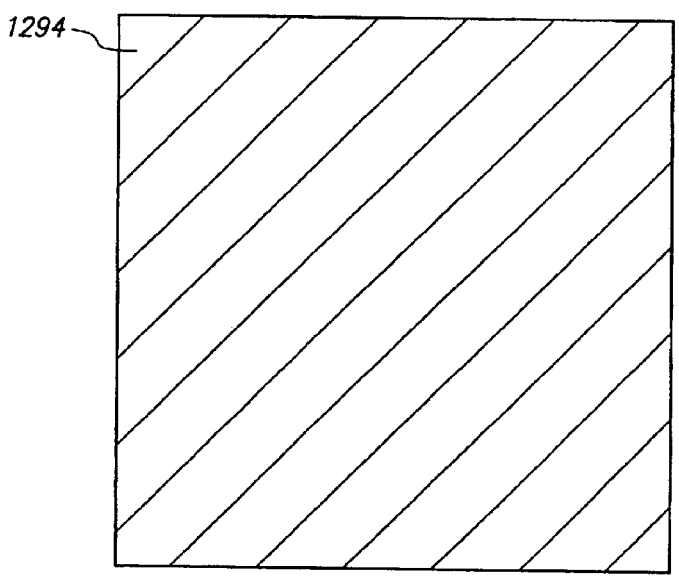
Figure 165C:
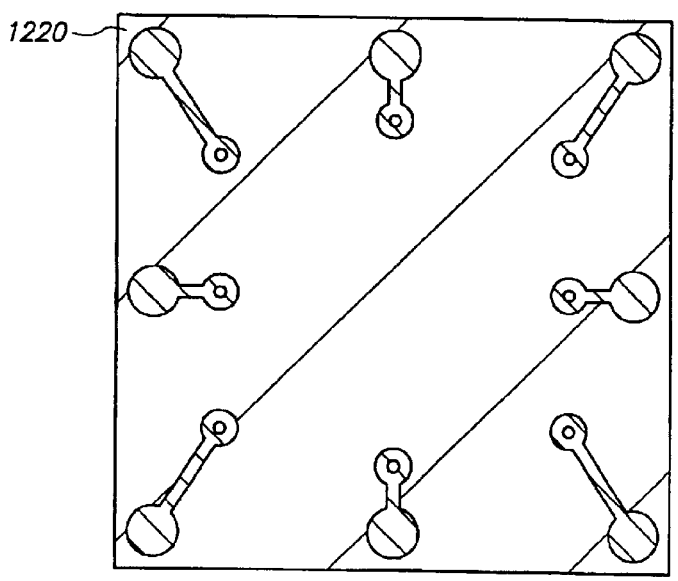

FIGS. 165A, 165B and 165C are cross-sectional, top and bottom views, respectively, of a semiconductor chip assembly in accordance with an twelfth embodiment of the present invention. In the twelfth embodiment, the cavity extends into but not though the substrate. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, substrate 1220 corresponds to substrate 120, etc.

Dielectric base 1228 has a thickness of 700 microns, and therefore is twice as thick as dielectric base 128. Furthermore, cavity 1242 extends from surface 1222 of substrate 1220 into substrate 1220 and has a depth of 400 microns. As a result, cavity 1242 extends into but not through substrate 1220 and is spaced from surface 1224 of substrate 1220 by 400 microns. Substrate 1220 provides back-side environmental protection such as moisture resistance and particle protection for chip 1210. Nevertheless, surface 1214 of chip 1210 is spaced from substrate 1220 by an open gap and is exposed within cavity 1242.

Dielectric base 1228 is manufactured by providing a first dielectric base layer that has a thickness of 400 microns and includes cavity 1242, providing a second dielectric base layer that has a thickness of 400 microns and excludes a cavity, and laminating the first and second dielectric base layers to one another. Thus, the first dielectric base layer is identical to dielectric base 128, and the second dielectric base layer is identical to dielectric base 128 except that the cavity is missing. For convenience of illustration, the first and second dielectric base layers are shown as a single layer.

Semiconductor chip assembly 1298 includes chip 1210, substrate 1220, conductive trace 1270, adhesive 1278, connection joint 1290, interconnect 1292 and insulative base 1294.

The semiconductor chip assemblies described above are merely exemplary. Numerous other embodiments are contemplated. For instance, the metal base and/or the insulative base can be omitted. In addition, various aspects of the embodiments described above can be combined with another. For instance, the laminated structure can be attached to the chip, regardless of whether the back-side of the chip is protected or unprotected. The connection joint and the interconnect can be formed by electroplating, regardless of whether the adhesive is a single-piece or a double-piece. The conductive trace can be electrically connected to the chip before mechanically attaching the chip to the substrate, regardless of whether the via is formed through the metal base and the adhesive or the adhesive alone. The conductive trace can be soldered to the substrate, regardless of whether the cavity extends through or into but not through the substrate. Various aspects of the embodiments described above can be mixed-and-matched with one another and other embodiments depending on design and reliability considerations.

Figure 166:
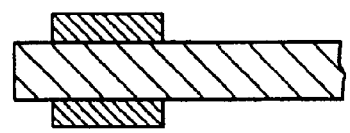
FIGS. 166–170 are top plan views of conductive trace variations in accordance with the present invention.
Figure 167:
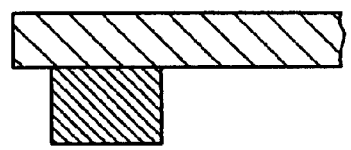
Figure 168:
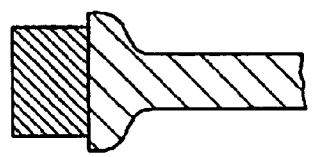
Figure 169:
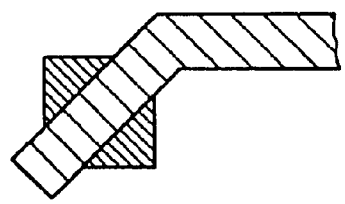
Figure 170:
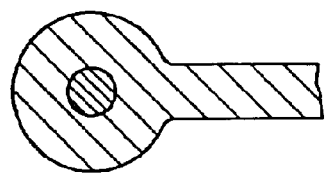

The conductive trace can have various shapes and sizes. The conductive trace can overlap various portions of the pad, such as one peripheral edge and the center of the pad (FIG. 8E), two opposing peripheral edges and the center of the pad (FIG. 166), three peripheral edges but not the center of the pad (FIGS. 167 and 168), two corners and the center of the pad (FIG. 169) or four peripheral edges but not the center of the pad (FIG. 170). Likewise, the conductive trace can overlap various portions of the first contact terminal.

The conductive trace can be various conductive metals including copper, gold, nickel, silver, palladium, tin, combinations thereof, and alloys thereof. The preferred composition of the conductive trace will depend on the nature of the connection joint and the interconnect as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in as well as fan-out.

The conductive trace can be formed on the metal base by numerous deposition techniques including electroplating and electroless plating. In addition, the conductive trace can be deposited on the metal base as a single layer or multiple layers. For instance, the conductive trace can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the conductive trace can consist of a non-copper layer electroplated on a copper base and a copper layer electroplated on the non-copper layer. Suitable non-copper layers include nickel, gold, palladium and silver. After the conductive trace is mechanically attached to the chip by the adhesive, a wet chemical etch can be applied that is highly selective of copper with respect to the non-copper layer to remove the copper base (or the exposed portion of the copper base) without removing the copper or non-copper layers. The non-copper layer provides an etch stop that prevents the wet chemical etch from removing the copper layer. Furthermore, it is understood that in the context of the present invention, the conductive trace and the metal base are different metals (or metallic materials) even if a multi-layer conductive trace includes a single layer that is similar to the metal base (such as the example described above).

If desired, the conductive trace can be spot plated near the pad and the first contact terminal to make it compatible with receiving the connection joint and the interconnect. For instance, a copper conductive trace can be spot plated with nickel and then silver to make it compatible with a gold ball bond connection joint and interconnect and avoid the formation of brittle silver-copper intermetallic compounds.

The conductive trace need not necessarily be flat, and a vertically protruding ball, pad, pillar (columnar post), bumped terminal or contact terminal can be deposited on or integral with the conductive trace. A pillar is particularly well-suited for reducing thermal mismatch related stress in the next level assembly, and a bumped terminal is particularly well-suited for providing vertical compliance in the next level assembly. Furthermore, the conductive trace can be a single-layer or multi-layer trace. For instance, a multi-layer trace can include first and second conductive layers disposed on opposite sides of a dielectric layer and a vertical connection that extends through the dielectric layer and electrically connects the conductive layers. In addition, the first conductive layer can contact the connection joint and the interconnect, or the first conductive layer can contact the connection joint and the second conductive layer can contact the interconnect, or the first conductive layer can contact the interconnect and the second conductive layer can contact the connection joint, or the second conductive layer can contact the connection joint and the interconnect.

The metal base can be various metals including copper, copper alloys, nickel, iron-nickel alloys, aluminum, and so on, and can be a single layer or multiple layers.

The metal base need not necessarily be removed. For instance, a portion of the metal base above the pad can be selectively etched to permit formation of the opening, another portion of the metal base above the first contact terminal can be selectively etched to permit formation of the via, and a large portion of the metal base that is disposed within the periphery of the chip can remain intact and provide a heat sink. Likewise, the connection joint and the interconnect can be formed over small portions of the metal base, and the small portions of the metal base can remain embedded between the connection joint and the adhesive and between the interconnect and the adhesive.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. Resin-coated copper foil (RCC) laminates are also suitable. However, other laminated structures can also be employed.

The metal layer can be etched to form the conductive trace in numerous manners. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. For example, the metal layer can be an ultra-thin copper foil with a thickness of 1–3 microns that is attached to an aluminum layer, then the metal layer can be laminated to the insulative base and sandwiched between the aluminum layer and the insulative base, then the aluminum layer can be peeled off the metal layer, the plated metal can be electroplated copper with a thickness of 10–15 microns, and a copper etching solution can be briefly applied to etch completely through the metal layer and remove a few microns of the plated metal. In this manner, the conductive trace can be formed semi-additively and composed of copper and include unetched portions of the metal layer and the plated metal. Likewise, the conductive trace can be formed subtractively from the metal layer, regardless of whether the plated metal etch mask remains attached to the conductive trace.

The pad can have numerous shapes including a flat rectangular shape and a bumped shape. For instance, a bump-shaped pad may extend into the opening and may even extend above the conductive trace. The pad can either be partially or completely exposed prior to forming the connection joint. The pad can have a length and width that are larger than, equal to, or smaller than the diameter of the opening. Preferably, a substantial portion of the pad is directly beneath the opening. If desired, the pad can be treated to accommodate the connection joint.

The substrate can be a wide variety of structures including printed circuit boards, printed wiring boards and high density interconnects, the conductive terminal can be a wide variety of conductive materials and have a wide variety of shapes and sizes, and the dielectric base can be a wide variety of insulative materials and have a wide variety of shapes and sizes. Furthermore, the substrate can be a single-layer or multi-layer structure and can include a redistribution layer, controlled impedance layer, thermal dissipater, buried capacitor, buried resistor, EMI shielding and so on.

The first contact terminal can have numerous shapes and can be protruded above, recessed below or substantially aligned with the dielectric base. For instance, a bump-shaped first contact terminal may extend into the via and may even extend above the conductive trace. The first contact terminal can either be partially or completely exposed prior to forming the interconnect. The first contact terminal can have a length and width that are larger than, equal to, or smaller than the diameter of the via. Preferably, a substantial portion of the first contact terminal is directly beneath the via. If desired, the first contact terminal can be treated to accommodate the interconnect.

The second contact terminal can have numerous shapes and can be protruded above, recessed below or substantially aligned with the dielectric base. The second contact terminal can be disposed within a periphery of the chip if the cavity extends into but not through the substrate and the second routing line provides fan-in routing.

Numerous adhesives can be applied between the conductive trace, the chip and the substrate. For instance, the adhesive can be applied as a paste, a laminated layer, or a liquid applied by screen-printing, spin-on, or spray-on. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The opening and the via can be formed either before or after mechanically attaching the conductive trace, the chip and the substrate. For instance, the adhesive can be applied as a liquid or paste (A stage) over the conductive trace, the adhesive can be partially cured (B stage), a back-side etch can form the opening and the via, the partially cured adhesive can be brought into contact with the chip and the substrate, and then the adhesive can be fully cured (C stage). Alternatively, the liquid or paste adhesive can be sandwiched between the conductive trace, the chip and the substrate, the adhesive can be fully cured, and then a front-side etch can form the opening and the via.

The opening and the via can be formed in numerous manners. For instance, the opening and the via can each be formed with a single removal step such as mechanical drilling, mechanical punching or laser drilling. Alternatively, the opening and the via can each be formed with multiple removal steps. For example, the opening and the via can be formed through a cover sheet using laser drilling, then through the metal base using wet chemical etching, and then through the insulative base and/or the adhesive using laser drilling. As another example, the opening and the via can be defined by a photoresist layer, then formed through the metal base using wet chemical etching, and then through the insulative base and/or the adhesive using laser drilling. The opening and the via can be formed using laser ablation (including laser direct write without a mask and projection laser ablation with a mask) or plasma etching. Similarly, the opening and the via can be formed by a combination of laser ablation and plasma etching. See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference. In addition, the opening and the via can be formed simultaneously or in sequence.

The opening and the via can have a circular, ovular, square, rectangular or other shape (as viewed from the top surface of the insulative base). The opening may be aligned with and expose a single pad or multiple pads and may expose one or more peripheral edges of the pad or just a central portion of the pad spaced from the peripheral edges of the pad. Likewise, the via may be aligned with and expose a single first contact terminal or multiple first contact terminals and may expose one or more peripheral edges of the first contact terminal or just a central portion of the first contact terminal spaced from the peripheral edges of the first contact terminal. Furthermore, the opening and via sidewalls may have a wide variety of shapes and slopes including vertical sidewalls, tapered sidewalls, continuous sidewalls and stepped sidewalls.

The connection joint and the interconnect can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing, and welding, and can have a wide variety of shapes and sizes. The shape and composition of the connection joint and the interconnect depends on the composition of the conductive trace as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference. These connection joint techniques are applicable to the interconnect as well.

The connection joint and the interconnect can be formed by a wide variety of plating techniques. For instance, the connection joint and the interconnect can be formed by applying a copper activator solution that renders the opening and the via sidewalls at the adhesive and/or the insulative base catalytic to electroless copper, then performing a copper electroless plating operation that deposits a thin electroless copper layer in the opening and the via, and then performing a copper electroplating operation that deposits a thick electroplated copper layer on the thin electroless copper layer.

The connection joint and the interconnect can be formed simultaneously or in sequence. The connection joint and the interconnect can be formed in sequence in numerous manners. For example, the connection joint can be formed before mechanically attaching the chip to the substrate, and then the interconnect can be formed after mechanically attaching the chip to the substrate. As another example, after mechanically attaching the conductive trace and the chip to the substrate, the opening and the connection joint can be formed, and then the via and the interconnect can be formed. Alternatively, the connection joint and the interconnect can be simultaneously formed after mechanically attaching the conductive trace to the chip and the substrate. The phrase "simultaneously formed" as used in this context means that the connection joint and the interconnect are formed during the same deposition operation, such as a plating operation, and although the connection joint and the interconnect need not necessarily electrically connect the conductive trace to the pad and the conductive terminal at the same time, the connection joint and the interconnect are formed concurrently and electrically connect the conductive trace to the pad and the conductive terminal during the deposition operation.

The insulative base can be disposed over the conductive trace before or after mechanically attaching the conductive trace to the chip. The insulative base can be a wide variety of materials including glass, transparent glue and transfer molded material. An adherent insulative base can attach a metal plate that provides a heat sink and EMI shielding for the chip, and a glass or transparent glue insulative base can permit optical transmission for an optoelectronic chip such as an image sensor that includes a light sensitive cell.

The insulative base may be rigid or flexible and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be disposed over the conductive trace, the connection joint and the interconnect in numerous manners, including printing and transfer molding.

The insulative base can be disposed between the metal base and the metal layer in numerous manners. For instance, an epoxy resin without reinforcement can be coated onto the metal base and then laminated to the metal layer as heat and pressure are applied. Alternatively, a prepreg with reinforcement can be a dry film that is sandwiched between the metal base and the metal layer and then laminated to the metal base and the metal layer as heat and pressure are applied.

If desired, a soldering material or solder ball can be deposited over the second contact terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint and the interconnect are formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulaton has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

Various cleaning steps, such as a brief oxygen plasma cleaning step, or a brief wet chemical cleaning step using a solution containing potassium permanganate, can be applied to the structure at various stages, such as after forming the opening and the via to dean the conductive trace, the first contact terminal and the pad.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted, rotated or slanted. Likewise, the conductive trace is shown above the chip and the substrate, the insulative base is shown above the conductive trace and the adhesive, and the metal base is shown above the conductive trace and the adhesive with a single orientation throughout the drawings for ease of comparison between the figures, although the assembly and its components may be inverted at various manufacturing stages.

The semiconductor chip assembly of the present invention can have a wide variety of packaging formats as required by the next level assembly. For instance, the conductive terminals can be configured so that the assembly is a surface mount technology (SMT) package such as a plastic leadless chip carrier (PLCC). The conductive terminals can also be configured so that the assembly is a grid array such as a ball grid array (BGA), column grid array (CGA), land grid array (LGA) or pin grid array (PGA).

The working format for the semiconductor chip assembly can be single assembly or multiple assemblies based on the manufacturing design. For instance, a single assembly that includes a single chip and a single substrate can be attached to the metal base. Alternatively, numerous assemblies can be simultaneously batch manufactured on a single metal base and then separated from one another. For example, conductive traces for multiple assemblies can be simultaneously electroplated on the metal base, then separate spaced adhesives for the respective assemblies can be selectively disposed on the metal base and corresponding conductive traces then the chips can be disposed on the corresponding adhesives, then the substrates can be aligned with the corresponding chips and conductive traces and attached to the corresponding adhesives, then the adhesives can be simultaneously fully cured, then the metal base can be removed, thereby separating the individual chip-substrate assemblies, and then the openings, vias, connection joints, interconnects and insulative bases can be formed for the individual chip-substrate assemblies.

Advantageously, the semiconductor chip assembly of the present invention is reliable and inexpensive. The conductive trace provides fine-pitch fan-out routing for the pad, and the conductive terminal provides coarse-pitch fan-out routing for the pad, thereby accommodating advanced logic chips with high pin count. The conductive terminal also provides vertical routing for the pad and includes the second contact terminal at the back-side of the substrate. The adhesive and the insulative base provide a known dielectric barrier for the conductive trace. The substrate and the adhesive provide mechanical support for the conductive trace after the metal base is removed. The substrate, the adhesive, the insulative base and the insulative plug protect the chip from handling damage. The mode of the connection can shift from the initial mechanical coupling of the conductive trace to the chip and the substrate by the adhesive to metallurgical coupling of the conductive trace to the chip and the substrate by the connection joint and the interconnect to assure sufficient metallurgical bond strength. Furthermore, the conductive trace can be mechanically and metallurgically coupled to the chip and the substrate, and thus the chip can be electrically connected to the substrate, without wire bonding or TAB, and without fabricating build-up layers on the chip, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A semiconductor chip assembly, comprising:
    a semiconductor chip that includes first and second opposing major surfaces, wherein the first surface of the chip includes a conductive pad;
    a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity,
    a conductive trace in an electrically conductive path between the conductive terminal and the pad, wherein the electrically conductive path extends outside the cavity and is devoid of wire bonds and TAB leads; and
    an adhesive disposed between the conductive trace and the chip, the conductive trace and the substrate, and the chip and the substrate.

2. The assembly of claim 1, wherein the first surface of the chip is disposed outside the cavity.

3. The assembly of claim 1, wherein the first surface of the chip is essentially coplanar with the conductive terminal at the first surface of the substrate.

4. The assembly of claim 1, wherein the second surface of the chip is disposed within the cavity.

5. The assembly of claim 1, wherein the second surface of the chip is spaced from the substrate by an open gap.

6. The assembly of claim 1, wherein the second surface of the chip is exposed.

7. The assembly of claim 1, wherein the cavity has a generally rectangular shape bounded by inner sidewalls of the dielectric base.

8. The assembly of claim 1, wherein the cavity is spaced from the conductive terminal.

9. The assembly of claim 1, wherein the cavity extends into but not through the substrate.

10. The assembly of claim 1, wherein the cavity extends through the substrate.

11. The assembly of claim 1, wherein the conductive trace extends within and outside a periphery of the chip.

12. The assembly of claim 1, wherein the conductive trace is disposed outside the cavity.

13. The assembly of claim 1, wherein the conductive trace is essentially flat and parallel to the first surface of the chip.

14. The assembly of claim 1, wherein the conductive trace extends within and outside a periphery of the chip and is disposed outside the cavity.

15. The assembly of claim 1, wherein the conductive trace is disposed outside the cavity and is essentially flat and parallel to the first surface of the chip.

16. The assembly of claim 1, wherein the conductive trace extends within and outside a periphery of the chip, is disposed outside the cavity and is essentially flat and parallel to the first surface of the chip.

17. The assembly of claim 1, wherein the conductive trace overlaps only one peripheral edge of the pad.

18. The assembly of claim 1, wherein the conductive trace overlaps only two peripheral edges of the pad, and the two peripheral edges are opposite one another.

19. The assembly of claim 1, wherein the conductive trace overlaps only three peripheral edges of the pad, and two of the three peripheral edges are opposite one another.

20. The assembly of claim 1, wherein the conductive trace overlaps only one peripheral edge of the conductive terminal.

21. The assembly of claim 1, wherein the conductive trace provides horizontal routing within and outside a periphery of the chip.

22. The assembly of claim 21, wherein the conductive trace does not provide vertical routing.

23. The assembly of claim 21, wherein the conductive terminal provides horizontal and vertical routing outside the periphery of the chip.

24. The assembly of claim 23, wherein the conductive terminal provides horizontal routing at the first surface of the substrate and vertical routing between the first and second surfaces of the substrate.

25. The assembly of claim 24, wherein the conductive trace is disposed outside the cavity and is essentially flat and parallel to the first surface of the chip.

26. The assembly of claim 1, wherein the conductive trace overlaps and is spaced from the conductive terminal and the pad and provides horizontal routing within and outside a periphery of the chip, and the conductive terminal provides horizontal and vertical routing outside the periphery of the chip.

27. The assembly of claim 26, wherein the conductive trace is disposed outside the cavity and is essentially flat and parallel to the first surface of the chip.

28. The assembly of claim 26, wherein the conductive trace includes a first distal end that is proximate to the pad and a second distal end that is proximate to the conductive terminal.

29. The assembly of claim 26, wherein the conductive terminal provides horizontal routing at the first surface of the substrate and vertical routing between the first and second surfaces of the substrate.

30. The assembly of claim 26, wherein the conductive trace is disposed outside the cavity and is essentially flat and parallel to the first surface of the chip and includes a first distal end that is proximate to the pad and a second distal end that is proximate to the conductive terminal, and the conductive terminal provides horizontal routing at the first surface of the substrate and vertical routing between the first and second surfaces of the substrate.

31. The assembly of claim 1, wherein the conductive trace provides fine-pitch fan-out routing for the pad and the conductive terminal provides coarse-pitch fan-out routing for the pad.

32. The assembly of claim 1, wherein the conductive trace has a larger pitch proximate to the conductive terminal than proximate to the pad.

33. The assembly of claim 1, wherein the conductive terminal has a larger pitch at the second surface of the substrate than proximate to the conductive trace.

34. The assembly of claim 1, wherein:
the conductive trace has a larger pitch proximate to the conductive terminal than proximate to the pad; and
the conductive terminal has a larger pitch at the second surface of the substrate than proximate to the conductive trace.

35. The assembly of claim 34, wherein the conductive trace and the conductive terminal have essentially identical pitches where they are proximate to one another.

36. The assembly of claim 1, wherein the conductive trace includes first and second distal ends, the conductive terminal includes first and second contact terminals at the first and second surfaces, respectively, of the substrate, the first end is proximate to and spaced from the pad, and the second end is proximate to and spaced from the first contact terminal.

37. The assembly of claim 36, wherein the conductive trace has a first pitch at the first end with other conductive traces that are spaced from the chip and the substrate, the conductive trace has a second pitch at the second end with the other conductive traces, and the first pitch is less than the second pitch.

38. The assembly of claim 36, wherein the conductive terminal has a third pitch at the first contact terminal with other conductive terminals that extend through the dielectric base, the conductive terminal has a fourth pitch at the second contact terminal with the other conductive terminals, and the third pitch is less than the fourth pitch.

39. The assembly of claim 36, wherein:
the conductive trace has a first pitch at the first end with other conductive traces that are spaced from the chip and the substrate, the conductive trace has a second pitch at the second end with the other conductive traces, and the first pitch is less than the second pitch; and
the conductive terminal has a third pitch at the first contact terminal with other conductive terminals that extend through the dielectric base, the conductive terminal has a fourth pitch at the second contact terminal with the other conductive terminals, and the third pitch is less than the fourth pitch.

40. The assembly of claim 39, wherein the second and third pitches are essentially identical.

41. The assembly of claim 1, wherein the adhesive is disposed between the conductive trace and the pad.

42. The assembly of claim 1, wherein the adhesive is disposed between the conductive trace and the conductive terminal.

43. The assembly of claim 1, wherein the adhesive is disposed between the chip and the dielectric base.

44. The assembly of claim 1, wherein the adhesive is disposed between the conductive trace and the pad, and the adhesive is disposed between the conductive trace and the conductive terminal.

45. The assembly of claim 1, wherein the adhesive is disposed between the conductive trace and the pad, and the adhesive is disposed between the chip and the dielectric base.

46. The assembly of claim 1, wherein the adhesive is disposed between the conductive trace and the conductive terminal, and the adhesive is disposed between the chip and the dielectric base.

47. The assembly of claim 1, wherein the adhesive is disposed between the conductive trace and the pad, the adhesive is disposed between the conductive trace and the conductive terminal, and the adhesive is disposed between the chip and the dielectric base.

48. The assembly of claim 1, wherein the adhesive contacts and is sandwiched between the conductive trace and the pad.

49. The assembly of claim 1, wherein the adhesive contacts and is sandwiched between the conductive trace and the conductive terminal.

50. The assembly of claim 1, wherein the adhesive contacts and is sandwiched between the chip and the dielectric base.

51. The assembly of claim 1, wherein the adhesive contacts and is sandwiched between the conductive trace and the pad, and the adhesive contacts and is sandwiched between the conductive trace and the conductive terminal.

52. The assembly of claim 1, wherein the adhesive contacts and is sandwiched between the conductive trace and the pad, and the adhesive contacts and is sandwiched between the chip and the dielectric base.

53. The assembly of claim 1, wherein the adhesive contacts and is sandwiched between the conductive trace and the conductive terminal, and the adhesive contacts and is sandwiched between the chip and the dielectric base.

54. The assembly of claim 1, wherein the adhesive contacts and is sandwiched between the conductive trace and the pad, the adhesive contacts and is sandwiched between the conductive trace and the conductive terminal, and the adhesive contacts and is sandwiched between the chip and the dielectric base.

55. The assembly of claim 1, wherein the adhesive extends into the cavity.

56. The assembly of claim 1, wherein the adhesive extends to the first and second surfaces of the chip.

57. The assembly of claim 1, wherein the adhesive extends to the first surface of the chip and does not extend to the second surface of the chip.

58. The assembly of claim 1, wherein the adhesive and the chip seal the cavity at the first surface of the substrate.

59. The assembly of claim 1, wherein the adhesive is a single-piece adhesive.

60. The assembly of claim 1, wherein the adhesive is silicone, polyimide or epoxy.

61. The assembly of claim 1, including a connection joint that contacts and electrically connects and provides vertical routing between the conductive trace and the pad.

62. The assembly of claim 61, wherein an opening extends through the adhesive, and the connection joint extends into the opening.

63. The assembly of claim 62, wherein the opening is disposed within the periphery of the chip.

64. The assembly of claim 62, wherein the opening is aligned with the pad.

65. The assembly of claim 62, wherein the adhesive contacts and is sandwiched between the conductive trace and the pad.

66. The assembly of claim 61, wherein the connection joint contacts a surface of the conductive trace that is disposed above and overlaps and faces away from the pad.

67. The assembly of claim 61, wherein the connection joint contacts a peripheral sidewall of the conductive trace that is disposed above and overlaps and is orthogonal to the pad.

68. The assembly of claim 61, wherein the connection joint contacts opposing peripheral sidewalls of the conductive trace that are disposed above and overlap and are orthogonal to the pad.

69. The assembly of claim 61, wherein the connection joint is a plated metal.

70. The assembly of claim 61, wherein the connection joint is devoid of wire bonds and TAB leads.

71. The assembly of claim 1, including an interconnect that contacts and electrically connects and provides vertical routing between the conductive trace and the conductive terminal.

72. The assembly of claim 71, wherein a via extends through the adhesive, and the interconnect extends into the via.

73. The assembly of claim 72, wherein the via is disposed outside the periphery of the chip.

74. The assembly of claim 72, wherein the via is aligned with the conductive terminal.

75. The assembly of claim 72, wherein the adhesive contacts and is sandwiched between the conductive trace and the conductive terminal.

76. The assembly of claim 71, wherein the interconnect contacts a surface of the conductive trace that is disposed above and overlaps and faces away from the conductive terminal.

77. The assembly of claim 71, wherein the interconnect contacts a peripheral sidewall of the conductive trace that is disposed above and overlaps and is orthogonal to the conductive terminal.

78. The assembly of claim 71, wherein the interconnect contacts opposing peripheral sidewalls of the conductive trace that are disposed above and overlap and are orthogonal to the conductive terminal.

79. The assembly of claim 71, wherein the interconnect is a plated metal.

80. The assembly of claim 71, wherein the interconnect is devoid of wire bonds and TAB leads.

81. A semiconductor chip assembly, comprising:
 a semiconductor chip that includes first and second opposing major surfaces, wherein the first surface of the chip includes a conductive pad;
 a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the first surfaces of the chip and the substrate face in a first direction, the second surfaces of the chip and the substrate face in a second direction, and the chip extends into the cavity;
 a conductive trace disposed within and outside a periphery of the chip and outside the cavity;
 an adhesive that mechanically attaches the conductive trace to the chip, the conductive trace to the substrate and the chip to the substrate, wherein the adhesive includes first and second opposing major surfaces, the first surface of the adhesive faces in the first direction, the second surface of the adhesive faces in the second direction, and the adhesive extends into the cavity,
 an opening that extends through the adhesive from the first surface of the adhesive to the pad;
 a connection joint in the opening that contacts and electrically connects the conductive trace and the pad;
 a via that extends through the adhesive from the first surface of the adhesive to the first contact terminal; and
 an interconnect in the via that contacts and electrically connects the conductive trace and the first contact terminal.

82. The assembly of claim 81, wherein the first surface of the chip is disposed outside the cavity.

83. The assembly of claim 81, wherein the first surface of the chip is essentially coplanar with the first contact terminal.

84. The assembly of claim 81, wherein the second surface of the chip is disposed in the cavity.

85. The assembly of claim 81, wherein the second surface of the chip is spaced from the substrate by an open gap.

86. The assembly of claim 81, wherein the second surface of the chip is exposed.

87. The assembly of claim 81, wherein the cavity has a generally rectangular shape bounded by inner sidewalls of the dielectric base.

88. The assembly of claim 81, wherein the cavity is spaced from the conductive terminal.

89. The assembly of claim 81, wherein the cavity extends through the substrate.

90. The assembly of claim 81, wherein the cavity extends into but not through the substrate.

91. The assembly of claim 81, wherein the conductive trace is essentially flat and parallel to the first surface of the chip and overlaps the pad and the first contact terminal.

92. The assembly of claim 81, wherein the conductive terminal is disposed outside the periphery of the chip.

93. The assembly of claim 81, wherein the adhesive contacts and is sandwiched between the conductive trace and the pad, and the adhesive contacts and is sandwiched between the conductive trace and the first contact terminal.

94. The assembly of claim 81, wherein the adhesive contacts and is sandwiched between the conductive trace and the pad, the adhesive contacts and is sandwiched between the conductive trace and the first contact terminal, and the adhesive contacts and is sandwiched between the chip and the dielectric base.

95. The assembly of claim 81, wherein the adhesive contacts the first and second surfaces of the chip.

96. The assembly of claim 81, wherein the adhesive contacts the first surface of the chip and does not extend to the second surface of the chip.

97. The assembly of claim 81, wherein the adhesive does not contact or cover a surface of the conductive trace that faces in the first direction.

98. The assembly of claim 81, wherein the adhesive and the chip seal the cavity at the first surface of the substrate.

99. The assembly of claim 81, wherein the adhesive is a single-piece adhesive.

100. The assembly of claim 81, wherein the adhesive includes a first single-piece adhesive that extends between conductive trace and the chip and does not extend outside a periphery of the cavity and a second single-piece adhesive that extends between the conductive, trace and the substrate and extends outside the periphery of the cavity.

101. The assembly of claim 81, wherein the opening is disposed within the periphery of the chip, and the via is disposed outside the periphery of the chip.

102. The assembly of claim 101, wherein the opening is aligned with the pad, and the via is aligned with the first contact terminal.

103. The assembly of claim 81, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

104. The assembly of claim 81, wherein the conductive trace provides fine-pitch fan-out routing for the pad, and the conductive terminal provides coarse-pitch fan-out routing for the pad.

105. The assembly of claim 104, wherein:
the conductive trace includes a first distal end that is proximate to the pad and a second distal end that is proximate to the first contact terminal;
the conductive trace has a larger pitch at the second distal end than at the first distal end; and
the conductive terminal has a larger pitch at the second contact terminal than at the first contact terminal.

106. The assembly of claim 105, wherein the first contact terminal and the second distal end have essentially identical pitches.

107. The assembly of claim 81, wherein the adhesive is silicone, polyimide or epoxy, the connection joint is an electroplated metal, an electrolessly plated metal, a ball bond, a weld, solder or conductive adhesive, and the interconnect is an electroplated metal, an electrolessly plated metal, a ball bond, a weld, solder or conductive adhesive.

108. The assembly of claim 81, wherein the connection joint is a plated metal, and the interconnect is a plated metal.

109. The assembly of claim 81, wherein the connection joint is a plated metal, and the interconnect is solder or conductive adhesive.

110. The assembly of claim 81, wherein the assembly is devoid of wire bonds and TAB leads.

111. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the cavity has a generally rectangular shape bounded by inner sidewalls of the dielectric base and is spaced from the conductive terminal, the first surfaces of the chip and the substrate face in a first direction, the second surfaces of the chip and the substrate face in a second direction, and the chip extends into the cavity;
a conductive trace disposed within and outside a periphery of the chip and outside the cavity;
an adhesive that contacts and is sandwiched between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, and the adhesive extends into the cavity;
an opening that extends through the adhesive from the first surface of the adhesive to the pad and is disposed within the periphery of the chip;
a connection joint in the opening that contacts and electrically connects the conductive trace and the pad;
a via that extends through the adhesive from the first surface of the adhesive to the first contact terminal and is disposed outside the periphery of the chip; and
an interconnect in the via that contacts and electrically connects the conductive trace and the first contact terminal.

112. The assembly of claim 111, wherein the first surface of the chip is disposed outside the cavity, and the second surface of the chip is disposed in the cavity.

113. The assembly of claim 111, wherein the second surface of the chip is spaced from the substrate by an open gap and is exposed.

114. The assembly of claim 111, wherein the cavity extends through the substrate.

115. The assembly of claim 111, wherein the cavity extends into but not through the substrate.

116. The assembly of claim 111, wherein the conductive trace is essentially flat and parallel to the first surface of the chip and overlaps the pad and the first contact terminal.

117. The assembly of claim 111, wherein the adhesive contacts the first surface of the chip and does not contact or cover the second surface of the chip.

118. The assembly of claim 111, wherein the adhesive does not contact or cover a surface of the conductive trace that faces in the first direction.

119. The assembly of claim 111, wherein the adhesive and the chip seal the cavity at the first surface of the substrate.

120. The assembly of claim 111, wherein the opening is aligned with the pad, and the via is aligned with the first contact terminal.

121. The assembly of claim 111, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

122. The assembly of claim 111, wherein the conductive trace provides fine-pitch fan-out routing for the pad, and the conductive terminal provides coarse-pitch fan-out routing for the pad.

123. The assembly of claim 111, wherein:
the conductive trace includes a first distal end that is proximate to the pad and a second distal end that is proximate to the first contact terminal;
the conductive trace has a larger pitch at the second distal end than at the first distal end;
the conductive terminal has a larger pitch at the second contact terminal than at the first contact terminal; and
the first contact terminal and the second distal end have essentially identical pitches.

124. The assembly of claim 111, wherein the connection joint is a plated metal, and the interconnect is a plated metal.

125. The assembly of claim 111, wherein the assembly is devoid of wire bonds and TAB leads.

126. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the second surface of the chip is disposed in the cavity and spaced from the substrate by an open gap;

a conductive trace disposed within and outside a periphery of the chip and outside the cavity;

an adhesive that mechanically attaches the conductive trace to the chip, the conductive trace to the substrate and the chip to the substrate, wherein the adhesive includes first and second opposing major surfaces, the first surface of the adhesive faces in the first direction, the second surface of the adhesive faces in the second direction, and the adhesive extends into the cavity;

an opening that extends through the adhesive from the first surface of the adhesive to the pad and is disposed within the periphery of the chip;

a connection joint in the opening that contacts and electrically connects the conductive trace and the pad;

a via that extends through the adhesive from the first surface of the adhesive to the first contact terminal is disposed outside the periphery of the chip; and an interconnect in the via that contacts and electrically connects the conductive trace and the first contact terminal.

127. The assembly of claim 126, wherein the first surface of the chip is disposed outside the cavity.

128. The assembly of claim 126, wherein the second surface of the chip is parallel to the second surface of the substrate.

129. The assembly of claim 126, wherein the cavity extends through the substrate.

130. The assembly of claim 126, wherein the cavity extends into but not through the substrate.

131. The assembly of claim 126, wherein the conductive trace is essentially flat and parallel to the first surface of the chip and overlaps the pad and the first contact terminal.

132. The assembly of claim 126, wherein the adhesive contacts the first surface of the chip and does-not contact or cover the second surface of the chip.

133. The assembly of claim 126, wherein the adhesive does not contact or cover a surface of the conductive trace that faces in the first direction.

134. The assembly of claim 126, wherein the adhesive and the chip seal the cavity at the first surface of the substrate.

135. The assembly of claim 126, wherein the opening is aligned with the pad, and the via is aligned with the first contact terminal.

136. The assembly of claim 126, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

137. The assembly of claim 126, wherein the conductive trace provides fine-pitch fan-out routing for the pad, and the conductive terminal provides coarse-pitch fan-out routing for the pad.

138. The assembly of claim 126, wherein:
the conductive trace includes a first distal end that is proximate to the pad and a second distal end that is proximate to the first contact terminal;
the conductive trace has a larger pitch at the second distal end than at the first distal end;
the conductive terminal has a larger pitch at the second contact terminal than at the first contact terminal; and
the first contact terminal and the second distal end have essentially identical pitches.

139. The assembly of claim 126, wherein the connection joint is a plated metal, and the interconnect is a plated metal.

140. The assembly of claim 126, wherein the assembly is devoid of wire bonds and TAB leads.

141. A semiconductor chip assembly, comprising:
a semiconductor chip that includes first and second opposing major surfaces, wherein the first surface of the chip includes a conductive pad;

a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the chip extends into the cavity;

a conductive trace disposed within and outside a periphery of the chip and outside the cavity;

an adhesive disposed between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, the adhesive extends into the cavity, and the adhesive and the chip seal the cavity at the first surface of the substrate;

an opening that extends through the adhesive from the first surface of the adhesive to the pad and is disposed within the periphery of the chip;

a connection joint in the opening that contacts and electrically connects the conductive trace and the pad;

a via that extends through the adhesive from the first surface of the adhesive to the first contact terminal and is disposed outside the periphery of the chip; and an interconnect in the via that contacts and electrically connects the conductive trace and the first contact terminal.

142. The assembly of claim 141, wherein the first surface of the chip is disposed outside the cavity, and the second surface of the chip is disposed in the cavity.

143. The assembly of claim 141, wherein the second surface of the chip is spaced from the substrate by an open gap and is exposed.

144. The assembly of claim 141, wherein the cavity extends through the substrate.

145. The assembly of claim 141, wherein the cavity extends into but not through the substrate.

146. The assembly of claim 141, wherein the conductive trace is essentially flat and parallel to the first surface of the chip and overlaps the pad and the first contact terminal.

147. The assembly of claim 141, wherein the adhesive contacts and is sandwiched between the conductive trace and the chip, the conductive trace and the substrate, and the chip and the dielectric base.

148. The assembly of claim 141, wherein the adhesive contacts the first surface of the chip and does not contact or cover the second surface of the chip.

149. The assembly of claim 141, wherein the adhesive does not contact or cover a surface of the conductive trace that faces in the first direction.

150. The assembly of claim 141, wherein the opening is aligned with the pad, and the via is aligned with the first contact terminal.

151. The assembly of claim 141, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

152. The assembly of claim 141, wherein the conductive trace provides fine-pitch fan-out routing for the pad, and the conductive terminal provides coarse-pitch fan-out routing for the pad.

153. The assembly of claim 141, wherein:
the conductive trace includes a first distal end that is proximate to the pad and a second distal end that is proximate to the first contact terminal;
the conductive trace has a larger pitch at the second distal end than at the first distal end;
the conductive terminal has a larger pitch at the second contact terminal than at the first contact terminal; and
the first contact terminal and the second distal end have essentially identical pitches.

154. The assembly of claim 141, wherein the connection joint is a plated metal, and the interconnect is a plated metal.

155. The assembly of claim 141, wherein the assembly is devoid of wire bonds and TAB leads.

156. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the chip extends into the cavity;
a conductive trace disposed within and outside a periphery of the chip and outside the cavity, wherein the conductive trace includes first and second opposing major surfaces and first and second opposing major peripheral sidewalls therebetween, the first surface of the conductive trace faces in the first direction, and the second surface of the conductive trace faces in the second direction;
an adhesive disposed between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, the adhesive contacts the first and second peripheral sidewalls and the second surface of the conductive trace, the adhesive does not contact or cover the first surface of the conductive trace, and the adhesive extends into the cavity,
an opening that extends through the adhesive from the first surface of the adhesive to the pad and is disposed within the periphery of the chip;
a connection joint in the opening that contacts and electrically connects the conductive trace and the pad;
a via that extends through the adhesive from the first surface of the adhesive to the first contact terminal and is disposed outside the periphery of the chip; and
an interconnect in the via that contacts and electrically connects the conductive trace and the first contact terminal.

157. The assembly of claim 156, wherein the first surface of the chip is disposed outside the cavity, and the second surface of the chip is disposed in the cavity.

158. The assembly of claim 156, wherein the second surface of the chip is spaced from the substrate by an open gap and is exposed.

159. The assembly of claim 156, wherein the cavity extends through the substrate.

160. The assembly of claim 156, wherein the cavity extends into but not through the substrate.

161. The assembly of claim 156, wherein the conductive trace is essentially flat and parallel to the first surface of the chip and overlaps the pad and the first contact terminal.

162. The assembly of claim 156, wherein the conductive trace includes first and second distal ends that overlap the pad and the first contact terminal, respectively.

163. The assembly of claim 156, wherein the adhesive contacts the first surface of the chip and does not contact or cover the second surface of the chip.

164. The assembly of claim 156, wherein the adhesive and the chip seal the cavity at the first surface of the substrate.

165. The assembly of claim 156, wherein the opening is aligned with the pad, and the via is aligned with the first contact terminal.

166. The assembly of claim 156, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

167. The assembly of claim 156, wherein the conductive trace provides fine-pitch fan-out routing for the pad, and the conductive terminal provides coarse-pitch fan-out routing for the pad.

168. The assembly of claim 156, wherein:
the conductive trace includes a first distal end that is proximate to the pad and a second distal end that is proximate to the first contact terminal;
the conductive trace has a larger pitch at the second distal end than at the first distal end;
the conductive terminal has a larger pitch at the second contact terminal than at the first contact terminal; and
the first contact terminal and the second distal end have essentially identical pitches.

169. The assembly of claim 156, wherein the connection joint is a plated metal, and the interconnect is a plated metal.

170. The assembly of claim 156, wherein the assembly is devoid of wire bonds and TAB leads.

171. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, the chip extends into the cavity, and the pad is essentially coplanar with the first contact terminal at the first surfaces of the chip and the substrate;
a conductive trace disposed within and outside a periphery of the chip and outside the cavity;
an adhesive that contacts and is sandwiched between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, and the adhesive extends into the cavity;
an opening that extends through the adhesive from the first surface of the adhesive to the pad and is disposed within the periphery of the chip;
a connection joint in the opening that contacts and electrically connects the conductive trace and the pad;
a via that extends through the adhesive from the first surface of the adhesive to the first contact terminal and is disposed outside the periphery of the chip; and
an interconnect in the via that contacts and electrically connects the conductive trace and the first contact terminal.

172. The assembly of claim 171, wherein the first surface of the chip is disposed outside the cavity, and the second surface of the chip is disposed in the cavity.

173. The assembly of claim 171, wherein the second surface of the chip is spaced from the substrate by an open gap and is exposed.

174. The assembly of claim 171, wherein the cavity extends through the substrate.

175. The assembly of claim 171, wherein the cavity extends into but not through the substrate.

176. The assembly of claim 171, wherein the conductive trace is essentially flat and parallel to the first surface of the chip and overlaps the pad and the first contact terminal.

177. The assembly of claim 171, wherein the adhesive contacts the first surface of the chip and does not contact or cover the second surface of the chip.

178. The assembly of claim 171, wherein the adhesive does not contact or cover a surface of the conductive trace that faces in the first direction.

179. The assembly of claim 171, wherein the adhesive and the chip seal the cavity at the first surface of the substrate.

180. The assembly of claim 171, wherein the opening is aligned with the pad, and the via is aligned with the first contact terminal.

181. The assembly of claim 171, wherein the pad and the first contact terminal are vertically offset from one another by at most 10 microns at the first surfaces of the chip and the substrate.

182. The assembly of claim 171, wherein the pad and the first contact terminal are vertically offset from one another by at most 5 microns at the first surfaces of the chip and the substrate.

183. The assembly of claim 171, wherein the dielectric base is essentially flat at the first and second surfaces of the substrate.

184. The assembly of claim 171, wherein the first contact terminal terminal vertically protrudes from the dielectric base at the first surface of the substrate.

185. The assembly of claim 171, wherein the second contact terminal vertically protrudes from the dielectric base at the second surface of the substrate.

186. The assembly of claim 171, wherein the conductive trace provides horizontal routing for the pad within and outside the periphery of the chip, the conductive terminal provides horizontal and vertical routing for the pad outside the periphery of the chip, the connection joint provides vertical routing for the pad within the periphery of the chip, and the interconnect provides vertical routing for the pad outside the periphery of the chip.

187. The assembly of claim 171, wherein the conductive trace provides fine-pitch fan-out routing for the pad, and the conductive terminal provides coarse-pitch fan-out routing for the pad.

188. The assembly of claim 171, wherein:
the conductive trace includes a first distal end that is proximate to the pad and a second distal end that is proximate to the first contact terminal;
the conductive trace has a larger pitch at the second distal end than at the first distal end;
the conductive terminal has a larger pitch at the second contact terminal than at the first contact terminal; and
the first contact terminal and the second distal end have essentially identical pitches.

189. The assembly of claim 171, wherein the connection joint is a plated metal, and the interconnect is a plated metal.

190. The assembly of claim 171, wherein the assembly is devoid of wire bonds and TAB leads.

191. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity;
a conductive trace in an electrically conductive path between the conductive terminal and the pad, wherein the electrically conductive path extends outside the cavity and is devoid of wire bonds and TAB leads; and
an adhesive disposed between the conductive trace and the chip, the conductive trace and the substrate, and the chip and the substrate.

192. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity;
a conductive trace in an electrically conductive path between the conductive terminal and the pad, wherein the electrically conductive path extends outside the cavity and is devoid of wire bonds, TAB leads, solder and conductive adhesive; and
an adhesive disposed between the conductive trace and the chip, the conductive trace and the substrate, and the chip and the substrate.

193. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base to the first and second surfaces of the substrate, a cavity extends from the first surface of the substrate into the substrate, the cavity has a generally rectangular shape bounded by inner sidewalls of the dielectric base, the conductive terminal is spaced from the cavity, the first surfaces of the chip and the substrate face in a first direction, the second surfaces of the chip and the substrate face in a second direction, and the chip extends into the cavity;
a conductive trace in an electrically conductive path between the conductive terminal and the pad, wherein the conductive trace extends within and outside a periphery of the chip, is disposed outside the cavity and is essentially flat and parallel to the first surfaces of the chip and the substrate; and
an adhesive disposed between the conductive trace and the chip, the conductive trace and the substrate, and the chip and the substrate.

194. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base to the first and second surfaces of the substrate, the dielectric base is essentially flat at the first and second surfaces of the substrate, a cavity extends from the first surface of the substrate into the substrate, the cavity has a generally rectangular shape bounded by inner sidewalls of the dielectric base, the conductive terminal is spaced from the cavity, the first surfaces of the chip and the substrate face in a first direction, the second surfaces of the chip and the substrate face in a second direction, and the chip extends into the cavity;
a conductive trace in an electrically conductive path between the conductive terminal and the pad, wherein the conductive trace extends within and outside a periphery of the chip, is disposed outside the cavity and is devoid of wire bonds and TAB leads; and
an adhesive disposed between the conductive trace and the chip, the conductive trace and the substrate, and the chip and the substrate, wherein the adhesive extends into the cavity without extending to the second surface of the substrate, and the adhesive and the chip seal the cavity at the first surface of the substrate.

195. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base to the first and second surfaces of the substrate, the dielectric base is essentially flat at the first and second surfaces of the substrate, a cavity extends from the first surface of the substrate into the substrate, the cavity has a generally rectangular shape bounded by inner sidewalls of the dielectric base, the conductive terminal is spaced from the cavity, the first surfaces of the chip and the substrate face in a first direction, the second surfaces of the chip and the substrate face in a second direction, and the chip extends into the cavity;
a conductive trace in an electrically conductive path between the conductive terminal and the pad, wherein the conductive trace extends within and outside a periphery of the chip, is disposed outside the cavity and is devoid of wire bonds and TAB leads; and
an adhesive disposed between and in contact with the conductive trace and the chip, the conductive trace and the substrate, and the chip and the substrate, wherein the adhesive and the chip seal the cavity at the first surface of the substrate, the adhesive contacts opposing peripheral sidewalls of the conductive trace and a surface of the conductive trace that faces in the second direction without contacting or covering a surface of the conductive trace that faces in the first direction, the adhesive contacts the chip and the dielectric base within the cavity, and the adhesive is a cured material.

196. A semiconductor chip assembly, comprising:
a semiconductor chip that includes first and second opposing major surfaces, wherein the first surface of the chip includes a conductive pad;
a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, the dielectric base is essentially flat at the first and second surfaces of the substrate, a cavity extends from the first surface of the substrate into the substrate, the first surfaces of the chip and the substrate face in a first direction, the second surfaces of the chip and the substrate face in a second direction, and the chip extends into the cavity;
a conductive trace disposed within and outside a periphery of the chip and outside the cavity, wherein the conductive trace overlaps the pad and the first contact terminal;

an adhesive that mechanically attaches the conductive trace to the chip, the conductive trace to the substrate and the chip to the substrate, wherein the adhesive includes first and second opposing major surfaces, the first surface of the adhesive faces in the first direction, the second surface of the adhesive faces in the second direction, and the adhesive extends into the cavity;

an opening that extends through the adhesive from the first surface of the adhesive to the pad and is aligned with the pad;

a connection joint in the opening that contacts and electrically connects the conductive trace and the pad;

a via that extends through the adhesive from the first surface of the adhesive to the first contact terminal and is aligned with the first contact terminal; and an interconnect in the via that contacts and electrically connects the conductive trace and the first contact terminal.

197. A semiconductor chip assembly, comprising:

a semiconductor chip that includes first and second opposing major surfaces, wherein the first surface of the chip includes a conductive pad;

a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, the dielectric base is essentially flat at the first and second surfaces of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the chip extends into the cavity;

a conductive trace disposed within and outside a periphery of the chip and outside the cavity, wherein the conductive trace overlaps the pad and the first contact terminal;

an adhesive that contacts and is sandwiched between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, and the adhesive extends into the cavity;

an opening that extends through the adhesive from the first surface of the adhesive to the pad and is disposed within the periphery of the chip and aligned with the pad;

a connection joint in the opening that contacts and electrically connects the conductive trace and the pad;

a via that extends through the adhesive from the first surface of the adhesive to the first contact terminal and is disposed outside the periphery of the chip and aligned with the first contact terminal; and an interconnect in the via that contacts and electrically connects the conductive trace and the first contact terminal.

198. A semiconductor chip assembly, comprising:

a semiconductor chip that includes first and second opposing major surfaces, wherein the first surface of the chip includes a conductive pad;

a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, the dielectric base is essentially flat at the first and second surfaces of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the second surface of the chip is disposed in the cavity and spaced from the substrate by an open gap;

a conductive trace disposed within and outside a periphery of the chip and outside the cavity, wherein the conductive trace overlaps the pad and the first contact terminal;

an adhesive that mechanically attaches the conductive trace to the chip, the conductive trace to the substrate and the chip to the substrate, wherein the adhesive includes first and second opposing major surfaces, the first surface of the adhesive faces in the first direction, the second surface of the adhesive faces in the second direction, and the adhesive extends into the cavity;

an opening that extends through the adhesive from the first surface of the adhesive to the pad and is disposed within the periphery of the chip and aligned with the pad;

a connection joint in the opening that contacts and electrically connects the conductive trace and the pad;

a via that extends through the adhesive from the first surface of the adhesive to the first contact terminal is disposed outside the periphery of the chip and aligned with the first contact terminal; and an interconnect in the via that contacts and electrically connects the conductive trace and the first contact terminal.

199. A semiconductor chip assembly, comprising:

a semiconductor chip that includes first and second opposing major surfaces, wherein the first surface of the chip includes a conductive pad;

a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, the dielectric base is essentially flat at the first and second surfaces of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the chip extends into the cavity;

a conductive trace disposed within and outside a periphery of the chip and outside the cavity, wherein the conductive trace overlaps the pad and the first contact terminal;

an adhesive disposed between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, the adhesive extends into the cavity, and the adhesive and the chip seal the cavity at the first surface of the substrate;

an opening that extends through the adhesive from the first surface of the adhesive to the pad and is disposed within the periphery of the chip and aligned with the pad;

a connection joint in the opening that contacts and electrically connects the conductive trace and the pad;

a via that extends through the adhesive from the first surface of the adhesive to the first contact terminal and is disposed outside the periphery of the chip and aligned with the first contact terminal; and an interconnect in the via that contacts and electrically connects the conductive trace and the first contact terminal.

200. A semiconductor chip assembly, comprising:

a semiconductor chip that includes first and second opposing major surfaces, wherein the first surface of the chip includes a conductive pad;

a substrate that includes first and second opposing major surfaces, wherein the first and second surfaces of the substrate include a conductive terminal and a dielectric base, the conductive terminal extends through the dielectric base and includes a first contact terminal at the first surface of the substrate and a second contact terminal at the second surface of the substrate, the dielectric base is essentially flat at the first and second surfaces of the substrate, a cavity extends from the first surface of the substrate into the substrate, the cavity has a generally rectangular shape bounded by inner sidewalls of the dieletric base and is spaced from the conductive terminal, the first surfaces of the chip and the substrate face in a first direction, the second surfaces of the chip and the substrate face in a second direction, and the chip extends into the cavity;

a conductive trace disposed within and outside a periphery of the chip and outside the cavity, wherein the conductive trace includes first and second opposing major surfaces and first and second opposing major peripheral sidewalls therebetween, the first surface of the conductive trace faces in the first direction, the second surface of the conductive trace faces in the second direction, and the conductive trace overlaps the pad and the first contact terminal;

an adhesive disposed between the conductive trace and the chip, the conductive trace and the substrate, and the chip and the substrate, wherein the adhesive includes first and second opposing major surfaces, the first surface of the adhesive faces in the first direction, the second surface of the adhesive faces in the second direction, the adhesive contacts the first and second peripheral sidewalls and the second surface of the conductive trace, the adhesive does not contact or cover the first surface of the conductive trace, and the adhesive extends into the cavity;

an opening that extends through the adhesive from the first surface of the adhesive to the pad and is disposed within the periphery of the chip and aligned with the pad;

a connection joint in the opening that contacts and electrically connects the conductive trace and the pad;

a via that extends through the adhesive from the first surface of the adhesive to the first contact terminal and is disposed outside the periphery of the chip and aligned with the first contact terminal; and an interconnect in the via that contacts and electrically connects the conductive trace and the first contact terminal.

* * * * *

UNITED STATES PATENT AND TRADEMARK OFFICE
CERTIFICATE OF CORRECTION

PATENT NO. : 6,876,072 B1
DATED : April 5, 2005
INVENTOR(S) : Chia-Chung Wang et al.

It is certified that error appears in the above-identified patent and that said Letters Patent is hereby corrected as shown below:

Column 59,
Line 49, change the second instance of "," to -- ; --.

Column 64,
Line 3, change the second instance of "," to -- ; --.
Line 64, delete ",".

Column 67,
Line 30, insert -- and -- after "terminal".
Line 48, change "-" to a space.

Column 70,
Line 9, change "," to -- ; --.

Column 72,
Line 16, delete the second instance of "terminal".

Column 76,
Line 37, insert -- and -- after "terminal".

Signed and Sealed this

Thirty-first Day of May, 2005

JON W. DUDAS
*Director of the United States Patent and Trademark Office*